US011450789B2

(12) United States Patent
Horie

(10) Patent No.: US 11,450,789 B2
(45) Date of Patent: Sep. 20, 2022

(54) ILLUMINATION METHOD USING A LIGHT-EMITTING DEVICE

(71) Applicant: CITIZEN ELECTRONICS CO., LTD., Fujiyoshida (JP)

(72) Inventor: Hideyoshi Horie, Odawara (JP)

(73) Assignee: CITIZEN ELECTRONICS CO., LTD., Fujiyoshida (JP)

(*) Notice: Subject to any disclaimer, the term of this patent is extended or adjusted under 35 U.S.C. 154(b) by 88 days.

(21) Appl. No.: 15/191,734

(22) Filed: Jun. 24, 2016

(65) Prior Publication Data

US 2016/0308097 A1 Oct. 20, 2016

Related U.S. Application Data

(63) Continuation of application No. PCT/JP2014/084487, filed on Dec. 26, 2014.

(30) Foreign Application Priority Data

| Dec. 27, 2013 | (JP) | ............................ JP2013-272763 |
| Aug. 5, 2014 | (JP) | ............................ JP2014-159784 |
| Sep. 3, 2014 | (JP) | ............................ JP2014-178928 |
| Sep. 3, 2014 | (JP) | ............................ JP2014-178941 |

(51) Int. Cl.
*H01L 33/50* (2010.01)
*C09K 11/77* (2006.01)

(52) U.S. Cl.
CPC ........ *H01L 33/504* (2013.01); *C09K 11/7734* (2013.01); *C09K 11/7769* (2013.01); *C09K 11/7774* (2013.01)

(58) Field of Classification Search
CPC .................................................... H01L 33/504
See application file for complete search history.

(56) References Cited

U.S. PATENT DOCUMENTS

| 5,803,579 A | 9/1998 | Turnbull et al. |
| 5,998,925 A | 12/1999 | Shimizu et al. |
| 6,132,072 A | 10/2000 | Turnbull et al. |
| 6,252,254 B1 | 6/2001 | Soules et al. |

(Continued)

FOREIGN PATENT DOCUMENTS

| EP | 2 543 920 A1 | 1/2013 |
| EP | 2 629 341 A1 | 8/2013 |

(Continued)

OTHER PUBLICATIONS

International Search Report dated Oct. 2, 2012 in PCT/JP2012/072143.

(Continued)

*Primary Examiner* — Kevin Parendo
(74) *Attorney, Agent, or Firm* — Oblon, McClelland, Maier & Neustadt, L.L.P.

(57) ABSTRACT

It is an object of the present invention to improve light source efficiency of "a light-emitting device capable of realizing a natural, vivid, highly visible and comfortable appearance of colors or an appearance of objects" already arrived at by adopting a spectral power distribution having a shape completely different from the shape of conventionally known spectral power distributions while maintaining favorable color appearance characteristics.

10 Claims, 89 Drawing Sheets

(56) References Cited

U.S. PATENT DOCUMENTS

| | | |
|---|---|---|
| 6,459,197 B1 | 10/2002 | Mori et al. |
| 6,523,976 B1 | 2/2003 | Turnbull et al. |
| 8,373,338 B2 | 2/2013 | Beers |
| 9,818,914 B2* | 11/2017 | Horie .................... H01L 33/502 |
| 2003/0156425 A1 | 8/2003 | Turnbull et al. |
| 2008/0106734 A1 | 5/2008 | Katabe |
| 2008/0297027 A1 | 12/2008 | Miller et al. |
| 2009/0033201 A1* | 2/2009 | Shimooka .......... C09K 11/0883 |
| | | 313/483 |
| 2009/0122530 A1 | 5/2009 | Beers et al. |
| 2010/0189429 A1* | 7/2010 | Butterworth ............ G03B 7/08 |
| | | 396/155 |
| 2010/0194291 A1 | 8/2010 | Ishiwata |
| 2010/0224895 A1 | 9/2010 | Murazaki et al. |
| 2010/0225226 A1 | 9/2010 | Murazaki et al. |
| 2010/0244700 A1 | 9/2010 | Chong et al. |
| 2010/0289044 A1* | 11/2010 | Krames .................. C09K 11/08 |
| | | 257/98 |
| 2010/0295464 A1 | 11/2010 | Kasakura et al. |
| 2011/0006334 A1* | 1/2011 | Ishii ..................... C09K 11/584 |
| | | 257/98 |
| 2011/0068322 A1* | 3/2011 | Pickett ................... C09K 11/02 |
| | | 257/13 |
| 2011/0068698 A1 | 3/2011 | Swoboda et al. |
| 2011/0211336 A1 | 9/2011 | Oshio |
| 2011/0220920 A1* | 9/2011 | Collins ................. H01L 33/504 |
| | | 257/88 |
| 2011/0220929 A1* | 9/2011 | Collins .............. C09K 11/0883 |
| | | 257/98 |
| 2011/0273079 A1* | 11/2011 | Pickard ................. H01L 33/504 |
| | | 313/483 |
| 2012/0008318 A1 | 1/2012 | Ishiwata et al. |
| 2012/0112626 A1 | 5/2012 | Sakuta et al. |
| 2012/0286238 A1* | 11/2012 | Linton ................. C09K 11/025 |
| | | 257/13 |
| 2012/0300432 A1 | 11/2012 | Matsubayashi et al. |
| 2012/0313124 A1* | 12/2012 | Clatterbuck ....... C09K 11/7774 |
| | | 257/98 |
| 2012/0319565 A1 | 12/2012 | Sakuta et al. |
| 2013/0235555 A1* | 9/2013 | Tanaka ...................... F21V 9/16 |
| | | 362/84 |
| 2013/0264592 A1* | 10/2013 | Bergmann .............. H01L 33/50 |
| | | 257/88 |
| 2013/0264937 A1 | 10/2013 | Sakuta et al. |
| 2013/0300282 A1* | 11/2013 | Mori ..................... H01L 33/504 |
| | | 313/503 |
| 2014/0175473 A1* | 6/2014 | Donofrio ................ H01L 33/44 |
| | | 257/94 |
| 2014/0183578 A1 | 7/2014 | Horie |
| 2014/0217417 A1* | 8/2014 | Horie ................. H05B 33/0866 |
| | | 257/76 |
| 2014/0217436 A1* | 8/2014 | Hussell ................... H01L 33/62 |
| | | 257/98 |
| 2014/0376205 A1* | 12/2014 | Takizawa ................ H01S 5/005 |
| | | 362/84 |
| 2015/0016088 A1* | 1/2015 | Shiraichi ............... H01L 33/504 |
| | | 362/84 |
| 2015/0295144 A1* | 10/2015 | Weiler .................. H01L 33/504 |
| | | 362/84 |
| 2016/0308097 A1* | 10/2016 | Horie .................... H01L 33/504 |
| 2017/0155026 A1* | 6/2017 | Bergmann ............... B23K 1/00 |
| 2017/0331014 A1* | 11/2017 | Horie .................... H01L 33/504 |

FOREIGN PATENT DOCUMENTS

| | | |
|---|---|---|
| JP | 2007-141737 A | 6/2007 |
| JP | 2007-299714 A | 11/2007 |
| JP | 2009-48989 | 3/2009 |
| JP | 2009-60094 A | 3/2009 |
| JP | 2010-232529 | 10/2010 |
| JP | 2011-9078 A | 1/2011 |
| JP | 2011-159809 A | 8/2011 |
| JP | 2012-113958 A | 6/2012 |
| JP | 2012/142163 | 7/2012 |
| JP | 2013-171688 A | 9/2013 |
| WO | WO 00/33390 A1 | 6/2000 |
| WO | WO 2009/063915 A1 | 5/2009 |
| WO | WO 2009/082737 A1 | 7/2009 |
| WO | WO 2010/126065 A1 | 11/2010 |
| WO | WO 2011/024818 A1 | 3/2011 |
| WO | WO 2011/070473 A1 | 6/2011 |
| WO | 2012/104937 | 9/2012 |
| WO | WO 2013/069208 A1 | 5/2013 |

OTHER PUBLICATIONS

International Preliminary Report on Patentability and Written Opinion of the International Searching Authority dated Mar. 4, 2014 in PCT/JP2012/072143 filed Aug. 31, 2012 (submitting English translation).

International Search Report dated Oct. 2, 2012 in PCT/JP2012/072144.

International Preliminary Report on Patentability and Written Opinion of the International Searching Authority dated Mar. 4, 2014 in PCT/JP2012/072144 filed Aug. 31, 2012 (submitting English translation).

International Search Report dated Sep. 10, 2013 in PCT/JP2013/066601.

International Preliminary Report on Patentability and Written Opinion of the International Searching Authority dated Mar. 3, 2015 in PCT/JP2013/066601 filed Jun. 17, 2013 (submitting English translation).

International Search Report dated Jun. 3, 2014 in PCT/JP2014/055388.

International Preliminary Report on Patentability and Written Opinion of the International Searching Authority dated Sep. 8, 2015 in PCT/JP2014/055388 filed Mar. 4, 2014 (submitting English translation).

International Preliminary Report on Patentability and Written Opinion of the International Searching Authority dated Jul. 7, 2016 in PCT/JP2014/084487 filed Dec. 26, 2014 (submitting English translation).

Office Action dated Mar. 10, 2016 in co-pending U.S. Appl. No. 14/927,746.

Office Action dated Feb. 4, 2016 in co-pending U.S. Appl. No. 14/927,703.

Extended European Search Report dated Apr. 20, 2016 in Patent Application No. 12827440.4.

Extended European Search Report dated Apr. 20, 2016 in Patent Application No. 12827647.4.

Combined Chinese Office Action and Search Report dated Aug. 27, 2014 in Patent Application No. 201280005125.2 (with English translation).

Extended European Search Report dated Oct. 24, 2016 in Patent Application No. 14761235.2.

Office Action dated May 9, 2017 in Japanese Patent Application No. 2016-128778 ( with unedited computer generated English translation).

Extended European Search Report dated Jun. 28, 2017 in Patent Application No. 14873899.0.

International Search Report dated Mar. 31, 2015 in PCT/JP2014/084487, filed on Dec. 26, 2014.

Office Action as received in the Japanese Patent No. 2014-041249 dated Jan. 9, 2018 w/Machine generated English translation, 6 pages.

Office Action as received in the corresponding Japanese Patent No. 4014-041249 dated Jan. 9, 2018 w/Machine generated English translation, 6 pages.

Result of consultation issued in related European Patent Application No. 12827440.4 dated Nov. 14, 2018.

Minutes of the Oral Proceedings issued in related European Patent Application No. 12827440.4 dated Dec. 13, 2018.

Decision to Refuse issued in related European Patent Application No. 12827440.4 dated Dec. 14, 2018.

Result of consultation issued in related European Patent Application No. 12827647.4 dated Nov. 14, 2018.

(56) References Cited

OTHER PUBLICATIONS

Minutes of the Oral Proceedings issued in related European Patent Application No. 12827647.4 dated Dec. 13, 2018.
Decision to Refuse issued in related European Patent Application No. 12827647.4 dated Dec. 14, 2018.
Yoshi Ohno, et al., "Rational of Color Quality Scale", Digi-Key Electronics, May 27, 2011.
Office Action as received in the corresponding Chinese Patent Application No. 201480070627.2 dated Apr. 22, 2019 w/English machine translation.
Office Action issued in corresponding European Patent Application No. 14873899.0 dated Dec. 20, 2018.
Office Action as received in the corresponding Chinese Patent Application No. 201480070627.2 dated Aug. 27, 2018 w/Computer Generated English Translation.

\* cited by examiner

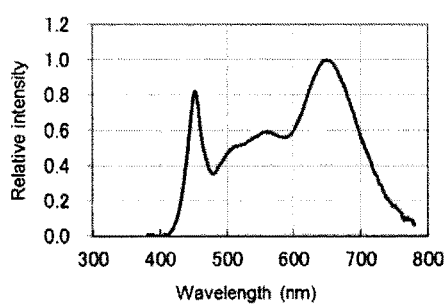 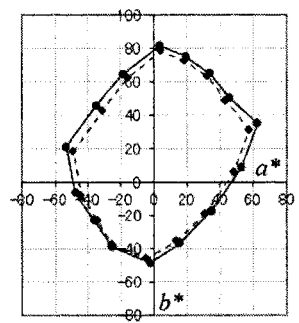
CCT=3807K
$D_{uv}(\varphi_{SSL1}(\lambda))=-0.0122$
Ra=86.6
Reference experimental example 101
Fig. 1-6

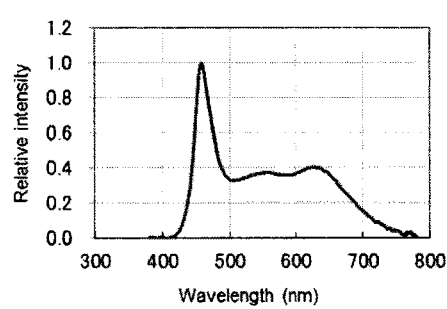
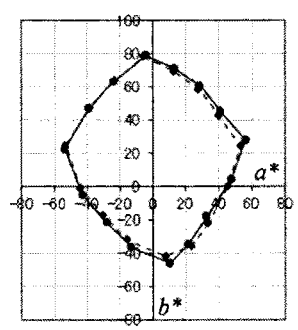
CCT=6965K
$D_{uv}(\varphi_{SSL1}(\lambda))$ =-0.0124
Ra=84.4
Experimental example 118
Fig. 1-9

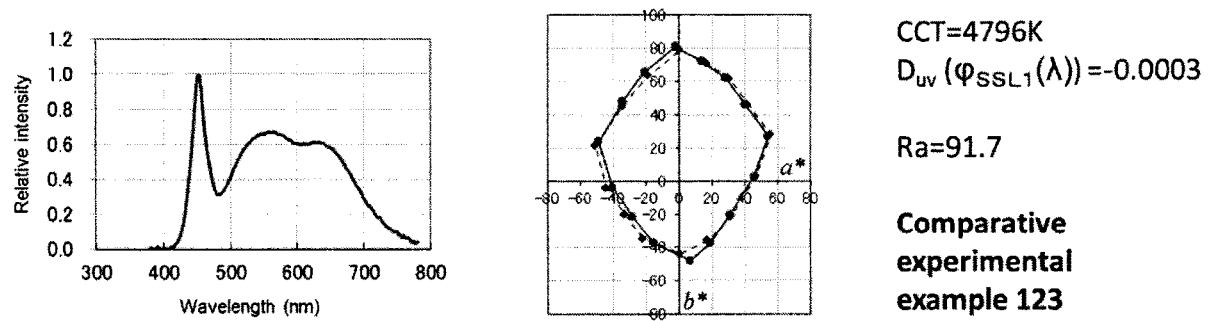
Fig. 1−25

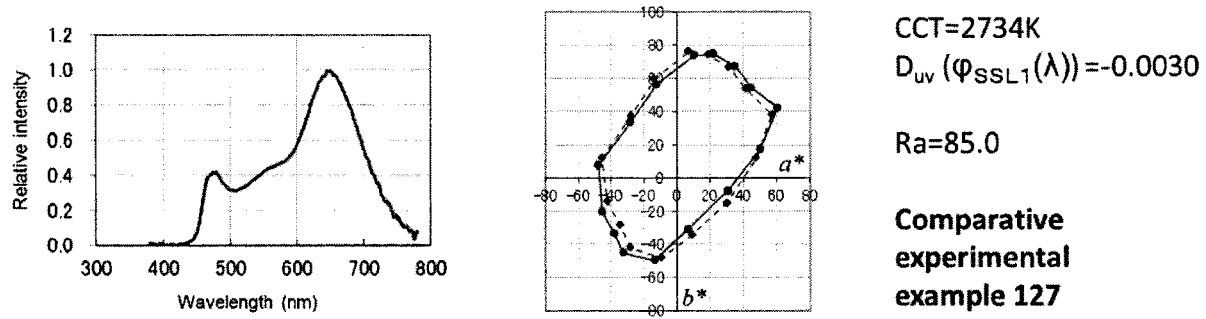
Fig. 1−27

Experimental example 201
Drive point A
3207K
$D_{uv}(\phi_{SSL2}(\lambda)) = -0.0072$ Experimental example 201
Drive point B
3466K
$D_{uv}(\phi_{SSL2}(\lambda)) = -0.0106$

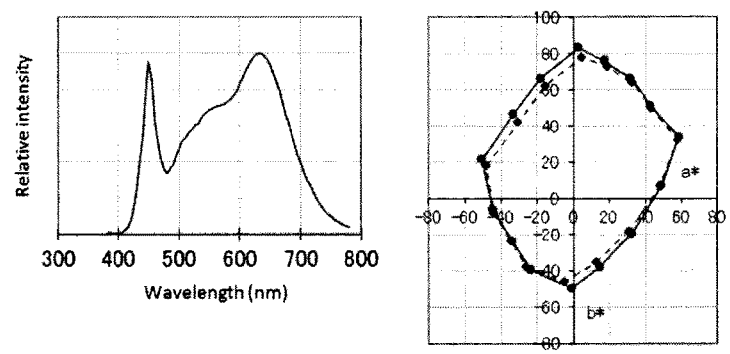
Fig. 2−4

Experimental example 201
Drive point D
3791K
$D_{uv}(\phi_{SSL2}(\lambda)) = -0.0133$ Experimental example 202
Drive point B
3133K
$D_{uv}(\phi_{SSL2}(\lambda)) = -0.0073$ Experimental example 202
Drive point D
3323K
$D_{uv}(\phi_{SSL2}(\lambda)) = -0.0100$
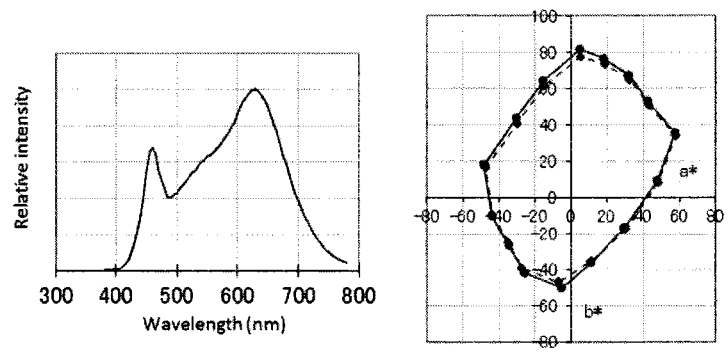
Fig. 2−12

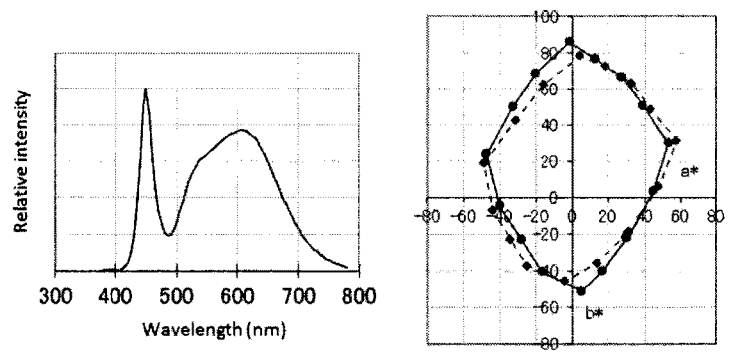
Experimental example 203
Drive point B
3849K
$D_{uv} (\phi_{SSL2}(\lambda)) = -0.0118$
Fig. 2−16

Experimental example 204
Drive point B
5114K
$D_{uv}(\phi_{SSL2}(\lambda)) = -0.0040$
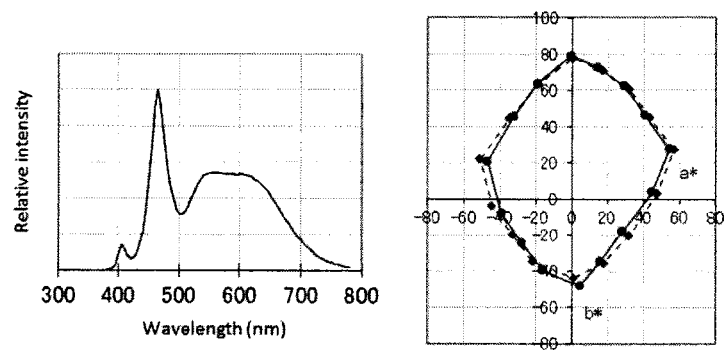
Fig. 2−22

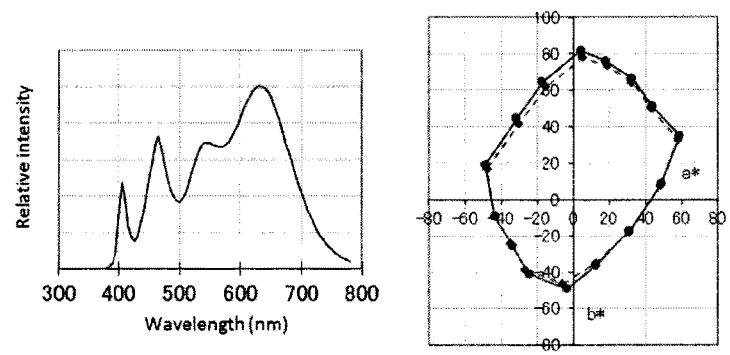
Fig. 2−24

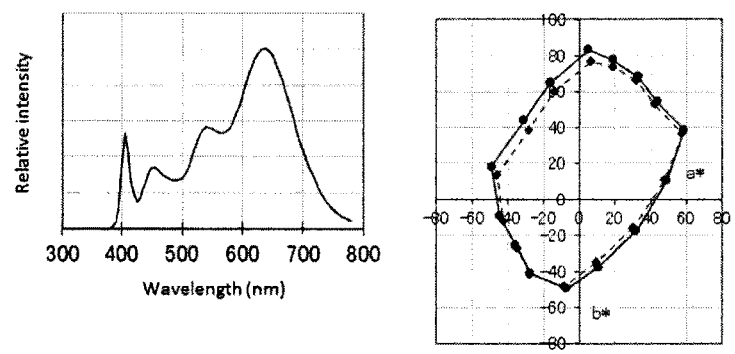
Fig. 2−25

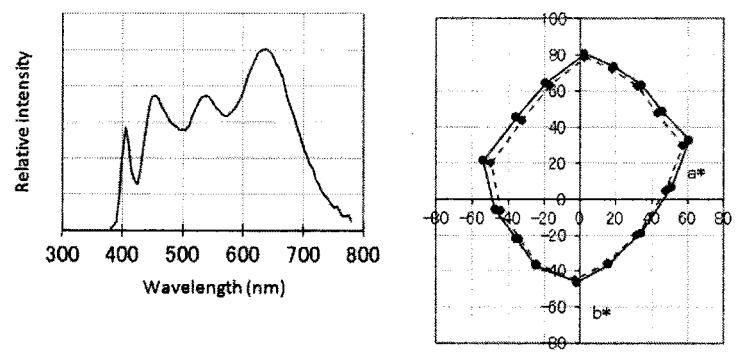
Fig. 2−32

Experimental example 206
Drive point B
3968K
$D_{uv}(\phi_{SSL2}(\lambda)) = -0.0116$ Comparative experimental example 201
Drive point A
4134K
$D_{uv}(\phi_{SSL2}(\lambda)) = -0.0097$ Comparative
experimental example 201
Drive point C
4645K
$D_{uv}(\phi_{SSL2}(\lambda)) = -0.0159$
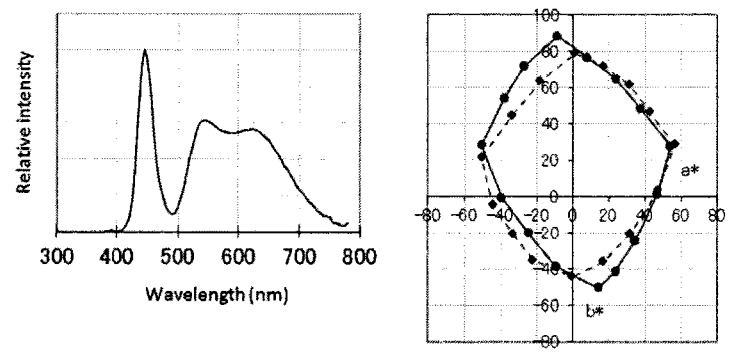
Fig. 2−43

Comparative experimental example 201

Reference
experimental
example 301
3215K
$D_{uv}$ = -0.0072
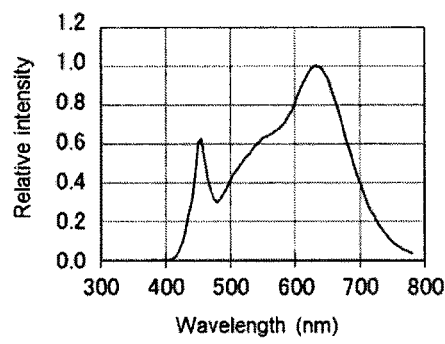
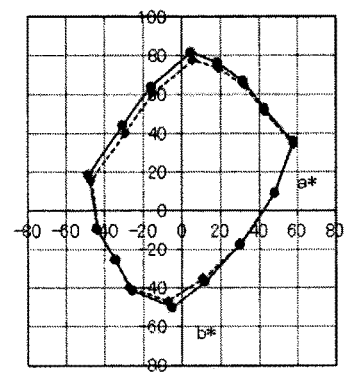
Experimental
example 301
3124K
$D_{uv}$ = -0.0076
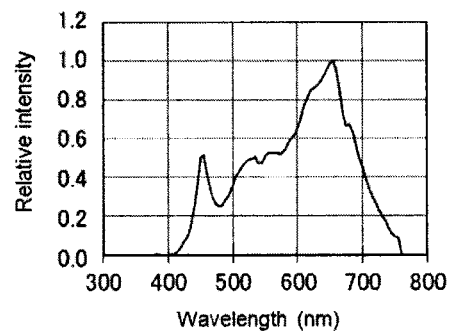
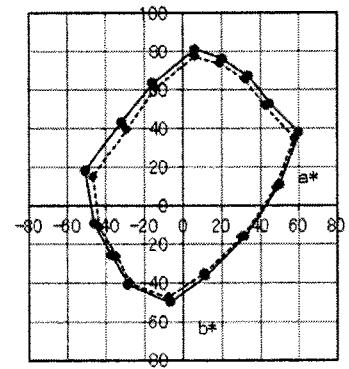
Fig. 3-7

Reference comparative experimental example 301
4206K
$D_{uv} = -0.0040$
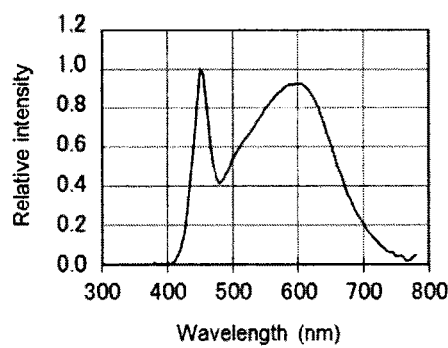
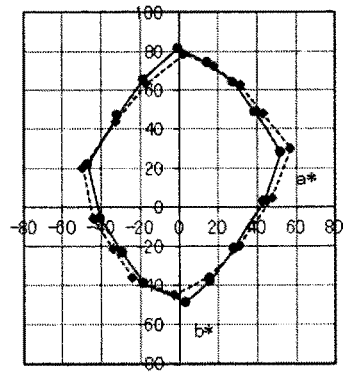
Experimental example 302
4592K
$D_{uv} = -0.0073$
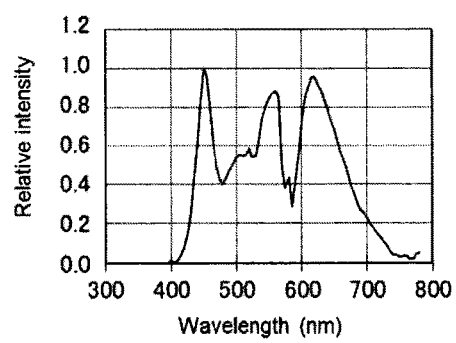
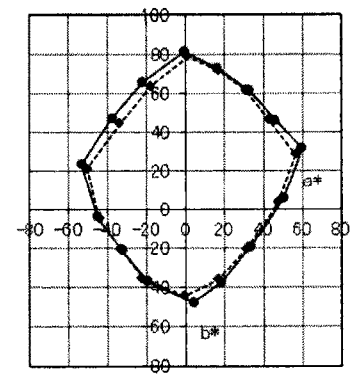
Fig. 3-10

Reference comparative experimental example 302
4183K
$D_{uv} = -0.0117$
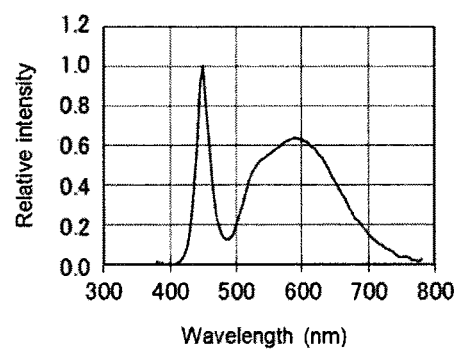
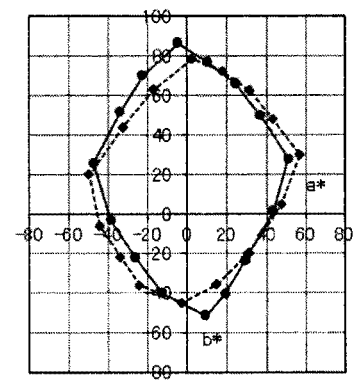
Experimental example 303
3994K
$D_{uv} = -0.0123$
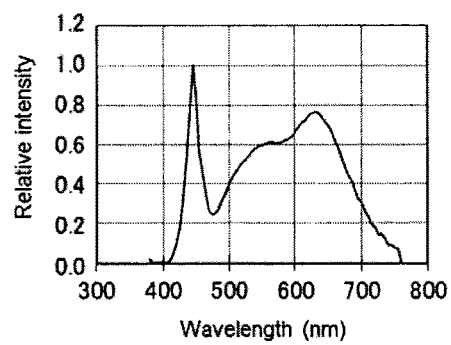
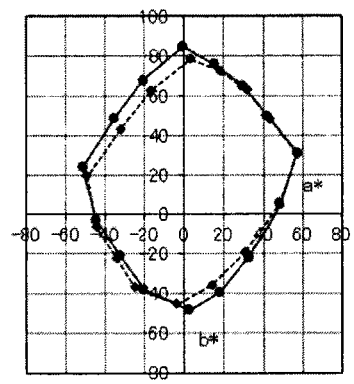
Fig. 3-13

Reference comparative experimental example 302
4183K
$D_{uv} = -0.0117$
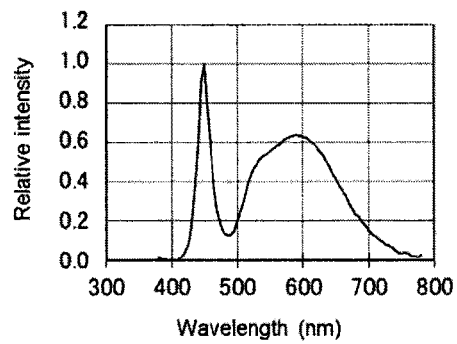
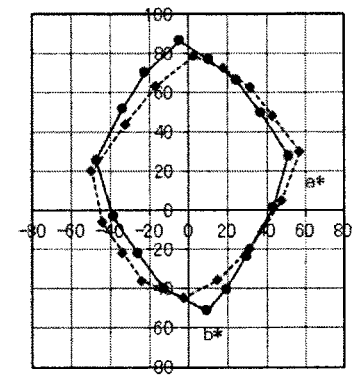
Comparative experimental example 301
4108K
$D_{uv} = -0.0112$
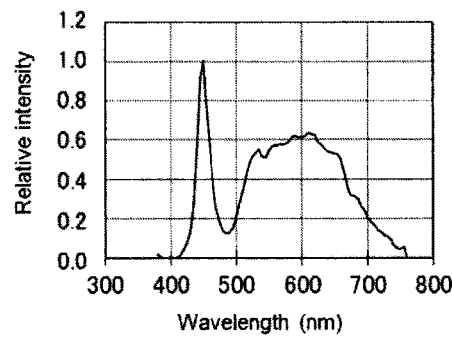
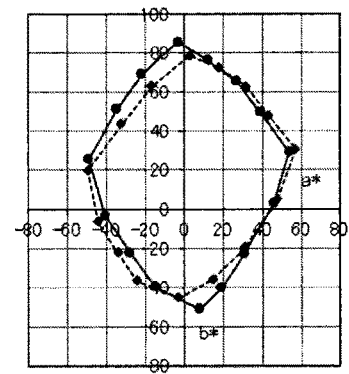
Fig. 3-15

ILLUMINATION METHOD USING A LIGHT-EMITTING DEVICE

CROSS-REFERENCE TO RELATED APPLICATION

This is a continuation of International Application PCT/JP2014/084487, filed on Dec. 26, 2014, and designated the U.S., and claims priority from Japanese Patent Application 2013-272763 which was filed on Dec. 27, 2013, Japanese Patent Application 2014-159784 which was filed on Aug. 5, 2014, Japanese Patent Application 2014-178928 which was filed on Sep. 3, 2014, and Japanese Patent Application 2014-which was filed on Sep. 3, 2014, the entire contents of which are incorporated herein by reference.

TECHNICAL FIELD

The present invention relates to a light-emitting device including a blue semiconductor light-emitting element, a green phosphor and a red phosphor, and to a method for designing a light-emitting device.

BACKGROUND ART

Recent advances toward higher output and higher efficiency in GaN related semiconductor light-emitting elements have been dramatic. In addition, active research is underway to increase efficiency of semiconductor light-emitting elements and various phosphors that use an electron beam as an excitation source. As a result, power-saving capabilities of today's light-emitting devices such as light sources, light source modules including light sources, fixtures including light source modules, and systems including fixtures are advancing rapidly as compared to their conventional counterparts.

For example, it is widely popular to incorporate a GaN related blue light-emitting element as an excitation light source of a yellow phosphor and create a so-called pseudo-white light source from a spectrum of the GaN related blue light-emitting element and a spectrum of the yellow phosphor, use the pseudo-white light source as an illumination light source or create a lighting fixture that incorporates the pseudo-white light source or, further, fabricate a lighting system in which a plurality of such fixtures are arranged in a space (refer to Patent Document 1).

Among packaged LEDs (for example, those that include the GaN related blue light-emitting element, the yellow phosphor, an encapsulant, and the like in a package material) which are a type of an illumination light source that can be incorporated into such modes, there are products with luminous efficacy of a source as a packaged LED exceeding 150 lm/W in a correlated color temperature (CCT) region of around 6000 K (refer to Non-Patent Document 2).

Furthermore, similar advances toward higher efficiency and greater power saving are being made in light sources for liquid crystal display (LCD) backlighting and the like.

However, many have pointed out that such light-emitting devices aiming for higher efficiency do not give sufficient consideration to color appearance. In particular, when used for illumination purposes, "color appearance" when illuminating an object with a light-emitting device such as a light source, fixture, system, or the like is particularly important together with increasing efficiency of the light-emitting device.

Furthermore, some of such light-emitting devices designed with the intention of enhancing efficiency do not give sufficient consideration to color appearance of an illuminated object. Attempts to address this issue include superimposing a spectrum of a red phosphor or a red semiconductor light-emitting element on a spectrum of a blue light-emitting element and a spectrum of a yellow phosphor in order to improve scores of a color rendering index (CRI) (CIE (13.3)) as established by the International Commission on Illumination (Commission Internationale de l'Eclairage/CIE). For example, while an average color rendering index ($R_a$) and a special color rendering index ($R_9$) with respect to a vivid red color sample for a typical spectrum (CCT=around 6800 K) that does not include a red source are $R_a$=81 and $R_9$=24 respectively, the scores of the color rendering indices can be improved to $R_a$=98 and $R_9$=95 when a red source is included (refer to Patent Document 2).

On the other hand, based on novel experimental facts with respect to color appearance of an illuminated object, the present inventor has disclosed an illumination method, and a light-emitting device in general such as an illumination light source, a lighting fixture, and a lighting system, which are capable of realizing a natural, vivid, highly visible and comfortable appearance of colors or an appearance of objects as perceived by a human observer as if the objects were seen under an outdoor high luminance environment, regardless of values of various color rendition indexes (refer to Patent Documents 3 and 4).

According to Patent Documents 3 and 4, a light-emitting device can be realized which is capable of achieving a natural, vivid, highly visible and comfortable appearance of colors or an appearance of objects as perceived by a human observer when an index $A_{cg}$ related to a spectral power distribution of light emitted by a light-emitting device is in a range of −360 or more and −10 or less.

CITATION LIST

Patent Documents

Patent Document 1: Japanese Patent Publication No. 3503139
Patent Document 2: WO2011/024818
Patent Document 3: Japanese Patent Publication No. 5252107
Patent Document 4: Japanese Patent Publication No. 5257538

SUMMARY OF INVENTION

Technical Problem

However, while the two patents described above disclose details related to radiant efficiency (luminous efficacy of radiation) K (lm/W) as derived from spectral power distribution, there is no description of efficiency as an actual light source or, in other words, light source efficiency (luminous efficacy of a source) η (lm/W). With an actual LED light source, the latter is equally as important as the former and both are normally respectively treated as independent efficiency indexes. The former (luminous efficacy of radiation K) is efficiency dependent "only on shape" of a spectral power distribution of a light source in its relationship with spectral luminous efficiency V(λ) and is an extremely useful index when considering ideal efficiency. On the other hand, the latter (light source efficiency η) is a quantity indicating how much of power supplied to a light-emitting device is converted into a luminous flux and must also be evaluated from a different perspective from luminous efficacy of radiation.

It is an object of the present invention to improve light source efficiency of "a light-emitting device capable of realizing a natural, vivid, highly visible and comfortable appearance of colors or an appearance of objects" already arrived at by the present inventor by adopting a spectral power distribution having a shape completely different from the shape of conventionally known spectral power distributions while maintaining favorable color appearance characteristics.

Solution to Problems

As a result of extensive research conducted in order to study a light-emitting device that achieves the object described above, the present inventor arrived at a light-emitting device configured as follows.

A first aspect of a first invention of the present invention is a light-emitting device at least including, as light-emitting elements:

a blue semiconductor light-emitting element;
a green phosphor; and
a red phosphor, wherein light emitted from the light-emitting device in a main radiant direction satisfies all of Conditions 1 to 4 below.

Condition 1:

when $\lambda$ denotes wavelength, $\varphi_{SSL1}(\lambda)$ denotes a spectral power distribution of light emitted from the light-emitting device in the main radiant direction, $\varphi_{refl}(\lambda)$ denotes a spectral power distribution of reference light which is selected in accordance with a correlated color temperature $T_{SSL1}$ of the light emitted from the light-emitting device in the main radiant direction, $(X_{SSL1}, Y_{SSL1}, Z_{SSL1})$ denote tristimulus values of the light emitted from the light-emitting device in the main radiant direction, and $(X_{refl}, Y_{refl}, Z_{refl})$ denote tristimulus values of the reference light which is selected in accordance with $T_{SSL1}$ of the light emitted from the light-emitting device in the main radiant direction, and a normalized spectral power distribution $S_{SSL1}(\lambda)$ of the light emitted from the light-emitting device in the main radiant direction, a normalized spectral power distribution $S_{refl}(\lambda)$ of the reference light which is selected in accordance with $T_{SSL1}$ (K) of the light emitted from the light-emitting device in the main radiant direction, and a difference $\Delta S_{SSL1}(\lambda)$ of between normalized spectral power distributions are respectively defined as $$S_{SSL1}(\lambda) = \varphi_{SSL1}(\lambda)/Y_{SSL1}$$

$$S_{refl}(\lambda) = \varphi_{refl}(\lambda)/Y_{refl}$$

$$\Delta S_{SSL1}(\lambda) = S_{refl}(\lambda) - S_{SSL1}(\lambda), \text{ and}$$

in a case where $\lambda_{SSL1-RL-max}$ (nm) represents a wavelength that provides a longest wavelength local maximum value of $S_{SSL1}(\lambda)$ in a wavelength range of 380 nm or more and 780 nm or less, and when a wavelength $\Lambda 4$ that is represented by $S_{SSL1}(\lambda_{SSL1-RL-max})/2$ exists on a longer wavelength-side of $\lambda_{SSL1-RL-max}$, an index $A_{cg}(\varphi_{SSL1}(\lambda))$ represented by the following formula (1-1) satisfies $$-10.0 < A_{cg}(\varphi_{SSL1}(\lambda)) \leq 120.0,$$

but in a case where $\lambda_{SSL1-RL-max}$ (nm) represents a wavelength that provides the longest wavelength local maximum value of $S_{SSL1}(\lambda)$ in a wavelength range of 380 nm or more and 780 nm or less, and when the wavelength $\Lambda 4$ that is represented by $S_{SSL1}(\lambda_{SSL1-RL-max})/2$ does not exist on the longer wavelength-side of $\lambda_{SSL1-RL-max}$, an index $A_{cg}(\varphi_{SSL1}(\lambda))$ represented by the following formula (1-2) satisfies $$-10.0 < A_{cg}(\varphi_{SSL1}(\lambda)) \geq 120.0;$$

[Expression 1]

$$A_{cg}(\varphi_{SSL1}(\lambda)) = \int_{380}^{495} \Delta S_{SSL1}(\lambda) d\lambda + \int_{495}^{590} (-\Delta S_{SSL1}(\lambda)) d\lambda + \int_{590}^{\Lambda 4} \Delta S_{SSL1}(\lambda) d\lambda \quad (1\text{-}1)$$

[Expression 2]

$$A_{cg}(\varphi_{SSL1}(\lambda)) = \int_{380}^{495} \Delta S_{SSL1}(\lambda) d\lambda + \int_{495}^{590} (-\Delta S_{SSL1}(\lambda)) d\lambda + \int_{590}^{780} \Delta S_{SSL1}(\lambda) d\lambda \quad (1\text{-}2)$$

Condition 2:

a distance $D_{uv}(\varphi_{SSL1}(\lambda))$ of the spectral power distribution $\varphi_{SSL1}(\lambda)$ of light from a black-body radiation locus defined by ANSI C78.377 satisfies $$-0.0220 \leq D_{uv}(\varphi_{SSL1}(\lambda)) \leq -0.0070;$$

Condition 3:

when a maximum value of spectral intensity in a range of 430 nm or more and 495 nm or less is defined as $\varphi_{SSL1-BM-max}$ and a minimum value of spectral intensity in a range of 465 nm or more and 525 nm or less is defined as $\varphi_{SSL1-BG-min}$, the spectral power distribution $\varphi_{SSL1}(\lambda)$ of light satisfies $$0.2250 \leq \varphi_{SSL1-BG-min}/\varphi_{SSL1-BM-max} \leq 0.7000; \text{ and}$$

Condition 4:

in the spectral power distribution $\varphi_{SSL1}(\lambda)$ of light, when a maximum value of spectral intensity in a range of 590 nm or more and 780 nm or less is defined as $\varphi_{SSL1-RM-max}$, a wavelength $\lambda_{SSL1-RM-max}$ that provides $\varphi_{SSL1-RM-max}$ satisfies $$605 \text{ (nm)} \leq \lambda_{SSL1-RM-max} \leq 653 \text{ (nm)}.$$

The light-emitting device preferably satisfies, in Condition 2 described above, $$-0.0184 \leq D_{uv}(\varphi_{SSL1}(\lambda)) \leq -0.0084.$$

The light-emitting device preferably satisfies, in Condition 4 described above, $$625 \text{ (nm)} \leq \lambda_{SSL1-RM-max} \leq 647 \text{ (nm)}.$$

The light-emitting device preferably satisfies Condition 5 below.

Condition 5:

In the spectral power distribution $\varphi_{SSL1}(\lambda)$ of light described above, a wavelength $\lambda_{SSL1-BM-max}$ that provides $\varphi_{SSL1-BM-max}$ satisfies $$430 \text{ (nm)} \leq \lambda_{SSL1-BM-max} \leq 480 \text{ (nm)}.$$

The light-emitting device preferably satisfies Condition 6 below.

Condition 6:

$$0.1800 \leq \varphi_{SSL1-BG-min}/\varphi_{SSL1-RM-max} \leq 0.8500.$$

In addition, the light-emitting device preferably satisfies, in Condition 6 described above, $$0.1917 \leq \varphi_{SSL1-BG-min}/\varphi_{PSSL1-RM-max} \leq 0.7300.$$

In the light-emitting device, a luminous efficacy of radiation $K_{SSL1}$ (lm/W) in a wavelength range of 380 nm or more and 780 nm or less, which is derived from $\varphi_{SSL1}(\lambda)$, preferably satisfies Condition 7.
Condition 7:

210.0 lm/W≤$K_{SSL1}$≤290.0 lm/W.

In the light-emitting device, $T_{SSL1}$ (K) preferably satisfies Condition 8.
Condition 8:

2600 K≤$T_{SSL1}$≤7700 K.

In the light-emitting device, $\varphi_{SSL1}(\lambda)$ preferably does not have effective intensity derived from the light-emitting element in a range of 380 nm or more and 405 nm or less.

In the light-emitting device, the blue semiconductor light-emitting element is preferably configured such that a dominant wavelength $\lambda_{CHIP-BM-dom}$ of the blue semiconductor light-emitting element alone when pulse-driven is 445 nm or more and 475 nm or less.

In the light-emitting device, the green phosphor is preferably a wide-band green phosphor.

In the light-emitting device, the green phosphor is preferably configured such that a wavelength $\lambda_{PHOS-GM-max}$ that provides maximum emission intensity when light is excited by the green phosphor alone is 511 nm or more and 543 nm or less and a full-width at half-maximum $W_{PHOS-GM-fwhm}$ thereof is 90 nm or more and 110 nm or less.

The light-emitting device preferably includes substantially no yellow phosphor.

In the light-emitting device, the red phosphor is preferably configured such that a wavelength $\lambda_{PHOS-RM-max}$ that provides maximum emission intensity when light is excited by the red phosphor alone is 622 nm or more and 663 nm or less and a full-width at half-maximum $W_{PHOS-RM-fwhm}$ thereof is 80 nm or more and 105 nm or less.

In the light-emitting device, the blue semiconductor light-emitting element is preferably an AlInGaN light-emitting element.

In the light-emitting device, the green phosphor is preferably $Ca_3(Sc,Mg)_2Si_3O_{12}$:Ce (CSMS phosphor), $CaSc_2O_4$:Ce (CSO phosphor), $Lu_3Al_5O_{12}$:Ce (LuAG phosphor), or $Y_3(Al,Ga)_5O_{12}$:Ce (G-YAG phosphor).

In the light-emitting device, the red phosphor preferably includes (Sr,Ca)AlSiN$_3$:Eu (SCASN phosphor), CaAlSi(ON)$_3$:Eu (CASON phosphor), or CaAlSiN$_3$:Eu (CASN phosphor).

In the light-emitting device, preferably, the blue semiconductor light-emitting element is an AlInGaN light-emitting element with a dominant wavelength $\lambda_{CHIP-BM-dom}$ when the blue semiconductor light-emitting element alone is pulse-driven, of 452.5 nm or more and 470 nm or less, the green phosphor is $CaSc_2O_4$:Ce (CSO phosphor) or $Lu_3Al_5O_{12}$:Ce (LUAG phosphor) with a wavelength $\lambda_{PHOS-GM-max}$ that provides maximum emission intensity when light is excited by the green phosphor alone, of 515 nm or more and 535 nm or less, and a full-width at half-maximum $W_{PHOS-GM-fwhm}$ of 90 nm or more and 110 nm or less, and the red phosphor is CaAlSi(ON)$_3$:Eu (CASON phosphor) or CaAlSiN$_3$:Eu (CASN phosphor) with a wavelength that provides maximum emission intensity $\lambda_{PHOS-RM-max}$ when light is excited by the red phosphor alone, of 640 nm or more and 663 nm or less, and a full-width at half-maximum $W_{PHOS-RM-fwhm}$ of 80 nm or more and 105 nm or less.

The light-emitting device is preferably a packaged LED, a chip-on-board LED, an LED module, an LED light bulb, an LED lighting fixture, or an LED lighting system.

In the light-emitting device, the light emitted from the light-emitting device in the main radiant direction preferably satisfies Conditions I to IV below.
Condition I:

when $a^*_{nSSL1}$ and $b^*_{nSSL1}$ (where n is a natural number from 1 to 15) respectively denote the a* value and b* value in the CIE 1976 L*a*b* color space of the following 15 Munsell renotation color samples of #01 to #15 based on a mathematical assumption that illumination is performed by the light emitted from the light-emitting device in the main radiant direction, and when $a^*_{nrefl}$ and $b^*_{nrefl}$ (where n is a natural number from 1 to 15) respectively denote the a* value and b* value in the CIE 1976 L*a*b* color space of the 15 Munsell renotation color samples based on a mathematical assumption that illumination is performed by reference light which is selected in accordance with the correlated color temperature $T_{SSL1}$(K) of the light emitted in the main radiant direction, each saturation difference $\Delta C_{nSSL1}$ satisfies −4.00≤$\Delta C_{nSSL1}$≤8.00 (where $n$ is a natural number from 1 to 15);

Condition II:
an average saturation difference represented by the following formula (1-3) satisfies $$\frac{\sum_{n=1}^{15} \Delta C_{nSSL1}}{15} \quad \text{[Expression 3]} \tag{1-3}$$

$$0.50 \leq \frac{\sum_{n=1}^{15} \Delta C_{nSSL1}}{15} \leq 4.00; \quad \text{[Expression 4]}$$

Condition III:
when a maximum saturation difference value is denoted by $\Delta C_{SSL-max1}$ and a minimum saturation difference value is denoted by $\Delta C_{SSL-min1}$, a difference $|\Delta C_{SSL-max1} - \Delta C_{SSL-min1}|$ between the maximum saturation difference value and the minimum saturation difference value satisfies 2.00≤$|\Delta C_{SSL-max1} - \Delta C_{SSL-min1}|$≤10.00 where $\Delta C_{nSSL1} = \sqrt{\{(a^*_{nSSL1})^2 + (b^*_{nSSL1})^2\}} - \sqrt{\{(a^*_{nrefl})_2 + (b^*_{nrefl})^2\}}$, with the 15 Munsell renotation color samples being:

| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |

| | | |
|---|---|---|
| #14 | 5R | 4/14 |
| #15 | 7.5RP | 4/12; | and
Condition IV:

when $\theta_{nSSL1}$ (degrees) (where n is a natural number from 1 to 15) denotes a hue angle in the CIE 1976 L*a*b* color space of the 15 Munsell renotation color samples based on a mathematical assumption that illumination is performed by the light emitted from the light-emitting device in the main radiant direction, and when $\theta_{nrefl}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature $T_{SSL1}$ of the light emitted in the main radiant direction, an absolute value of each difference in hue angles $|\Delta h_{nSSL1}|$ satisfies 0.00 degrees $\leq |\Delta h_{nSSL1}| \leq$ 12.50 degrees (where n is a natural number from 1 to 15), where $\Delta h_{nSSL1} = \theta_{nSSL1} - \theta_{nrefl}$.

The light-emitting device is also preferably used as a residential uses' illumination device, an exhibition illumination device, a presentation illumination device, a medical illumination device, a work illumination device, an illumination device incorporated in industrial equipments, an illumination device for interior of transportation, an illumination device for works of art, and an illumination device for aged persons.

A second aspect of the first invention of the present invention is a method for designing a light-emitting device which at least includes, as light-emitting elements:

a blue semiconductor light-emitting element;

a green phosphor; and a red phosphor, the method comprising designing the light-emitting device so that light emitted from the light-emitting device in a main radiant direction satisfies all of Conditions 1 to 4 below.

Condition 1:

when $\lambda$ denotes wavelength, $\varphi_{SSL1}(\lambda)$ denotes a spectral power distribution of light emitted from the light-emitting device in the main radiant direction, $\varphi_{refl}(\lambda)$ denotes a spectral power distribution of reference light which is selected in accordance with a correlated color temperature $T_{SSL1}$ of the light emitted from the light-emitting device in the main radiant direction, $(X_{SSL1}, Y_{SSL1}, Z_{SSL1})$ denote tristimulus values of the light emitted from the light-emitting device in the main radiant direction, and $(X_{refl}, Y_{refl}, Z_{refl})$ denote tristimulus values of the reference light which is selected in accordance with $T_{SSL1}$ of the light emitted from the light-emitting device in the main radiant direction, and a normalized spectral power distribution $S_{SSL1}(\lambda)$ of the light emitted from the light-emitting device in the main radiant direction, a normalized spectral power distribution $S_{refl}(\lambda)$ of the reference light which is selected in accordance with $T_{SSL1}$ (K) of the light emitted from the light-emitting device in the main radiant direction, and a difference $\Delta S_{SSL1}(\lambda)$ of between normalized spectral power distributions are respectively defined as $S_{SSL1}(\lambda) = \varphi_{SSL1}(\lambda)/Y_{SSL1}$ $S_{refl}(\lambda) = \varphi_{refl}(\lambda)/Y_{refl}$ $\Delta S_{SSL1}(\lambda) = S_{refl}(\lambda) - S_{SSL1}(\lambda)$, and in a case where $\lambda_{SSL1-RL-max}$ (nm) represents a wavelength that provides a longest wavelength local maximum value of $S_{SSL1}(\lambda)$ in a wavelength range of 380 nm or more and 780 nm or less, and when a wavelength $\Lambda 4$ that is represented by $S_{SSL1}(\lambda_{SSL1-RL-max})/2$ exists on a longer wavelength-side of $\lambda_{SSL1-RL-max}$, an index $A_{cg}(\varphi_{SSL1}(\lambda))$ represented by the following formula (1-1) satisfies $-10.0 < A_{cg}(\varphi_{SSL1}(\lambda)) \leq 120.0$, but in a case where $\lambda_{SSL1-RL-max}$ (nm) represents a wavelength that provides the longest wavelength local maximum value of $S_{SSL1}(\lambda)$ in a wavelength range of 380 nm or more and 780 nm or less, and when the wavelength $\Lambda 4$ that is represented by $S_{SSL1}(\lambda_{SSL1-RL-max})/2$ does not exist on the longer wavelength-side of $\lambda_{SSL1-RL-max}$, an index $A_{cg}(\varphi_{SSL1}(\lambda))$ represented by the following formula (1-2) satisfies $-10.0 < A_{cg}(\varphi_{SSL1}(\lambda)) \leq 120.0;$

[Expression 5]

$$A_{cg}(\varphi_{SSL1}(\lambda)) = \int_{380}^{496} \Delta S_{SSL1}(\lambda) d\lambda + \int_{495}^{590}(-\Delta S_{SSL1}(\lambda)) d\lambda + \int_{590}^{\Lambda 4} \Delta S_{SSL1}(\lambda) d\lambda \quad (1-1)$$

[Expression 6]

$$A_{cg}(\varphi_{SSL1}(\lambda)) = \int_{380}^{495} \Delta S_{SSL1}(\lambda) d\lambda + \int_{495}^{590}(-\Delta S_{SSL1}(\lambda)) d\lambda + \int_{SSL1}(\lambda) d\lambda \quad (1-2)$$

Condition 2:

a distance $D_{uv}(\varphi_{SSL1}(\lambda))$ of the spectral power distribution $\varphi_{SSL1}(\lambda)$ of light from a black-body radiation locus defined by ANSI C78.377 satisfies $-0.0220 \leq D_{uv}(\varphi_{SSL1}(\lambda)) \leq -0.0070;$ Condition 3:

when a maximum value of spectral intensity in a range of 430 nm or more and 495 nm or less is defined as $\varphi_{SSL1-BM-max}$ and a minimum value of spectral intensity in a range of 465 nm or more and 525 nm or less is defined as $\varphi_{SSL1-BG-min}$, the spectral power distribution $\varphi_{SSL1}(\lambda)$ of light satisfies $0.2250 \leq \varphi_{SSL1-BG-min}/\varphi_{SSL1-BM-max} \leq 0.7000;$ and Condition 4:

in the spectral power distribution $\varphi_{SSL1}(\lambda)$ of light, when a maximum value of spectral intensity in a range of 590 nm or more and 780 nm or less is defined as $\varphi_{SSL1-RM-max}$, a wavelength $\lambda_{SSL1-RM-max}$ that provides $\varphi_{SSL1-RM-max}$ satisfies 605 (nm) $\leq \lambda_{SSL1-RM-max} \leq$ 653 (nm).

The method preferably satisfies,
in Condition 2 described above, $-0.0184 \leq D_{uv}(\varphi_{SSL1}(\lambda)) \leq -0.0084.$ The method preferably satisfies,
in Condition 4 described above, 625 (nm) $\leq \lambda_{SSL1-RM-max} \leq$ 647 (nm).

The method preferably satisfies Condition 5 below.
Condition 5:

In the spectral power distribution $\varphi_{SSL1}(\lambda)$ of light described above, a wavelength $\lambda_{SSL1-BM-max}$ that provides $\varphi_{SSL1-BM-max}$ satisfies 430 (nm) $\leq \lambda_{SSL1-BM-max} \leq$ 480 (nm).

The method preferably satisfies Condition 6 below.
Condition 6:

$$0.1800 \leq \varphi_{SSL1\text{-}BG\text{-}min}/\varphi_{SSL1\text{-}RM\text{-}max} \leq 0.8500.$$

In addition, the method preferably satisfies, in Condition 6 described above, $$0.1917 \leq \varphi_{SSL1\text{-}BG\text{-}min}/\varphi_{SSL1\text{-}RM\text{-}max} \leq 0.7300.$$

Advantageous Effects of Invention

With a light-emitting device according to the first aspect of the first invention of the present invention, light source efficiency can be improved in "a light-emitting device capable of realizing a natural, vivid, highly visible and comfortable appearance of colors or an appearance of objects" while maintaining favorable color appearance characteristics.

In addition, with a method for designing a light-emitting device according to the second aspect of the first invention of the present invention, design guidelines for "a light-emitting device capable of realizing a natural, vivid, highly visible and comfortable appearance of colors or an appearance of objects" can be provided.

BRIEF DESCRIPTION OF DRAWINGS

FIG. 1-2 is a diagram showing an integral range for a parameter $A_{cg}$ (when a CCT is 5000 K or higher);

FIG. 1-3 is a diagram showing an integral range of the parameter $A_{cg}$ (when a CCT is lower than 5000 K);

FIG. 1-4 presents diagrams showing a spectral power distribution when assuming that light emitted from a packaged LED which includes a semiconductor light-emitting element with a peak wavelength of 410 nm and which is provided with a narrow-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 101);

FIG. 1-5 presents diagrams showing a spectral power distribution when assuming that light emitted from a packaged LED which includes a semiconductor light-emitting element with a peak wavelength of 410 nm and which is provided with a narrow-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 102);

FIG. 1-6 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Reference Experimental Example 101);

FIG. 1-7 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Experimental Example 101);

FIG. 1-8 presents diagrams showing a spectral power distribution when assuming that light emitted from a packaged LED which includes a semiconductor light-emitting element with a peak wavelength of 460 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Experimental Example 109);

FIG. 1-9 presents diagrams showing a spectral power distribution when assuming that light emitted from a packaged LED which includes a semiconductor light-emitting element with a peak wavelength of 460 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Experimental Example 118);

FIG. 1-10 presents diagrams showing a spectral power distribution when assuming that light emitted from a packaged LED which includes a semiconductor light-emitting element with a peak wavelength of 452.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Experimental Example 120);

FIG. 1-11 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Experimental Example 140);

FIG. 1-12 presents diagrams showing a spectral power distribution when assuming that light emitted from a packaged LED which includes a semiconductor light-emitting element with a peak wavelength of 452.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Experimental Example 147);

FIG. 1-13 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Experimental Example 149);

FIG. 1-14 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Experimental Example 150);

FIG. 1-15 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 103);

FIG. 1-16 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 104);

FIG. 1-17 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 105);

FIG. 1-18 presents diagrams showing a spectral power distribution when assuming that light emitted from a packaged LED which includes a semiconductor light-emitting element with a peak wavelength of 457.5 nm and which is provided with an yellow phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 107);

FIG. 1-19 presents diagrams showing a spectral power distribution when assuming that light emitted from a packaged LED which includes a semiconductor light-emitting element with a peak wavelength of 455 nm and which is provided with a narrow-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 110);

FIG. 1-20 presents diagrams showing a spectral power distribution when assuming that light emitted from a packaged LED which includes a semiconductor light-emitting element with a peak wavelength of 447.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 115);

FIG. 1-21 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 116);

FIG. 1-22 presents diagrams showing a spectral power distribution when assuming that light emitted from a packaged LED which includes a semiconductor light-emitting element with a peak wavelength of 450 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 118);

FIG. 1-23 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 119);

FIG. 1-24 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 122);

FIG. 1-25 presents diagrams showing a spectral power distribution when assuming that light emitted from a packaged LED which includes a semiconductor light-emitting element with a peak wavelength of 457.5 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 123);

FIG. 1-26 presents diagrams showing a spectral power distribution when assuming that light emitted from a packaged LED which includes a semiconductor light-emitting element with a peak wavelength of 465 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 126);

FIG. 1-27 presents diagrams showing a spectral power distribution when assuming that light emitted from a packaged LED which includes a semiconductor light-emitting element with a peak wavelength of 465 nm and which is provided with a wide-band green phosphor and a red phosphor illuminates 15 Munsell renotation color samples, and a CIELAB color space in which are plotted both the a* value and the b* value of the 15 Munsell renotation color samples when assuming that the color samples are illuminated by the LED and when assuming that the color samples are illuminated by reference light (Comparative Experimental Example 127);

FIG. 2-1 is a diagram showing a disposition of light-emitting areas of the packaged LED used for Experimental Example 201 and Comparative Example Experimental Example 201;

FIG. 2-2 is a diagram showing a spectral power distribution when the radiant flux ratio of the light-emitting area 211 and the light-emitting area 212 is 3:0 in Experimental Example 201, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A);

FIG. 2-3 is a diagram showing a spectral power distribution when the radiant flux ratio of the light-emitting area 211 and the light-emitting area 212 is 2:1 in Experimental Example 201, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B);

FIG. 2-4 is a diagram showing a spectral power distribution when the radiant flux ratio of the light-emitting area 211 and the light-emitting area 212 is 1.5:1.5 in Experimental Example 201, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C);

FIG. 2-5 is a diagram showing a spectral power distribution when the radiant flux ratio of the light-emitting area 211 and the light-emitting area 212 is 1:2 in Experimental Example 201, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D);

FIG. 2-6 is a diagram showing a spectral power distribution when the radiant flux ratio of the light-emitting area 211 and the light-emitting area 212 is 0:3 in Experimental Example 201, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E);

FIG. 2-7 is the CIE 1976 u'v' chromaticity diagram on which the chromaticity of the drive points A to E in Experimental Example 201 are indicated. The two-dot chain line in FIG. 2-7 is a range of $D_{uv}$ that satisfies Condition 1 of the second invention of the present invention;

FIG. 2-8 is a diagram showing a disposition of light-emitting areas of the packaged LED used for Experimental Example 202;

FIG. 2-9 is a diagram showing a spectral power distribution when the radiant flux ratio of the light-emitting area 221, the light-emitting area 222 and the light-emitting area 223 is 3:0:0 in Experimental Example 202, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A);

FIG. 2-10 is a diagram showing a spectral power distribution when the radiant flux ratio of the light-emitting area 221, the light-emitting area 222 and the light-emitting area 223 is 0:3:0 in Experimental Example 202, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B);

FIG. 2-11 is a diagram showing a spectral power distribution when the radiant flux ratio of the light-emitting area 221, the light-emitting area 222 and the light-emitting area 223 is 0:0:3 in Experimental Example 202, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C);

FIG. 2-12 is a diagram showing a spectral power distribution when the radiant flux ratio of the light-emitting area 221, the light-emitting area 222 and the light-emitting area 223 is 1:1:1 in Experimental Example 202, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D);

FIG. 2-13 is the CIE 1976 u'v' chromaticity diagram on which the chromaticity of the drive points A to D in Experimental Example 202 are indicated. The two-dot chain line in FIG. 2-13 is a range of $D_{uv}$ that satisfies Condition 1 of the second invention of the present invention;

FIG. 2-14 is a diagram showing a disposition of the light-emitting areas of the illumination system used for Experimental Example 203;

FIG. 2-15 is a diagram showing a spectral power distribution when the radiant flux ratio of the light-emitting area 231 and the light-emitting area 232 is 90:0 in Experimental Example 203, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A);

FIG. 2-16 is a diagram showing a spectral power distribution when the radiant flux ratio of the light-emitting area 231 and the light-emitting area 232 is 70:20 in Experimental Example 203, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B);

FIG. 2-17 is a diagram showing a spectral power distribution when the radiant flux ratio of the light-emitting area 231 and the light-emitting area 232 is 45:45 in Experimental Example 203, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C);

FIG. 2-18 is a diagram showing a spectral power distribution when the radiant flux ratio of the light-emitting area 231 and the light-emitting area 232 is 30:60 in Experimental Example 203, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D);

FIG. 2-19 is a diagram showing a spectral power distribution when the radiant flux ratio of the light-emitting area 231 and the light-emitting area 232 is 0:90 in Experimental Example 203, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E);

FIG. 2-20 is the CIE 1976 u'v' chromaticity diagram on which the chromaticity of the drive points A to E in Experimental Example 203 are indicated. The two-dot chain line in FIG. 2-20 is a range of $D_{uv}$ that satisfies Condition 1 of the second invention of the present invention;

FIG. 2-21 is a diagram showing a spectral power distribution when the radiant flux ratio of the light-emitting area 231 and the light-emitting area 232 is 90:0 in Experimental Example 204, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A);

FIG. 2-22 is a diagram showing a spectral power distribution when the radiant flux ratio of the light-emitting area 231 and the light-emitting area 232 is 70:20 in Experimental Example 204, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B);

FIG. 2-23 is a diagram showing a spectral power distribution when the radiant flux ratio of the light-emitting area 231 and the light-emitting area 232 is 49:41 in Experimental Example 204, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C);

FIG. 2-24 is a diagram showing a spectral power distribution when the radiant flux ratio of the light-emitting area 231 and the light-emitting area 232 is 30:60 in Experimental Example 204, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D);

FIG. 2-25 is a diagram showing a spectral power distribution when the radiant flux ratio of the light-emitting area 231 and the light-emitting area 232 is 0:90 in Experimental Example 204, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E);

FIG. 2-26 is the CIE 1976 u'v' chromaticity diagram on which the chromaticity of the drive points A to E in Experimental Example 204 are indicated. The two-dot chain line in FIG. 2-26 is a range of $D_{uv}$ that satisfies Condition 1 of the second invention of the present invention;

FIG. 2-27 is a diagram showing the deposition of the light-emitting areas of the light-emitting device (pair of packaged LEDs) used for Experimental Example 205;

FIG. 2-28 is a diagram showing a spectral power distribution when the radiant flux ratio of the light-emitting area 241 and the light-emitting area 242 is 9:0 in Experimental Example 205, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A);

FIG. 2-29 is a diagram showing a spectral power distribution when the radiant flux ratio of the light-emitting area 241 and the light-emitting area 242 is 7:2 in Experimental Example 205, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B);

FIG. 2-30 is a diagram showing a spectral power distribution when the radiant flux ratio of the light-emitting area 241 and the light-emitting area 242 is 4.5:4.5 in Experimental Example 205, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C);

FIG. 2-31 is a diagram showing a spectral power distribution when the radiant flux ratio of the light-emitting area 241 and the light-emitting area 242 is 2:7 in Experimental Example 205, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D);

FIG. 2-32 is a diagram showing a spectral power distribution when the radiant flux ratio of the light-emitting area 241 and the light-emitting area 242 is 0:9 in Experimental Example 205, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E);

FIG. 2-33 is the CIE 1976 u'v' chromaticity diagram on which the chromaticity of the drive points A to E in Experimental Example 205 are indicated. The two-dot chain line in FIG. 2-33 is a range of $D_{uv}$ that satisfies Condition 1 of the second invention of the present invention;

FIG. 2-34 is a diagram showing a disposition of light-emitting areas of the packaged LED used for Experimental Example 206;

FIG. 2-35 is a diagram showing a spectral power distribution when the radiant flux ratio of the light-emitting area 251 and the light-emitting area 252 is 16:0 in Experimental Example 206, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A);

FIG. 2-36 is a diagram showing a spectral power distribution when the radiant flux ratio of the light-emitting area 251 and the light-emitting area 252 is 4:12 in Experimental Example 206, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B);

FIG. 2-37 is a diagram showing a spectral power distribution when the radiant flux ratio of the light-emitting area 251 and the light-emitting area 252 is 3:13 in Experimental Example 206, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C);

FIG. 2-38 is a diagram showing a spectral power distribution when the radiant flux ratio of the light-emitting area 251 and the light-emitting area 252 is 1:15 in Experimental Example 206, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D);

FIG. 2-39 is a diagram showing a spectral power distribution when the radiant flux ratio of the light-emitting area 251 and the light-emitting area 252 is 0:16 in Experimental Example 206, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E);

FIG. 2-40 is the CIE 1976 u'v' chromaticity diagram on which the chromaticity of the drive points A to E in Experimental Example 206 are indicated. The two-dot chain line in FIG. 2-40 is a range of $D_{uv}$ that satisfies Condition 1 of the second invention of the present invention;

FIG. 2-41 is a diagram showing a spectral power distribution when the radiant flux ratio of the light-emitting area 211 and the light-emitting area 212 is 3:0 in Comparative Experimental Example 201, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A);

FIG. 2-42 is a diagram showing a spectral power distribution when the radiant flux ratio of the light-emitting area 211 and the light-emitting area 212 is 2:1 in Comparative Experimental Example 201, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B);

FIG. 2-43 is a diagram showing a spectral power distribution when the radiant flux ratio of the light-emitting area 211 and the light-emitting area 212 is 1.5:1.5 in Comparative Experimental Example 201, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C);

FIG. 2-44 is a diagram showing a spectral power distribution when the radiant flux ratio of the light-emitting area 211 and the light-emitting area 212 is 1:2 in Comparative Experimental Example 201, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D);

FIG. 2-45 is a diagram showing a spectral power distribution when the radiant flux ratio of the light-emitting area 211 and the light-emitting area 212 is 0:3 in Comparative Experimental Example 201, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E);

FIG. 2-46 is the CIE 1976 u'v' chromaticity diagram on which the chromaticity of the drive points A to E in Comparative Experimental Example 201 are indicated. The two-dot chain line in FIG. 2-46 is a range of $D_{uv}$ that satisfies Condition 1 of the second invention of the present invention;

FIG. 2-47 is a diagram showing light-emitting areas of a light-emitting device according to the second invention of the present invention;

FIG. 3-1 is a diagram showing a normalized test light spectral power distribution (solid line) of test light in Experimental Example 101 and a normalized reference light spectral power distribution (dotted line) of calculational reference light corresponding to the test light;

FIG. 3-2 is a diagram showing a normalized test light spectral power distribution (solid line) of test light in Experimental Example 150 and a normalized reference light spectral power distribution (dotted line) of calculational reference light corresponding to the test light;

FIG. 3-3 is a schematic diagram showing an example of the light-emitting device according to the first aspect of the third invention of the present invention;

FIG. 3-4 is a schematic diagram showing an example of the light-emitting device according to the first aspect of the third invention of the present invention;

FIG. 3-5 is a graph showing the transmission characteristic of the control element (filter) used for Experimental Example 301 and Comparative Experimental Example 301;

FIG. 3-6 is a graph showing the spectral power distributions in the Reference Experimental Example 301 and Experimental Example 301. In FIG. 3-6, the dotted line indicates the relative spectral power distribution in the Reference Experimental Example 301 that does not include a control element, and the solid line indicates the relative spectral power distribution radiating onto the axis in Experimental Example 301 that includes a control element;

FIG. 3-7 are graphs showing the spectral power distributions of Reference Experimental Example 301 and Experimental Example 301, and the CIELAB plots plotting both the a* value and the b* value of the 15 color samples assuming the case of illuminating with these spectral power distributions, and with a calculational reference light (black-body radiator) having a CCT corresponding to these spectral power distributions respectively (the dotted line in the CIELAB plot indicates the result of the reference light, and the solid line indicates the result of the packaged LED);

FIG. 3-8 is a graph showing the transmission characteristic of the control element (filter) used for Experimental Example 302;

FIG. 3-9 is a graph showing the spectral power distributions in the Reference Comparative Experimental Example 301 and Experimental Example 302. In FIG. 3-9, the dotted line indicates the relative spectral power distribution in the Reference Comparative Experimental Example 301 that does not include a control element, and the solid line indicates the relative spectral power distribution radiating onto the axis in Experimental Example 302 that includes a control element;

FIG. 3-10 are graphs showing the spectral power distributions of Reference Comparative Experimental Example 301 and Experimental Example 302, and the CIELAB plots plotting both the a* value and the b* value of the 15 color samples assuming the case of illuminating with these spectral power distributions, and with a calculational reference light (black-body radiator) having a CCT corresponding to these spectral power distributions respectively (the dotted line in the CIELAB plot indicates the result of the reference light, and the solid line indicates the result of the packaged LED);

FIG. 3-11 is a graph showing the transmission characteristic of the control element (filter) used for Experimental Example 303;

FIG. 3-12 is a graph showing the spectral power distributions in the Reference Comparative Experimental Example 302 and Experimental Example 303. In FIG. 3-12, the dotted line indicates the relative spectral power distribution in the Reference Comparative Experimental Example 302 that does not include a control element, and the solid line indicates the relative spectral power distribution radiating onto the axis in Experimental Example 303 that includes a control element;

FIG. 3-13 are graphs showing the spectral power distributions of Reference Comparative Experimental Example 302 and Experimental Example 303, and the CIELAB plots plotting both the a* value and the b* value of the 15 color samples assuming the case of illuminating with these spectral power distributions, and with a calculational reference light (black-body radiator) having a CCT corresponding to these spectral power distributions respectively (the dotted line in the CIELAB plot indicates the result of the reference light, and the solid line indicates the result of the packaged LED);

FIG. 3-14 is a graph showing the spectral power distributions in the Reference Comparative Experimental Example 302 and Comparative Experimental Example 301. In FIG. 3-14, the dotted line indicates the relative spectral power distribution in the Reference Comparative Experimental Example 302 that does not include a control element, and the solid line indicates the relative spectral power distribution radiating onto the axis in Comparative Experimental Example 301 that includes a control element;

FIG. 3-15 are graphs showing the spectral power distributions of Reference Comparative Experimental Example 302 and Comparative Experimental Example 301, and the CIELAB plots plotting both the a* value and the b* value of the 15 color samples assuming the case of illuminating with these spectral power distributions, and with a calculational reference light (black-body radiator) having a CCT corresponding to these spectral power distributions respectively (the dotted line in the CIELAB plot indicates the result of the reference light, and the solid line indicates the result of the packaged LED).

DESCRIPTION OF EMBODIMENTS

Figure 1:
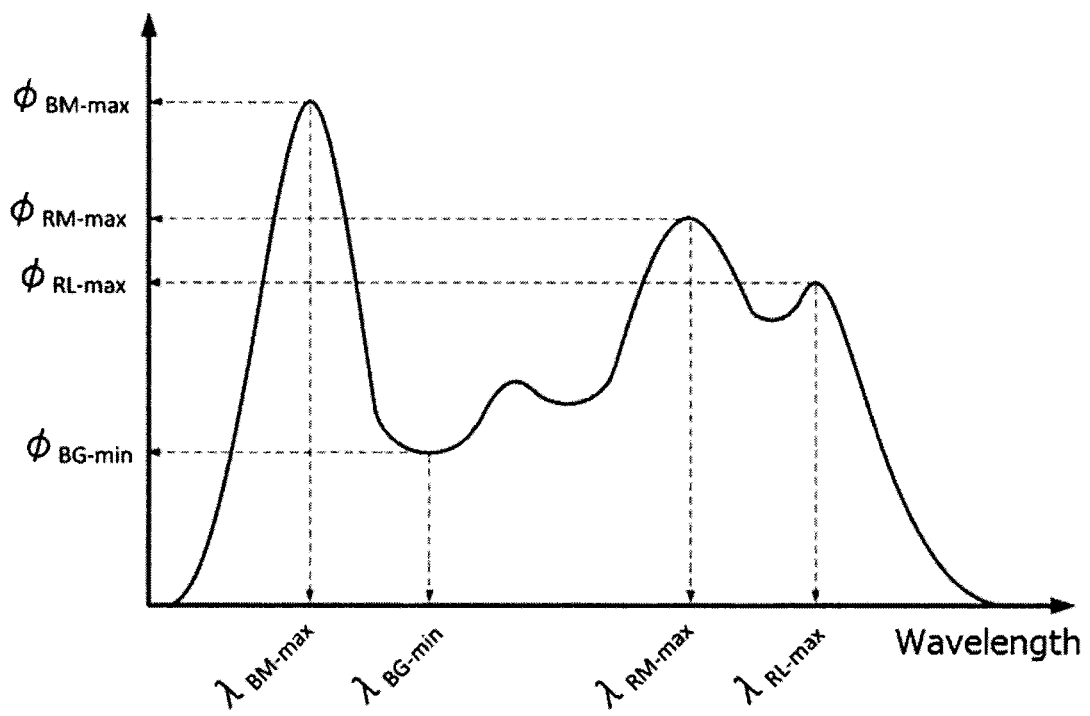
FIG. 1-1 is a diagram showing a relationship among parameters $\varphi_{BM\text{-}max}$, $\lambda_{BM\text{-}max}$, $\lambda_{BG\text{-}min}$, $\varphi_{BG\text{-}min}$, $\lambda_{RM\text{-}max}$, $\lambda_{RM\text{-}max}$, $\varphi_{RL\text{-}max}$, and $\lambda_{RL\text{-}max}$ in an embodiment with a spectral power distribution of $\varphi(\lambda)$.

While means for solving the problems will be hereinafter described in detail, important terms used in the present specification are defined as follows.

A concept of the novel invention discovered by the present inventor enables a natural, vivid, highly visible and comfortable appearance of colors and appearance of objects to be realized and improves a light source efficiency of a light-emitting body that realizes a natural, vivid, highly visible and comfortable appearance of colors and appearance of objects. In other words, the novel invention represents a discovery of a spectral power distribution capable of realizing such an appearance of objects. The three inventions below are provided as specific means for implementing the novel invention described above.

(1) An invention related to a light-emitting device which emits light having a spectral power distribution capable of realizing a natural, vivid, highly visible and comfortable appearance of colors and appearance of objects (first invention)

(2) An invention related to a light-emitting device which emits light having a spectral power distribution capable of realizing a natural, vivid, highly visible and comfortable appearance of colors and appearance of objects and which emits light emitted from a plurality of light-emitting areas (second invention)

(3) An invention related to a light-emitting device which emits light having a spectral power distribution capable of realizing a natural, vivid, highly visible and comfortable appearance of colors and appearance of objects and which includes a control element (third invention)

Therefore, in the present specification, a spectral power distribution $\varphi(\lambda)$ of light emitted by a light source may be described using different notations ($\varphi_{SSL1}(\lambda)$, $\varphi_{SSL2}(\lambda)$, $\varphi_{SSL3}(\lambda)$, and $\varphi_{elm3}(\lambda)$) in accordance with the respective inventions.

In a similar manner, in the present specification, correlated color temperature T may be described using different notations ($T_{SSL1}$, $T_{SSL2}$, $T_{SSL3}$, and $T_{elm3}$) in accordance with the respective inventions.

In a similar manner, in the present specification, $\varphi_{ref}(\lambda)$ a spectral power distribution of reference light which is selected in accordance with a correlated color temperature T, may be described using different notations ($\varphi_{ref1}(\lambda)$, $\varphi_{ref2}(\lambda)$, $\varphi_{SSL-ref3}(\lambda)$, and $\varphi_{elm-ref3}(\lambda)$) in accordance with the respective inventions.

In a similar manner, in the present specification, tristimulus values of the light (X, Y, Z) may be described using different notations (($X_{SSL1}$, $Y_{SSL1}$, $Z_{SSL1}$), ($X_{SSL2}$, $Y_{SSL2}$, $Z_{SSL}$) ($X_{SSL3}$, $Y_{SSL3}$, $Z_{SSL3}$), and ($X_{elm3}$, $Y_{elm3}$, $Z_{elm3}$)) in accordance with the respective inventions.

In a similar manner, in the present specification, ($X_{ref}$, $Y_{ref}$, $Z_{ref}$), tristimulus values of the reference light which is selected in accordance with T, may be described using different notations (($X_{ref1}$, $Y_{ref1}$, $Z_{ref1}$), ($X_{ref2}$, $Y_{ref2}$, $Z_{ref2}$), ($X_{SSL-ref3}$, $Y_{SSL-ref3}$, $Z_{SSL-ref3}$), and ($X_{elm-ref3}$, $Y_{elm-ref3}$, $Z_{elm-ref3}$)) in accordance with the respective inventions.

In a similar manner, in the present specification, a normalized spectral power distribution $S(\lambda)$ may be described using different notations ($S_{SSL1}(\lambda)$, $S_{SSL2}(\lambda)$, $S_{SSL3}(\lambda)$, and $S_{elm3}(\lambda)$) in accordance with the respective inventions.

In a similar manner, in the present specification, a normalized spectral power distribution $S_{ref}(\lambda)$ of the reference light which is selected in accordance with T may be described using different notations ($S_{ref1}(\lambda)$, $S_{ref2}(\lambda)$, $S_{SSL-ref3}(\lambda)$, and $S_{elm-ref3}(\lambda)$) in accordance with the respective inventions.

In a similar manner, in the present specification, a difference $\Delta S(\lambda)$ of normalized spectral power distributions may be described using different notations ($\Delta S_{SSL1}(\lambda)$, $\Delta S_{SSL2}(\lambda)$, $\Delta S_{SSL3}(\lambda)$, and $\Delta S_{elm3}(\lambda)$) in accordance with the respective inventions.

In a similar manner, in the present specification, the below-mentioned wavelength $\lambda_{BG-min}$ may be described using different notations ($\lambda_{SSL1-BG-min}$, $\lambda_{SSL2-BG-min}$, $\lambda_{SSL3-BG-min}$, $\lambda_{SSL3-BG-min}$, and $\lambda_{elm3-BG-min}$) in accordance with the respective inventions.

In a similar manner, in the present specification, the below-mentioned wavelength $\lambda_{BM-max}$ may be described using different notations ($\lambda_{SSL1-BM-max}$, $\lambda_{SSL2-BM-max}$, $\lambda_{SSL3-BM-max}$, and $\lambda_{elm3-BM-max}$) in accordance with the respective inventions.

In a similar manner, in the present specification, the below-mentioned wavelength $\lambda_{RM-max}$ may be described using different notations ($\lambda_{SSL1-RM-max}$, $\lambda_{SSL2-RM-max}$, $\lambda_{SSL3-RM-max}$, and $\lambda_{elm3-RL-max}$) in accordance with the respective inventions.

In a similar manner, in the present specification, the below-mentioned wavelength $\varphi_{RL-max}$ may be described using different notations ($\lambda_{SSL1-RL-max}$, $\lambda_{SSL2-RL-max}$, $j\lambda_{SSL3-RL-max}$, and $\lambda_{elm3-RL-max}$) in accordance with the respective inventions.

In a similar manner, in the present specification, the below-mentioned $\varphi_{BG-min}$, a minimum value of spectral intensity in a range of 465 nm or more and 525 nm or less, may be described using different notations ($\varphi_{SSL1-BG-min}$, $\varphi_{SSL2-BG-min}$, $\varphi_{SSL3-BG-min}$, and $\varphi_{elm3-BG-min}$) in accordance with the respective inventions.

In a similar manner, in the present specification, the below-mentioned $\varphi_{BM-max}$, a maximum value of spectral intensity in a range of 430 nm or more and 495 nm or less, may be described using different notations ($\varphi_{SSL1-BM-max}$, $\varphi_{SSL2-BM-max}$, $\varphi_{SSL3-BM-max}$, and $\varphi_{elm3-BM-max}$) in accordance with the respective inventions.

In a similar manner, in the present specification, the below-mentioned $\varphi_{RM-max}$, a maximum value of spectral intensity in a range of 590 nm or more and 780 nm or less, may be described using different notations ($\varphi_{SSL1-RM-max}$, $\varphi_{SSL2-RM-max}$, $\varphi_{SSL3-RM-max}$, and $\varphi_{elm3-RM-max}$) in accordance with the respective inventions.

In a similar manner, in the present specification, the below-mentioned $\varphi_{RL-max}$, a longest wavelength local maximum value of a normalized spectral power distribution $S(\lambda)$ which is derived from the spectral power distribution $\varphi(\lambda)$ in a range of 380 nm or more and 780 nm or less may be described using different notations ($\varphi_{SSL1-RL-max}$, $\varphi_{SSL2-RL-max}$, $\varphi_{SSL3-RL-max}$, and $\varphi_{elm3-RL-max}$) in accordance with the respective inventions.

In a similar manner, in the present specification, the below-mentioned index $A_{cg}$ may be described using different notations ($A_{cg}(\varphi_{SSL1}(\lambda))$, $A_{cg}(\varphi_{SSL2}(\lambda))$, $A_{cg}(\varphi_{SSL3}(\lambda))$, and $A_{cg}(\varphi_{elm3}(\lambda))$) in accordance with the respective inventions.

In a similar manner, in the present specification, the below-mentioned distance $D_{uv}$ may be described using different notations ($D_{uv}(\varphi_{SSL1}(\lambda))$, $D_{uv}(\varphi_{SSL2}(\lambda))$, $D_{uv}(\varphi_{SSL3}(\lambda))$, and $D_{uv}(\varphi_{elm3}(\lambda))$) in accordance with the respective inventions.

In a similar manner, in the present specification, the below-mentioned $a^*_n$ value may be described using different notations ($a^*_{nSSL1}$, $a^*_{nSSL2}$, $a^*_{nSSL3}$, and $a^*_{nelm3}$) in accordance with the respective inventions.

In a similar manner, in the present specification, the below-mentioned $b^*_n$ value may be described using different notations ($b^*_{nSSL1}$, $b^*_{nSSL2}$, $b^*_{nSSL3}$, and $b^*_{nelm3}$) in accordance with the respective inventions.

In a similar manner, in the present specification, the below-mentioned $a^*_{nref}$ value may be described using different notations ($a^*_{nref1}$, $a^*_{nref2}$, $a^*_{nSSL-ref3}$, and $a^*_{nelm-ref3}$) in accordance with the respective inventions.

In a similar manner, in the present specification, the below-mentioned $b^*_{nref}$ value may be described using different notations ($b^*_{nref1}$, $b^*_{nref2}$, $b^*_{nSSL-ref3}$, and $b^*_{nelm-ref3}$) in accordance with the respective inventions.

In a similar manner, in the present specification, the below-mentioned hue angle $\theta_n$ may be described using different notations ($\theta_{nSSL1}$, $\theta_{nSSL2}$, $\theta_{nSSL3}$, and $\theta_{nelm3}$) in accordance with the respective inventions.

In a similar manner, in the present specification, the below-mentioned hue angle $\theta_{nref}$ may be described using different notations ($\theta_{nref1}$, $\theta_{nref2}$, $\theta_{nSSL-ref3}$, and $\theta_{nelm-ref3}$) in accordance with the respective inventions.

In a similar manner, in the present specification, the below-mentioned each difference in hue angles $\Delta h_n$ may be described using different notations ($\Delta h_{nSSL1}$, $\Delta h_{nSSL2}$, $\Delta h_{nSSL3}$, and $\Delta h_{nelm3}$) in accordance with the respective inventions.

In a similar manner, in the present specification, the below-mentioned each saturation difference $\Delta C_n$ may be described using different notations ($\Delta C_{nSSL1}$, $\Delta C_{nSSL2}$, $\Delta C_{nSSL3}$, and $\Delta C_{nelm3}$) in accordance with the respective inventions.

In a similar manner, in the present specification, the below-mentioned average saturation difference $SAT_{ave}$ may be described using different notations ($SAT_{ave}(\varphi_{SSL1}(\lambda))$, $SAT_{ave}(\varphi_{SSL2}(\lambda))$, $SAT_{ave}(\varphi_{SSL3}(\lambda))$, and $SAT_{ave}(\varphi_{elm3}(\lambda))$) in accordance with the respective inventions.

In a similar manner, in the present specification, the below-mentioned maximum saturation difference value $\Delta C_{max}$ may be described using different notations ($\Delta C_{SSL-max1}$, $\Delta C_{SSL-max2}$, $\Delta C_{SSL-max3}$, and $\Delta C_{elm-max3}$) in accordance with the respective inventions.

In a similar manner, in the present specification, the below-mentioned minimum saturation difference value $\Delta C_{min}$ may be described using different notations ($\Delta C_{SSL-min1}$, $\Delta C_{SSL-min2}$, $\Delta C_{SSL-min3}$, and $\Delta C_{elm-min3}$) in accordance with the respective inventions.

In a similar manner, in the present specification, the below-mentioned luminous efficacy of radiation K may be described using different notations ($K_{SSL1}$, $K_{SSL2}$, $K_{SSL3}$, and $K_{elm3}$) in accordance with the respective inventions.

In a similar manner, in the present specification, the below-mentioned light source efficiency $\eta$ may be described using different notations ($\eta_{SSL1}$, $\eta_{SSL2}$, $\eta_{SSL3}$, and $\eta_{elm3}$) in accordance with the respective inventions.

The present invention includes the first invention, the second invention, and the third invention described above.

The first invention of the present invention includes an aspect related to the light-emitting device described above (a first aspect of the first invention) as well as an aspect related to a method for designing the light-emitting device (a second aspect of the first invention).

The second invention of the present invention includes an aspect related to the light-emitting device described above (a first aspect of the second invention) as well as an aspect related to a method for designing the light-emitting device (a second aspect of the second invention), an aspect related to a method for driving the light-emitting device (a third aspect of the second invention), and an aspect related to an illumination method (a fourth aspect of the second invention).

The third invention of the present invention includes an aspect related to the light-emitting device described above (a first aspect of the third invention) as well as an aspect related to a method for designing the light-emitting device (a second aspect of the third invention), an aspect related to an illumination method (a fourth aspect of the third invention), and an aspect related to a method for manufacturing the light-emitting device (a fifth aspect of the third invention). It should be noted that a third aspect of the third invention of the present invention will not be described for the sake of convenience.

In addition, in the present specification, examples and the like of the first to third inventions of the present invention and the experimental examples and the like described later have the following relationships.

Examples of the first invention of the present invention are Experimental Example 101 to Experimental Example 152 described later.

Comparative Examples of the first invention of the present invention are Comparative Experimental Example 101 to Comparative Experimental Example 127 described later.

A Reference Example of the first invention of the present invention is Reference Experimental Example 101 described later.

Examples of the second invention of the present invention are Experimental Example 201 to Experimental Example 206 described later.

A Comparative Example of the second invention of the present invention is Comparative Experimental Example 201 described later.

Experimental Examples of the second invention of the present invention are Experimental Example 101 to Experimental Example 152 described later.

Comparative Experimental Examples of the second invention of the present invention are Comparative Experimental Example 101 to Comparative Experimental Example 127 described later.

A Reference experimental Example of the second invention of the present invention is Reference Experimental Example 101 described later.

Examples of the third invention of the present invention are Experimental Example 301 to Experimental Example 303 described later.

A Comparative Example of the third invention of the present invention is Comparative Experimental Example 301 described later.

A Reference Example of the third invention of the present invention is Reference Experimental Example 301 described later.

Reference Comparative Examples of the third invention of the present invention are Reference Comparative Experimental Example 301 to Reference Comparative Experimental Example 302 described later.

Experimental Examples of the third invention of the present invention are Experimental Example 101 to Experimental Example 152 described later.

Comparative Experimental Examples of the third invention of the present invention are Comparative Experimental Example 101 to Comparative Experimental Example 127 described later.

A Reference experimental Example of the third invention of the present invention is Reference Experimental Example 101 described later.

<1. First Invention>
<Light-Emitting Device>

The First Invention of the Present Invention Includes an aspect related to a light-emitting device (a first aspect of the first invention) as well as an aspect related to a method for designing the light-emitting device (a second aspect of the first invention).

The light-emitting device according to the first aspect of the first invention of the present invention may be a single semiconductor light-emitting element to which a lead wire or the like as a power supplying mechanism is added, a packaged LED to which a heat radiation mechanism or the like is added and which is integrated with a phosphor or the like, a COB (chip-on-board), and the like. Alternatively, the light-emitting device according to the first aspect of the first invention of the present invention may be an LED module generally mounted with a plurality of packaged LEDs including one or more packaged LEDs to which a further robust heat radiation mechanism has been added. Alternatively, the light-emitting device according to the first aspect of the first invention of the present invention may be an LED light bulb or an LED lighting fixture obtained by adding a lens, a light reflecting mechanism, and the like to a packaged LED or the like. Moreover, a lighting system which supports a large number of LED lighting fixtures or the like and which is configured to be capable of illuminating an object may be adopted. The light-emitting device according to the first aspect of the first invention encompasses all of the above.

<Main Radiant Direction>

The first aspect of the first invention is identified by light in a "main radiant direction" among light emitted by the light-emitting device. Therefore, a light-emitting device capable of emitting light including light in the "main radiant direction" which fulfills the requirement of the first aspect of the first invention belongs to the scope of the first aspect of the first invention.

As used herein, the "main radiant direction" according to the first aspect of the first invention refers to a direction in which light is radiated over a suitable range and in a suitable orientation which are in line with usage of the light-emitting device.

For example, the "main radiant direction" may be a direction in which luminous intensity or luminance of the light-emitting device of the first aspect of the first invention is maximum or locally maximum.

In addition, the main radiant direction of the first aspect of the first invention may be a direction having a finite range including a direction in which the luminous intensity or the luminance of the light-emitting device is maximum or locally maximum.

In addition, the main radiant direction of the first aspect of the first invention may be a direction in which radiant intensity or radiance of the light-emitting device is maximum or locally maximum.

In addition, the main radiant direction of the first aspect of the first invention may be a direction having a finite range including a direction in which the radiant intensity or the radiance of the light-emitting device is maximum or locally maximum.

Specific examples will be given below.

When the light-emitting device of the first aspect of the first invention is an individual light-emitting diode (LED), an individual packaged LED, an individual chip-on-board (COB), an individual LED module, an individual LED bulb, an individual composite lamp constituted by a fluorescent lamp and a semiconductor light-emitting element, an individual composite lamp constituted by an incandescent bulb and a semiconductor light-emitting element, or the like, a main radiant direction may be a vertical direction of each light-emitting device or within a finite solid angle which includes the vertical direction and which ranges between, for example, a maximum of $\pi$ (sr) and a minimum of $\pi/100$ (sr).

When the light-emitting device of the first aspect of the first invention is an LED lighting fixture in which a lens, a reflection mechanism, and the like is added to the packaged LED or the like or a lighting fixture which incorporates a fluorescent lamp and a semiconductor light-emitting element and which has light distribution characteristics applicable to so-called direct lighting use, semi-direct lighting use, general diffused lighting use, direct/indirect lighting use, semi-indirect lighting use, and indirect lighting use, a main radiant direction may be a vertical direction of each light-emitting device or within a finite solid angle which includes the vertical direction and which ranges between, for example, a maximum of $\pi$ (sr) and a minimum of $\pi/100$ (sr). In addition, the main radiant direction may be a direction in which luminous intensity or luminance of the light-emitting device of the first aspect of the first invention is maximum or locally maximum. Furthermore, the main radiant direction may be within a finite solid angle that includes a direction in which luminous intensity or luminance of the light-emitting device of the first aspect of the first invention is maximum or locally maximum and which ranges between, for example, a maximum of $\pi$ (sr) and a minimum of $\pi/100$ (sr). In addition, the main radiant direction may be a direction in which radiant intensity or radiance of the light-emitting device of the first aspect of the first invention is maximum or locally maximum. Furthermore, the main radiant direction may be within a finite solid angle which includes a direction in which radiant intensity or radiance of the light-emitting device of the first aspect of the first invention is maximum or locally maximum and which ranges between, for example, a maximum of $\pi$ (sr) and a minimum of $\pi/100$ (s).

When the light-emitting device of the first aspect of the first invention is a lighting system in which a plurality of the LED lighting fixtures or lighting fixtures having a fluorescent lamp is mounted, the main radiant direction may be a vertical direction of a planar center of each light-emitting device or within a finite solid angle which includes the vertical direction and which ranges between, for example, a maximum of π (sr) and a minimum of π/100 (s). In addition, the main radiant direction may be a direction in which luminous intensity or luminance of the light-emitting device of the first aspect of the first invention is maximum or locally maximum. Furthermore, the main radiant direction may be within a finite solid angle which includes a direction in which luminous intensity or luminance of the light-emitting device of the first aspect of the first invention is maximum or locally maximum and which ranges between, for example, a maximum of π (sr) and a minimum of π/100 (s). In addition, the main radiant direction may be a direction in which radiant intensity or radiance of the light-emitting device of the first aspect of the first invention is maximum or locally maximum. Furthermore, the main radiant direction may be within a finite solid angle which includes a direction in which radiant intensity or radiance of the light-emitting device of the first aspect of the first invention is maximum or locally maximum and which ranges between, for example, a maximum of π (sr) and a minimum of π/100 (s).

The spectral power distribution of light emitted from the light-emitting device in the main radiant direction according to the first aspect of the first invention is preferably measured at a distance where luminance at the measurement is practical luminance such as between 5 lx and 10000 lx.

<Drive Environment>

With the light-emitting device according to the first aspect of the first invention, when drive conditions thereof such as a temperature environment, a level of injected current, and drive modes including intermittent lighting/continuous lighting differ, the spectral power distribution of light emitted from the light-emitting device in the main radiant direction differs in a similar manner to general light-emitting devices. From this perspective, if a light-emitting device is capable of emitting light disclosed in the first aspect of the first invention under at least one specific condition that realistically enables the light-emitting device to emit light, then the light-emitting device is considered a light-emitting device within the scope of the disclosure of the first aspect of the first invention.

<Emission of Light by Single Light-Emitting Element and Emission of Light by Light-Emitting Device>

The light-emitting device according to the first aspect of the first invention may be, for example, a packaged LED including a semiconductor light-emitting element and a phosphor, an LED light bulb including a packaged LED, or a light-emitting module, a light-emitting system, or the like which integrates such light-emitting devices. Hereinafter, a member/material which constitutes the light-emitting device according to the first aspect of the first invention and which is capable of emitting light either spontaneously or as a result of being excited by another member will be described as a light-emitting element. Therefore, in the first aspect of the first invention, a semiconductor light-emitting element, a phosphor, and the like may be light-emitting elements.

Although superimposition of light emitted by light-emitting elements form a basis of light emitted from the light-emitting device in the main radiant direction according to the first aspect of the first invention, various factors prevent the superimposition from being simple and straight-forward. For example, reciprocal absorption of light between light-emitting elements is a major factor. In addition, the spectral power distribution of the light-emitting device according to the first aspect of the first invention may significantly change from a simple superimposition of spectral power distributions of light-emitting elements due to spectral transmission characteristics of a lens, a filter, or the like that can be included in the light-emitting device. Furthermore, the spectral power distribution of the light-emitting device may also change from a simple superimposition of spectral power distributions of light-emitting elements due to spectral transmission characteristics of a constituent member such as a reflecting film of the light-emitting device which is positioned in a vicinity of a light-emitting element.

Moreover, consideration must also be given to the fact that the spectral power distribution of the light-emitting element cannot be simply derived from a superimposition of spectral power distributions of light-emitting elements due to a "difference" between a widely-used measurement environment for a single light-emitting element and a general measurement environment of a light-emitting device.

In consideration of the above, light-emitting elements in the light-emitting device according to the first aspect of the first invention are defined as follows.

A purple semiconductor light-emitting element is characterized by a peak wavelength $\lambda_{CHIP\text{-}VM\text{-}max}$ when the purple semiconductor light-emitting element alone is driven by a pulse current.

A blue semiconductor light-emitting element is characterized by a dominant wavelength $\lambda_{CHIP\text{-}BM\text{-}dom}$ when the blue semiconductor light-emitting element alone is driven by a pulse current.

A phosphor material is characterized by an emission peak wavelength (denoted by $\lambda_{PHOS\text{-}GM\text{-}max}$ for a green phosphor and denoted by $\lambda_{PHOS\text{-}RM\text{-}max}$ for a red phosphor) when light is excited by the material alone and by a full-width at half-maximum (denoted by $W_{PHOS\text{-}GM\text{-}fwhm}$ for a green phosphor and denoted by $W_{PHOS\text{-}RM\text{-}fwhm}$ for a red phosphor) of an emission spectral power distribution of the material.

On the other hand, a spectral power distribution $\varphi_{SSL1}(\lambda)$ of the light-emitting device itself according to the first aspect of the first invention is based on characteristics when power is being continuously supplied thereto and is characterized by the following indexes.

Specifically, the spectral power distribution $T_{SSL1}(\lambda)$ of the light-emitting device is characterized by a maximum value $\varphi_{SSL1\text{-}BM\text{-}max}$ of spectral intensity and a wavelength $\lambda_{SSL1\text{-}BM\text{-}max}$ that provides the maximum value $\varphi_{SSL1\text{-}BM\text{-}max}$ of spectral intensity in a range of 430 nm or more and 495 nm or less, a minimum value $\varphi_{SSL1\text{-}BG\text{-}min}$ of spectral intensity and a wavelength $\lambda_{SSL1\text{-}BG\text{-}min}$ that provides the minimum value $\varphi_{SSL1\text{-}BG\text{-}min}$ of spectral intensity in a range of 465 nm or more and 525 nm or less, a maximum value $\varphi_{SSL1\text{-}RM\text{-}max}$ of spectral intensity and a wavelength $\lambda_{SSL1\text{-}RM\text{-}max}$ that provides the maximum value $\varphi_{SSL1\text{-}RN\text{-}max}$ of spectral intensity in a range of 590 nm or more and 780 nm or less, and $\lambda_{SSL1\text{-}RL\text{-}max}$ that provides a longest wavelength local maximum value $\varphi_{SSL1\text{-}RL\text{-}max}$ of a normalized spectral power distribution $S_{SSL1}(\lambda)$ which is derived from the spectral power distribution $\varphi_{SSL1}(\lambda)$ in a range of 380 nm or more and 780 nm or less which is used in the definition of an index $A_{cg}(\varphi_{SSL1}(\lambda))$ to be described later. This relationship is shown in FIG. 1-1. It should be noted that the suffix SSL1 has been omitted in FIG. 1-1. This is because the various indexes shown in FIG. 1-1 are general concepts which are shared throughout the entirety of the present invention and which are also applied to the second and third inventions of the present inventions to be described later.

Therefore, for example, $\lambda_{CHIP\text{-}BM\text{-}dom}$ generally differs from $\lambda_{SSL1\text{-}BM\text{-}max}$ and $\lambda_{PHOS\text{-}RM\text{-}max}$ also generally differs from $\lambda_{SSL1\text{-}RM\text{-}max}$. On the other hand, $\lambda_{SSL1\text{-}RL\text{-}max}$ may sometimes assume a same value as $\lambda_{SSL1\text{-}RM\text{-}max}$.

<Index $A_{cg}$ ($\varphi_{SSL1}(\lambda)$)>

The index $A_{cg}$ ($\varphi_{SSL1}(\lambda)$) is defied as below, as disclosed as the index $A_{cg}$ in Japanese Patent No. 5252107 and Japanese Patent No. 5257538.

Let $\varphi_{refl}(\lambda)$ and $\varphi_{SSL1}(\lambda)$ respectively denote spectral power distributions of calculational reference light and test light which represent color stimuli that differ from one another when measuring light emitted in a main radiant direction from a light-emitting device of the first aspect of the first invention, $x(\lambda)$, $y(\lambda)$, and $z(\lambda)$ denote a color-matching function, and ($X_{refl}$, $Y_{refl}$, $Z_{refl}$) and ($X_{SSL1}$, $Y_{SSL1}$, $Z_{SSL1}$) respectively denote tristimulus values corresponding to the calculational reference light and the test light. In this case, the following is satisfied regarding the calculational reference light and the test light, where k denotes a constant.

$Y_{refl} = k \int \varphi_{refl}(\lambda) \cdot y(\lambda) d\lambda$ $Y_{SSL1} = k \int \varphi_{SSL1}(\lambda) \cdot y(\lambda) d\lambda$ At this point, normalized spectral power distributions obtained by normalizing the spectral power distributions of the calculational reference light and the test light by their respective Y were defined as $S_{refl}(\lambda) = \varphi_{refl}(\lambda)/Y_{refl}$ and $S_{SSL1}(\lambda) = \varphi_{SSL1}(\lambda)/Y_{SSL1}$, and a difference between the normalized reference light spectral power distribution and the normalized test light spectral power distribution was represented by $\Delta S_{SSL1}(\lambda) = S_{refl}(\lambda) - S_{SSL1}(\lambda)$.

Furthermore, at this point, the index $A_{cg}$ ($\varphi_{SSL1}(\lambda)$) was defined as follows.

$A_{cg}(\varphi_{SSL1}(\lambda)) = \int_{\Lambda1}^{\Lambda2} \Delta S_{SSL1}(\lambda) d\lambda + \int_{\Lambda2}^{\Lambda3}(-\Delta S_{SSL1}(\lambda)) d\lambda + \int_{\Lambda3}^{\Lambda4} \Delta S_{SSL1}(\lambda) d\lambda$ [Expression 7]

Moreover, upper and lower limit wavelengths of the integrals were respectively set to $\Lambda1 = 380$ nm, $\Lambda2 = 495$ nm, and $\Lambda3 = 590$ nm.

In addition, $\Lambda4$ is defined by dividing $\Lambda4$ into the two cases described below. First, if a wavelength that provides a longest wavelength local maximum value in a range of 380 nm or more and 780 nm or less in a normalized test light spectral power distribution $S_{SSL1}(\lambda)$ is denoted by $\lambda_{SSL1\text{-}RL\text{-}max}$ (nm) and a normalized spectral intensity thereof is denoted by $S_{SSL1}(\lambda_{SSL1\text{-}RL\text{-}max})$, then a wavelength which is on a longer wavelength-side of $\lambda_{SSL1\text{-}RL\text{-}max}$ and which has an intensity of $S_{SSL1}(\lambda_{SSL1\text{-}RL\text{-}max})/2$ is denoted as $\Lambda4$. If such a wavelength does not exist in a range up to 780 nm, then $\Lambda4$ is assumed to be 780 nm.

<Narrow-Band/Wide-Band>

A narrow-band light-emitting element according to the first aspect of the first invention shares the same definition as Japanese Patent No. 5252107 and Japanese Patent No. 5257538 and refers to a light-emitting element, the full-width at half-maximum of which is ⅔ or less with respect to 115 nm, 95 nm, and 190 nm which respectively represent region widths of a short wavelength region (380 nm to 495 nm), an intermediate wavelength region (495 nm to 590 nm), and a long wavelength region (590 nm to 780 nm).

Conversely, a wide-band light-emitting element according to the first aspect of the first invention refers to a light-emitting element the full-width at half-maximum of which is wider than ⅔ with respect to 115 nm, 95 nm, and 190 nm which respectively represent region widths of the short wavelength region (380 nm to 495 nm), the intermediate wavelength region (495 nm to 590 nm), and the long wavelength region (590 nm to 780 nm). In other words, generally, a light-emitting element with a full-width at half-maximum of approximately 77 nm or more in the short wavelength region, approximately 64 nm or more in the intermediate wavelength region, and approximately 127 nm or more in the long wavelength region is a wide-band light-emitting element.

<Notation of Chromaticity of Light Source>

Chromaticity points of the light-emitting device according to the first aspect of the first invention are explicitly indicated as follows. Chromaticity derived from a spectral power distribution of light emitted from the light-emitting device in the main radiant direction can be discussed using, for example, the CIE 1931 (x, y) chromaticity diagram or the CIE 1976 (u', v') chromaticity diagram. However, since a position on a chromaticity diagram can be described in an easily-understood manner using correlated color temperature CCT and deviation $D_{uv}$, the (u', (2/3)v') chromaticity diagram (synonymous with the CIE 1960 (u, v) chromaticity diagram) is particularly used in the first aspect of the first invention.

Moreover, deviation $D_{uv}$ of the first aspect of the first invention is an amount defined by ANSI C78.377 and represents a distance of closest approach to a black-body radiation locus on a (u',(2/3)v') chromaticity diagram as an absolute value thereof. Furthermore, a positive sign means that a chromaticity point of a light-emitting device is above (on a side where v' is greater than) the black-body radiation locus, and a negative sign means that the chromaticity point of the light-emitting device is below (on a side where v' is smaller than) the black-body radiation locus.

<$\varphi_{SSL1\text{-}BG\text{-}min}/\varphi_{SSL1\text{-}BM\text{-}max}$ and $\varphi_{SSL1\text{-}BG\text{-}min}/\varphi_{SSL1\text{-}RM\text{-}max}$>

$\varphi_{SSL1\text{-}BG\text{-}min}$ mainly appears in a portion where a longer wavelength-side tail (a base portion where spectral radiant flux intensity decreases) of a spectral radiant flux due to emission of light by a blue semiconductor light-emitting element and a shorter wavelength side tail (a base portion where spectral radiant flux intensity decreases) of a spectral radiant flux due to emission of light by a light-emitting element responsible for the intermediate wavelength region overlap with each other. In other words, $\varphi_{SSL1\text{-}13G\text{-}min}$ often occurs as a recess with a shape of $\varphi_{SSL1}(\lambda)$ in a range of 465 nm or more and 525 nm or less which straddles the short wavelength region and the intermediate wavelength region.

In order to relatively uniformly improve saturation of color appearance of the 15 specific mathematically-derived Munsell renotation color samples to be described later, $\varphi_{SSL1\text{-}BG\text{-}min}/\varphi_{SSL1\text{-}BM\text{-}max}$ obtained by normalizing $\varphi_{SSL1\text{-}BG\text{-}min}$ with a maximum value of spectral intensity in a range of 430 nm to 495 nm and $\varphi_{SSL1\text{-}BG\text{-}min}/\varphi_{SSL1\text{-}RM\text{-}max}$ obtained by normalizing $\varphi_{SSL1\text{-}BG\text{-}min}$ with a maximum value of spectral intensity in a range of 590 nm to 780 nm must be controlled with care. In other words, in the light-emitting device according to the first aspect of the first invention, $\varphi_{SSL1\text{-}BG\text{-}min}/\varphi_{SSL1\text{-}BM\text{-}max}$ and $\varphi_{SSL1\text{-}BG\text{-}min}/\varphi_{SSL1\text{-}RM\text{-}max}$ have optimum ranges as will be described later.

<Reference Light, Experimental Reference Light, and Test Light>

In the first aspect of the first invention, reference light defined by CIE and used in calculations for predicting a mathematical color appearance is described as reference light, reference light for calculation, calculation reference light, and the like. On the other hand, reference light for experiments used in actual visual comparisons such as light of an incandescent bulb having a tungsten filament or the like is described as reference light, reference light for experiment, experimental reference light, and the like. In addition, light with high $R_a$ and high $R_i$, the color appearance of which is predicted to approach that of reference light such as light from an LED light source including a purple semiconductor light-emitting element and a blue/green/red phosphor is also described as reference light, reference light for experiment, experimental reference light, and the like. Furthermore, light as an object of a mathematical or experimental consideration may sometimes be described as test light in comparison to reference light.

<Method for Quantifying Color Appearance of Illuminated Object>

In order to quantitatively evaluate the color appearance of an object illuminated by light based on the spectral power distribution of the light, a color sample with known mathematical spectral reflection characteristics is defined, a case where illumination by calculation reference light is assumed is compared with a case where illumination by test light is assumed, and a "difference in color appearances" of the color sample is used as an index.

Although test colors used in CRI may generally be considered as options, the color samples $R_1$ to $R_8$ used to derive average color rendition indexes are color samples with intermediate chroma and are therefore unsuitable for discussing saturation of colors with high chroma. In addition, while $R_9$ to $R_{12}$ are high-chroma color samples, there are not enough samples for a detailed discussion covering a range of all hue angles.

Therefore, it was decided that 15 color samples (one color sample per hue) be selected from color samples which have the highest chroma and which are positioned outermost in a Munsell color circle according to the Munsell renotation color system. Moreover, these are the same color samples used in CQS (Color Quality Scale) (versions 7.4 and 7.5) that is a new color rendition index proposed by NIST (National Institute of Standards and Technology), U.S.A. The 15 color samples used in the first aspect of the first invention will be listed below. In addition, a number assigned for convenience sake are provided before each color sample. Moreover, in the present specification, these numbers will sometimes be represented by n. For example, n=3 signifies "5PB 4/12". n denotes a natural number from 1 to 15.

| #01 | 7.5P   | 4/10   |
|-----|--------|--------|
| #02 | 10PB   | 4/10   |
| #03 | 5PB    | 4/12   |
| #04 | 7.5B   | 5/10   |
| #05 | 10BG   | 6/8    |
| #06 | 2.5BG  | 6/10   |
| #07 | 2.5G   | 6/12   |
| #08 | 7.5GY  | 7/10   |
| #09 | 2.5GY  | 8/10   |
| #10 | 5Y     | 8.5/12 |
| #11 | 10YR   | 7/12   |
| #12 | 5YR    | 7/12   |
| #13 | 10R    | 6/12   |
| #14 | 5R     | 4/14   |
| #15 | 7.5RP  | 4/12   |

In the first aspect of the first invention, from the perspective of deriving various indices, an attempt was made to quantify in what way the color appearance of the 15 color samples listed above changes (or does not change) between a case where the colors are assumed to be illuminated by calculational reference light and a case where the colors are assumed to be illuminated by test light when a color appearance or an object appearance that is as natural, vivid, highly visible, and comfortable as though perceived in an outdoor high-illuminance environment is achieved even in an ordinary indoor illuminance environment, and to extract results of the quantification as a color rendering property that should be attained by a light-emitting device.

Moreover, selection of a color space and selection of a chromatic adaptation formula are also important when quantitatively evaluating color appearance that is mathematically derived from the spectral power distributions described above. In the first aspect of the first invention, CIE 1976 L*a*b* (CIELAB) that is a uniform color space currently recommended by the CIE was used. In addition, CMC-CAT2000 (Colour Measurement Committee's Chromatic Adaptation Transform of 2000) was adopted for chromatic adaptation calculation.

Moreover, while the CIELAB color space is a three-dimensional color space, since the first aspect of the first invention mainly focuses chroma and hue, lightness has been omitted in the CIELAB color space according to the first aspect of the first invention and only the a* and b* axes are plotted two-dimensionally. In addition, in the CIELAB color space used when describing experimental examples, comparative experimental examples, and the like according to the first aspect of the first invention, points connected by dotted lines in the drawings represent results when assuming illumination by a calculation reference light and solid lines represent results when assuming illumination by respective test lights.

Furthermore, specifically, quantification related to color appearance is performed as follows. First, when the light-emitting device according to the first aspect of the first invention emits test light in the main radiant direction, the a* values and the b* values of the 15 color samples in the CIE 1976 L*a*b* color space of the test light (related to the light-emitting device according to the first aspect of the first invention) are to be respectively denoted by $a^*_{nSSL1}$ and $b^*_{nSSL1}$ (where n is a natural number from 1 to 15), and hue angles of the 15 color samples are to be respectively denoted by $\theta_{nSSL1}$ (degrees) (where n is a natural number from 1 to 15). In addition, when mathematically assuming illumination by a calculation reference light (black-body radiation light when lower than 5000 K and CIE daylight when equal to or higher than 5000 K) which is selected in accordance with the correlated color temperature $T_{SSL1}$ of the test light described above, the a* values and the b* values of the 15 color samples in the CIE 1976 L*a*b* color space are to be respectively denoted by $a^*_{nrefl}$ and $b^*_{nrefl}$ (where n is a natural number from 1 to 15), and hue angles of the 15 color samples are to be respectively denoted by $\theta_{nrefl}$ (degrees) (where n is a natural number from 1 to 15). In this case, an absolute value $|\Delta h_{nSSL1}|$ of each difference in hue angles $\Delta h_{nSSL1}$ (degrees) (where n is a natural number from 1 to 15) of each of the 15 Munsell renotation color samples when illuminated by the two types of light may be represented by $$|\Delta h_{nSSL1}| = |\theta_{nSSL1} - \theta_{nrefl}|.$$

A mathematically-predicted each difference in hue angles related to the 15 Munsell renotation color samples particularly selected in the first aspect of the first invention are defined as described above because the present inventor considers each difference in hue angles to be an important index as means for comprehensively evaluating various objects and color appearances of the objects when conducting visual experiments using test light and experimental reference light or experimental pseudo-reference light and for realizing a natural, vivid, highly visible and comfortable appearance of colors and appearance of objects.

In addition, each saturation difference $\Delta C_{nSSL1}$ (where n is a natural number from 1 to 15) of the 15 Munsell renotation color samples when assuming illumination by the test light and the calculation reference light is represented by $$\Delta C_{nSSL1} = \sqrt{\{(a^*_{nSSL1})^2 + (b^*_{nSSL1})^2\}} - \sqrt{\{(a^*_{nref1})^2 + (b^*_{nref1})^2\}}.$$

Furthermore, an average saturation difference of the 15 Munsell renotation color samples is represented by (1-3)

$$\frac{\sum_{n=1}^{15} \Delta C_{nSSL1}}{15}$$ [Expression 8]

(hereinafter, may be denoted as $SAT_{ave}(\varphi_{SSL1}(\lambda))$. Moreover, when a maximum saturation difference value of the 15 Munsell renotation color samples is denoted by $\Delta C_{SSL-max1}$ and a minimum saturation difference value is denoted by $\Delta C_{SSL-min1}$, a difference between a maximum saturation difference and a minimum saturation difference (difference among differences between maximum and minimum degrees of saturation) is represented by $$|\Delta C_{SSL-max1} - \Delta C_{SSL-min1}|.$$

Various characteristics related to mathematically-predicted saturation differences of the 15 Munsell renotation color samples particularly selected in the first aspect of the first invention are defined as described above because the present inventor considers these characteristics to be important indexes as means for comprehensively evaluating various objects and color appearances of the objects when conducting visual experiments using test light and experimental reference light or experimental pseudo-reference light and for realizing a natural, vivid, highly visible and comfortable appearance of colors and appearance of objects.

<Luminous Efficacy of Radiation $K_{ssL1}$ (lm/W) and Luminous Efficacy of a Source $\eta_{ssL1}$ (lm/W)>

Furthermore, when evaluating the test light spectral power distribution $\varphi_{SSL1}(\lambda)$ when measuring light emitted in a main radiant direction from a light-emitting device of the first aspect of the first invention, the widely-used definition below was adopted for luminous efficacy of radiation $K_{SSL1}$ (lm/W).

$$K_{SSL1} = Km \times [\int_{380}^{780} \{\varphi_{SSL1}(\lambda) \times V(\lambda)\} d\lambda] / [\int_{380}^{780} \varphi_{SSL1}(\lambda) d\lambda]$$ [Expression 9]

In the equation above,
$K_m$: maximum luminous efficacy (lm/W),
$V(\lambda)$: spectral luminous efficiency, and
$\lambda$: wavelength (nm).

Therefore, a luminous efficacy of radiation $K_{SSL1}$ (lm/W) of a test light spectral power distribution $\varphi_{SSL1}(\lambda)$ when measuring light in the main radiant direction emitted from the light-emitting device according to the first aspect of the first invention can be described as efficiency inherent in the shape of the spectral power distribution.

On the other hand, light source efficiency $\eta_{SSL1}$ (lm/W) is a quantity indicating how much of power supplied to the light-emitting device according to the first aspect of the first invention is converted into a luminous flux.

Furthermore, the luminous efficacy of radiation $K_{SSL1}$ (lm/W) of a test light spectral power distribution $\varphi_{SSL1}(\lambda)$ when measuring light in the main radiant direction emitted from the light-emitting device is efficiency inherent in the shape of the spectral power distribution itself and may be described as a quantity that equals light source efficiency $\eta_{SSL1}$ (lm/W) when assuming that characteristics of all materials constituting the light-emitting device (for example, internal quantum efficiency of semiconductor light-emitting elements, light extraction efficiency, internal quantum efficiency of phosphors, external quantum efficiency of phosphors, and efficiency related to light transmission characteristics of encapsulants) have 100% efficiency.

<Conception of Invention>

The present inventor mathematically and experimentally considered whether or not both favorable color appearance and high light source efficiency can be achieved when the index $A_{cg}(\varphi_{SSL1}(\lambda))$ has a value outside a range of −360 or more and −10 or less and, particularly, a value larger than −10.

Figures 1, 2:
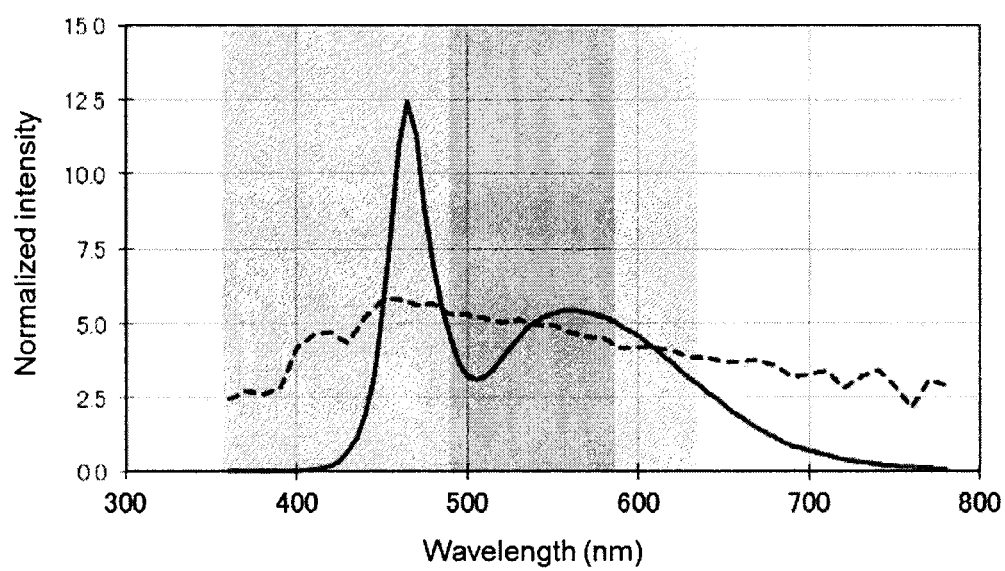
Figures 1, 2, 3:
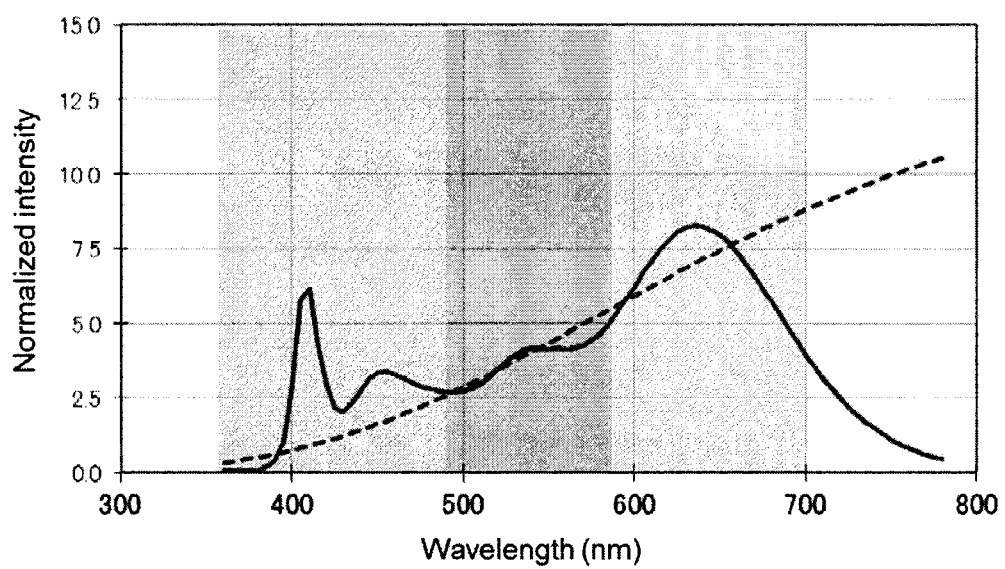

The index $A_{cg}(\varphi_{SSL1}(\lambda))$ is an index used when a visible range related to radiation that acts as color stimuli is roughly divided into a short wavelength region (380 nm or more and less than 495 nm in a blue region including purple and the like), an intermediate wavelength region (495 nm or more and less than 590 nm in a green region including yellow and the like), and a long wavelength region (590 nm or more and 780 nm or less in a red region including orange and the like) to perform a comparison with mathematical normalized reference light spectral power distributions to determine whether or not irregularities in a spectral power distribution exist at an appropriate intensity at appropriate positions in the normalized reference light spectral power distributions. As illustrated in FIGS. 1-2 and 1-3, integration ranges of the long wavelength region differ depending on positions of longest wavelength local maximum values. In addition, selections of calculational reference light differ according to a correlated color temperature $T_{SSL1}$ of test light. In the case of FIG. 1-2, since the CCT of the test light depicted by a solid line in FIG. 1-2 is equal to or higher than 5000 K, CIE daylight is selected as the reference light as depicted by a dotted line in FIG. 1-2. In the case of FIG. 1-3, since the CCT of the test light depicted by a solid line in FIG. 1-3 is lower than 5000 K, black-body radiator is selected as the reference light as depicted by a dotted line in FIG. 1-3. Moreover, shaded portions in the drawings schematically represent integral ranges of the short wavelength range, the intermediate wavelength range, and the long wavelength range.

As disclosed as the index $A_{cg}$ in Japanese Patent No. 5252107 and Japanese Patent No. 5257538, a requirement for realizing "a light-emitting device capable of realizing a natural, vivid, highly visible and comfortable appearance of colors and appearance of objects" is that the index $A_{cg}(\varphi_{SSL1}(\lambda))$ is within a range of −360 or more and −10 or less. These can be understood as follows.

In the short wavelength range, a first term of $A_{cg}(\varphi_{SSL1}(\lambda))$ (an integral of $\Delta S_{SSL1}(\lambda)$) is more likely to have a negative value when a distribution intensity of the normalized test light spectral power distribution is higher than that of the mathematically normalized reference light spectral power distribution.

In the intermediate wavelength range, conversely, a second term of $A_{cg}(\varphi_{SSL1}(\lambda))$ (an integral of $-\Delta S_{SSL1}(\lambda)$) is more likely to have a negative value when a distribution intensity of the normalized test light spectral power distribution is lower than that of the normalized reference light spectral power distribution.

Furthermore, in the long wavelength range, a third term of $A_{cg}(\varphi_{SSL1}(\lambda))$ (an integral of $\Delta S_{SSL1}(\lambda)$) is more likely to have a negative value when a distribution intensity of the normalized test light spectral power distribution is higher than that of the normalized reference light spectral power distribution.

In other words, it can be understood that one of the requirements for realizing "a light-emitting device capable of realizing a natural, vivid, highly visible and comfortable appearance of colors and appearance of objects" is fulfilled when such a tendency exists.

Moreover, as described earlier, the calculation reference light changes depending on CCT of test light. In other words, black-body radiator is used as the calculational reference light when the CCT of the test light is lower than 5000 K, and defined CIE daylight is used as the calculational reference light when the CCT of the test light is equal to or higher than 5000 K. When deriving a value of $A_{cg}(\varphi_{SSL1}(\lambda))$, mathematically defined black-body radiation light or CIE daylight is used for $\varphi_{refl}(\lambda)$ and a simulated function or a value obtained by measuring light emitted in a main radiant direction by a prototype light-emitting device in an experiment is used as $\varphi_{SSL1}(\lambda)$.

On the other hand, in order to improve light source efficiency of a light source, a substantially different shape from the spectral power distributions disclosed in Japanese Patent No. 5252107 and Japanese Patent No. 5257538 is required when also considering a shape of spectral luminous efficiency $V(\lambda)$.

With respect to a first term (a wavelength integration of $\Delta S_{SSL1}(\lambda)$ from 380 nm to 495 nm) and a third term (a wavelength integration of $\Delta S_{SSL1}(\lambda)$ from 590 nm to $\Lambda 4$ or 780 nm) of the index $A_{cg}(\varphi_{SSL1}(\lambda))$, desirably, spectral intensity of the normalized test light spectral power distribution is not excessively stronger than that of the normalized reference light spectral power distribution or, in other words, the wavelength integration of $\Delta S_{SSL1}(\lambda)$ does not assume an excessively negative value and is within an appropriate range. This is due to the fact that, since $V(\lambda)$ in these regions has a relatively small value, a contribution of $V(\lambda)$ towards improving luminous flux is small even if excessively strong radiation exists in these regions. In addition, in terms of improving light source efficiency, with respect to a second term (a wavelength integration of $-\Delta S_{SSL1}(\lambda)$ from 495 nm to 590 nm) of the index $A_{cg}(\varphi_{SSL1}(\lambda))$, spectrum intensity of the normalized test light spectral power distribution is not excessively weaker than that of the normalized reference light spectral power distribution or, in other words, the wavelength integration of $-\Delta S_{SSL1}(\lambda)$ does not assume an excessively negative value and is within an appropriate range. This is due to the fact that, since $V(\lambda)$ in this region has a relatively large value, the contribution of $V(\lambda)$ towards improving luminous flux is reduced if excessively weak radiation exists in this region.

In consideration thereof, based on the ideas discussed above, the present inventor examined whether or not a light source with higher light source efficiency and superior color appearance of illuminated objects can be realized by a spectral power distribution that completely differs from the disclosed contents of Japanese Patent No. 5252107 and Japanese Patent No. 5257538, and arrived at the light-emitting device according to the first aspect of the first invention. A specific method used is as follows.

First, as a light-emitting element that emits light in the intermediate wavelength region, a wide-band light-emitting element which differs from the narrow-band light-emitting elements disclosed as preferable cases in Japanese Patent No. 5252107 and Japanese Patent No. 5257538 was selected. It was thought that making such a selection reduces "excessive irregularities in the normalized test light spectral power distribution as compared with the normalized reference light spectral power distribution" in the intermediate wavelength region and prevents the spectrum intensity of the normalized test light spectral power distribution from becoming excessively weaker than that of the normalized reference light spectral power distribution in the second term (a wavelength integration of $-\Delta S_{SSL1}(\lambda)$ from 495 nm to 590 nm) of the index $A_{cg}(\varphi_{SSL1}(\lambda))$.

In addition, the selection of a phosphor-exciting light source in an LED light-emitting device was also made with the intention of reducing "excessive irregularities in the normalized test light spectral power distribution as compared with the normalized reference light spectral power distribution" in the short wavelength region and preventing the first term (a wavelength integration of $\Delta S_{SSL1}(\lambda)$ from 380 nm to 495 nm) of the index $A_{cg}(\varphi_{SSL1}(\lambda))$ from taking an excessively negative value. In other words, in order to prevent the spectrum intensity of the normalized test light spectral power distribution from becoming excessively stronger than that of the normalized reference light spectral power distribution, an emission wavelength of the phosphor-exciting light source was arranged in a region where the spectral intensity of the normalized reference light spectral power distribution is relatively high. Specifically, a blue semiconductor light-emitting element was selected as the phosphor-exciting light source instead of a purple semiconductor light-emitting element.

<Method and Conclusion of Experiment>

An experiment for completing the light-emitting device according to the first aspect of the first invention was performed and concluded as follows.

As the light-emitting device, a packaged LED was prepared by including various semiconductor light-emitting elements, various phosphors, an encapsulant, and the like in a small square package measuring 3.5 mm×3.5 mm. A prototype of an LED lamp including the packaged LED was also made.

In order to ensure fair comparisons of the various prototype light-emitting devices, although the various semiconductor light-emitting elements, various phosphors, and compositions thereof were altered for each device, all of the light sources used the same small package material, mounting positions/methods of the semiconductor light-emitting elements, LED lamp shape/material, and the like. In addition, the LED lamps were mounted with lenses made of a material with flat transmission characteristics from 350 nm to around 800 nm in order to preserve the spectral radiation characteristics of the packaged LEDs included in the LED lamps to the greatest extent feasible.

Under such conditions, a radiometric property and a photometric property of each light-emitting device were measured. In addition, the color appearance of the 15 Munsell renotation color samples described above when assuming illumination by light having the spectral power distribution of each light-emitting device was compared with the color appearance of the 15 Munsell renotation color samples when assuming illumination by calculation reference light to mathematically derive how the color appearance changes (or does not change) from a colorimetric perspective, and the color appearance was quantitatively evaluated using the indexes described earlier.

Furthermore, in the experiment of the first aspect of the first invention, a comparative visual experiment was also conducted in which test subjects were asked to determine superiority or inferiority of color appearance. In the comparative visual experiment, an experimental reference light was prepared for each color temperature group shown in Table 1-1 by referring to ANSI C78.377, a same illuminated object was respectively independently illuminated by test light and the experimental reference light, and the test subjects were asked to classify which of the lights illuminated the illuminated object so as to produce a more superior color appearance into 11 categories including rank −5, rank −4, rank −3, rank −2, rank −1, rank 0, rank +1, rank +2, rank +3, rank +4, and rank +5.

TABLE 1-1

[Table 1]

| Names of groups divided for each CCT during comparative visual experiment | Upper and lower limits of CCT (K) in each group | Other |
|---|---|---|
| A | ~2 5 8 0 | |
| B | 2 5 8 0~2 8 7 0 | |
| C | 2 8 7 0~3 2 2 0 | |
| D | 3 2 2 0~3 7 1 0 | |
| E | 3 7 1 0~4 2 6 0 | Example of experimental reference light (Comparative experimental example 101) |
| F | 4 2 6 0~4 7 4 5 | |
| G | 4 7 4 5~5 3 1 0 | |
| H | 5 3 1 0~6 0 2 0 | |
| I | 6 0 2 0~ | |

In this case, as the experimental reference light, a light-emitting device having chromaticity coordinates as close to a black-body locus as possible was prepared. The light-emitting device for emitting experimental reference light was configured as shown in, for example, Comparative Experimental Example 101 using a purple semiconductor light-emitting element with an emission peak wavelength of 410 nm when emitting light by itself, an SBCA phosphor as a blue phosphor, a β-SiAlON phosphor with a peak wavelength of 545 nm and a full-width at half-maximum of 55 nm during light excitation as a narrow-band green phosphor, and a CASON phosphor with a peak wavelength of 645 nm and a full-width at half-maximum of 99 nm during light excitation as a red phosphor so as to prepare light with a high $R_a$ and a high $R_i$ which conceivably produces color appearance approaching a mathematical reference light. For example, spectral radiation characteristics shown in Comparative Experimental Example 101 are an example of the experimental reference light of group E when classified according to CCT during the comparative visual experiment. The calculated CCT was 4116 K, $D_{uv}$ was −0.0017, and $R_a$ was 98.0. Moreover, for the other CCT groups, a light-emitting device which has chromaticity coordinates as close to a black-body locus as possible and which emits light with a high $R_a$ and a high $R_i$ that conceivably produces color appearance approaching a mathematical reference light when illuminating an illuminated object was similarly prepared.

When conducting the comparative visual experiment, in order to suppress changes in luminance due to switching light-emitting devices, distances between the illuminated objects and the light-emitting devices were adjusted, drive power supplies were changed to adjust an amount of current supplied to the LED lamps, and the like so that luminance at the positions of the illuminated objects was approximately the same. In addition, luminance during the comparative visual experiment was set to a range of approximately 100 lx to approximately 7000 lx.

In addition, the following illuminated objects and the like were prepared for the comparative visual experiment. Due consideration was given to preparing chromatic objects so that colors of all hues including purple, bluish purple, blue, greenish blue, green, yellowish green, yellow, reddish yellow, red, and reddish purple were represented. In addition, these objects were prepared in wide varieties and in large numbers including still objects, flowers, food, clothing, and printed material. Furthermore, the skins of the subjects (Japanese) themselves were also included in the experiment as observation objects. Moreover, the color names partially added to the object names listed below simply signify that such objects will appear in such colors in ordinary environments and are not accurate representations of the colors.

White ceramic plate, white asparagus, white mushroom, white preserved flower, white handkerchief, white dress shirt, white rice
Purple preserved flower
Bluish purple cloth handkerchief, blue jeans, blue preserved flower, greenish blue towel
Green bell pepper, lettuce, shredded cabbage, broccoli, green lime, green apple
Yellow banana, yellow bell pepper, greenish yellow lemon, yellow preserved flower, fried egg
Orange orange, orange bell pepper, carrot
Red tomato, red apple, red bell pepper, red sausage, red preserved flower
Black preserved flower
Pink necktie, pink preserved flower
Russet necktie, croquette, pork cutlet, burdock, cookie, chocolate, peanut, woodenware
Skin of subjects (Japanese)
Newspaper, color printed matter including black letters on white background (polychromatic), paperback, weekly magazine
Silver watch (white dial-plate)
Color checkers (Color checker classic manufactured by X-Rite; total of 24 color samples including 18 chromatic colors and six achromatic colors (one white, four grey, and one black)).

Moreover, names and Munsell notations of the respective color samples in the color checker are as follows.

| Name | Munsell Notation |
|---|---|
| Dark skin | 3.05YR 3.69/3.20 |
| Light skin | 2.2YR 6.47/4.10 |
| Blue sky | 4.3PB 4.95/5.55 |
| Foliage | 6.65GY 4.19/4.15 |
| Blue flower | 9.65PB 5.47/6.70 |
| Bluish green | 2.5BG 7/6 |
| Orange | 5YR6/11 |
| Purplish blue | 7.5PB 4/10.7 |
| Moderate red | 2.5R 5/10 |
| Purple | 5P 3/7 |
| Yellow green | 5GY 7.08/9.1 |
| Orange yellow | 10YR 7/10.5 |
| Blue | 7.5PB 2.90/12.75 |
| Green | 0.1G 5.38/9.65 |
| Red | 5R 4/12 |
| Yellow | 5Y 8/11.1 |
| Magenta | 2.5RP 5/12 |
| Cyan | 5B 5/8 |

-continued

| Name | Munsell Notation |
|---|---|
| White | N 9.5/ |
| Neutral 8 | N 8/ |
| Neutral 6.5 | N 6.5/ |
| Neutral 5 | N 5/ |
| Neutral 3.5 | N 3.5/ |
| Black | N 2/ |

Rankings obtained by the comparative visual experiment were statistically processed based on the results of classifications by the test subjects as follows. Cases where the result was the same as or comparable with the experimental reference light or when there was no perceptible change were classified as rank 0. In addition, when "a natural, vivid, highly visible and comfortable appearance of colors and appearance of objects were realized", cases where the result was slightly favorable were classified as rank +1, cases where the result was favorable were classified as rank +2, cases where the result was more favorable were classified as rank +3, cases where the result was extremely favorable were classified as rank +4, and cases where the result was dramatically favorable were classified as rank +5. Conversely, when "a natural, vivid, highly visible and comfortable appearance of colors and appearance of objects were not realized", depending on degrees of the results, cases where the result was slightly unfavorable were classified as rank −1, cases where the result was unfavorable were classified as rank −2, cases where the result was more unfavorable were classified as rank −3, cases where the result was extremely unfavorable were classified as rank −4, and cases where the result was dramatically unfavorable were classified as rank −5.

When determining the ranks, the test subjects were instructed to observe and comprehensively grade the illuminated objects from the following perspectives. Specifically, when the illuminated objects were illuminated by the respective light-emitting devices in comparison with being illuminated by the experimental reference light, A) whether or not "achromatic color appearances" such as black and white are favorably perceived, B) whether or not characters used on printed matter, newspapers, and the like including black letters on a white background are readily legible, C) whether or not "chromatic color appearances" having various hues including a test subject's own skin color are favorably perceived, D) whether or not colors of objects having similar hues (for example, two red bell peppers as different individual objects) are readily distinguishable, and E) whether or not increased brightness can be perceived (whether or not a sense of brightness increases) at the same luminance.

Moreover, among the various indexes organized in Tables 1-2 to 1-15 presented below, fields with the description "light-emitting element" indicate characteristics of single light-emitting elements as described above while fields with the description "light-emitting device" represent results of measurements as a packaged LED. Fields with the description "color appearance" represent results obtained by calculation from a spectral power distribution of the packaged LEDs and fields with the description "comparative visual experiment result" represent results of classification related to the color appearance of the illuminated objects during the comparative visual experiment using LED lamps containing the packaged LEDs.

Hereinafter, while the first invention of the present invention will be described in detail using the examples and the comparative examples, it is needless to say that the scope of the first invention of the present invention is not limited to the experimental examples and the like presented below.

<Overview>

First, an overview and effects of the first aspect of the first invention will be described using the four types of light-emitting devices shown in Table 1-2 as an example.

TABLE 1-2-1

| | Light-emitting element | | | | Light-emitting device | | |
|---|---|---|---|---|---|---|---|
| | Excitation source peak wavelength (nm) or dominant wavelength (nm) | Type of phosphor in short wavelength region peak wavelength (nm) full-width at half-maximum (nm) | Type of phosphor in intermediate wavelength region peak wavelength (nm) full-width at half-maximum (nm) | Type of phosphor in long wavelength region peak wavelength (nm) full-width at half-maximum (nm) | $T_{SSL1}$ (K) | $D_{uv}$ ($\varphi_{SSL1}(\lambda)$) | $A_{cg}$ ($\varphi_{SSL1}(\lambda)$) |
| Comparative experimental example 101 | 410 | SBCA 455 54 | β-SiAlON 545 55 | CASON 645 99 | 4116 | −0.0017 | 64.1 |
| Comparative experimental example 102 | 410 | SBCA 455 54 | β-SiAlON 545 55 | CASON 645 99 | 4158 | −0.0101 | −44.9 |
| Reference experimental example 101 | 457.5 | === | CSMS 514 106 | CASN 660 88 | 3807 | −0.0122 | −58.7 |
| Experimental example 101 | 457.5 | === | CSO 520 96 | CASN 660 88 | 4160 | −0.0103 | 10.4 |

TABLE 1-2-1-continued

| | Light-emitting device | | | | | |
|---|---|---|---|---|---|---|
| | $\lambda_{SSL1\text{-}BM\text{-}max}$ (nm) | $\varphi_{SSL1\text{-}BG\text{-}min}/\varphi_{SSL1\text{-}BM\text{-}max}$ | $\lambda_{SSL1\text{-}RM\text{-}max}$ (nm) | $\varphi_{SSL1\text{-}BG\text{-}min}/(\varphi_{SSL1}\text{-}RM\text{-}max)$ | $K_{SSL1}$ (lm/W) | $\eta_{SSL1}$ (lm/W) |
| Comparative experimental example 101 | 410 | 1.5048 | 629 | 0.6093 | 257.3 | 49.6 |
| Comparative experimental example 102 | 406 | 0.9405 | 630 | 0.5530 | 233.0 | 45.9 |
| Reference experimental example 101 | 452 | 0.4460 | 650 | 0.3561 | 222.0 | 48.0 |
| Experimental example 101 | 452 | 0.3335 | 647 | 0.3593 | 235.2 | 54.4 |

TABLE 1-2-2

| | Indexes extracted from calculations on 15 specific Munsell renotation color samples | | | | | | | Result of | |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ $(\varphi_{SSL1}(\lambda))$ | $\Delta C_{SSL\text{-}max1}$ | $\Delta C_{SSL\text{-}min1}$ | $|\Delta C_{SSL\text{-}max1} - \Delta C_{SSL\text{-}min1}|$ | Ra | comparative visual experiment | Drawing number |
| Comparative experimental example 101 | 1.81 | 0.06 | 0.45 | 1.28 | −0.43 | 1.71 | 98.0 | === | FIG. 1-4 |
| Comparative experimental example 102 | 2.96 | 0.06 | 2.34 | 4.53 | 0.86 | 3.67 | 88.3 | 4 | FIG. 1-5 |
| Reference experimental example 101 | 4.92 | 0.10 | 3.16 | 6.22 | 1.06 | 5.16 | 86.6 | 4 | FIG. 1-6 |
| Experimental example 101 | 4.96 | 0.12 | 2.61 | 5.00 | 0.20 | 4.80 | 90.3 | 5 | FIG. 1-7 |

Comparative Experimental Example 101 used a light-emitting device which produced a color appearance approaching reference light when illuminating the illuminated objects, which emitted experimental reference light with an extremely high average color rendition index ($R_a$) and a high special color rendition index ($R_i$), and of which $A_{cg}(\varphi_{SSL1}(\lambda))$ was +64.1. The light source was realized by using a purple semiconductor light-emitting element as a phosphor-exciting light source and a narrow-band β-SiAlON (with a wavelength providing maximum emission intensity when light is excited by a phosphor alone of 545 nm and a full-width at half-maximum of 55 nm) as a green phosphor.

Moreover, details of the SBCA phosphor, the β-SiAlON phosphor, and the CASON phosphor described in the present specification are the same as the materials disclosed in Japanese Patent No. 5252107 and Japanese Patent No. 5257538.

Comparative Experimental Example 102 used a light-emitting device which emitted the light disclosed in Japanese Patent No. 5252107 and Japanese Patent No. 5257538 and of which $A_{cg}(\varphi_{SSL1}(\lambda))$ was −44.9. In a similar manner to Comparative Experimental Example 101, this light source was also realized by using a purple semiconductor light-emitting element as a phosphor-exciting light source and a narrow-band β-SiAlON (with a wavelength providing maximum emission intensity when light is excited by a phosphor alone of 545 nm and a full-width at half-maximum of 55 nm) as a green phosphor.

Reference Experimental Example 101 also used a light-emitting device which emitted light within the scopes of Japanese Patent No. 5252107 and Japanese Patent No. 5257538 and of which $A_{cg}(\varphi_{SSL1}(\lambda))$ was −8.7. However, this light source was realized by using a blue semiconductor light-emitting element as a phosphor-exciting light source and a wide-band CSMS (with a wavelength providing maximum emission intensity when light is excited by a phosphor alone of 514 nm and a full-width at half-maximum of 106 nm) as a green phosphor.

Meanwhile, Experimental Example 101 used a novel light-emitting device which emitted light disclosed in neither Japanese Patent No. 5252107 nor Japanese Patent No. 5257538 and of which $A_{cg}(\varphi_{SSL1}(\lambda))_{was}$+10.4. This light source was realized by using a blue semiconductor light-emitting element as a phosphor-exciting light source and a wide-band CSO (with a wavelength providing maximum emission intensity when light is excited by a phosphor alone of 520 nm and a full-width at half-maximum of 96 nm) as a green phosphor.

Moreover, for purposes of comparison, these four light-emitting devices were all given correlated color temperatures (approximately 3800 to 4200 K) that are close to one another. In addition, with the exception of the light-emitting device of Comparative Experimental Example 101 which was prepared as experimental reference light, $D_{uv}(\varphi_{SSL1}(\lambda))$ also had values close to one another (approximately −0.0100 to −0.0125).

Furthermore, details of constituent materials and characteristics thereof of each light source and characteristics as light-emitting devices were as summarized in Table 1-2. Table 1-2 also shows mathematically-derived results of differences between cases where the 15 specific Munsell renotation color samples were illuminated by reference light and cases where the 15 specific Munsell renotation color samples were illuminated by respective test lights. Table 1-2 further shows a result of the comparative visual experiment conducted with the light-emitting device of Comparative Experimental Example 101 which was prepared as experimental reference light as a reference and using the remaining three light-emitting devices to assess actual color appearances.

Respective spectral radiant flux characteristics of the light-emitting device of Comparative Experimental Example 101, the light-emitting device of Comparative Experimental Example 102, the light-emitting device of the Reference Experimental Example 101, and the light-emitting device of the Experimental Example 101 are shown in FIGS. 1-4 to 1-7. FIGS. 1-4 to 1-7 also show CIELAB color spaces in which color appearances in cases where the 15 specific Munsell renotation color samples were illuminated by reference light and cases where the 15 specific Munsell renotation color samples were illuminated by respective test lights are plotted together with a* values and b* values. In the CIELAB color spaces, dotted lines represent cases where illumination was provided by reference light and solid lines represent cases where illumination was provided by respective test lights.

Table 1-2, FIGS. 1-5 to 1-7, and the like reveal the following.

With the light-emitting device in Comparative Experimental Example 102, the index $A_{cg}(\varphi_{SSL1}(\lambda))$ was −44.9 and light source efficiency $\eta_{SSL1}$ as a light-emitting device was 45.9 (lm/W). In addition, from a mathematical perspective, FIG. 1-5 also shows that saturation of each hue improves relatively uniformly, and the comparative visual experiment actually determined that color appearance was more favorable than that of the light-emitting device in Comparative Experimental Example 101 and resulted in a grade of rank 4.

Furthermore, with the light-emitting device in Reference Experimental Example 101, the index $A_{cg}(\varphi_{SSL1}(\lambda))$ was −58.7 and light source efficiency $\eta_{SSL1}$ as a light-emitting device was 48.0 (lm/W). In addition, from a mathematical perspective, FIG. 1-6 also shows that saturation of each hue improves relatively uniformly, and color appearance was determined to be more favorable than that of the light-emitting device in Comparative Experimental Example 101 and resulted in a grade of rank 4.

In comparison, with the light-emitting device shown in Experimental Example 101, the index $A_{cg}(\varphi_{SSL1}(\lambda))$ was +10.4. Light source efficiency $\eta_{SSL1}$ as a light-emitting device was 54.4 (lm/W), which was relatively higher than both light-emitting devices. In addition, from a mathematical perspective, FIG. 1-7 also shows that saturation of each hue improves relatively uniformly, and color appearance was determined to be more favorable than that of the light-emitting device in Comparative Experimental Example 101 and resulted in a grade of rank 5.

In other words, the result of the light-emitting device of Experimental Example 101 can be described as illustrating, in concrete terms, that even when outside of the scopes of the light-emitting devices according to Japanese Patent No. 5252107 and Japanese Patent No. 5257538 and, in particular, even when the index $A_{cg}(\varphi_{SSL1}(\lambda))$ has a larger value than −10, there may be cases where "a light-emitting device capable of realizing a natural, vivid, highly visible and comfortable appearance of colors and appearance of objects" can be realized. Furthermore, it is shown that, precisely in such cases, the light source efficiency $\eta_{SSL1}$ of the light-emitting device may be improved.

<Detailed Description 1>

Next, the first aspect of the first invention will be described in detail by further illustrating experimental examples/comparative experimental examples.

Tables 1-3 to 1-7 show experimental examples of the first aspect of the first invention. The tables represent, in the order of table numbers, results of light-emitting devices graded rank +1 to rank +5 by the comprehensive rank classification of the comparative visual experiment. In addition, light-emitting devices classified in one rank have been sorted in order from low $T_{SSL1}$ to high $T_{SSL1}$. Furthermore, FIGS. 1-8 to 1-14 illustrate a spectral power distribution and a CIELAB color space of light emitted by a light-emitting device extracted as an example from each rank.

TABLE 1-3-1

| | Light-emitting element | | | | |
|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | Light-emitting device | |
| | | | | $T_{SSL1}$ (K) | $D_{uv}$ ($\varphi_{SSL1}(\lambda)$) |
| Experimental example 102 | 457.5 | CSMS 514 106 | SCASN 625 87 | 4049 | −0.0110 |
| Experimental example 103 | 457.5 470 | LuAG 530 104 | CASON 645 99 | 4188 | −0.0102 |
| Experimental example 104 | 462.5 | LuAG 530 104 | CASON 645 99 | 4241 | −0.0099 |

TABLE 1-3-1-continued

| | | | | | |
|---|---|---|---|---|---|
| Experimental example 105 | 457.5 | CSMS 514 106 | SCASN 625 87 | 4250 | −0.0135 |
| Experimental example 106 | 457.5 470 | LuAG 530 104 | CASON 645 99 | 4291 | −0.0075 |
| Experimental example 107 | 457.5 467.5 | LuAG 530 104 | CASON 645 99 | 4311 | −0.0072 |
| Experimental example 108 | 457.5 | LuAG 530 104 | SCASN 625 87 | 4676 | −0.0151 |
| Experimental example 109 | 460 | LuAG 540 106 | CASN 645 89 | 5387 | −0.0081 |

| | Light-emitting device | | | | | |
|---|---|---|---|---|---|---|
| | $A_{cg}$ ($\varphi_{SSL1}(\lambda)$) | $\lambda_{SSL1\text{-}BM\text{-}max}$ (nm) | $\varphi_{SSL1\text{-}BG\text{-}min}/$ $\varphi_{SSL1\text{-}BM\text{-}max}$ | $\lambda_{SSL1\text{-}RM\text{-}max}$ (nm) | $\varphi_{SSL1\text{-}BG\text{-}min}/$ $\varphi_{SSL1\text{-}RM\text{-}max}$ | $K_{SSL1}$ (lm/W) | $\eta_{SSL1}$ (lm/W) |
| Experimental example 102 | 52.9 | 452 | 0.3775 | 607 | 0.4556 | 286.9 | 70.0 |
| Experimental example 103 | 55.9 | 455 | 0.5244 | 625 | 0.5862 | 260.0 | 65.8 |
| Experimental example 104 | 36.8 | 458 | 0.4502 | 628 | 0.5962 | 257.3 | 76.3 |
| Experimental example 105 | 42.7 | 452 | 0.3551 | 606 | 0.4874 | 282.5 | 69.5 |
| Experimental example 106 | 90.1 | 450 | 0.5070 | 628 | 0.6024 | 264.3 | 72.8 |
| Experimental example 107 | 89.1 | 453 | 0.5456 | 628 | 0.6111 | 264.2 | 74.4 |
| Experimental example 108 | 58.4 | 451 | 0.2983 | 607 | 0.4835 | 282.1 | 82.5 |
| Experimental example 109 | 14.7 | 459 | 0.4243 | 630 | 0.7548 | 255.6 | 70.0 |

TABLE 1-3-2

| | Indexes extracted from calculations on 15 specific Munsell renotation color samples | | | | | | | Result of | |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL\text{-}max1}$ | $\Delta C_{SSL\text{-}min1}$ | $|\Delta C_{SSL\text{-}max1} - \Delta C_{SSL\text{-}min1}|$ | Ra | comparative visual experiment | Drawing number |
| Experimental example 102 | 7.50 | 0.14 | 0.56 | 4.33 | −3.49 | 7.82 | 92.7 | 1 | === |
| Experimental example 103 | 5.00 | 0.31 | 0.85 | 3.79 | −1.85 | 5.64 | 93.8 | 1 | === |
| Experimental example 104 | 5.75 | 0.14 | 0.67 | 4.17 | −3.12 | 7.28 | 90.3 | 1 | === |
| Experimental example 105 | 8.20 | 0.18 | 0.84 | 4.67 | −2.99 | 7.66 | 93.2 | 1 | === |
| Experimental example 106 | 5.59 | 0.37 | 0.68 | 3.82 | −1.56 | 5.38 | 96.2 | 1 | === |
| Experimental example 107 | 5.40 | 0.33 | 0.53 | 3.80 | −2.04 | 5.84 | 95.3 | 1 | === |
| Experimental example 108 | 10.83 | 0.00 | 0.97 | 5.63 | −3.30 | 8.93 | 92.7 | 1 | === |

TABLE 1-3-2-continued

| | Indexes extracted from calculations on 15 specific Munsell renotation color samples | | | | | | | Result of | |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL-max1}$ | $\Delta C_{SSL-min1}$ | $|\Delta C_{SSL-max1} - \Delta C_{SSL-min1}|$ | Ra | comparative visual experiment | Drawing number |
| Experimental example 109 | 5.76 | 0.02 | 0.72 | 3.75 | −2.72 | 6.47 | 89.0 | 1 | FIG. 1-8 |

TABLE 1-4-1

| | Light-emitting element | | | Light-emitting device | |
|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | $T_{SSL1}$ (K) | $D_{uv}$ ($\varphi_{SSL1}(\lambda)$) |
| Experimental example 110 | 450 | LuAG 540 106 | CASN 645 89 | 3076 | −0.0073 |
| Experimental example 111 | 457.5 | CSO 520 96 | CASN 660 88 | 3342 | −0.0078 |
| Experimental example 112 | 457.5 | CSO 520 96 | CASN 660 88 | 3729 | −0.0071 |
| Experimental example 113 | 452.5 457.5 | LuAG 530 104 | CASON 645 99 | 4156 | −0.0093 |
| Experimental example 114 | 452.5 | LuAG 530 104 | CASON 645 99 | 4236 | −0.0088 |
| Experimental example 115 | 457.5 | G-YAG 535 108 | CASN 660 88 | 4308 | −0.0083 |
| Experimental example 116 | 457.5 | CSO 520 96 | SCASN 625 87 | 4586 | −0.0212 |
| Experimental example 117 | 457.5 | LuAG 530 104 | CASN 660 88 | 6721 | −0.0078 |
| Experimental example 118 | 460 | LuAG 540 106 | CASN 645 89 | 6965 | −0.0124 |

| | Light-emitting device | | | | | | |
|---|---|---|---|---|---|---|---|
| | $A_{cg}$ ($\varphi_{SSL1}(\lambda)$) | $\lambda_{SSL1\text{-}BM\text{-}max}$ (nm) | $\varphi_{SSL1\text{-}BG\text{-}min}/\varphi_{SSL1\text{-}BM\text{-}max}$ | $\lambda_{SSL1\text{-}RM\text{-}max}$ (nm) | $\varphi_{SSL1\text{-}BG\text{-}min}/\varphi_{SSL1\text{-}RM\text{-}max}$ | $K_{SSL1}$ (lm/W) | $\eta_{SSL1}$ (lm/W) |
| Experimental example 110 | 88.6 | 445 | 0.3069 | 635 | 0.1982 | 262.3 | 63.2 |
| Experimental example 111 | 2.5 | 452 | 0.4079 | 646 | 0.2530 | 229.1 | 50.3 |
| Experimental example 112 | 25.1 | 452 | 0.3825 | 652 | 0.3053 | 236.1 | 52.6 |
| Experimental example 113 | 99.9 | 448 | 0.3496 | 625 | 0.4336 | 267.1 | 75.5 |
| Experimental example 114 | 116.3 | 445 | 0.2527 | 624 | 0.3688 | 268.6 | 75.7 |
| Experimental example 115 | 99.4 | 452 | 0.3115 | 638 | 0.4271 | 256.2 | 69.2 |
| Experimental example 116 | 6.1 | 451 | 0.2461 | 606 | 0.4188 | 274.7 | 68.7 |

TABLE 1-4-1-continued

| | | | | | | | |
|---|---|---|---|---|---|---|---|
| Experimental example 117 | 60.2 | 450 | 0.3448 | 647 | 0.7792 | 238.3 | 69.8 |
| Experimental example 118 | 17.3 | 458 | 0.3381 | 627 | 0.8326 | 243.5 | 70.6 |

TABLE 1-4-2

| | Indexes extracted from calculations on 15 specific Munsell renotation color samples | | | | | | | Result of | |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL-max1}$ | $\Delta C_{SSL-min1}$ | $|\Delta C_{SSL-max1} - \Delta C_{SSL-min1}|$ | Ra | comparative visual experiment | Drawing number |
| Experimental example 110 | 4.63 | 0.56 | 2.03 | 6.54 | −1.93 | 8.47 | 95.6 | 2 | === |
| Experimental example 111 | 2.87 | 0.08 | 2.71 | 4.91 | 0.61 | 4.30 | 89.9 | 2 | === |
| Experimental example 112 | 3.60 | 0.12 | 2.30 | 4.38 | 0.39 | 3.99 | 91.3 | 2 | === |
| Experimental example 113 | 6.97 | 0.52 | 1.26 | 4.36 | −2.08 | 6.44 | 95.7 | 2 | === |
| Experimental example 114 | 7.88 | 0.30 | 1.39 | 5.29 | −2.85 | 8.13 | 93.1 | 2 | === |
| Experimental example 115 | 8.03 | 0.24 | 1.38 | 4.64 | −2.11 | 6.75 | 95.6 | 2 | === |
| Experimental example 116 | 11.01 | 0.22 | 1.74 | 6.34 | −2.50 | 8.84 | 92.7 | 2 | === |
| Experimental example 117 | 7.95 | 0.01 | 1.92 | 5.15 | −0.75 | 5.90 | 91.4 | 2 | === |
| Experimental example 118 | 7.96 | 0.23 | 1.04 | 4.64 | −2.97 | 7.61 | 84.4 | 2 | FIG. 1-9 |

TABLE 1-5-1

| | Light-emitting element | | | | |
|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | Light-emitting device | |
| | | | | $T_{SSL1}$ (K) | $D_{uv}$ ($\varphi_{SSL1}(\lambda)$) |
| Experimental example 119 | 452.5 457.5 | LuAG 530 104 | CASON 645 99 | 4052 | −0.0122 |
| Experimental example 120 | 452.5 | LuAG 540 106 | CASN 645 89 | 4113 | −0.0094 |
| Experimental example 121 | 452.5 | LuAG 530 104 | CASON 645 99 | 4129 | −0.0117 |
| Experimental example 122 | 457.5 | LuAG 530 104 | CASON 645 99 | 4146 | −0.0135 |
| Experimental example 123 | 447.5 470 | LuAG 530 104 | CASON 645 99 | 4162 | −0.0112 |
| Experimental example 124 | 457.5 | LuAG 530 104 | SCASN 640 90 | 4183 | −0.0138 |

TABLE 1-5-1-continued

| | | | | | |
|---|---|---|---|---|---|
| Experimental example 125 | 457.5 | CSO 520 96 | SCASN 625 87 | 4208 | −0.0176 |
| Experimental example 126 | 457.5 | LuAG 530 104 | SCASN 640 90 | 4240 | −0.0111 |
| Experimental example 127 | 450 | LuAG 540 106 | CASN 645 89 | 4241 | −0.0112 |

| | Light-emitting device | | | | | |
|---|---|---|---|---|---|---|
| | $A_{cg}$ ($\varphi_{SSL1}(\lambda)$) | $\lambda_{SSL1\text{-}BM\text{-}max}$ (nm) | $\varphi_{SSL1\text{-}BG\text{-}min}/\varphi_{SSL1\text{-}BM\text{-}max}$ | $\lambda_{SSL1\text{-}RM\text{-}max}$ (nm) | $\varphi_{SSL1\text{-}BG\text{-}min}/\varphi_{SSL1\text{-}RM\text{-}max}$ | $K_{SSL1}$ (lm/W) | $\eta_{SSL1}$ (lm/W) |
| Experimental example 119 | 60.7 | 450 | 0.4033 | 625 | 0.4611 | 261.3 | 69.0 |
| Experimental example 120 | 77.1 | 450 | 0.3844 | 630 | 0.4536 | 264.4 | 66.7 |
| Experimental example 121 | 80.1 | 449 | 0.3379 | 620 | 0.4201 | 264.2 | 69.5 |
| Experimental example 122 | 39.8 | 453 | 0.4103 | 624 | 0.5109 | 258.0 | 69.5 |
| Experimental example 123 | 38.3 | 440 | 0.6602 | 628 | 0.6197 | 255.6 | 64.6 |
| Experimental example 124 | 38.7 | 456 | 0.4452 | 617 | 0.5530 | 264.5 | 67.1 |
| Experimental example 125 | 18.4 | 452 | 0.2728 | 607 | 0.3948 | 282.3 | 69.0 |
| Experimental example 126 | 74.0 | 450 | 0.3947 | 620 | 0.5200 | 269.4 | 75.2 |
| Experimental example 127 | 87.7 | 446 | 0.2427 | 628 | 0.3503 | 265.3 | 70.3 |

TABLE 1-5-2

| | Indexes extracted from calculations on 15 specific Munsell renotation color samples | | | | | | | Result of comparative visual experiment | Drawing number |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL\text{-}max1}$ | $\Delta C_{SSL\text{-}min1}$ | $|\Delta C_{SSL\text{-}max1} - \Delta C_{SSL\text{-}min1}|$ | Ra | | |
| Experimental example 119 | 6.61 | 0.17 | 1.45 | 4.58 | −1.46 | 6.04 | 96.1 | 3 | === |
| Experimental example 120 | 5.78 | 0.53 | 1.45 | 3.91 | −0.98 | 4.88 | 96.3 | 3 | FIG. 1-10 |
| Experimental example 121 | 7.44 | 0.77 | 1.53 | 5.24 | −2.27 | 7.51 | 95.3 | 3 | === |
| Experimental example 122 | 6.80 | 0.31 | 1.40 | 4.55 | −1.13 | 5.68 | 94.9 | 3 | === |
| Experimental example 123 | 2.41 | 0.06 | 1.17 | 3.14 | −0.08 | 3.22 | 95.3 | 3 | === |
| Experimental example 124 | 6.17 | 0.34 | 1.11 | 4.33 | −1.59 | 5.91 | 93.2 | 3 | === |
| Experimental example 125 | 9.59 | 0.70 | 1.37 | 6.19 | −3.33 | 9.52 | 92.5 | 3 | === |
| Experimental example 126 | 6.44 | 0.17 | 1.15 | 4.28 | −1.04 | 5.33 | 95.8 | 3 | === |

TABLE 1-5-2-continued

| | Indexes extracted from calculations on 15 specific Munsell renotation color samples | | | | | | Result of | |
|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL-max1}$ | $\Delta C_{SSL-min1}$ | $|\Delta C_{SSL-max1} - \Delta C_{SSL-min1}|$ | Ra | comparative visual experiment | Drawing number |
| Experimental example 127 | 7.96 | 0.04 | 2.02 | 6.15 | −2.39 | 8.54 | 93.5 | 3 | === |

TABLE 1-5-3

| | Light-emitting element | | | Light-emitting device | |
|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | $T_{SSL1}$ (K) | $D_{uv}$ ($\varphi_{SSL1}(\lambda)$) |
| Experimental example 128 | 452.5 467.5 | LuAG 530 104 | CASON 645 99 | 4242 | −0.0098 |
| Experimental example 129 | 457.5 | LuAG 530 104 | CASON 645 99 | 4255 | −0.0102 |
| Experimental example 130 | 452.5 470 | LuAG 530 104 | CASON 645 99 | 4296 | −0.0105 |
| Experimental example 131 | 452.5 457.5 | LuAG 530 104 | CASON 645 99 | 4315 | −0.0129 |
| Experimental example 132 | 457.5 | LuAG 530 104 | SCASN 625 87 | 4710 | −0.0184 |
| Experimental example 133 | 457.5 | G-YAG 535 108 | CASN 660 88 | 5135 | −0.0140 |
| Experimental example 134 | 452.5 | LuAG 540 106 | CASN 645 89 | 5514 | −0.0148 |
| Experimental example 135 | 457.5 | G-YAG 535 108 | CASN 660 88 | 5750 | −0.0167 |
| Experimental example 136 | 457.5 | CSO 520 96 | CASN 660 88 | 7613 | −0.0165 |

| | Light-emitting device | | | | | | |
|---|---|---|---|---|---|---|---|
| | $A_{cg}$ ($\varphi_{SSL1}(\lambda)$) | $\lambda_{SSL1-BM-max}$ (nm) | $\varphi_{SSL1-BG-min}/\varphi_{SSL1-BM-max}$ | $\lambda_{SSL1-RM-max}$ (nm) | $\varphi_{SSL1-BG-min}/\varphi_{SSL1-RM-max}$ | $K_{SSL1}$ (lm/W) | $\eta_{SSL1}$ (lm/W) |
| Experimental example 128 | 79.0 | 444 | 0.4605 | 626 | 0.5519 | 262.2 | 71.6 |
| Experimental example 129 | 83.1 | 450 | 0.3603 | 626 | 0.4910 | 264.6 | 75.8 |
| Experimental example 130 | 82.0 | 444 | 0.3878 | 627 | 0.5236 | 262.0 | 71.6 |
| Experimental example 131 | 74.6 | 446 | 0.3052 | 630 | 0.4296 | 261.6 | 75.5 |
| Experimental example 132 | 33.3 | 451 | 0.2799 | 607 | 0.4746 | 276.8 | 81.3 |
| Experimental example 133 | 15.6 | 451 | 0.2611 | 638 | 0.5077 | 249.1 | 70.2 |
| Experimental example 134 | 18.3 | 450 | 0.2924 | 631 | 0.5982 | 255.5 | 76.6 |

TABLE 1-5-3-continued

| | | | | | | | |
|---|---|---|---|---|---|---|---|
| Experimental example 135 | 6.8 | 452 | 0.2293 | 637 | 0.5252 | 244.4 | 70.5 |
| Experimental example 136 | 25.7 | 451 | 0.2278 | 647 | 0.6207 | 227.5 | 59.6 |

TABLE 1-5-4

| | Indexes extracted from calculations on 15 specific Munsell renotation color samples | | | | | | | Result of | |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL\text{-}max1}$ | $\Delta C_{SSL\text{-}min1}$ | $|\Delta C_{SSL\text{-}max1} - \Delta C_{SSL\text{-}min1}|$ | Ra | comparative visual experiment | Drawing number |
| Experimental example 128 | 5.30 | 0.08 | 1.23 | 3.72 | −1.26 | 4.98 | 96.7 | 3 | === |
| Experimental example 129 | 7.14 | 0.02 | 1.22 | 4.48 | −1.42 | 5.90 | 96.5 | 3 | === |
| Experimental example 130 | 6.09 | 0.58 | 1.46 | 4.43 | −1.68 | 6.11 | 95.8 | 3 | === |
| Experimental example 131 | 7.88 | 0.58 | 1.82 | 5.38 | −2.18 | 7.56 | 95.0 | 3 | === |
| Experimental example 132 | 11.40 | 0.03 | 1.36 | 6.03 | −2.83 | 8.86 | 93.0 | 3 | === |
| Experimental example 133 | 10.67 | 0.29 | 2.35 | 6.10 | −2.52 | 8.63 | 92.7 | 3 | === |
| Experimental example 134 | 9.22 | 0.27 | 2.30 | 5.62 | −1.42 | 7.04 | 91.8 | 3 | === |
| Experimental example 135 | 12.43 | 0.24 | 2.71 | 6.97 | −2.54 | 9.50 | 90.7 | 3 | === |
| Experimental example 136 | 10.87 | 0.26 | 3.52 | 7.11 | −1.07 | 8.18 | 85.3 | 3 | === |

TABLE 1-6-1

| | Light-emitting element | | | Light-emitting device | |
|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | $T_{SSL1}$ (K) | $D_{uv}$ ($\varphi_{SSL1}(\lambda)$) |
| Experimental example 137 | 460 | LuAG 540 106 | CASN 645 89 | 2998 | −0.0112 |
| Experimental example 138 | 452.5 | LuAG 540 106 | CASN 645 89 | 3101 | −0.0095 |
| Experimental example 139 | 452.5 | LuAG 540 106 | CASN 660 88 | 3545 | −0.0085 |
| Experimental example 140 | 457.5 | CSO 520 96 | CASN 660 88 | 3946 | −0.0084 |
| Experimental example 141 | 457.5 | G-YAG 535 108 | CASN 660 88 | 4027 | −0.0102 |
| Experimental example 142 | 452.5 467.5 | LuAG 530 104 | CASON 645 99 | 4148 | −0.0124 |

TABLE 1-6-1-continued

| | | | | | |
|---|---|---|---|---|---|
| Experimental example 143 | 457.5 | LuAG 530 104 | CASN 660 88 | 4149 | −0.0089 |
| Experimental example 144 | 452.5 457.5 | LuAG 530 104 | CASON 645 99 | 4205 | −0.0161 |
| Experimental example 145 | 452.5 470 | LuAG 530 104 | CASON 645 99 | 4211 | −0.0130 |
| Experimental example 146 | 457.5 | LuAG 530 104 | CASN 660 88 | 4241 | −0.0099 |
| Experimental example 147 | 452.5 | LuAG 540 106 | CASN 660 88 | 4279 | −0.0134 |
| Experimental example 148 | 457.5 | LuAG 530 104 | CASN 660 88 | 5512 | −0.0089 |
| Experimental example 149 | 457.5 | CSO 520 96 | CASN 660 88 | 6177 | −0.0099 |

| | Light-emitting device | | | | | | |
|---|---|---|---|---|---|---|---|
| | $A_{cg}$ ($\varphi_{SSL1}(\lambda)$) | $\lambda_{SSL1\text{-}BM\text{-}max}$ (nm) | $\varphi_{SSL1\text{-}BG\text{-}min}/\varphi_{SSL1\text{-}BM\text{-}max}$ | $\lambda_{SSL1\text{-}RM\text{-}max}$ (nm) | $\varphi_{SSL1\text{-}BG\text{-}min}/\varphi_{SSL1\text{-}RM\text{-}max}$ | $K_{SSL1}$ (lm/W) | $\eta_{SSL1}$ (lm/W) |
| Experimental example 137 | 2.4 | 460 | 0.6225 | 637 | 0.3676 | 247.3 | 54.8 |
| Experimental example 138 | 57.0 | 451 | 0.4530 | 635 | 0.2850 | 258.2 | 58.6 |
| Experimental example 139 | 17.4 | 451 | 0.4531 | 645 | 0.3394 | 236.4 | 60.1 |
| Experimental example 140 | 19.5 | 452 | 0.3549 | 646 | 0.3309 | 236.0 | 53.6 |
| Experimental example 141 | 64.3 | 452 | 0.3162 | 645 | 0.3800 | 250.2 | 66.1 |
| Experimental example 142 | 48.7 | 448 | 0.5282 | 622 | 0.5662 | 259.0 | 64.9 |
| Experimental example 143 | 23.2 | 451 | 0.3960 | 645 | 0.3926 | 237.4 | 62.3 |
| Experimental example 144 | 31.3 | 449 | 0.3662 | 628 | 0.4697 | 255.3 | 69.0 |
| Experimental example 145 | 53.5 | 447 | 0.4603 | 623 | 0.5361 | 257.6 | 66.0 |
| Experimental example 146 | 70.9 | 451 | 0.3708 | 630 | 0.4484 | 261.1 | 73.9 |
| Experimental example 147 | −4.6 | 451 | 0.3602 | 646 | 0.4393 | 235.9 | 64.4 |
| Experimental example 148 | 8.1 | 450 | 0.3532 | 645 | 0.6202 | 238.9 | 70.1 |
| Experimental example 149 | 42.8 | 451 | 0.2706 | 647 | 0.5793 | 239.4 | 61.4 |

TABLE 1-6-2

| | Indexes extracted from calculations on 15 specific Munsell renotation color samples | | | | | | | Result of comparative visual experiment | Drawing number |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL-max1}$ | $\Delta C_{SSL-min1}$ | $|\Delta C_{SSL-max1} - \Delta C_{SSL-min1}|$ | Ra | | |
| Experimental example 137 | 3.43 | 0.12 | 2.35 | 4.39 | −1.37 | 5.76 | 89.6 | 4 | === |
| Experimental example 138 | 3.97 | 0.22 | 2.17 | 5.84 | −0.42 | 6.25 | 95.9 | 4 | === |
| Experimental example 139 | 4.01 | 0.13 | 2.21 | 4.27 | 0.15 | 4.12 | 92.8 | 4 | === |
| Experimental example 140 | 4.24 | 0.18 | 2.43 | 4.64 | 0.32 | 4.32 | 90.9 | 4 | FIG. 1-11 |
| Experimental example 141 | 7.25 | 0.38 | 1.82 | 5.07 | −1.73 | 6.80 | 95.4 | 4 | === |
| Experimental example 142 | 5.10 | 0.25 | 1.40 | 3.98 | −0.79 | 4.76 | 95.9 | 4 | === |
| Experimental example 143 | 4.91 | 0.19 | 2.22 | 4.38 | −0.26 | 4.64 | 91.9 | 4 | === |
| Experimental example 144 | 7.39 | 0.09 | 1.97 | 5.56 | −1.63 | 7.20 | 95.0 | 4 | === |
| Experimental example 145 | 6.02 | 0.17 | 1.60 | 4.69 | −1.37 | 6.06 | 95.8 | 4 | === |
| Experimental example 146 | 5.68 | 0.31 | 1.70 | 4.14 | −0.84 | 4.98 | 95.1 | 4 | === |
| Experimental example 147 | 5.90 | 0.30 | 2.51 | 4.72 | −0.18 | 4.91 | 90.9 | 4 | FIG. 1-12 |
| Experimental example 148 | 6.11 | 0.23 | 2.24 | 4.42 | −0.40 | 4.82 | 90.9 | 4 | === |
| Experimental example 149 | 7.57 | 0.59 | 2.59 | 5.24 | −0.97 | 6.21 | 90.1 | 4 | FIG. 1-13 |

TABLE 1-7-1

| | Light-emitting element | | | | |
|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | Light-emitting device | |
| | | | | $T_{SSL1}$ (K) | $D_{uv}$ ($\varphi_{SSL1}(\lambda)$) |
| Experimental example 150 | 457.5 | LuAG 530 104 | CASN 660 88 | 2644 | −0.0085 |
| Experimental example 151 | 457.5 | LuAG 530 104 | CASN 645 89 | 4196 | −0.0131 |
| Experimental example 152 | 457.5 | CSO 520 96 | CASN 660 88 | 6797 | −0.0145 |

| | Light-emitting device | | | | | | |
|---|---|---|---|---|---|---|---|
| | $A_{cg}$ ($\varphi_{SSL1}(\lambda)$) | $\lambda_{SSL1-BM-max}$ (nm) | $\varphi_{SSL1-BG-min}/\varphi_{SSL1-BM-max}$ | $\lambda_{SSL1-RM-max}$ (nm) | $\varphi_{SSL1-BG-min}/\varphi_{SSL1-RM-max}$ | $K_{SSL1}$ (lm/W) | $\eta_{SSL1}$ (lm/W) |
| Experimental example 150 | −1.5 | 450 | 0.5906 | 646 | 0.1917 | 212.2 | 44.2 |

TABLE 1-7-1-continued

| | | | | | | | |
|---|---|---|---|---|---|---|---|
| Experimental example 151 | 26.0 | 457 | 0.4450 | 630 | 0.5269 | 256.4 | 67.0 |
| Experimental example 152 | 18.9 | 451 | 0.2427 | 646 | 0.5840 | 232.2 | 59.9 |

TABLE 1-7-2

| | Indexes extracted from calculations on 15 specific Munsell renotation color samples | | | | | | Result of | |
|---|---|---|---|---|---|---|---|---|
| | $|\Delta h_{nSSL1}|$ maximum value (degrees) | $|\Delta h_{nSSL1}|$ minimum value (degrees) | $SAT_{ave}$ $(\varphi_{SSL1}(\lambda))$ | $\Delta C_{SSL-max1}$ | $\Delta C_{SSL-min1}$ | $|\Delta C_{SSL-max1} - \Delta C_{SSL-min1}|$ | Ra | comparative visual experiment | Drawing number |
| Experimental example 150 | 2.69 | 0.08 | 3.76 | 6.74 | 1.70 | 5.04 | 88.0 | 5 | FIG. 1-14 |
| Experimental example 151 | 4.75 | 0.02 | 1.66 | 3.96 | −0.70 | 4.66 | 92.7 | 5 | === |
| Experimental example 152 | 9.25 | 0.12 | 3.24 | 6.17 | −0.93 | 7.10 | 86.9 | 5 | === |

A detailed examination of the results of the experimental examples/comparative experimental examples reveals that, when the color appearance due to illumination by a light-emitting device was determined to be +1 or higher in the comparative visual experiment, the light-emitting device included the following light-emitting elements.

Condition α: blue semiconductor light-emitting element
Condition β: wide-band green phosphor
Condition γ: red phosphor Meanwhile, it is revealed that, when the color appearance due to illumination by a light-emitting device was determined to be +1 or higher in the comparative visual experiment, the various indexes derived from the spectral power distribution $\varphi_{SSL1}(\lambda)$ of the light-emitting device included all of the following characteristics.

Condition 1: $-10.0 < A_{cg}(\varphi_{SSL1}(\lambda)) \leq 120.0$
Condition 2: $-0.0220 \leq D_{uv}(\varphi_{SSL1}(\lambda)) \leq -0.0070$
Condition 3: $0.2250 \leq \varphi_{SSL1-BG-min}/\varphi_{SSL1-BM-max} \leq 0.7000$
Condition 4: 605 (nm) $\leq \lambda_{SSL1-RM-max} \leq$ 653 (nm)

Furthermore, it is revealed that the spectral power distribution $\varphi_{SSL1}(\lambda)$ of a light-emitting device determined to have a rank of +1 or higher in the comparative visual experiment also had the following characteristics.

Condition 5: 430 (nm) $\leq \lambda_{SSL1-BM-max} \leq$ 480 (nm)
Condition 6: $0.1800 \leq \varphi_{SSL1-BG-min}/\varphi_{SSL1-RM-max} \leq 0.8500$ Moreover, it is revealed that luminous efficacy of radiation $K_{SSL1}$ (lm/W) and correlated color temperature $T_{SSL1}$ (K) derived from the spectral power distribution $T_{SSL1}(\lambda)$ of a light-emitting device determined to have a rank of +1 or higher in the comparative visual experiment may have the following characteristics.

Condition 7: 210.0 lm/W $\leq K_{SSL1} \leq$ 290.0 lm/W
Condition 8: 2600 K $\leq T_{SSL1} \leq$ 7700 K In addition, it is revealed that the spectral power distribution $\varphi_{SSL1}(\lambda)$ of a light-emitting device determined to have a rank of +1 or higher in the comparative visual experiment characteristically does not have effective intensity derived from a light-emitting element in a range of 380 nm or more and 405 nm or less.

Furthermore, it is revealed that $\varphi_{SSL1}(\lambda)$ of the light-emitting device determined to have a rank of +1 or higher in the comparative visual experiment characteristically does not include a narrow-band green phosphor and a yellow phosphor as light-emitting elements.

Meanwhile, it is revealed that, when the color appearance due to illumination by a light-emitting device was determined to be +1 or higher in the comparative visual experiment, the various indexes related to "color appearance" derived from the spectral power distribution $\varphi_{SSL1}(\lambda)$ of the light-emitting device included all of the following characteristics, where n is a natural number from 1 to 15.

Condition I: $-4.00 \leq \Delta C_{nSSL1} \leq 8.00$
Condition II: $0.50 \leq SAT_{ave}(\varphi_{SSL1}(\lambda)) \leq 4.00$
Condition III: $2.00 \leq |\Delta C_{SSL-max1} - \Delta C_{SSL-min1}| \leq 10.00$
Condition IV: 0.00 degree $\leq |\Delta h_{nSSL1}| \leq$ 12.50 degrees Results of calculating color appearance based on the spectral power distribution $\varphi_{SSL1}(\lambda)$ of the light-emitting devices satisfying the above or, in other words, FIGS. 1-7 to 1-14 reveal the following. A comparison between color appearance assuming a case where the 15 Munsell renotation color samples are illuminated by reference light and color appearance in a case where the 15 Munsell renotation color samples are illuminated by the spectral power distribution $\varphi_{SSL1}(\lambda)$ of the respective light-emitting devices reveals that, with all of the light-emitting devices, (1) each difference in hue angles is small, (2) saturation improves relatively uniformly in all of the 15 hues, and (3) a degree of improvement in saturation is within an appropriate range. Such characteristics conceivably induce "a natural, vivid, highly visible and comfortable appearance of colors and appearance of objects" when an illuminated object is actually illuminated and conceivably mathematically correspond to Conditions I to IV.

To further specifically describe the effects of color appearance, it was confirmed that using the light-emitting device according to the first aspect of the first invention for illumination produced the effects of A) favorably perceiving "achromatic color appearances" such as black and white, B) perceiving characters used on printed matter, newspapers, and the like including black letters on a white background to be readily legible, C) favorably perceiving "chromatic color appearances" having various hues including a test subject's own skin color, D) perceiving colors of objects having similar hues to be readily distinguishable, and E) perceiving increased brightness even at the same luminance as compared to illumination by reference light.

Furthermore, the selection of a blue semiconductor light-emitting element described in Condition α is conceivably characterized as follows when considering the results classified into ranks +1 to +5.

A dominant wavelength $\lambda_{CHIP-BM-dom}$ of the blue light-emitting element alone when pulse-driven can be selected from a range of 445 nm or more and 475 nm or less, based on the results of all experimental examples, slightly favorably selected from a range of 447.5 nm or more and 470 nm or less, based on the results of ranks +4 and +5, extremely favorably selected from a range of 452.5 nm or more and 470 nm or less, and based on the result of rank +5, dramatically favorably selected from a vicinity of 457.5 nm.

In this case, a vicinity refers to ±2.5 nm.

Furthermore, the selection of a wide-band green phosphor described in Condition β is conceivably characterized as follows when considering the results classified into ranks +1 to +5.

A wavelength $\lambda_{PHOS-GM-max}$ of the wide-band green phosphor that provides maximum emission intensity when light is excited by a phosphor alone is 511 nm or more and 543 nm or less and a full-width at half-maximum $W_{PHOS-GM-fwhm}$ thereof can be selected from a range of 90 nm or more and 110 nm or less, based on the results of all experimental examples, slightly favorably, the wavelength $\lambda_{PHOS-GM-max}$ that provides maximum emission intensity when light is excited by a phosphor alone is 514 nm or more and 540 nm or less and the full-width at half-maximum $W_{PHOS-GM-fwhm}$ thereof is selected from a range of 96 nm or more and 108 nm or less, based on the results of ranks +2 to +5, favorably, the wavelength $\lambda_{PHOS-GM-max}$ that provides maximum emission intensity when light is excited by a phosphor alone is 520 nm or more and 540 nm or less and the full-width at half-maximum $W_{PHOS-GM-fwhm}$ thereof is selected from a range of 96 nm or more and 108 nm or less, and based on the result of rank +5, dramatically favorably, the wavelength $\lambda_{PHOS-GM-max}$ that provides maximum emission intensity when light is excited by a phosphor alone is 520 nm or more and 530 nm or less and the full-width at half-maximum $W_{PHOS-GM-fwhm}$ thereof is selected from a range of 96 nm or more and 104 nm or less.

Furthermore, based on an overall trend, further dramatically favorably, the wavelength $\lambda_{PHOS-GM-max}$ that provides maximum emission intensity when light is excited by the phosphor alone is 521 nm or more and 529 nm or less and the full-width at half-maximum $W_{PHOS-GM-fwhm}$ thereof is selected from a range of 97 nm or more and 103 nm or less.

These are trends that are conceivably required by the light-emitting device according to the first aspect of the first invention to have irregularities of appropriate sizes at appropriate positions of the spectral power distribution $\varphi_{SSL1}(\lambda)$.

Moreover, specific phosphor materials are conceivably characterized as follows when considering the results classified into ranks +1 to +5.

While the green phosphor is not particularly limited as long as the green phosphor emits green light when light is excited by a phosphor alone and satisfies the optical characteristics described above, examples of the green phosphor include a LuAG phosphor, a CSO phosphor, a G-YAG phosphor, a CSMS phosphor, a BSS phosphor, and a BSON phosphor, based on results of all experimental examples, a LuAG phosphor, a CSO phosphor, a G-YAG phosphor, or a CSMS phosphor is slightly favorably selected, based on the results of ranks +2 to +5, a LuAG phosphor, a CSO phosphor, or a G-YAG phosphor is favorably selected, and based on the result of rank +5, a LuAG phosphor or a CSO phosphor is dramatically favorably selected.

Furthermore, the selection of a red phosphor described in Condition γ is conceivably characterized as follows when considering the results classified into ranks +1 to +5.

A wavelength $\lambda_{PHOS-RM-max}$ of the red phosphor that provides maximum emission intensity when light is excited by a phosphor alone is 622 nm or more and 633 nm or less and a full-width at half-maximum $W_{PHOS-RM-fwhm}$ thereof can be selected from a range of 80 nm or more and 105 nm or less, based on the results of all experimental examples, slightly favorably, the wavelength $\lambda_{PHOS-RM-max}$ that provides maximum emission intensity when light is excited by a phosphor alone is 625 nm or more and 660 nm or less and the full-width at half-maximum $W_{PHOS-GM-fwhm}$ thereof is selected from a range of 87 nm or more and 99 nm or less, based on the results of ranks +4 to +5, extremely favorably, the wavelength $\lambda_{PHOS-RM-max}$ that provides maximum emission intensity when light is excited by a phosphor alone is 645 nm or more and 660 nm or less and the full-width at half-maximum $W_{PHOS-GM-fwhm}$ thereof is selected from a range of 88 nm or more and 99 nm or less, and based on the result of rank +5, dramatically favorably, the wavelength $\lambda_{PHOS-RM-max}$ that provides maximum emission intensity when light is excited by a phosphor alone is 645 nm or more and 660 nm or less and the full-width at half-maximum $W_{PHOS-RM-fwhm}$ thereof is selected from a range of 88 nm or more and 89 nm or less.

In addition, based on an overall trend, conceivably favorably, the wavelength $\lambda_{PHOS-RM-max}$ that provides maximum emission intensity when light is excited by the phosphor alone is 632 nm or more and 660 nm or less and the full-width at half-maximum $W_{PHOS-RM-fwhm}$ thereof is selected from a range of 88 nm or more and 99 nm or less.

Moreover, specific phosphor materials are conceivably characterized as follows when considering the results classified into ranks +1 to +5.

While the red phosphor is not particularly limited as long as the red phosphor emits red light when light is excited by a phosphor alone and satisfies the optical characteristics described above, examples of the red phosphor include a CASN phosphor, a CASON phosphor, and a SCASN phosphor, based on results of all experimental examples, a CASN phosphor, a CASON phosphor, or a SCASN phosphor is slightly favorably selected, based on the results of ranks +4 to +5, a CASN phosphor, or a CASON phosphor is extremely favorably selected, and based on the result of rank +5, a CASN phosphor is dramatically favorably selected.

Furthermore, the selection of an index $A_{cg}(\varphi_{SSL1}(\lambda)$ described in Condition 1 is conceivably characterized as follows when considering the results classified into ranks +1 to +5.

An index $A_{cg}(\varphi_{SSL1}(\lambda)$ can be selected from a range of more than −10.0 and 120.0 or less, based on the results of all experimental examples, slightly favorably, the index is −4.6 or more and 116.3 or less, based on the results of ranks +3 to +5, more favorably, the index is −4.6 or more and 87.7 or less, based on the results of ranks +4 to +5, extremely favorably, the index is −4.6 or more and 70.9 or less, and based on the result of rank +5, dramatically favorably, the index is −1.5 or more and 26.0 or less.

Furthermore, the selection of a $D_{uv}(\varphi_{SSL1}(\lambda))$ described in Condition 2 is conceivably characterized as follows when considering the results classified into ranks +1 to +5.

A distance $D_{uv}(\varphi_{SSL1}(\lambda))$ can be selected from a range of −0.0220 or more and −0.0070 or less, based on the results of all experimental examples, slightly favorably, the distance $D_{uv}(\varphi_{SSL1}(\lambda))$ is −0.0212 or more and −0.0071 or less, based on the results of ranks +3 to +5, more favorably, the distance $D_{uv}(\varphi_{SSL1}(\lambda))$ is −0.0184 or more and −0.0084 or less, based on the results of ranks +4 to +5, extremely favorably, the distance $D_{uv}(\varphi_{SSL1}(\lambda))$ is −0.0161 or more and −0.0084 or less, and based on the result of rank +5, dramatically favorably, the distance $D_{uv}(\varphi_{SSL1}(\lambda))$ is −0.0145 or more and −0.0085 or less.

Moreover, based on an overall trend, $D_{uv}(\varphi_{SSL1}(\lambda))$ is further dramatically favorably selected from a range of −0.0145 or more and −0.0090 or less, even more dramatically favorably selected from a range of −0.0140 or more and less than −0.0100, and still even more dramatically favorably selected from a range of −0.0135 or more and less than −0.0120.

Furthermore, the selection of a value of $\varphi_{SSL1\text{-}BG\text{-}min}/\varphi_{SSL1\text{-}BM\text{-}max}$ described in Condition 3 is conceivably characterized as follows when considering the results classified into ranks +1 to +5.

A value of $\varphi_{SSL1\text{-}BG\text{-}min}/\varphi_{SSL1\text{-}BM\text{-}max}$ can be selected from a range of 0.2250 or more and 0.7000 or less, based on the results of all experimental examples, slightly favorably, the value of $\varphi_{SSL1\text{-}BG\text{-}min}/\varphi_{SSL1\text{-}BM\text{-}max}$ is 0.2278 or more and 0.6602 or less, based on the results of ranks +4 to +5, extremely favorably, the value of $\varphi_{SSL1\text{-}BG\text{-}min}/\varphi_{SSL1\text{-}BM\text{-}max}$ is 0.2427 or more and 0.6225 or less, and based on the result of rank +5, dramatically favorably, the value of $\varphi_{SSL1\text{-}BG\text{-}min}/\varphi_{SSL1\text{-}BM\text{-}max}$ is 0.2427 or more and 0.5906 or less.

Furthermore, the selection of a wavelength $\lambda_{SSL1\text{-}RM\text{-}max}$ described in Condition 4 is conceivably characterized as follows when considering the results classified into ranks +1 to +5.

A wavelength $\lambda_{SSL1\text{-}RM\text{-}max}$ can be selected from a range of 605 nm or more and 653 nm or less, based on the results of all experimental examples, slightly favorably, the wavelength $\lambda_{SSL1\text{-}RM\text{-}max}$ is selected from a range of 606 nm or more and 652 nm or less, based on the results of ranks +3 to +5, more favorably, the wavelength $\lambda_{SSL1\text{-}RM\text{-}max}$ is 607 nm or more and 647 nm or less, and based on the results of ranks +4 to +5, extremely favorably, the wavelength $\lambda_{SSL1\text{-}RM\text{-}max}$ is 622 nm or more and 647 nm or less. In addition, based on the trends described so far, $\lambda_{SSL1\text{-}RM\text{-}max}$ is conceivably extremely favorably selected from a range of 625 nm or more and 647 nm or less.

Furthermore, based on the result of rank +5, $\lambda_{SSL1\text{-}RM\text{-}max}$ is dramatically favorably selected from a range of 630 nm or more and 647 nm or less.

Moreover, based on an overall trend, $\lambda_{SSL1\text{-}RM\text{-}max}$ is conceivably further dramatically favorably selected from a range of 631 nm or more and 647 nm or less.

These are trends that are conceivably required by the light-emitting device according to the first aspect of the first invention to have irregularities of appropriate sizes at appropriate positions of the spectral power distribution $\varphi_{SSL1}(\lambda)$.

Furthermore, the selection of a wavelength $\lambda_{SSL1\text{-}BM\text{-}max}$ described in Condition 5 is conceivably characterized as follows when considering the results classified into ranks +1 to +5.

A wavelength $\lambda_{SSL1\text{-}BM\text{-}max}$ can be selected from a range of 430 nm or more and 480 nm or less, based on the results of all experimental examples, slightly favorably, the wavelength $\lambda_{SSL1\text{-}BM\text{-}max}$ is selected from a range of 440 nm or more and 460 nm or less, based on the results of ranks +4 to +5, extremely favorably, the wavelength $\lambda_{SSL1\text{-}BM\text{-}max}$ is 447 nm or more and 460 nm or less, and based on the results of rank +5, dramatically favorably, the wavelength $\lambda_{SSL1\text{-}BM\text{-}max}$ is 450 nm or more and 457 nm or less.

In addition, based on an overall trend, $\lambda_{SSL1\text{-}BM\text{-}max}$ is conceivably further dramatically favorably selected from a range of 451 nm or more and 456 nm or less.

These are trends that are conceivably required by the light-emitting device according to the first aspect of the first invention to have irregularities of appropriate sizes at appropriate positions of the spectral power distribution $\lambda_{SSL1}(\lambda)$.

Furthermore, the selection of a value of $\varphi_{SSL1\text{-}BG\text{-}min}/\varphi_{SSL1\text{-}RM\text{-}max}$ described in Condition 6 is conceivably characterized as follows when considering the results classified into ranks +1 to +5.

A value of $\varphi_{SSL1\text{-}BG\text{-}min}/\varphi_{SSL1\text{-}RM\text{-}max}$ can be selected from a range of 0.1800 or more and 0.8500 or less, based on the results of all experimental examples, slightly favorably, the value of $\varphi_{SSL1\text{-}BG\text{-}min}/\varphi_{SSL1\text{-}RM\text{-}max}$ is 0.1917 or more and 0.8326 or less, based on the results of ranks +3 to +5, more favorably, the value of $\varphi_{SSL1\text{-}BG\text{-}min}/\varphi_{SSL1\text{-}RM\text{-}max}$ is 0.1917 or more and 0.6207 or less, and based on the results of ranks +4 to +5, extremely favorably, the value of $\varphi_{SSL1\text{-}BG\text{-}min}/\varphi_{SSL1\text{-}RM\text{-}max}$ is 0.1917 or more and 0.6202 or less, and based on the result of rank +5, dramatically favorably, the value of $\varphi_{SSL1\text{-}BG\text{-}min}/\varphi_{SSL1\text{-}RM\text{-}max}$ is 0.1917 or more and 0.5840 or less.

Furthermore, based on an overall trend, $\varphi_{SSL1\text{-}BG\text{-}min}/\varphi_{SSL1\text{-}RM\text{-}max}$ is conceivably favorably selected from a range of 0.1917 or more and 0.7300 or less.

These are trends that are conceivably required by the light-emitting device according to the first aspect of the first invention to have irregularities of appropriate sizes at appropriate positions of the spectral power distribution $\varphi_{SSL1}(\lambda)$.

Furthermore, the selection of a luminous efficacy of radiation $K_{SSL1}$ (lm/W) described in Condition 7 is conceivably characterized as follows when considering the results classified into ranks +1 to +5.

A luminous efficacy of radiation $K_{SSL1}$ (lm/W) can be selected from a range of 210.0 (lm/W) or more and 290.0 (lm/W) or less, based on the results of all experimental examples, slightly favorably, the luminous efficacy of radiation $K_{SSL1}$ (lm/W) is selected from a range of 212.2 (lm/W) or more and 286.9 (lm/W) or less, based on the results of ranks +2 to +5, favorably, the luminous efficacy of radiation $K_{SSL1}$ (lm/W) is 212.2 (lm/W) or more and 282.3 (lm/W) or less, based on the results of ranks +4 to +5, extremely favorably, the luminous efficacy of radiation $K_{SSL1}$ (lm/W) is 212.2 (lm/W) or more and 261.1 (lm/W) or less, and based on the results of rank +5, dramatically favorably, the luminous efficacy of radiation $K_{SSL1}$ (lm/W) is 212.2 (lm/W) or more and 256.4 (lm/W) or less.

Furthermore, the selection of a correlated color temperature $T_{SSL1}$ (K) described in Condition 8 is conceivably characterized as follows when considering the results classified into ranks +1 to +5.

A correlated color temperature $T_{SSL1}$ (K) can be selected from a range of 2600 (K) or more and 7700 (K) or less, based on the results of all experimental examples, slightly favorably, the correlated color temperature $T_{SSL1}$ (K) is 2644 (K) or more and 7613 (K) or less, and based on the results of ranks +4 to +5, extremely favorably, the correlated color temperature $T_{SSL1}$ (K) is 2644 (K) or more and 6797 (K) or less.

Furthermore, the selection of each saturation difference $\Delta C_{nSSL1}$ described in Condition I is conceivably characterized as follows when considering the results classified into ranks +1 to +5.

Each saturation difference $\Delta C_{nSSL1}$ can be selected from a range of −4.00 or more and 8.00 or less, based on the results of all experimental examples, slightly favorably, each saturation difference $\Delta C_{nSSL1}$ is −3.49 or more and 7.11 or less, based on the results of ranks +2 to +5, favorably, each saturation difference $\Delta C_{nSSL1}$ is −3.33 or more and 7.11 or less, based on the results of ranks +4 to +5, extremely favorably, each saturation difference $\Delta C_{nSSL1}$ is −1.73 or more and 6.74 or less, and based on the result of rank +5, dramatically favorably, each saturation difference $\Delta C_{nSSL1}$ is −0.93 or more and 6.74 or less.

Furthermore, the selection of a value of $SAT_{ave}(\varphi_{SSL1}(\lambda))$ described in Condition II is conceivably characterized as follows when considering the results classified into ranks +1 to +5.

A value of $SAT_{ave}(\varphi_{SSL1}(\lambda))$ can be selected from a range of 0.50 or more and 4.00 or less, based on the results of all experimental examples, slightly favorably, the value of $SAT_{ave}(\varphi_{SSL1}(\lambda))$ is 0.53 or more and 3.76 or less, based on the results of ranks +2 to +5, favorably, the value of $SAT_{ave}(\varphi_{SSL1}(\lambda))$ is 1.04 or more and 3.76 or less, based on the results of ranks +3 to +5, more favorably, the value of $SAT_{ave}(\varphi_{SSL1}(\lambda))$ is 1.11 or more and 3.76 or less, based on the results of ranks +4 to +5, extremely favorably, the value of $SAT_{ave}(\varphi_{SSL1}(\lambda))$ is 1.40 or more and 3.76 or less, and based on the result of rank +5, dramatically favorably, the value of $SAT_{ave}(\varphi_{SSL1}(\lambda))$ is 1.66 or more and 3.76 or less.

Furthermore, the selection of a difference $|\Delta C_{SSL-max1} - \Delta C_{SSL-min1}|$ between the maximum saturation difference value and the minimum saturation difference value described in Condition III is conceivably characterized as follows when considering the results classified into ranks +1 to +5.

A difference $|\Delta C_{SSL-max1} - \Delta C_{SSL-min1}|$ can be selected from a range of 2.00 or more and 10.00 or less, based on the results of all experimental examples, slightly favorably, the difference $|\Delta C_{SSL-max1} - \Delta C_{SSL-min1}|$ is 3.22 or more and 9.52 or less, based on the results of ranks +4 to +5, extremely favorably, the difference $|\Delta C_{SSL-max1} - \Delta C_{SSL-min1}|$ is 4.12 or more and 7.20 or less, and based on the result of rank +5, dramatically favorably, the index is 4.66 or more and 7.10 or less.

Furthermore, the selection of an absolute value of each difference in hue angles $|\Delta h_{nSSL1}|$ described in Condition IV is conceivably characterized as follows when considering the results classified into ranks +1 to +5.

A absolute value of each difference in hue angles $|\Delta h_{nSSL1}|$ can be selected from a range of 0.00 or more and 12.50 or less, based on the results of all experimental examples, slightly favorably, the absolute value of each difference in hue angles $|\Delta h_{nSSL1}|$ is 0.00 or more and 12.43 or less, based on the results of ranks +2 to +5, favorably, the absolute value of each difference in hue angles $|\Delta h_{nSSL1}|$ is 0.01 or more and 12.43 or less, based on the results of ranks +3 to +5, more favorably, the absolute value of each difference in hue angles $|\Delta h_{nSSL1}|$ is 0.02 or more and 12.43 or less, and based on the results of ranks +4 to +5, extremely favorably, the absolute value of each difference in hue angles $|\Delta h_{nSSL1}|$ is 0.02 or more and 9.25 or less.

Moreover, since an absolute value of each difference in hue angles $|\Delta h_{nSSL1}|$ is conceivably desirably 0, by adjusting a lower limit of values thereof, ideally, a range of 0.00 or more and 12.43 or less is more favorably selected, a range of 0.00 or more and 9.25 or less is extremely favorably selected, a range of 0.00 or more and 7.00 or less is more extremely favorably selected, and a range of 0.00 or more and 5.00 or less is further extremely favorably selected.

With respect to color appearance, the examination conducted above also shows that the color appearance realized by a light-emitting device "capable of realizing a natural, vivid, highly visible and comfortable appearance of colors and appearance of objects" is quantified when Conditions I to IV are simultaneously satisfied.

<Detailed Description 2>

The comparative visual experiment confirmed that light emitted from the light-emitting devices described in Experimental Examples 101 to 152 are more superior in terms of color appearance than light-emitting devices respectively emitting experimental reference light. At the same time, a significant improvement in light source efficiency $\eta_{SSL1}$ was also confirmed as described below. Table 1-8 compiles values of $A_{cg}(\varphi_{SSL1}(\lambda))$ and light source efficiency $\eta_{SSL1}$ of Comparative Experimental Example 102 and Reference Experimental Example 101 shown in Table 1-2.

TABLE 1-8

[Table 16]

| | minimum | average | maximum |
|---|---|---|---|
| $A_{cg}(\varphi_{SSL1}(\lambda))$ | −58.7 | −51.8 | −44.9 |
| $\eta_{SSL1}$ (lm/W) | 45.9 | 47.0 | 48.0 |

Meanwhile, Table 1-9 extracts all light-emitting devices with $T_{SSL}1$ in a range of 3800 K to 4200 K and $D_{uv}(\varphi_{SSL1}(\lambda))$ in a range of −0.0125 or more and −0.0100 or less from the experimental examples shown in Tables 1-3 to 1-7 and presents the light-emitting devices in such a manner that a fair comparison with Comparative Experimental Example 102 and Reference Experimental Example 101 can be performed. Table 1-9 compiles values derived from 101, 102, 103, 119, 121, 123, 141, and 142. Although Table 1-8 shows that $A_{cg}(\varphi_{SSL1}(\lambda))$ has an average value of −51.8 and $\eta_{SSL1}$ has an average value of 47.0 (lm/W), Table 1-9 shows that $A_{cg}(\varphi_{SSL1}(\lambda))$ has an average value of +51.4 and $\eta_{SSL1}$ has an average value of 65.5 (lm/W). On average, a difference in color appearance of illuminated objects between the light-emitting device shown in Table 1-8 and the light-emitting device shown in Table 1-9 is not large. Nevertheless, this shows that, compared to the conventional light-emitting device shown in Table 1-8, light source efficiency of the light-emitting device according to the first aspect of the first invention shown in Table 1-9 has increased by approximately 390.

TABLE 1-9

[Table 17]

|  | minimum | average | maximum |
|---|---|---|---|
| $A_{cg}(\varphi_{SSL1}(\lambda))$ | 10.4 | 51.4 | 80.1 |
| $\eta_{SSL1}$ (lm/W) | 54.4 | 65.5 | 70.0 |

<Detailed Description 3>

Tables 1-10 to 1-15 show respective comparative experimental examples (ranks −1 to −5) of the first aspect of the first invention from the following perspectives. In addition, FIGS. 1-15 to 1-27 illustrate a spectral power distribution and a CIELAB color space based on the respective tables.

TABLE 1-10-1

| | Light-emitting element | | | Light-emitting device | |
|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | $T_{SSL1}$ (K) | $D_{uv}$ ($\varphi_{SSL1}(\lambda)$) |
| Comparative experimental example 103 | 457.5 | LuAG 530 104 | CASN 660 88 | 3106 | −0.0412 |
| Comparative experimental example 104 | 457.5 | LuAG 530 104 | SCASN 625 87 | 5671 | −0.0324 |
| Comparative experimental example 105 | 457.5 | G-YAG 535 108 | CASN 660 88 | 6497 | −0.0228 |

| | Light-emitting device | | | | | | |
|---|---|---|---|---|---|---|---|
| | $A_{cg}$ ($\varphi_{SSL1}(\lambda)$) | $\lambda_{SSL1\text{-}BM\text{-}max}$ (nm) | $\varphi_{SSL1\text{-}BG\text{-}min}/\varphi_{SSL1\text{-}BM\text{-}max}$ | $\lambda_{SSL1\text{-}RM\text{-}max}$ (nm) | $\varphi_{SSL1\text{-}BG\text{-}min}/\varphi_{SSL1\text{-}RM\text{-}max}$ | $K_{SSL1}$ (lm/W) | $\eta_{SSL1}$ (lm/W) |
| Comparative experimental example 103 | −372.4 | 450 | 0.2582 | 655 | 0.2534 | 183.6 | 48.8 |
| Comparative experimental example 104 | −117.9 | 451 | 0.2206 | 610 | 0.4994 | 252.3 | 73.6 |
| Comparative experimental example 105 | −35.4 | 452 | 0.2033 | 642 | 0.5285 | 233.7 | 68.3 |

TABLE 1-10-2

| | Indexes extracted from calculations on 15 specific Munsell renotation color samples | | | | | | | Result of | |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL\text{-}max1}$ | $\Delta C_{SSL\text{-}min1}$ | $|\Delta C_{SSL\text{-}max1} - \Delta C_{SSL\text{-}min1}|$ | Ra | comparative visual experiment | Drawing number |
| Comparative experimental example 103 | 5.71 | 0.17 | 7.79 | 14.14 | 2.04 | 12.10 | 70.8 | −3 | FIG. 1-15 |
| Comparative experimental example 104 | 14.92 | 0.12 | 3.34 | 8.39 | −2.42 | 10.81 | 87.3 | −1 | FIG. 1-16 |

TABLE 1-10-2-continued

| | Indexes extracted from calculations on 15 specific Munsell renotation color samples | | | | | | Result of | |
|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL-max1}$ | $\Delta C_{SSL-min1}$ | $|\Delta C_{SSL-max1} - \Delta C_{SSL-min1}|$ | Ra | comparative visual experiment | Drawing number |
| Comparative experimental example 105 | 14.58 | 0.09 | 3.62 | 8.47 | −2.32 | 10.79 | 86.0 | −2 | FIG. 1-17 |

TABLE 1-11-1

| | Light-emitting element | | | Light-emitting device | | | |
|---|---|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | $T_{SSL1}$ (K) | $D_{uv}$ ($\varphi_{SSL1}(\lambda)$) | $A_{cg}$ ($\varphi_{SSL1}(\lambda)$) | $\lambda_{SSL1-BM-max}$ (nm) |
| Comparative experimental example 106 | 457.5 | LSN 535 107 | CASN 660 88 | 3178 | −0.0173 | 73.6 | 450 |
| Comparative experimental example 107 | 457.5 | YAG 545 108 | SCASN 640 90 | 4156 | −0.0112 | 92.0 | 448 |
| Comparative experimental example 108 | 457.5 | YAG 545 108 | SCASN 640 90 | 4169 | −0.0118 | 77.4 | 451 |
| Comparative experimental example 109 | 457.5 | LSN 535 107 | CASN 660 88 | 6013 | −0.0239 | 42.1 | 450 |

| | Light-emitting device | | | | |
|---|---|---|---|---|---|
| | $\varphi_{SSL1-BG-min}/\varphi_{SSL1-BM-max}$ | $\lambda_{SSL1-RM-max}$ (nm) | $\varphi_{SSL1-BG-min}/\varphi_{SSL1-RM-max}$ | $K_{SSL1}$ (lm/W) | $\eta_{SSL1}$ (lm/W) |
| Comparative experimental example 106 | 0.1033 | 630 | 0.1049 | 255.5 | 51.8 |
| Comparative experimental example 107 | 0.1269 | 593 | 0.1961 | 299.5 | 101.8 |
| Comparative experimental example 108 | 0.1788 | 586 | 0.2448 | 294.6 | 94.1 |
| Comparative experimental example 109 | 0.0700 | 588 | 0.1867 | 260.0 | 73.7 |

TABLE 1-11-2

| | Indexes extracted from calculations on 15 specific Munsell renotation color samples | | | | | | | Result of comparative visual experiment | Drawing number |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL-max1}$ | $\Delta C_{SSL-min1}$ | $|\Delta C_{SSL-max1} - \Delta C_{SSL-min1}|$ | Ra | | |
| Comparative experimental example 106 | 11.63 | 1.19 | 3.46 | 12.66 | −4.77 | 17.43 | 91.4 | −4 | === |
| Comparative experimental example 107 | 15.62 | 0.75 | 0.94 | 8.17 | −6.32 | 14.49 | 83.4 | −4 | FIG. 1-18 |
| Comparative experimental example 108 | 15.40 | 0.98 | 0.69 | 7.52 | −6.22 | 13.74 | 84.6 | −4 | === |
| Comparative experimental example 109 | 22.21 | 0.11 | 3.64 | 11.62 | −5.85 | 17.46 | 86.6 | −4 | === |

TABLE 1-12-1

| | Light-emitting element | | | Light-emitting device | | | |
|---|---|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | $T_{SSL1}$ (K) | $D_{uv}$ ($\varphi_{SSL1}(\lambda)$) | $A_{cg}$ ($\varphi_{SSL1}(\lambda)$) | $\lambda_{SSL1-BM-max}$ (nm) |
| Comparative experimental example 110 | 455 | β-SiAlON 545 55 | CASON 645 99 | 4103 | −0.0115 | 100.5 | 453 |

| | Light-emitting device | | | | |
|---|---|---|---|---|---|
| | $\varphi_{SSL1-BG-min}/\varphi_{SSL1-BM-max}$ | $\lambda_{SSL1-RM-max}$ (nm) | $\varphi_{SSL1-BG-min}/\varphi_{SSL1-RM-max}$ | $K_{SSL1}$ (lm/W) | $\eta_{SSL1}$ (lm/W) |
| Comparative experimental example 110 | 0.0978 | 631 | 0.1474 | 269.3 | 49.9 |

TABLE 1-12-2

| | Indexes extracted from calculations on 15 specific Munsell renotation color samples | | | | | | | Result of comparative visual experiment | Drawing number |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL-max1}$ | $\Delta C_{SSL-min1}$ | $|\Delta C_{SSL-max1} - \Delta C_{SSL-min1}|$ | Ra | | |
| Comparative experimental example 110 | 17.59 | 0.50 | 1.94 | 8.99 | −6.48 | 15.47 | 87.5 | −4 | FIG. 1-19 |

TABLE 1-13-1

| | Light-emitting element | | | Light-emitting device | | | | | | | |
|---|---|---|---|---|---|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | $T_{SSL1}$ (K) | $D_{uv}$ $(\varphi_{SSL1}(\lambda))$ | $A_{cg}$ $((\varphi_{SSL1}(\lambda)))$ | $\lambda_{SSL1\text{-}BM\text{-}max}$ (nm) | $\varphi_{SSL1\text{-}BG\text{-}min}/\varphi_{SSL1\text{-}BM\text{-}max}$ | $\lambda_{SSL1\text{-}RM\text{-}max}$ (nm) | $\varphi_{SSL1\text{-}BG\text{-}min}/\varphi_{SSL1\text{-}RM\text{-}max}$ | $K_{SSL1}$ (lm/W) | $\eta_{SSL1}$ (lm/W) |
| Comparative experimental example 111 | 457.5 | G-YAG 535 108 | SCASN 625 87 | 4054 | −0.0108 | 75.3 | 453 | 0.2746 | 602 | 0.3593 | 299.5 | 87.1 |
| Comparative experimental example 112 | 457.5 | LuAG 530 104 | SCASN 625 87 | 4238 | −0.0116 | 64.8 | 451 | 0.3298 | 604 | 0.4373 | 290.0 | 82.6 |
| Comparative experimental example 113 | 465 | LuAG 540 106 | CASN 660 88 | 4245 | −0.0006 | 14.6 | 467 | 0.5044 | 647 | 0.6087 | 237.4 | 57.9 |
| Comparative experimental example 114 | 457.5 | LuAG 530 104 | SCASN 625 87 | 4254 | −0.0133 | 27.4 | 455 | 0.4145 | 603 | 0.5258 | 281.7 | 74.9 |
| Comparative experimental example 115 | 447.5 | LuAG 530 104 | CASON 645 99 | 4281 | −0.0101 | 104.1 | 437 | 0.1105 | 627 | 0.2135 | 266.6 | 83.6 |
| Comparative experimental example 116 | 457.5 | LuAG 530 104 | SCASN 620 84 | 4283 | −0.0123 | 32.1 | 455 | 0.4064 | 601 | 0.5004 | 296.2 | 79.2 |
| Comparative experimental example 117 | 457.5 | LuAG 530 104 | SCASN 625 87 | 6147 | −0.0165 | 39.7 | 451 | | | | | |
| Comparative experimental example 118 | 450 | LuAG 540 106 | CASN 645 89 | 7340 | −0.0207 | 56.7 | 445 | | | | | |

TABLE 1-13-1-continued

|  |  |  |  |  |  |
|---|---|---|---|---|---|
| Comparative experimental example 117 | 0.2802 | 601 | 0.4339 | 271.1 | 64.0 |
| Comparative experimental example 118 | 0.1761 | 624 | 0.5573 | 244.9 | 75.3 |

TABLE 25

| | Indexes extracted from calculations on 15 specific Munsell renotation color samples | | | | | | Result of | |
|---|---|---|---|---|---|---|---|---|
| | $|\Delta h_{nSSL1}|$ maximum value (degrees) | $|\Delta h_{nSSL1}|$ minimum value (degrees) | $SAT_{ave}$ $(\varphi_{SSL1}(\lambda))$ | $\Delta C_{SSL\text{-}max1}$ | $\Delta C_{SSL\text{-}min1}$ | $|\Delta C_{SSL\text{-}max1} - \Delta C_{SSL\text{-}min1}|$ | Ra | comparative visual experiment | Drawing number |
| Comparative experimental example 111 | 11.72 | 0.20 | 0.28 | 5.70 | −5.72 | 11.42 | 87.8 | −2 | === |
| Comparative experimental example 112 | 9.33 | 0.31 | 0.59 | 4.95 | −4.07 | 9.02 | 91.7 | −2 | === |
| Comparative experimental example 113 | 11.14 | 0.27 | −0.13 | 5.34 | −5.88 | 11.22 | 82.5 | −2 | === |
| Comparative experimental example 114 | 8.68 | 0.21 | 0.27 | 4.97 | −3.54 | 8.51 | 90.7 | −2 | === |
| Comparative experimental example 115 | 8.63 | 0.28 | 2.00 | 7.84 | −4.07 | 11.91 | 86.9 | −4 | FIG. 1-20 |
| Comparative experimental example 116 | 10.12 | 0.12 | −0.35 | 5.25 | −5.76 | 11.00 | 87.7 | −2 | FIG. 1-21 |
| Comparative experimental example 117 | 13.49 | 0.24 | 1.57 | 6.89 | −3.08 | 9.97 | 92.7 | −2 | === |
| Comparative experimental example 118 | 14.36 | 0.23 | 3.93 | 8.24 | −2.73 | 10.97 | 84.9 | −4 | FIG. 1-22 |

TABLE 26

| | Light-emitting element | | | Light-emitting device | | | |
|---|---|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | $T_{SSL1}$ (K) | $D_{uv}$ $(\varphi_{SSL1}(\lambda))$ | $A_{cg}$ $((\varphi_{SSL1}(\lambda)))$ | $\lambda_{SSL1\text{-}BM\text{-}max}$ (nm) |
| Comparative experimental example 119 | 457.5 | G-YAG 535 108 | CASN 660 88 | 2129 | 0.0041 | 253.4 | 455 |

TABLE 26-continued

| | | | | | | | |
|---|---|---|---|---|---|---|---|
| Comparative experimental example 120 | 457.5 | G-YAG 535 108 | CASN 660 88 | 3395 | 0.0014 | 156.7 | 454 |
| Comparative experimental example 121 | 457.5 | LuAG 530 104 | CASN 660 88 | 3910 | 0.0038 | 131.8 | 451 |
| Comparative experimental example 122 | 457.5 | LuAG 530 104 | CASN 660 88 | 4440 | 0.0213 | 334.4 | 450 |
| Comparative experimental example 123 | 457.5 | G-YAG 535 108 | CASN 660 88 | 4796 | −0.0003 | 189.0 | 453 |
| Comparative experimental example 124 | 457.5 | LuAG 530 104 | CASN 660 88 | 6557 | 0.0039 | 189.5 | 450 |
| Comparative experimental example 125 | 457.5 | LuAG 530 104 | CASN 660 88 | 7321 | 0.0069 | 245.1 | 450 |

| | Light-emitting device | | | | |
|---|---|---|---|---|---|
| | $\varphi_{SSL1-BG-min}/\varphi_{SSL1-BM-max}$ | $\lambda_{SSL1-RM-max}$ (nm) | $\varphi_{SSL1-BG-min}/\varphi_{SSL1-RM-max}$ | $K_{SSL1}$ (lm/W) | $\eta_{SSL1}$ (lm/W) |
| Comparative experimental example 119 | 0.9434 | 647 | 0.0562 | 218.2 | 42.1 |
| Comparative experimental example 120 | 0.4795 | 647 | 0.2925 | 262.0 | 64.3 |
| Comparative experimental example 121 | 0.5981 | 645 | 0.4154 | 254.3 | 62.8 |
| Comparative experimental example 122 | 0.7039 | 647 | 0.5277 | 293.4 | 76.3 |
| Comparative experimental example 123 | 0.3261 | 635 | 0.5327 | 273.7 | 75.4 |
| Comparative experimental example 124 | 0.3791 | 643 | 0.9030 | 259.5 | 79.4 |
| Comparative experimental example 125 | 0.3940 | 638 | 1.1046 | 262.6 | 80.7 |

TABLE 27

| | Indexes extracted from calculations on 15 specific Munsell renotation color samples | | | | | | | Result of | |
|---|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL-max1}$ | $\Delta C_{SSL-min1}$ | $|\Delta C_{SSL-max1} - \Delta C_{SSL-min1}|$ | Ra | comparative visual experiment | Drawing number |
| Comparative experimental example 119 | 7.70 | 0.04 | −4.15 | 0.86 | −12.63 | 13.49 | 97.1 | −5 | FIG. 1-23 |
| Comparative experimental example 120 | 4.24 | 0.00 | 0.04 | 2.53 | −1.78 | 4.31 | 95.6 | −1 | === |

TABLE 27-continued

| | Indexes extracted from calculations on 15 specific Munsell renotation color samples | | | | | | Result of comparative visual experiment | Drawing number |
|---|---|---|---|---|---|---|---|---|
| | $|\Delta h_{nSSL1}|$ maximum value (degrees) | $|\Delta h_{nSSL1}|$ minimum value (degrees) | $SAT_{ave}$ ($\varphi_{SSL1}(\lambda)$) | $\Delta C_{SSL-max1}$ | $\Delta C_{SSL-min1}$ | $|\Delta C_{SSL-max1} - \Delta C_{SSL-min1}|$ | Ra | | |
| Comparative experimental example 121 | 3.50 | 0.07 | 0.04 | 2.07 | −1.53 | 3.60 | 96.3 | −1 | === |
| Comparative experimental example 122 | 4.38 | 0.10 | −3.39 | 0.85 | −7.01 | 7.86 | 87.3 | −5 | FIG. 1-24 |
| Comparative experimental example 123 | 9.27 | 0.02 | −0.01 | 4.64 | −3.60 | 8.24 | 91.7 | −1 | FIG. 1-25 |
| Comparative experimental example 124 | 7.79 | 0.07 | 0.12 | 4.26 | −2.53 | 6.79 | 95.6 | −1 | === |
| Comparative experimental example 125 | 8.81 | 0.22 | −0.52 | 4.46 | −3.63 | 8.09 | 93.1 | −1 | === |

TABLE 28

| | Light-emitting element | | | Light-emitting device | | | |
|---|---|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | $T_{SSL1}$ (K) | $D_{uv}$ ($\varphi_{SSL1}(\lambda)$) | $A_{cg}$ (($\varphi_{SSL1}(\lambda)$)) | $\lambda_{SSL1-BM-max}$ (nm) |
| Comparative experimental example 126 | 465 | LuAG 540 106 | CASN 660 88 | 2611 | 0.0025 | 89.1 | 482 |
| Comparative experimental example 127 | 465 | LuAG 540 106 | CASN 660 88 | 2734 | −0.0030 | 5.0 | 478 |

| | Light-emitting device | | | | |
|---|---|---|---|---|---|
| | $\varphi_{SSL1-BG-min}/\varphi_{SSL1-BM-max}$ | $\lambda_{SSL1-RM-max}$ (nm) | $\varphi_{SSL1-BG-min}/\varphi_{SSL1-RM-max}$ | $K_{SSL1}$ (lm/W) | $\eta_{SSL1}$ (lm/W) |
| Comparative experimental example 126 | 0.9931 | 647 | 0.3024 | 223.3 | 43.4 |
| Comparative experimental example 127 | 0.7597 | 647 | 0.3203 | 217.8 | 44.8 |

TABLE 29

| | Indexes extracted from calculations on 15 specific Munsell renotation color samples | | | | | | Result of | |
|---|---|---|---|---|---|---|---|---|
| | $|\Delta h_{nSSL1}|$ maximum value (degrees) | $|\Delta h_{nSSL1}|$ minimum value (degrees) | $SAT_{ave}$ $(\varphi_{SSL1}(\lambda))$ | $\Delta C_{SSL\text{-}max1}$ | $\Delta C_{SSL\text{-}min1}$ | $|\Delta C_{SSL\text{-}max1} - \Delta C_{SSL\text{-}min1}|$ | Ra | comparative visual experiment | Drawing number |
| Comparative experimental example 126 | 13.00 | 0.24 | −0.75 | 4.95 | −7.20 | 12.15 | 89.5 | −5 | FIG. 1-26 |
| Comparative experimental example 127 | 12.23 | 0.72 | 1.32 | 5.81 | −4.18 | 9.99 | 85.0 | −2 | FIG. 1-27 |

Table 1-10 illustrates "a case where $D_{uv}(\varphi_{SSL1}(\lambda))$ is less than −0.0220 and $A_{cg}(\varphi_{SSL1}(\lambda))$ is −10 or less" despite using an appropriate blue semiconductor light-emitting element, an appropriate wide-band green phosphor, and an appropriate red phosphor.

Table 1-11 illustrates "a case where $\varphi_{SSL1\text{-}BG\text{-}min}/\varphi_{SSL1\text{-}BM\text{-}max}$ is less than 0.225 as a result of the use of a yellow phosphor as a light-emitting element in the intermediate wavelength region" despite using an appropriate blue semiconductor light-emitting element and an appropriate red phosphor and despite $A_{cg}(\varphi_{SSL1}(\lambda))$ being within an appropriate range.

Table 1-12 illustrates "a case where $\varphi_{SSL1\text{-}BG\text{-}min}/\varphi_{SSL1\text{-}BM\text{-}max}$ is less than 0.225 as a result of the use of a narrow-band green phosphor as a light-emitting element in the intermediate wavelength region" despite using an appropriate blue semiconductor light-emitting element and an appropriate red phosphor and despite both $D_{uv}(\varphi_{SSL1}(\lambda))$ and $A_{cg}(\varphi_{SSL1}(\lambda))$ being within appropriate ranges.

Table 1-13 illustrates "a case where any of $D_{uv}(\varphi_{SSL1}(\lambda))$, $\varphi_{SSL1\text{-}BG\text{-}min}/\varphi_{SSL1\text{-}BM\text{-}max}$, and $\lambda_{SSL1\text{-}RM\text{-}max}$ which characterize a spectral power distribution is not appropriate" despite using an appropriate blue semiconductor light-emitting element, an appropriate wide-band green phosphor, and an appropriate red phosphor and despite $A_{cg}(\varphi_{SSL1}(\lambda))$ being within an appropriate range.

Table 1-14 illustrates "a case where $D_{uv}(\varphi_{SSL1}(\lambda))$ is more than −0.007 and $A_{cg}(\varphi_{SSL1}(\lambda))$ is more than +120" despite using an appropriate blue semiconductor light-emitting element, an appropriate wide-band green phosphor, and an appropriate red phosphor.

Table 1-15 illustrates "a case where $\varphi_{SSL1\text{-}BG\text{-}min}/\varphi_{SSL1\text{-}BM\text{-}max}$ is more than 0.7000 and $D_{uv}(\varphi_{SSL1}(\lambda))$ is more than −0.007" despite using an appropriate blue semiconductor light-emitting element, an appropriate wide-band green phosphor, and an appropriate red phosphor and despite $A_{cg}(\varphi_{SSL1}(\lambda))$ being within an appropriate range.

These results show that a light-emitting device which achieves both "a natural, vivid, highly visible and comfortable appearance of colors and appearance of objects" and "an improvement in light source efficiency" cannot be realized unless the spectral power distribution $\varphi_{SSL1}(\lambda)$ as a light-emitting device satisfies all of Condition 1, Condition 2, Condition 3, and Condition 4. It is also shown that a light-emitting device with a spectral power distribution $\varphi_{SSL1}(\lambda)$ not satisfying at least one of Condition 1, Condition 2, Condition 3, and Condition 4 failed to satisfy at least one of Conditions I to IV related to color appearance and, at the same time, ended up being classified in any of ranks −1 to −5 in comparative visual experiments.

Furthermore, with respect to light-emitting elements constituting a light-emitting device, a light-emitting device which achieves both "a natural, vivid, highly visible and comfortable appearance of colors and appearance of objects" and "an improvement in light source efficiency" could not be realized when using a narrow-band green phosphor or a yellow phosphor. This is also apparent from the fact that at least one of Conditions I to IV related to color appearance was not satisfied and, at the same time, from the fact that the light-emitting device was classified into rank −4 in a comparative visual experiment.

Further detailed examination reveals the following.

FIGS. 1-15, 1-16, and 1-17 respectively illustrate spectral power distributions and CIELAB plots of Comparative Experimental Example 103, Comparative Experimental Example 104, and Comparative Experimental Example 105 which correspond to "a case where $D_{uv}(\varphi_{SSL1}(\lambda))$ is less than −0.0220 and $A_{cg}(\varphi_{SSL1}(\lambda))$ is −10 or less" shown in Table 1-10. These comparative experimental examples respectively had the following problems.

Comparative Experimental Example 103 (refer to FIG. 1-15) appeared "excessively gaudy" in a comparative visual experiment. This conceivably corresponds to an excessive degree of improvement in saturation indicated in the CIELAB plot shown in FIG. 1-15. In addition, in essence, this is conceivably also a result of both $D_{uv}(\varphi_{SSL1}(\lambda))$ and $A_{cg}(\varphi_{SSL1}(\lambda))$ having excessively negative values.

In Comparative Experimental Example 104 (refer to FIG. 1-16) and Comparative Experimental Example 105 (refer to FIG. 1-17), "while some colors appeared vividly, other colors appeared dull" in comparative visual experiments. This is conceivably consistent with the degrees of improvement in saturation indicated in the CIELAB plots shown in FIGS. 1-16 and 1-17 being relatively non-uniform for each color sample and, for some hues, the degrees of improvement in saturation tended to be nonsaturated as compared to reference light. In addition, the fact that, for some color samples, an excessive change in hue angle resulted in an excessive change in the color itself conceivably also contributes to this impression.

Meanwhile, with respect to "a case where $\varphi_{SSL1\text{-}BG\text{-}min}/\varphi_{SSL1\text{-}BM\text{-}max}$ is less than 0.225 as a result of the use of a yellow phosphor as a light-emitting element in the intermediate wavelength region" presented in Table 1-11 and "a case where $\varphi_{SSL1\text{-}BG\text{-}min}/\varphi_{SSL1\text{-}BM\text{-}max}$ is less than 0.225 as a result of the use of a narrow-band green phosphor as a light-emitting element in the intermediate wavelength region" presented in Table 1-12, FIGS. 1-18 and 1-19 respectively illustrate spectral power distributions and CIELAB plots of Comparative Experimental Example 107 and Comparative Experimental Example 110. These comparative experimental examples respectively had the following problems.

In comparative visual experiments thereof, "some colors appeared excessively gaudy while other colors appeared excessively dull, and such differences in impression created a sense of considerable discomfort with respect to color appearance". These are trends consistent with the CIELAB plots shown in FIGS. 1-18 and 1-19. In addition, in essence, as demonstrated by Comparative Experimental Example 107 (refer to FIG. 1-18) and Comparative Experimental Example 110 (refer to FIG. 1-19), this is conceivably also due to the fact that, in "a region with weak spectral intensity around 465 nm or more and 525 nm or less" which is created between a spectral power distribution originating from a blue semiconductor light-emitting element and spectral power distributions originating from phosphors responsible for emission of light in the respective intermediate wavelength regions, excessively low spectral intensity caused saturation to increase in comparison to reference light in a hue of an illuminated object while causing saturation to decrease in other hues. Furthermore, the fact that, for some color samples, an excessive change in hue angle resulted in an excessive change in the color itself conceivably also contributes to this impression.

Conversely, using a wide-band green phosphor as a light-emitting element is conceivably favorable because these problems can be readily solved.

In Comparative Experimental Example 106 (not illustrated, $\varphi_{SSL1\text{-}BG\text{-}min}/\varphi_{SSL1\text{-}BM\text{-}max}=0.1033$) presented in Table 1-11, Comparative Experimental Example 110 (FIG. 1-19, $\varphi_{SSL1\text{-}BG\text{-}min}/\varphi_{SSL1\text{-}BM\text{-}max}=0.0978$) presented in Table 1-12, Comparative Experimental Example 115 (FIG. 1-20, $\varphi_{SSL1\text{-}BG\text{-}min}/\varphi_{SSL1\text{-}BM\text{-}max}=0.1105$) presented in Table 1-13, and Comparative Experimental Example 118 (FIG. 1-22, $\varphi_{SSL1\text{-}BG\text{-}min}/\varphi_{SSL1\text{-}BM\text{-}max}=0.1761$) which correspond to "a case where a value of $\varphi_{SSL1\text{-}BG\text{-}min}/\varphi_{SSL1\text{-}BM\text{-}max}$ is excessively smaller than 0.2250", even when Condition 1 (value of $A_{cg}(\varphi_{SSL1}(\lambda))$) Condition 2 (value of $D_{uv}(\varphi_{SSL1}(\lambda))$), and Condition 4 (value of $\lambda_{SSL1\text{-}RM\text{-}max}$) were satisfied, among the color appearances of the 15 specific mathematically-derived Munsell renotation color samples, some demonstrated excessive saturation tendencies while others demonstrated excessive nonsaturation tendencies. In addition, comparative visual experiments conducted using these light-emitting devices resulted in a rank of −4.

Moreover, the following measures are conceivable as means to avoid situations such as those described above where $\varphi_{SSL1\text{-}BG\text{-}min}/\varphi_{SSL1\text{-}BM\text{-}max}$ is excessively small. First, as first means, a wide-band green phosphor can be used. The use of a wide-band green phosphor enables situations where $\varphi_{SSL1\text{-}BG\text{-}min}/\varphi_{SSL1\text{-}BM\text{-}max}$ is excessively small as presented in Comparative Experimental Example 106 and Comparative Experimental Example 110 to be avoided.

In addition, as second means to avoid situations where $\varphi_{SSL1\text{-}BG\text{-}min}/\varphi_{SSL1\text{-}BM\text{-}max}$ is excessively small, a blue semiconductor light-emitting element having an appropriate wavelength can conceivably be used in addition to using a wide-band green phosphor. In the first aspect of the first invention, based on experimental examples, a blue semiconductor light-emitting element having a dominant wavelength during pulse drive of 445.0 nm or more and 475.0 nm or less can be selected, a blue semiconductor light-emitting element having a dominant wavelength during pulse drive of 447.5 nm or more and 470.0 nm or less can be more favorably selected, and a blue semiconductor light-emitting element having a dominant wavelength during pulse drive of 457.5 nm±2.5 nm can be dramatically favorably selected.

Moreover, while one may reason that $\varphi_{SSL1\text{-}BG\text{-}min}/\varphi_{SSL1\text{-}BM\text{-}mix}$ is favorably prevented from becoming excessively small by setting $\lambda_{CHIP\text{-}BM\text{-}dom}$ to a longer wavelength, this is incorrect. A favorable range of $\lambda_{CHIP\text{-}BM\text{-}dom}$ is as described above. The reason for this follows.

First, while the blue semiconductor light-emitting element is an AlGaInN semiconductor light-emitting element epitaxially mainly grown on a sapphire substrate, a Si substrate, a SiC substrate, or a GaN substrate, internal quantum efficiency thereof is dependent on an In composition of a quantum well layer or, in other words, on $\lambda_{CHIP\text{-}BM\text{-}dom}$. For example, an InGaN quantum well layer will now be considered. Since concentration of an In composition in a quantum well layer having sufficient spectral intensity at 465 nm or more and 525 nm or less is high enough to weaken a condition that causes maximum internal quantum efficiency, such an In composition is not favorable from the perspective of satisfying "both color appearance and light source efficiency of a light-emitting device".

In addition, when considering color appearance, setting $\lambda_{CHIP\text{-}BM\text{-}dom}$ to an excessively long wavelength so that spectral intensity originating from a light-emitting element is no longer present in an appropriate portion of a short wavelength region of $\varphi_{SSL1}(\lambda)$ results in color appearances of the 15 specific mathematically-derived Munsell renotation color samples in which a part thereof demonstrates excessive saturation tendencies while other parts demonstrate excessive nonsaturation tendencies. Specifically, tendencies of saturation/nonsaturation occur in different color samples from cases where $\varphi_{SSL1\text{-}BG\text{-}min}/\varphi_{SSL1\text{-}BM\text{-}max}$ is excessively small. Therefore, setting $\lambda_{CHIP\text{-}BM\text{-}dom}$ to an excessively long wavelength is not favorable for the purpose of preventing $\varphi_{SSL1\text{-}BG\text{-}min}/\varphi_{SSL1\text{-}BM\text{-}max}$ from becoming excessively small.

Furthermore, the following measure is conceivable as third means to avoid situations where $\varphi_{SSL1\text{-}BG\text{-}min}/\varphi_{SSL1\text{-}BM\text{-}max}$ is excessively small. Specifically, when a first $\lambda_{CHIP\text{-}BM\text{-}dom}$ is set using a blue semiconductor light-emitting element having a dominant wavelength during pulse drive of 445.0 nm or more and 475.0 nm or less and a yellow phosphor or a narrow-band green phosphor is used as a light-emitting element in the intermediate wavelength region, a light-emitting element can conceivably be added in a range of 465 nm or more and 525 nm or less which straddles the short wavelength region and the intermediate wavelength region. To this end, an AlGaInN blue semiconductor light-emitting element having a second $\lambda_{CHIP\text{-}BM\text{-}dom}$ with a center of its spectral power distribution in a region of 465 nm or more and 525 nm or less, a yellow-green light-emitting element (with a peak wavelength of around 530 nm to 570 nm) due to GaP on a GaP substrate having a second $\lambda_{CHIP\text{-}BM\text{-}dom}$, or the like can be selected and added. Moreover, a wide-band green phosphor can also be used in addition to the above.

However, since improvement in light source efficiency is as important as the color appearance of an illuminated object with the light-emitting device according to the first aspect of the first invention, excessively increasing light-emitting elements may cause a decline in light source efficiency in the form of increased mutual absorption, increased Stokes loss, or the like and is therefore not necessarily favorable. From this perspective, using a yellow phosphor, a narrow-band green phosphor, or the like as a light-emitting element in the intermediate wavelength region and further adding another light-emitting element is not favorable. In other words, in the light-emitting device according to the first aspect of the first invention, while a yellow phosphor, a narrow-band green phosphor, or the like can be used, the use of such phosphors is not necessarily favorable and a wide-band green phosphor is favorably used as a light-emitting element in the intermediate wavelength region.

FIGS. 1-20, 1-21, and 1-22 respectively illustrate spectral power distributions and CIELAB plots of Comparative Experimental Example 115, Comparative Experimental Example 116, and Comparative Experimental Example 118 which correspond to "a case where any of $D_{uv}(\varphi_{SSL1}(\lambda))$, $\varphi_{SSL1-BG-min}/\varphi_{SSL1-BM-max}$, and $\lambda_{SSL1-RM-max}$ which characterize a spectral power distribution is not appropriate" shown in Table 1-13. These comparative experimental examples respectively had the following problems.

In comparative visual experiments of Comparative Experimental Example 115 (refer to FIG. 1-20) and Comparative Experimental Example 118 (refer to FIG. 1-22), "some colors appeared excessively gaudy while other colors appeared excessively dull, and such differences in impression created a sense of considerable discomfort with respect to color appearance". This is conceivably consistent with the degrees of change in saturation indicated in the CIELAB plots shown in FIGS. 1-20 and 1-22 in which saturation is higher than reference light depending on a hue of an illuminated object while saturation decreases for other hues. In essence, this is conceivably due to $\varphi_{SSL1-BG-min}/\varphi_{SSL1-BM-max}$ having an excessively small value.

In Comparative Experimental Example 116 (refer to FIG. 1-21), "while some colors appeared vividly, other colors appeared dull" in a comparative visual experiment. This is conceivably consistent with the degree of improvement in saturation indicated in the CIELAB plot shown in FIG. 1-21 being relatively non-uniform and, for some hues, the degree of improvement in saturation tended to be nonsaturated as compared to reference light. In essence, this is conceivably due to $\lambda_{SSL1-RM-max}$ being on a shorter wavelength side than an appropriate range. Furthermore, conceivably, the fact that, for some color samples, an excessive change in hue angle resulted in an excessive change in the color itself also contributes to this impression.

FIGS. 1-23, 1-24, and 1-25 respectively illustrate spectral power distributions and CIELAB plots of Comparative Experimental Example 119, Comparative Experimental Example 122, and Comparative Experimental Example 123 which correspond to "a case where $D_{uv}(\varphi_{SSL1}(\lambda))$ is more than −0.007 and $A_{cg}(\varphi_{SSL1}(\lambda))$ is more than +120" shown in Table 1-14. These comparative experimental examples respectively had the following problems.

In Comparative Experimental Example 119 (refer to FIG. 1-23) and Comparative Experimental Example 122 (refer to FIG. 1-24), it was determined in comparative visual experiments that "colors appeared dull overall". This is conceivably consistent with the degrees of change in saturation indicated in the CIELAB plots shown in FIGS. 1-23 and 1-24 which demonstrate nonsaturation tendencies as a whole regardless of a hue of an illuminated object. In essence, this is conceivably a result of $D_{uv}(\varphi_{SSL1}(\lambda))$ and $A_{cg}(\varphi_{SSL1}(\lambda))$ having excessively large values. On the other hand, in Comparative Experimental Example 123 (refer to FIG. 1-25), it was determined in a comparative visual experiment that "there was no perceivable improvement in color appearance and, in some colors, the color appearance was inferior". This conceivably corresponds to the degree of change in saturation indicated in the CIELAB plot shown in FIG. 1-25 being small and comparable to reference light. In essence, this is conceivably a result of $D_{uv}(\varphi_{SSL1}(\lambda))$ and $A_{cg}(\varphi_{SSL1}(\lambda))$ having excessively large values.

FIGS. 1-26 and 1-27 respectively illustrate spectral power distributions and CIELAB plots of Comparative Experimental Example 126 and Comparative Experimental Example 127 which correspond to "a case where $\varphi_{SSL1-BG-min}/\varphi_{SSL1-BM-max}$ is more than 0.7000 and $D_{uv}(\varphi_{SSL1}(\lambda))$ is more than −0.007" shown in Table 1-15. These comparative experimental examples respectively had the following problems.

In Comparative Experimental Example 126 (refer to FIG. 1-26) and Comparative Experimental Example 127 (refer to FIG. 1-27), it was respectively determined in comparative visual experiments that "colors appeared dull overall" and "while some colors appeared vividly, other colors appeared dull". This is conceivably consistent with the degree of change in saturation indicated in the CIELAB plot shown in FIG. 1-26 generally demonstrating a nonsaturation tendency regardless of a hue of an illuminated object and, in FIG. 1-27, the degree of improvement in saturation being generally non-uniform and, for some hues, the degree of improvement in saturation tending to be nonsaturated as compared to reference light. In essence, this is conceivably due to $\varphi_{SSL1-BG-min}/\varphi_{SSL1-BM-max}$ being excessively large and, at the same time, $D_{uv}(\varphi_{SSL1}(\lambda))$ being excessively large. Comparative visual experiments respectively resulted in low ranks of −5 and −2 for Comparative Experimental Example 126 and Comparative Experimental Example 127. Therefore, in order to achieve a light-emitting device according to the first aspect of the first invention which satisfies "both color appearance and light source efficiency of a light-emitting device", $\varphi_{SSL1-BG-min}/\varphi_{SSL1-BM-max}$ must be sufficiently controlled. Conceivably, the problem in Comparative Experimental Example 126 and Comparative Experimental Example 127 was that irregularities with appropriate sizes were not formed and irregularities were excessively small in a region of 465 nm or more and 525 nm or less in the spectral power distribution.

Moreover, in a similar manner, $\varphi_{SSL1-BG-min}/\varphi_{SSL1-RM-max}$ must also be sufficiently controlled. In general terms, the appropriate ranges of $\varphi_{SSL1-BG-min}/\varphi_{SSL1-BM-max}$ and $\varphi_{SSL1-BG-min}/\varphi_{SSL1-RM-max}$ indicate that, in order to realize the effect of the first aspect of the first invention, it is essential that irregularities with appropriate sizes are present at appropriate positions in the spectral power distribution $\varphi_{SSL1}(\lambda)$ of the light-emitting device.

While a favorable embodiment for implementing the light-emitting device according to the first aspect of the first invention will be described below, it is to be understood that modes for implementing the light-emitting device according to the first aspect of the first invention is not limited to those used in the following description.

With the light-emitting device according to the first aspect of the first invention, no restrictions are placed on configurations, materials, and the like of the light-emitting device as long as a radiometric property and a photometric property of test light which is irradiated from the light-emitting device in a main radiant direction and which becomes a color stimulus with respect to an illuminated object are in appropriate ranges.

A light-emitting device for implementing the light-emitting device according to the first aspect of the first invention such as an illumination light source, a lighting fixture including the illumination light source, or a lighting system including the illumination light source or the lighting fixture includes blue semiconductor light-emitting element.

Moreover, when the various conditions described above are satisfied and the effect of the first aspect of the first invention is obtained, illuminating light sources including semiconductor light-emitting elements may include, in addition to a blue semiconductor light-emitting element, for example, a plurality of semiconductor light-emitting elements of different types such as green and red in a single illuminating light source or a single illuminating light source may include a blue semiconductor light-emitting element, another single illuminating light source may include a green semiconductor light-emitting element, yet another single illuminating light source may include a red semiconductor light-emitting element, and the illuminating light sources may be integrated together with a lens, a reflecting mirror, a drive circuit, and the like in a lighting fixture to be provided in an illuminating system. Furthermore, in a case where one illumination light source is included in one lighting fixture and an individual semiconductor light-emitting element is incorporated in the illumination light source, even if the light-emitting device according to the first aspect of the first invention cannot be implemented as an individual illumination light source or an individual lighting fixture, a lighting system may be configured such that light radiated as the lighting system satisfies desired characteristics at a position of an illuminated object due to additive color mixing with light from a different lighting fixture that exists in the lighting system or the lighting system may be configured such that light in a main radiant direction among light radiated as the lighting system satisfies desired characteristics. In any mode, light as a color stimulus which is ultimately irradiated on an illuminated object or light in a main radiant direction among light emitted from the light-emitting device need only satisfy appropriate conditions according to the first aspect of the first invention.

Hereinafter, a light-emitting device according to the first aspect of the first invention will be described on the basis of satisfying the appropriate conditions described above.

The light-emitting device according to the first aspect of the first invention favorably includes a light-emitting element (light-emitting material) which has a peak within a short wavelength range from $\Lambda 1$ (380 nm) to $\Lambda 2$ (495 nm), another light-emitting element (light-emitting material) which has a peak within an intermediate wavelength range from $\Lambda 2$ (495 nm) to $\Lambda 3$ (590 nm), and yet another light-emitting element (light-emitting material) which has a peak within a long wavelength range from $\Lambda 3$ (590 nm) to 780 nm. This is because favorable color appearance can be readily achieved if intensity of each of the light-emitting elements can be individually set or controlled.

Therefore, a light-emitting device according to the first aspect of the first invention at least includes one light-emitting element (light-emitting material) having a light emission peak in each of the three wavelength regions described above.

Moreover, when the various conditions described above are satisfied and the effect of the first aspect of the first invention is obtained, two regions among the three wavelength regions may respectively include one light-emitting element (light-emitting material) while the other region may include a plurality of light-emitting elements (light-emitting materials), one region among the three wavelength regions may include one light-emitting element (light-emitting material) while the other two regions may include a plurality of light-emitting elements (light-emitting materials), or all three wavelength regions may include a plurality of light-emitting elements.

In the first aspect of the first invention, while semiconductor light-emitting elements and phosphors can be freely mixed and mounted, at least a blue light-emitting element and two types of (green and red) phosphors are mounted in one light source. Moreover, when the various conditions described above are satisfied and the effect of the first aspect of the first invention is obtained, a blue light-emitting element and three types of (green, red 1, and red 2) phosphors may be mounted in one light source or one light source may include a portion mounted with a blue light-emitting element and two types of (green and red) phosphors and a portion mounted with a purple light-emitting element and three types of (blue, green, and red) phosphors.

In a light-emitting device according to the first aspect of the first invention, as light-emitting elements (light-emitting materials) in the three respective wavelength regions, the following light-emitting materials, phosphor materials, and semiconductor light-emitting elements are favorably included in the light-emitting device as light-emitting elements from the perspective of controlling intensity of peak portions or intensity of valleys between peaks or, in other words, from the perspective of forming appropriate irregularities in a spectral power distribution.

First, in the short wavelength range from $\Lambda 1$ (380 nm) to $\Lambda 2$ (495 nm) among the three wavelength ranges, light emitted from all light sources can be included, such as thermal emission light from a hot filament or the like, electric discharge emission light from a fluorescent tube, a high-pressure sodium lamp, or the like, stimulated emission light from a laser or the like, spontaneous emission light from a semiconductor light-emitting element, and spontaneous emission light from a phosphor. Among the above, emission of light from a semiconductor light-emitting element is favorable due to its small sizes and high energy efficiency.

Specifically, the following is favorable.

Favorable examples of a semiconductor light-emitting element include a blue light-emitting element in which an In(Al)GaN material formed on a sapphire substrate or a GaN substrate is included in an active layer structure. Furthermore, a blue light-emitting element in which a Zn(Cd)(S)Se material formed on a GaAs substrate is included in an active layer structure is also favorable (Favorable peak wavelengths are as described earlier).

Moreover, a spectral power distribution or a peak wavelength of a radiant flux produced by a light-emitting element (light-emitting material) such as a semiconductor light-emitting element or a phosphor normally fluctuates slightly depending on ambient temperature, a heat dissipation environment of the light-emitting device including a package and a fixture, injected current, circuit architecture and, in some cases, deterioration or the like. The same applies to a spectral power distribution or a peak wavelength of a radiant flux produced by light-emitting elements (light-emitting materials) such as the semiconductor light-emitting elements and phosphors described below.

The active layer structure may be any of a multiple quantum well structure in which a quantum well layer and a barrier layer are laminated, a single or a double heterostructure including a relatively thick active layer and a barrier layer (or a clad layer), and a homo junction constituted by a single pn junction.

In addition, when the various conditions described above are satisfied and the effect of the first aspect of the first invention is obtained, a semiconductor laser such as a blue semiconductor laser may be used as a light-emitting element.

A semiconductor light-emitting element in the short wavelength region which is used in a light-emitting device according to the first aspect of the first invention favorably has an emission spectrum with a relatively wide full-width at half-maximum. From this perspective, a full-width at half-maximum of a blue semiconductor light-emitting element used in the short wavelength region is favorably 5 nm or more, more favorably 10 nm or more, extremely favorably 15 nm or more, and dramatically favorably 20 nm or more. However, having a significantly wide emission spectrum also makes it difficult to control $\varphi_{SSL1\text{-}BG\text{-}min}/\varphi_{SSL1\text{-}BM\text{-}max}$, $\varphi_{SSL1\text{-}BG\text{-}min}/\varphi_{SSL1\text{-}RM\text{-}max}$, and the like and prevents irregularities with appropriate sizes from being formed at appropriate positions in the spectral power distribution $\varphi_{SSL1}(\lambda)$. Therefore, a full-width at half-maximum is favorably 45 nm or less, more favorably 40 nm or less, extremely favorably 35 nm or less, and dramatically favorably 30 nm or less.

Since a blue semiconductor light-emitting element in the short wavelength range that is used in the light-emitting device according to the first aspect of the first invention favorably includes an In(Al)GaN material in an active layer structure, the semiconductor light-emitting element is favorably a light-emitting element formed on a sapphire substrate or a GaN substrate.

In addition, as far as substrate thickness is concerned, the substrate is favorably either thick or completely separated from the blue semiconductor light-emitting element. In particular, when creating a blue semiconductor light-emitting element in the short wavelength range on a GaN substrate, in order to facilitate light extraction from side walls of the GaN substrate, the substrate is favorably thick and is 100 μm or more, more favorably 200 μm or more, extremely favorably 400 μm or more, and dramatically favorably 600 μm or more. On the other hand, for convenience of creating elements, the substrate thickness is favorably 2 mm or less, more favorably 1.8 mm or less, extremely favorably 1.6 mm or less, and dramatically favorably 1.4 mm or less.

Meanwhile, when creating a light-emitting element on a sapphire substrate or the like, the substrate is favorably separated using a method such as laser lift-off. Accordingly, internal reflection that occurs at an optical interface between an In(Al)GaN epitaxial layer and a sapphire substrate can be eliminated and light extraction efficiency can be improved. As a result, fabricating a light-emitting device according to the first aspect of the first invention using such a light-emitting element results in an improvement in light source efficiency and is therefore favorable.

In addition, when the various conditions described above are satisfied and the effect of the first aspect of the first invention is obtained, a light-emitting device according to the first aspect of the first invention may include a phosphor material in a short wavelength region.

Moreover, in the first aspect of the first invention, $\varphi_{SSL1}(\lambda)$ described above favorably does not have effective intensity derived from a light-emitting element in a range of 380 nm or more and 405 nm or less. "Does not have effective intensity derived from a light-emitting element" refers to cases where the various conditions described above are satisfied and the effect of the first aspect of the first invention is produced even when $\varphi_{SSL1}(\lambda)$ has intensity derived from a light-emitting element at a wavelength $\lambda_f$ in this range. More specifically, this refers to cases where intensity $\varphi_{SSL1}(\lambda_f)$ derived from a light-emitting element in the wavelength range described above having been normalized by a maximum spectral intensity of $\varphi_{SSL1}(\lambda)$ is favorably 10% or less, more favorably 5% or less, extremely favorably 3% or less, and dramatically favorably 1% or less as relative intensity at an arbitrary wavelength $\lambda_f$ of 380 nm or more and 405 nm or less.

Therefore, in the first aspect of the first invention which uses a light-emitting element that emits blue light such as a blue light-emitting element (for example, a blue semiconductor laser with an oscillation wavelength of around 445 nm to 485 nm), intensity may be included as noise derived from a light-emitting element when intensity derived from the light-emitting element in a range of 380 nm or more and 405 nm or less is within the range of relative intensity described above.

Next, in the intermediate wavelength range from Λ2 (495 nm) to Λ3 (590 nm) among the three wavelength ranges, light emitted from all light sources can be included, such as thermal emission light from a hot filament or the like, electric discharge emission light from a fluorescent tube, a high-pressure sodium lamp, or the like, stimulated emission light from a laser or the like including second-order harmonic generation (SHG) using a non-linear optical effect or the like, spontaneous emission light from a semiconductor light-emitting element, and spontaneous emission light from a phosphor. Among the above, emission of light from a photoexcited phosphor is favorable.

Furthermore, when the various conditions described above are satisfied and the effect of the first aspect of the first invention is obtained, light emission from a semiconductor light-emitting element and light emission from a semiconductor laser or an SHG laser may be included, in which case these components are favorable due to their small sizes and high energy efficiency.

Examples of semiconductor light-emitting elements include a blue-green light-emitting element (with a peak wavelength of around 495 nm to 500 nm), a green light-emitting element (with a peak wavelength of around 500 nm to 530 nm), a yellow-green light-emitting element (with a peak wavelength of around 530 nm to 570 nm), and a yellow light-emitting element (with a peak wavelength of around 570 nm to 580 nm) which include an In(Al)GaN material on a sapphire substrate or a GaN substrate in an active layer structure. In addition, examples of semiconductor light-emitting elements include a yellowish green light-emitting element (with a peak wavelength of around 530 nm to 570 nm) due to GaP on a GaP substrate or a yellow light-emitting element (with a peak wavelength of around 570 nm to 580 nm) due to GaAsP on a GaP substrate. Furthermore, example of semiconductor light-emitting elements includes a yellow light-emitting element (with a peak wavelength of around 570 nm to 580 nm) due to AlInGaP on a GaAs substrate.

Specific examples of a green phosphor material in the intermediate wavelength region to be used in a light-emitting device according to the first aspect of the first invention include green phosphors which use, as a base material, $Ce^{3+}$ activated aluminate, $Ce^{3+}$ activated yttrium-aluminum oxide, $Eu^{2+}$ activated alkaline-earth silicate crystals, or $Eu^{2+}$ activated alkaline-earth nitride silicate. These green phosphors can normally be excited using a semiconductor light-emitting element ranging from ultraviolet to blue.

Specific examples of the $Ce^{3+}$ activated aluminate phosphor include a green phosphor represented by the following general formula (4), $$Y_a(Ce,Tb,Lu)_b(Ga,Sc)_cAl_dO_e \tag{4}$$

(In the general formula (4), a, b, c, d and e satisfy a+b=3, $0 \leq b \leq 0.2$, $4.5 \leq c+d \leq 5.5$, $0.1 \leq c \leq 2.6$, and $10.8 \leq e \leq 13.4$.) ($Ce^{3+}$ activated aluminate phosphor represented by the general formula (4) is referred to as a G-YAG phosphor).

In the G-YAG phosphor in particular, the composition range that satisfies the general formula (4) can be suitably selected. In the first aspect of the first invention, the wavelength $\lambda_{PHOS\text{-}GM\text{-}max}$ and the full-width at half-maximum $W_{PHOS\text{-}GM\text{-}fwhm}$ that implement the maximum emission intensity when light is excited with the phosphor alone are preferably in the following ranges.

0.01≤b≤0.05 and 0.1≤c≤2.6 is preferable,
0.01≤b≤0.05 and 0.3≤c≤2.6 is more preferable, and
0.01≤b≤0.05 and 1.0≤c≤2.6 is extremely preferable;
0.01≤b≤0.03 and 0.1≤c≤2.6 is also preferable,
0.01≤b≤0.03 and 0.3≤c≤2.6 is more preferable, and
0.01≤b≤0.03 and 1.0≤c≤2.6 is extremely preferable.

Specific examples of $Ce^{3+}$ activated yttrium-aluminum oxide phosphor include a green phosphor represented by the following general formula (5).

$$Lu_a(Ce,Tb,Lu)_b(Ga,Sc)_cAl_dO_e \qquad (5)$$

(In the general formula (5), a, b, c, d and e satisfy a+b=3, 0≤b≤0.2, 4.5≤c+d≤5.5, 0≤c≤2.6, and 10.8≤e≤13.4.) (the $Ce^{3+}$ activated yttrium-aluminum oxide phosphor represented by the general formula (5) is called "LuAG phosphor".)

In the LuAG phosphor, in particular, the composition range that satisfies the general formula (5) can be suitably selected. In the first aspect of the first invention, the wavelength $\lambda_{PHOS-GM-max}$ and the full-width at half-maximum $W_{PHOS-GM-fwhm}$ that implement the maximum emission intensity when light is excited with the phosphor alone are preferably in the following ranges.

0.00≤b≤0.13 is preferable,
0.02≤b≤0.13 is more preferable, and
0.02≤b≤0.10 is extremely preferable.

Other examples include green phosphors represented by the following general formula (6) and a phosphor represented by the following general formula (7).

$$M^1_aM^2_bM^3_cO_d \qquad (6)$$

(In the general formula (6), $M^1$ indicates a bivalent metallic element, $M^2$ indicates a trivalent metallic element, and $M^3$ indicates a tetravalent metallic element, and a, b, c and d satisfy 2.7≤a≤3.3, 1.8≤b≤2.2, 2.7≤c≤3.3 and 11.0≤d≤13.0.) (The phosphor represented by the general formula (6) is referred to as a CSMS phosphor).

In the above general formula (6), $M^1$ is a bivalent metallic element, and is preferably at least one type selected from the group consisting of Mg, Ca, Zn, Sr, Cd and Ba, further preferably Mg, Ca or Zn, and particularly preferably Ca. In this case, Ca may be a single system or may be a composite system with Mg. $M^1$ may include other bivalent metallic elements.

$M^2$ is a trivalent metallic element, and is preferably at least one type selected from the group consisting of Al, Sc, Ga, Y, In, La, Gd and Lu, further preferably Al, Sc, Y or Lu, and particularly preferably Sc. In this case, Sc may be a single system or may be a composite system with Y or Lu. $M^2$ must include Ce and may include other trivalent metallic elements.

$M^3$ is a tetravalent metallic element, and preferably includes at least Si. An example of a tetravalent metallic element $M^3$, other than Si, is preferably at least one type selected from the group consisting of Ti, Ge, Zr, Sn and Hf, more preferably at least one type selected from the group consisting of Ti, Zr, Sn and Hf, and particularly preferably Sn. Particularly it is preferable that $M^3$ is Si. $M^3$ may include other tetravalent metallic elements.

In the CSMS phosphor in particular, the composition range that satisfies the general formula (6) can be suitably selected. For the wavelength $\lambda_{PHOS-GM-max}$ and the full-width at half-maximum $W_{PHOS-GM-fwhm}$ that implement the maximum emission intensity when light is excited with the phosphor alone to be in a preferable range in the first aspect of the first invention, the lower limit of the ratio of Ce included in $M^2$ to the entire $M^2$ is preferably 0.01 or more, and more preferably 0.02 or more. Further, the upper limit of the ratio of Ce included in $M^2$ to the entire $M^2$ is preferably 0.10 or less, and more preferably 0.06 or less. Further, the lower limit of the ratio of Mg included in $M^1$ to the entire $M^1$ is preferably 0.01 or more, and more preferably 0.03 or more. On the other hand, the upper limit is preferably 0.30 or less, and more preferably 0.10 or less.

Furthermore, examples include represented by the following general formula (7).

$$M^1_aM^2_bM^3_cO_d \qquad (7)$$

(In the general formula (7), $M^1$ indicates an activator element including at least Ce, $M^2$ is a bivalent metallic element, and $M^3$ is a trivalent metallic element, and a, b, c and d satisfy 0.0001≤a≤0.2, 0.8≤b≤1.2, 1.6≤c≤2.4 and 3.2≤d≤4.8.) (A phosphor represented by the general formula (7) is called "CSO phosphor".)

In the above general formula (7), $M^1$ is an activator element contained in a host crystal, and includes at least Ce. $M^1$ can contain at least one type of bivalent to tetravalent element selected from the group consisting of Cr, Mn, Fe, Co, Ni, Cu, Ce, Pr, Nd, Sm, Eu, Tb, Dy, Ho, Er, Tm and Yb.

$M^2$ is a bivalent metallic element, and is preferably at least one type selected from the group consisting of Mg, Ca, Zn, Sr, Cd and Ba, further preferably Mg, Ca or Sr, and is particularly preferably that Ca is 50 mol % or more of the elements of $M^2$.

$M^3$ is a trivalent metallic element, and is preferably at least one type selected from the group consisting of Al, Sc, Ga, Y, In, La, Gd, Yb and Lu, and further preferably Al, Sc, Yb or Lu, more further preferably Sc, or Sc and Al, or Sc and Lu, and is particularly preferably that Sc is 50 mol % or more of the elements of $M^3$.

$M^2$ and $M^3$ are a bivalent metallic element and trivalent metallic element respectively, and a small part of $M^2$ and/or $M^3$ may be a metallic element of which valence is any one of 1, 4 and 5, and a very small amount of anions, such as a halogen element (F, Cl, Br, I), nitrogen, sulfur selenium or the like may be contained in the compound.

In a CSO phosphor in particular, a composition range that satisfies the general formula (7) can be suitably selected. In the first aspect of the first invention, the wavelength $\lambda_{PHOS-GM-max}$ and the full-width at half-maximum $W_{PHOS-GM-fwhm}$ that implement the maximum emission intensity when light is excited with phosphor alone are preferably in the following ranges.

0.005≤a≤0.200 is preferable,
0.005≤a≤0.012 is more preferable, and
0.007≤a≤0.012 is extremely preferable.

Furthermore, specific examples of green phosphors using an alkaline-earth silicate crystal as a host and $Eu^{2+}$ as an activator include a phosphor represented by the following general formula (8).

$$(Ba_aCa_bSr_cMg_dEu_x)SiO_4 \qquad (8)$$

(In the general formula (8), a, b, c, d, and x satisfy a+b+c+d+x=2, 1.0≤a≤2.0, 0≤b<0.2, 0.2≤c≤1.0, 0≤d<0.2, and 0<x≤0.5.) (Alkaline-earth silicate represented by the general formula (8) is referred to as a BSS phosphor).

In the BSS phosphor, a composition range that satisfies the general formula (8) can be suitable selected. In the first aspect of the first invention, the wavelength $\lambda_{PHOS-GM-max}$ and the full-width at half-maximum $W_{PHOS-GM-fwhm}$ that implement the maximum emission intensity when light is excited with the phosphor alone are preferably in the following ranges.

0.20≤c≤1.00 and 0.25<x≤0.50 is more preferable.
0.20≤c≤1.00 and 0.25<x≤0.30 is extremely preferable;
Furthermore,
0.50≤c≤1.00 and 0.00<x≤0.50 is preferable,
0.50≤c≤1.00 and 0.25<x≤0.50 is more preferable, and
0.50≤c≤1.00 and 0.25<x≤0.30 is extremely preferable.

Furthermore, specific examples of green phosphors using an alkaline-earth nitride silicate as a host and $Eu^{2+}$ as an activator include a phosphor represented by the following general formula (9).

$$(Ba,Ca,Sr,Mg,Zn,Eu)_3Si_6O_{12}N_2 \quad (9)$$

(This phosphor is referred to as a BSON phosphor).

In the BSON phosphor, a composition range that satisfies the general formula (9) can be suitable selected. In the first aspect of the first invention, the wavelength $\lambda_{PHOS-GM-max}$ and the full-width at half-maximum $W_{PHOS-GM-fwhm}$ that implement the maximum emission intensity when light is excited with the phosphor alone are preferably in the following ranges.

In the general formula (9), a combination of Ba, Sr and Eu is preferably among the selectable bivalent metallic elements (Ba, Ca, Sr, Mg, Zn, Eu), and the ratio of Sr to Ba is more preferably 10 to 30%.

In addition, when the various conditions described above are satisfied and the effect of the first aspect of the first invention is obtained, a yellow phosphor may be additionally included such as a yttrium-aluminum-garnet-based phosphor (referred to as a YAG phosphor) which is represented by $(Y_{1-u}Gd_u)_3(Al_{1-v}Ga_v)_5O_{12}$:Ce,Eu (where u and v respectively satisfy 0≤u≤0.3 and 0≤v≤0.5) or a lanthanum silicon nitride phosphor (referred to as an LSN phosphor) which is represented by $Ca_{1.5x}La_{3-x}Si_6N_{11}$:Ce (where x satisfies 0≤x≤1). Furthermore, a narrow-band green phosphor represented by $Si_{6-z}Al_zO_zN_{8-z}$:EU (where 0<z<4.2) having an $Eu^{2+}$ activated SiAlON crystal as a base material (this phosphor is referred to as a β-SiAlON phosphor) may be included. However, it is difficult to realize a desired color appearance of an illuminated object when configuring a light-emitting device using only these narrow-band green phosphors or yellow phosphors as a light-emitting element in the intermediate wavelength region. Therefore, in the light-emitting device according to the first aspect of the first invention, while a yellow phosphor or a narrow-band green phosphor can be used in combination with other semiconductor light-emitting elements, wide-band phosphors, or the like, such combined use is not necessarily favorable. Favorably, a wide-band green phosphor is used as a light-emitting element in the intermediate wavelength region.

Therefore, a light-emitting device according to the first aspect of the first invention favorably does not substantially include a yellow phosphor. "Does not substantially include a yellow phosphor" refers to cases where the various conditions described above are satisfied and the effect produced by the first aspect of the first invention is obtained even when a yellow phosphor is included and specifically refers to cases where a weight of a yellow phosphor with respect to a weight of all phosphors is favorably 7% or less, more favorably 5% or less, extremely favorably 3% or less, and dramatically favorably 1% or less.

Next, in the long wavelength range from Λ3 (590 nm) to 780 nm among the three wavelength ranges, light emitted from all light sources can be included, such as thermal emission light from a hot filament or the like, electric discharge emission light from a fluorescent tube, a high-pressure sodium lamp, or the like, stimulated emission light from a laser or the like, spontaneous emission light from a semiconductor light-emitting element, and spontaneous emission light from a phosphor. Among the above, emission of light from a photoexcited phosphoris is favorable.

Furthermore, when the various conditions described above are satisfied and the effect of the first aspect of the first invention is obtained, light emission from a semiconductor light-emitting element and light emission from a semiconductor laser or an SHG laser may be included, in which case these components are favorable due to their small sizes and high energy efficiency.

Examples of the semiconductor light-emitting element include an orange light-emitting element (with a peak wavelength of around 590 nm to 600 nm) or a red light-emitting element (from 600 nm to 780 nm) in which an AlGaAs material formed on a GaAs substrate or an (Al)InGaP material formed on a GaAs substrate is included in an active layer structure. In addition, examples of the semiconductor light-emitting element include of a red light-emitting element (from 600 nm to 780 nm) in which an GaAsP material formed on a GaP substrate is included in an active layer structure.

In addition, specific examples of the light-emitting device according to the first aspect of the first invention include phosphors using $Eu^{2+}$ as an activator and a crystal constituted by alkaline-earth silicon-nitride, a SiAlON, or alkaline-earth silicate as a host. A red phosphor of this type can normally be excited using a semiconductor light-emitting element ranging from ultraviolet to blue.

Specific examples of phosphors using an alkaline-earth silicon-nitride crystal as a host include a phosphor represented by $CaAlSiN_3$:Eu (this phosphor is referred to as a CASN phosphor), $(Ca,Sr,Ba,Mg)AlSiN_3$:Eu and/or $(Ca,Sr,Ba)AlSiN_3$:Eu (this phosphor is referred to as a SCASN phosphor), a phosphor represented by $(CaAlSiN_3)_{1-x}(Si_2N_2O)_x$:Eu (where x satisfies 0<x<0.5) (this phosphor is referred to as a CASON phosphor), a phosphor represented by $(Sr,Ca,Ba)_2Al_xSi_{5-x}O_xN_{8-x}$:Eu (where 0≤x≤2), and a phosphor represented by $Eu_y(Sr,Ca,Ba)_{1-y}:Al_{1+x}Si_{4-x}O_xN_{7-x}$ (where 0≤x<4, 0≤y<0.2).

Other examples include a $Mn^{4+}$-activated fluoride complex phosphor. A $Mn^{4+}$-activated fluoride complex phosphor is a phosphor which uses $Mn^{4+}$ as an activator and a fluoride complex salt of an alkali metal, amine, or an alkaline-earth metal as a host crystal. Fluoride complex salts which form the host crystal include those whose coordination center is a trivalent metal (B, Al, Ga, In, Y, Sc, or a lanthanoid), a tetravalent metal (Si, Ge, Sn, Ti, Zr, Re, or Hf), and a pentavalent metal (V, P, Nb, or Ta), and the number of fluorine atoms coordinated around the center ranges from 5 to 7.

Specific examples of a $Mn^{4+}$-activated fluoride complex phosphor include $A_{2+x}M_yMn_zF_n$ (where A is Na and/or K; M is Si and Al; −1≤x≤1 and 0.9≤y+z≤1.1 and 0.001≤z≤0.4 and 5≤n≤7) having a hexafluoro complex salt of an alkaline metal as a base crystal. Phosphors represented by $A_{2+x}M_yMn_zF_n$ include those where A denotes one or more elements selected from K (potassium) and Na (sodium) and M denotes Si (silicon) or Ti (titanium) such as $K_2SiF_6$:Mn (referred to as a KSF phosphor) or $K_2Si_{1-x}Na_xAl_xF_6$:Mn, $K_2TiF_6$:Mn (referred to as a KSNAF phosphor) which is obtained by replacing a part (favorably, 10 mol % or less) of the constituent elements of $K_2SiF_6$:Mn with Al and Na.

Other examples include a phosphor represented by the following general formula (10) and a phosphor represented by the following general formula (11).

$(La_{1-x-y}Eu_xLn_y)_2O_2S$ (10)

(In the general formula (10), x and y denote numbers respectively satisfying 0.02≤x≤0.50 and 0≤y≤0.50, and Ln denotes at least one trivalent rare-earth element among Y, Gd, Lu, Sc, Sm, and Er). (A lanthanum oxysulfide phosphor represented by the general formula (10) is referred to as an LOS phosphor).

$(k-x)MgO \cdot xAF_2 \cdot GeO_2{:}yMn^{4+}$ (11)

(In the general formula (11), k, x, and y denote numbers respectively satisfying 2.8≤k≤5, 0.1≤x≤0.7, and 0.005≤y≤0.015, and A is any of calcium (Ca), strontium (Sr), barium (Ba), zinc (Zn), and a mixture consisted of these elements). (A germanate phosphor represented by the general formula (11) is referred to as an MGOF phosphor).

In the first aspect of the first invention, a configuration in which only one of a CASN phosphor, a CASON phosphor, and a SCASN phosphor is included in a light-emitting device is favorable for improving light source efficiency. Meanwhile, although a KSF phosphor, a KSNAF phosphor, a LOS phosphor, and a MGOF phosphor have extremely narrow half-value widths of around 6 nm, around 6 nm, around 4 nm, and around 16 nm, respectively, using these phosphors in combination with a CASN phosphor, a CASON phosphor, a SCASN phosphor, or the like may result in forming irregularities in an appropriate range in the spectral power distribution $\varphi_{SSL1}(\lambda)$ of the light-emitting device and is therefore favorable.

With the combinations of light-emitting elements described above, peak wavelength positions, full-widths at half-maximum, and the like of the respective light-emitting elements are extremely advantageous in realizing a color appearance or an object appearance perceived as favorable by the subjects in the visual experiments.

In the light-emitting device according to the first aspect of the first invention, it is favorable to use the light-emitting elements (light-emitting materials) heretofore described because the index $A_{cg}(\varphi_{SSL1}(\lambda))$, the distance $D_{uv}(\varphi_{SSL1}(\lambda))$, $\varphi_{SSL1\text{-}BG\text{-}min}/\varphi_{SSL1\text{-}BM\text{-}max}$, the wavelength $\lambda_{SSL1\text{-}RM\text{-}max}$ and the like can be more readily set to desired values. Using the light-emitting elements described above is also favorable because $\Delta C_{nSSL1}$, $SAT_{ave}(\varphi_{SSL1}(\lambda))$, $|\Delta C_{SSL\text{-}max1} - \Delta C_{SSL\text{-}min1}|$, and $|\Delta h_{nSSL1}|$ which are related, when light is treated as a color stimulus, to a difference between color appearances of the 15 color samples when illumination by the light-emitting device is assumed and color appearances when illumination by calculational reference light is assumed can also be more readily set to desired values.

A second aspect of the first invention of the present invention is a method for designing a light-emitting device. With a method for designing according to the second aspect of the first invention of the present invention, design guidelines for "a light-emitting device capable of realizing a natural, vivid, highly visible and comfortable appearance of colors or an appearance of objects" can be provided. In other words, by designing a light-emitting device according to the description of the second aspect of the first invention of the present invention, "a light-emitting device capable of realizing a natural, vivid, highly visible and comfortable appearance of colors or an appearance of objects" can be provided. That is, the description on the first aspect of the first invention may be entirely applied to the second aspect of the first invention of the present invention.

<2. Second Invention>

The second invention of the present invention includes an aspect related to the light-emitting device (a first aspect of the second invention) as well as an aspect related to a method for designing the light-emitting device (a second aspect of the second invention), an aspect related to a method for driving the light-emitting device (a third aspect of the second invention), and an aspect related to an illumination method (a fourth aspect of the second invention).

In order to solve the problems described in the section titled "Technical Problem" presented earlier, the present inventor has arrived with a light-emitting device having improved light source efficiency and a design guideline for the light-emitting device in Japanese Patent Application No. 2014-159784.

The light sources described above that satisfy the requirements which the present inventor has already discovered can implement "a natural, vivid, highly visible, and comfortable appearance of colors and an appearance of objects" and, at the same time, improve light source efficiency of such light sources.

However, the concept of an optimum illumination slightly differs depending on age, gender, country and the like, and also differs depending on the space and purpose of the illumination. Furthermore, taste in illumination which an individual feels to be optimum may differ greatly depending on the living environment where the individual grew up and the culture thereof.

It is an object of the second invention of the present invention to provide a light-emitting device that can implement a natural, vivid, highly visible and comfortable appearance of colors and appearance of objects as if the objects are seen outdoors, and to provide a light-emitting device with improved light source efficiency that can change the appearance of colors of illuminated objects so as to satisfy the requirements for various illuminations, and a method for designing thereof. Furthermore, it is an object of the second invention of the present invention to provide a method for driving the light-emitting device and an illumination method with a device.

In order to achieve the objects described above, the first aspect of the second invention of the present invention relates to the following a light-emitting device.

[1] A light-emitting device which includes M number of light-emitting areas (where M is a natural number equal to or greater than 2), and has a blue semiconductor light-emitting element, a green phosphor, and a red phosphor as light-emitting elements in at least one of the light-emitting areas, wherein when $\varphi_{SSL2}N(\lambda)$ (where N ranges from 1 to M) denotes a spectral power distribution of light emitted from each light-emitting area in a main radiant direction of the light-emitting device, and $\varphi_{SSL2}(\lambda)$ denoting a spectral power distribution of all light emitted from the light-emitting device in the radiant direction satisfies $$\phi_{SSL2}(\lambda) = \sum_{N=1}^{M} \phi_{SSL2}N(\lambda),$$ [Expression 10]

the light-emitting device includes a light-emitting area where $\varphi_{SSL2}(\lambda)$ satisfies Conditions 1 to 4 below.

Condition 1:
light emitted from the light-emitting device includes, in the main radiant direction thereof, light whose distance $D_{uv}(\varphi_{SSL2}(\lambda))$ from a black-body radiation locus as defined by ANSI C78.377 satisfies $$-0.0220 \leq D_{uv}(\varphi_{SSL2}(\lambda)) \leq -0.0070,$$

Condition 2:
$\varphi_{SSL2}(\lambda)$ denotes a spectral power distribution of light emitted from the light-emitting device in the radiant direction, $\varphi_{ref2}(\lambda)$ denotes a spectral power distribution of reference light which is selected in accordance with a correlated color temperature $T_{SSL2}$ of the light emitted from the light-emitting device in the radiant direction, $(X_{SSL2}, Y_{SSL2}, Z_{SSL2})$ denote tristimulus values of the light emitted from the light-emitting device in the radiant direction, and $(X_{ref2}, Y_{ref2}, Z_{ref2})$ denote tristimulus values of the reference light which is selected in accordance with the correlated color temperature $T_{SSL2}$ of the light emitted from the light-emitting device in the main radiant direction, and a normalized spectral power distribution $S_{SSL2}(\lambda)$ of the light emitted from the light-emitting device in the radiant direction, a normalized spectral power distribution $S_{ref2}(\lambda)$ of the reference light which is selected in accordance with the correlated color temperature $T_{SSL2}$ (K) of the light emitted from the light-emitting device in the radiant direction, and a difference $\Delta S_{SSL2}(\lambda)$ of between normalized spectral power distributions are respectively defined as $$S_{SSL2}(\lambda) = \varphi_{SSL2}(\lambda)/Y_{SSL2},$$

$$S_{ref2}(\lambda) = \varphi_{ref2}(\lambda)/Y_{ref2} \text{ and}$$

$$\Delta S_{SSL2}(\lambda) = S_{ref2}(\lambda) - S_{SSL2}(\lambda) \text{ and}$$

in a case where $\lambda_{SSL2-RL-max}$ (nm) represents a wavelength that provides a longest wavelength local maximum value of $S_{SSL2}(\lambda)$ in a wavelength range of 380 nm or more and 780 nm or less, and when a wavelength $\Lambda4$ that is represented by $S_{SSL2}(\lambda_{SSL2-RL-max})/2$ exists on a longer wavelength-side of $\lambda_{SSL2-RL-max}$, an index $A_{cg}(\varphi_{SSL2}(\lambda))$ represented by the following formula (2-1) satisfies $$-10.0 < A_{cg}(\varphi_{SSL2}(\lambda)) \leq 120.0,$$

but
in a case where $\lambda_{SSL2-RL-max}$ (nm) represents a wavelength that provides the longest wavelength local maximum value of $S_{SSL2}(\lambda)$ in a wavelength range of 380 nm or more and 780 nm or less, and when the wavelength $\Lambda4$ that is represented by $S_{SSL2}(\lambda_{SSL2-RL-max})/2$ does not exist on the longer wavelength-side of $\lambda_{SSL2-RL-max}$, an index $A_{cg}(\varphi_{SSL2}(\lambda))$ represented by the following formula (2-2) satisfies $$-10.0 < A_{cg}(\varphi_{SSL2}(\lambda)) \leq 120.0;$$

[Expression 11]

$$A_{cg}(\varphi_{SSL2}(\lambda)) = \int_{380}^{495} \Delta S_{SSL2}(\lambda)d\lambda + \int_{495}^{590}(-\Delta S_{SSL2}(\lambda))d\lambda + \int_{590}^{\Lambda 4} \Delta S_{SSL2}(\lambda)d\lambda \quad (2\text{-}1)$$

[Expression 12]

$$A_{cg}(\varphi_{SSL2}(\lambda)) = \int_{380}^{495} \Delta S_{SSL2}(\lambda)d\lambda + \int_{495}^{590}(-\Delta S_{SSL2}(\lambda))d\lambda + \int_{590}^{780} \Delta S_{SSL2}(\lambda)d\lambda \quad (2\text{-}2)$$

Condition 3:
when a maximum value of spectral intensity in a range of 430 nm or more and 495 nm or less is defined as $\varphi_{SSL2-BM-max}$ and a minimum value of spectral intensity in a range of 465 nm or more and 525 nm or less is defined as $\varphi_{SSL2-BG-min}$, the spectral power distribution $\varphi_{SSL2}(\lambda)$ of light satisfies $$0.2250 \leq \varphi_{SSL2-BG-min}/\varphi_{SSL2-BM-max} \leq 0.7000; \text{ and}$$

Condition 4:
in the spectral power distribution $\varphi_{SSL2}(\lambda)$ of light, when a maximum value of spectral intensity in a range of 590 nm or more and 780 nm or less is defined as $\varphi_{SSL2-RM-max}$, a wavelength $\lambda_{SSL2-RM-max}$ that provides $\varphi_{SSL2-RM-max}$ satisfies $$605 \text{ (nm)} \leq \lambda_{SSL2-RM-max} \leq 653 \text{ (nm)}.$$

[2] The light-emitting device according to [1], wherein all of $\varphi_{SSL2}N(\lambda)$ (N is 1 to M) satisfies the Conditions 1 to 4.

[3] The light-emitting device according to [1] or [2], wherein at least one light-emitting area of the M number of light-emitting areas has wiring that allows the light-emitting area to be electrically driven independently from other light-emitting areas.

[4] The light-emitting device according to [3], wherein all the M numbers of light-emitting areas each have wiring that allows the light-emitting area to be electrically driven independently from other light-emitting areas.

[5] The light-emitting device according to any one of [1] to [4], wherein the light-emitting device satisfies Condition 5 below.
Condition 5:
In the spectral power distribution $\varphi_{SSL2}(\lambda)$ of light described above, a wavelength $\lambda_{SSL2-BM-max}$ that provides $\varphi_{SSL2-BM-max}$ satisfies $$430 \text{ (nm)} \leq \lambda_{SSL2-BM-max} \leq 480 \text{ (nm)}.$$

[6] The light-emitting device according to any one of [1] to [5], wherein the light-emitting device satisfies Condition 6 below.
Condition 6:

$$0.1800 \leq \varphi_{SSL2-BG-min}/\varphi_{SSL2-RM-max} \leq 0.8500.$$

[7] The light-emitting device according to any one of [1] to [6], wherein a luminous efficacy of radiation $K_{SSL2}$ (lm/W) in a wavelength range of 380 nm or more and 780 nm or less, which is derived from $\varphi_{SSL2}(\lambda)$, satisfies Condition 7 below.
Condition 7:

$$210.0 \text{ lm/W} \leq K_{SSL2} \leq 290.0 \text{ lm/W}.$$

[8] The light-emitting device according to any one of [1] to [7], wherein at least one selected from the group consisting of the index $A_{cg}(\varphi_{SSL2}(\lambda))$ represented by the formula (2-1) or (2-2), the correlated color temperature $T_{SSL2}(K)$ and the distance $D_{uv}(\varphi_{SSL2}(\lambda))$ from the black-body radiation locus can be changed.

[9] The light-emitting device according to [8], wherein a luminous flux and/or a radiant flux emitted from the light-emitting device in the main radiant direction can be independently controlled when at least one selected from the group consisting of the index $A_{cg}(\varphi_{SSL2}(\lambda))$ represented by the formula (2-1) or (2-2), the correlated color temperature $T_{SSL2}(K)$ and the distance $D_{uv}(\varphi_{SSL2}(\lambda))$ from the black-body radiation locus is changed.

[10] The light-emitting device according to any one of [1] to [9], wherein a maximum distance L between two arbitrary points on a virtual outer periphery enveloping the entire light-emitting areas closest to each other, is 0.4 mm or more and 200 mm or less.

[11] The light-emitting device according to any one of [1] to [10], including the light-emitting areas that allow $\varphi_{SSL2}(\lambda)$ to further satisfy the following Conditions I to IV by changing a luminous flux amount and/or a radiant flux amount emitted from the light-emitting areas:

Condition I:

when $a^*_{nSSL2}$ and $b^*_{nSSL2}$ (where n is a natural number from 1 to 15) respectively denote the a* value and b* value in the CIE 1976 L*a*b* color space of the following 15 Munsell renotation color samples of #01 to #15 based on a mathematical assumption that illumination is performed by the light emitted in the radiant direction, and when $a^*_{nref2}$ and $b^*_{nref2}$ (where n is a natural number from 1 to 15) respectively denote the a* value and b* value in the CIE 1976 L*a*b* color space of the 15 Munsell renotation color samples based on a mathematical assumption that illumination is performed by reference light which is selected in accordance with the correlated color temperature $T_{SSL2}$ (K) of the light emitted in the radiant direction, each saturation difference $\Delta C_{nSSL2}$ satisfies $-4.00 \leq \Delta C_{nSSL2} \leq 8.00$ (where $n$ is a natural number from 1 to 15), Condition II:

an average saturation difference $SAT_{ave}(\varphi_{SSL2}(\lambda))$ represented by the following formula (2-3) satisfies $0.50 \leq SAT_{ave}(\varphi_{SSL1}(\lambda)) \leq 4.00$, (2-3) [Expression 13]

$$SAT_{ave}(\phi_{SSL2}(\lambda)) = \frac{\sum_{n=1}^{15} \Delta C_{nSSL2}}{15}$$

Condition III:

when a maximum saturation difference value is denoted by $\Delta C_{SSL-max2}$ and a minimum saturation difference value is denoted by $\Delta C_{SSL-min2}$, a difference $|\Delta C_{SSL-max2} - \Delta C_{SSL-min2}|$ between the maximum saturation difference value and the minimum saturation difference value satisfies $2.00 \leq |\Delta C_{max} - \Delta C_{min}| \leq 10.00$, where $\Delta C_{nSSL2} = \sqrt{\{(a^*_{nSSL2})^2 + (b^*_{nSSL2})^2\}} - \sqrt{\{(a^*_{nref2})^2 + (b^*_{nref2})^2\}}$ with the 15 Munsell renotation color samples being:

| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12 |

Condition IV:

when $\theta_{nSSL2}$ (degrees) (where n is a natural number from 1 to 15) denotes a hue angle in the CIE 1976 L*a*b* color space of the 15 Munsell renotation color samples based on a mathematical assumption that illumination is performed by the light emitted in the radiant direction, and when $\theta_{nref2}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature $T_{SSL2}$ of the light emitted in the radiant direction, an absolute value of each difference in hue angles $|\Delta h_{nSSL2}|$ satisfies 0.00 degree $\leq |\Delta h_{nSSL2}| \leq 9.0$ degree (where $n$ is a natural number from 1 to 15), where $\Delta h_n = \theta_{nSSL2} - \theta_{nref2}$.

[12] The light-emitting device according to any one of [1] to [11], wherein a correlated color temperature $T_{SSL2}$ (K) of light emitted from the light-emitting device in the radiant direction satisfies 2600 K $\leq T_{SSL2} \leq$ 7700 K.

[13] The light-emitting device according to any one of [1] to [12], including light-emitting areas so that the $\varphi_{SSL2}(\lambda)$ can satisfy the Conditions 1 to 4 by changing a luminous flux amount and/or a radiant flux amount emitted from the light-emitting areas.

[14] A method for designing a light-emitting device which includes M number of light-emitting areas (M is 2 or greater natural number), and has a blue semiconductor light-emitting element, a green phosphor, and a red phosphor as light-emitting elements in at least one of the light-emitting areas, the method comprising designing the light-emitting areas such that, when $\varphi_{SSL2}(\lambda)$ (N is 1 to M) is a spectral power distribution of a light emitted from each light-emitting area in a main radiant direction of the light-emitting device, and $\varphi_{SSL2}(\lambda)$, which is a spectral power distribution of all the lights emitted from the light-emitting device in the radiant direction, is represented by $$\phi_{SSL2}(\lambda) = \sum_{N=1}^{M} \phi_{SSL2N}(\lambda),$$ [Expression 14]

$\varphi_{SSL2}(\lambda)$ satisfies the following Conditions 1 to 4:

Condition 1:

a distance $D_{uv}(\varphi_{SSL2}(\lambda))$ of the spectral power distribution $\varphi_{SSL1}(\lambda)$ of light from a black-body radiation locus defined by ANSI C78.377 satisfies $-0.0220 \leq D_{uv}(\varphi_{SSL2}(\lambda)) \leq -0.0070$;

Condition 2:

$\varphi_{SSL2}(\lambda)$ denotes a spectral power distribution of light emitted from the light-emitting device in the radiant direction, $\varphi_{ref2}(\lambda)$ denotes a spectral power distribution of reference light which is selected in accordance with a correlated color temperature $T_{SSL2}$ of the light emitted from the light-emitting device in the radiant direction, $(X_{SSL2}, Y_{SSL2}, Z_{SSL2})$ denote tristimulus values of the light emitted from the light-emitting device in the radiant direction, and $(X_{ref2}, Y_{ref2}, Z_{ref2})$ denote tristimulus values of the reference light which is selected in accordance with the correlated color temperature $T_{SSL2}$ (K) of the light emitted from the light-emitting device in the radiant direction, and a normalized spectral power distribution $S_{SSL2}(\lambda)$ of the light emitted from the light-emitting device in the radiant direction, a normalized spectral power distribution $S_{ref2}(\lambda)$ of the reference light which is selected in accordance with the correlated color temperature $T_{SSL2}(\lambda)$ of the light emitted from the light-emitting device in the radiant direction, and a difference $\Delta S_{SSL2}(\lambda)$ of between normalized spectral power distributions are respectively defined as $S_{SSL2}(\lambda) = \varphi_{SSL2}(\lambda)/Y_{SSL2}$, $S_{ref2}(\lambda) = \varphi_{ref2}(\lambda)/Y_{ref2}$ and $\Delta S_{SSL2}(\lambda) = S_{ref2}(\lambda) - S_{SSL2}(\lambda)$ and in a case where $\lambda_{SSL2-RL-max}$ (nm) represents a wavelength that provides a longest wavelength local maximum value of $S_{SSL2}(\lambda)$ in a wavelength range of 380 nm or more and 780 nm or less, and when a wavelength $\Lambda 4$ that is represented by $S_{SSL2}(\lambda_{SSL2-RL-max})/2$ exists on a longer wavelength-side of $\lambda_{SSL2-RL-max}$, an index $A_{cg}(\varphi_{SSL2}(\lambda))$ represented by the following formula (2-1) satisfies $-10.0 < A_{cg}(\varphi_{SSL2}(\lambda)) \leq 120.0$, but in a case where $\lambda_{SSL2-RL-max}$ (nm) represents a wavelength that provides the longest wavelength local maximum value of $S_{SSL2}(\lambda)$ in a wavelength range of 380 nm or more and 780 nm or less, and when the wavelength $\Lambda 4$ that is represented by $S_{SSL2}(\lambda_{SSL2-RL-max})/2$ does not exist on the longer wavelength-side of $\lambda_{SSL2-RL-max}$, an index $A_{cg}(\varphi_{SSL2}(\lambda))$ represented by the following formula (2-2) satisfies $-10.0 < A_{cg}(\varphi_{SSL2}(\lambda)) \leq 120.0$;

[Expression 15]

$$A_{cg}(\varphi_{SSL2}(\lambda)) = \int_{380}^{495} \Delta S_{SSL2}(\lambda) d\lambda + \int_{495}^{590}(-\Delta S_{SSL2}(\lambda)) d\lambda + \int_{590}^{\Lambda 4} \Delta S_{SSL2}(\lambda) d\lambda \quad (2\text{-}1)$$

[Expression 16]

$$A_{cg}(\varphi_{SSL2}(\lambda)) = \int_{380}^{495} \Delta S_{SSL2}(\lambda) d\lambda + \int_{495}^{590}(-\Delta S_{SSL2}(\lambda)) d\lambda + \int_{590}^{780} \Delta S_{SSL2}(\lambda) d\lambda \quad (2\text{-}2)$$

Condition 3:

when a maximum value of spectral intensity in a range of 430 nm or more and 495 nm or less is defined as $\varphi_{SSL2-BM-max}$ and a minimum value of spectral intensity in a range of 465 nm or more and 525 nm or less is defined as $\varphi_{SSL2-BG-min}$, the spectral power distribution $\varphi_{SSL2}(\lambda)$ of light satisfies $0.2250 \leq \varphi_{SSL2-BG-min}/\varphi_{SSL2-BM-max} \leq 0.7000$; and Condition 4:

in the spectral power distribution $\varphi_{SSL2}(\lambda)$ of light, when a maximum value of spectral intensity in a range of 590 nm or more and 780 nm or less is defined as $\varphi_{SSL2-RM-max}$, a wavelength $\lambda_{SSL2-RM-max}$ that provides $\varphi_{SSL2-RM-max}$ satisfies $605 \text{ (nm)} \leq \lambda_{SSL2-RM-max} \leq 653 \text{ (nm)}$.

[15] The method for designing a light-emitting device according to [14], wherein all of $\varphi_{SSL2}N(\lambda)$ (N is 1 to M) satisfies the Conditions 1 to 4.

[16] The method for designing a light-emitting device according to [14] or [15], wherein at least one light-emitting area of the M number of light-emitting areas has wiring that allows the light-emitting area to be electrically driven independently from other light-emitting areas.

[17] The method for designing a light-emitting device according to [16], wherein all the M numbers of light-emitting areas each have wiring that allows the light-emitting area to be electrically driven independently from other light-emitting areas.

[18] The method for designing a light-emitting device according to any one of [14] to [18], wherein the method satisfies Condition 5 below.

Condition 5:

In the spectral power distribution $\varphi_{SSL2}(\lambda)$ of light described above, a wavelength $\lambda_{SSL2-BM-max}$ that provides $\varphi_{SSL2-BM-max}$ satisfies $430 \text{ (nm)} \leq \lambda_{SSL2-BM-max} \leq 480 \text{ (nm)}$.

[19] The method for designing a light-emitting device according to any one of [14] to [18], wherein the method satisfies Condition 6 below.

Condition 6:

$0.1800 \leq \varphi_{SSL2-BG-min}/\varphi_{SSL2-RM-max} \leq 0.8500$.

[20] The method for designing a light-emitting device according to any one of [14] to [19], wherein a luminous efficacy of radiation $K_{SSL2}$ (lm/W) in a wavelength range of 380 nm or more and 780 nm or less, which is derived from $\varphi_{SSL2}(\lambda)$ satisfies Condition 7 below.

Condition 7:

$210.0 \text{ lm/W} \leq K_{SSL2} \leq 290.0 \text{ lm/W}$.

[21] The method for designing a light-emitting device according to any one of [14] to [20], wherein at least one selected from the group consisting of the index $A_{cg}(\varphi_{SSL2}(\lambda))$ represented by the formula (2-1) or (2-2), the correlated color temperature $T_{SSL2}(K)$ and the distance $D_{uv}(\varphi_{SSL2}(\lambda))$ from the black-body radiation locus can be changed.

[22] The method for designing a light-emitting device according to [21], wherein a luminous flux and/or a radiant flux emitted from the light-emitting device in the main radiant direction can be independently controlled when at least one selected from the group consisting of the index $A_{cg}(\varphi_{SSL2}(\lambda))$ represented by the formula (2-1) or (2-2), the correlated color temperature $T_{SSL2}(\lambda)$ and the distance $D_{uv}(\varphi_{SSL2}(\lambda))$ from the black-body radiation locus is changed.

[23] The method for designing a light-emitting device according to any one of [14] to [22], wherein a maximum distance L between two arbitrary points on a virtual outer periphery enveloping the entire light-emitting areas closest to each other, is 0.4 mm or more and 200 mm or less.

[24] The method for designing a light-emitting device according to any one of [14] to [23], further comprising allowing $\varphi_{SSL2}(\lambda)$ to further satisfy the following Conditions I to IV by changing a luminous flux amount and/or a radiant flux amount emitted from the light-emitting areas:

Condition I:

when $a^*_{nSSL2}$ and $b^*_{nSSL2}$ (where n is a natural number from 1 to 15) respectively denote the a* value and b* value in the CIE 1976 L*a*b* color space of the following 15 Munsell renotation color samples of #01 to #15 based on a mathematical assumption that illumination is performed by the light emitted in the radiant direction, and when $a^*_{nref2}$ and $b^*_{nref2}$ (where n is a natural number from 1 to 15) respectively denote the a* value and b* value in the CIE 1976 L*a*b* color space of the 15 Munsell renotation color samples based on a mathematical assumption that illumination is performed by reference light which is selected in accordance with the correlated color temperature T (K) of the light emitted in the radiant direction, each saturation difference $\Delta C_{nSSL2}$ satisfies $-4.00 \Delta C_{nSSL2} \leq 8.00$ (where $n$ is a natural number from 1 to 15), Condition II:

an average saturation difference $SAT_{ave}(\varphi_{SSL2}(\lambda))$ represented by formula (2-3) satisfies $0.50 \leq SAT_{ave}(\varphi_{SSL2}(\lambda)) \leq 4.00$, $$SAT_{ave}(\phi_{SSL2}(\lambda)) = \frac{\sum_{n=1}^{15} \Delta C_{nSSL2}}{15}, \quad \text{[Expression 17]} \quad (2\text{-}3)$$

Condition III:

when a maximum saturation difference value is denoted by $\Delta C_{SSL-max2}$ and a minimum saturation difference value is denoted by $\Delta C_{SSL-min2}$, a difference $|\Delta C_{SSL-max2} - \Delta C_{SSL-min2}|$ between the maximum saturation difference value and the minimum saturation difference value satisfies $2.00 \leq |\Delta_{SSL-max2} - \Delta C_{SSL-min2}| \leq 10.00$, where $\Delta C_{nSSL2} = \sqrt{\{(a^*_{nSSL2})^2 + (b^*_{nSSL2})^2\}} - \sqrt{\{(a^*_{nref2})^2 + (b^*_{nref2})^2\}}$ with the 15 Munsell renotation color samples being:

| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12, |

Condition IV:

when $\theta_{nSSL2}$ (degrees) (where n is a natural number from 1 to 15) denotes a hue angle in the CIE 1976 L*a*b* color space of the 15 Munsell renotation color samples based on a mathematical assumption that illumination is performed by the light emitted in the radiant direction, and when $\theta_{nref2}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature $T_{SSL2}$ (K) of the light emitted in the radiant direction, an absolute value of each difference in hue angles $|\Delta h_{nSSL2}|$ satisfies 0.00 degrees $\leq |\Delta h_{nSSL2}| \leq 12.50$ degrees (where n is a natural number from 1 to 15), where $\Delta h_{nSSL2} = \theta_{nSSL2} - \theta_{nref2}$.

[25] The method for designing a light-emitting device according to any one of [14] to [24], wherein the correlated color temperature $T_{SSL2}$ (K) of light emitted from the light-emitting device in the radiant direction satisfies $2600 \text{ K} \leq T_{SSL2} \leq 7700 \text{ K}$.

[26] The method for designing a light-emitting device according to any one of [14] to [25], wherein the method comprises designing the light-emitting areas so that $\varphi_{SSL2}(\lambda)$ satisfies the Conditions 1 to 4 described earlier by changing an amount of luminous flux and/or an amount of radiant flux emitted from the light-emitting areas.

[27] A method for driving a light-emitting device which includes M number of light-emitting areas (M is 2 or greater natural number), and has a blue semiconductor light-emitting element, a green phosphor, and a red phosphor as light-emitting elements in at least one of the light-emitting areas, the method comprising supplying power to each light-emitting area such that, when $\varphi_{SSL2}(\lambda)$ (N is 1 to M) is a spectral power distribution of a light emitted from each light-emitting area in a main radiant direction of the light-emitting device, and $\varphi_{SSL2}(\lambda)$, which is a spectral power distribution of all the lights emitted from the light-emitting device in the radiant direction, is represented by $$\phi_{SSL2}(\lambda) = \sum_{N=1}^{M} \phi_{SSL2}N(\lambda), \quad \text{[Expression 18]}$$

$\varphi_{SSL2}(\lambda)$ satisfies the following Conditions 1 to 4:

Condition 1:

a distance $D_{uv}(\varphi_{SSL2}(\lambda))$ of the spectral power distribution $\varphi_{SSL2}(\lambda)$ of light from a black-body radiation locus defined by ANSI C78.377 satisfies $-0.0220 \leq D_{uv}(\varphi_{SSL2}(\lambda)) \leq -0.0070$;

Condition 2:

$\varphi_{SSL2}(\lambda)$ denotes a spectral power distribution of light emitted from the light-emitting device in the radiant direction, $\varphi_{ref2}(\lambda)$ denotes a spectral power distribution of reference light which is selected in accordance with a correlated color temperature $T_{SSL2}$ (K) of the light emitted from the light-emitting device in the radiant direction, $(X_{SSL2}, Y_{SSL2}, Z_{SSL2})$ denote tristimulus values of the light emitted from the light-emitting device in the radiant direction, and $(X_{ref2}, Y_{ref2}, Z_{ref2})$ denote tristimulus values of the reference light which is selected in accordance with the correlated color temperature $T_{SSL2}$ (K) of the light emitted from the light-emitting device in the radiant direction, and a normalized spectral power distribution $S_{SSL2}(\lambda)$ of the light emitted from the light-emitting device in the radiant direction, a normalized spectral power distribution $S_{ref2}(\lambda)$ of the reference light which is selected in accordance with the correlated color temperature $T_{SSL2}$ (K) of the light emitted from the light-emitting device in the radiant direction, and a difference $\Delta_{SSL2}(\lambda)$ of between normalized spectral power distributions are respectively defined as $S_{SSL2}(\lambda) = \varphi_{SSL2}(\lambda)/Y_{SSL2}$, $S_{ref2}(\lambda) = \varphi_{ref2}(\lambda)/Y_{ref2}$ and $\Delta S_{SSL2}(\lambda) = S_{ref2}(\lambda) - S_{SSL2}(\lambda)$ and in a case where $\lambda_{SSL2-RL-max}$ (nm) represents a wavelength that provides a longest wavelength local maximum value of $S_{SSL2}(\lambda)$ in a wavelength range of 380 nm or more and 780 nm or less, and when a wavelength Λ4 that is represented by $S_{SSL2}(\lambda_{SSL2-RL-max})/2$ exists on a longer wavelength-side of $\lambda_{SSL2-RL-max}$, an index $A_{cg}(\varphi_{SSL2}(\lambda))$ represented by the following formula (2-1) satisfies $-10.0 < A_{cg}(\varphi_{SSL2}(\lambda)) \leq 120.0$, but in a case where $\lambda_{SSL2\text{-}RL\text{-}max}$ (nm) represents a wavelength that provides the longest wavelength local maximum value of $S_{SSL2}(\lambda)$ in a wavelength range of 380 nm or more and 780 nm or less, and when the wavelength Λ4 that is represented by $S_{SSL2}(\lambda_{SSL2\text{-}RL\text{-}max})/2$ does not exist on the longer wavelength-side of $\lambda_{SSL2\text{-}RL\text{-}max}$, an index $A_{cg}(\varphi_{SSL2}(\lambda))$ represented by the following formula (2-2) satisfies $$-10.0 < A_{cg}(\varphi_{SSL2}(\lambda)) \leq 120.0;$$

[Expression 19]

$$A_{cg}(\varphi_{SSL2}(\lambda)) = \int_{380}^{495} \Delta S_{SSL2}(\lambda)d\lambda + \int_{495}^{590}(-\Delta S_{SSL2}(\lambda))d\lambda + \int_{590}^{\Lambda 4 \Delta} S_{SSL2}(\lambda)d\lambda \quad (2\text{-}1)$$

[Expression 20]

$$A_{cg}(\varphi_{SSL2}(\lambda)) = \int_{380}^{495} \Delta S_{SSL2}(\lambda)d\lambda + \int_{495}^{590}(-\Delta S_{SSL2}(\lambda))d\lambda + \int_{590}^{780} \Delta S_{SSL2}(\lambda))d\lambda \quad (2\text{-}2)$$

Condition 3:

when a maximum value of spectral intensity in a range of 430 nm or more and 495 nm or less is defined as $\varphi_{SSL2\text{-}BM\text{-}max}$ and a minimum value of spectral intensity in a range of 465 nm or more and 525 nm or less is defined as $\varphi_{SSL2\text{-}BG\text{-}min}$, the spectral power distribution $\varphi_{SSL2}(\lambda)$ of light satisfies $$0.2250 \leq \varphi_{SSL2\text{-}BG\text{-}min}/\varphi_{SSL2\text{-}BM\text{-}max} \leq 0.7000; \text{ and}$$

Condition 4:

in the spectral power distribution $\varphi_{SSL2}(\lambda)$ of light, when a maximum value of spectral intensity in a range of 590 nm or more and 780 nm or less is defined as $\varphi_{SSL2\text{-}RM\text{-}max}$, a wavelength $\lambda_{SSL1\text{-}RM\text{-}max}$ that provides $\varphi_{SSL2\text{-}RM\text{-}max}$ satisfies $$605 \text{ (nm)} \leq \lambda_{SSL2\text{-}RM\text{-}max} \leq 653 \text{ (nm)}.$$

[28] The method for driving a light-emitting device according to [27], wherein power is supplied to the light-emitting areas so that all of $\varphi_{SSL2N}(\lambda)$ (N is 1 to M) satisfies the Conditions 1 to 4.

[29] The method for driving a light-emitting device according to [27] or [28], wherein at least one light-emitting area of the M number of light-emitting areas is electrically driven independently from other light-emitting areas.

[30] The method for driving a light-emitting device according to any one of [27] to [29], wherein all the M number of light-emitting areas are electrically driven independently from other light-emitting areas.

[31] The method for driving a light-emitting device according to any one of [27] to [30], wherein the method satisfies Condition 5 below.

Condition 5:

In the spectral power distribution $\varphi_{SSL2}(\lambda)$ of light described above, a wavelength $\lambda_{SSL2\text{-}BM\text{-}max}$ that provides $\varphi_{SSL2\text{-}BM\text{-}max}$ satisfies $$430 \text{ (nm)} \leq \lambda_{SSL2\text{-}BM\text{-}max} \leq 480 \text{ (nm)}.$$

[32] The method for driving a light-emitting device according to any one of [27] to [31], wherein the method satisfies Condition 6 below.

Condition 6:

$$0.1800 \leq \varphi_{SSL2\text{-}BG\text{-}min}/\varphi_{SSL2\text{-}RM\text{-}max} \leq 0.8500.$$

[33] The method for driving a light-emitting device according to any one of [27] to [32], wherein a luminous efficacy of radiation $K_{SSL2}$ (lm/W) in a wavelength range of 380 nm or more and 780 nm or less, which is derived from $\varphi_{SSL2}(\lambda)$, satisfies Condition 7 below.

Condition 7:

$$210.0 \text{ lm/W} \leq K_{SSL2} \leq 290.0 \text{ lm/W}.$$

[34] The method for driving a light-emitting device according to any one of [27] to [33], wherein at least one selected from the group consisting of the index $A_{cg}(\varphi_{SSL2}(\lambda))$ represented by the formula (2-1) or (2-2), the correlated color temperature $T_{SSL2}$ (K) and the distance $D_{uv}(\varphi_{SSL2}(\lambda))$ from the black-body radiation locus is changed.

[35] The method for driving a light-emitting device according to [34], wherein a luminous flux and/or a radiant flux emitted from the light-emitting device in the main radiant direction is unchanged when at least one selected from the group consisting of the index $A_{cg}(\varphi_{SSL2}(\lambda))$ represented by the formula (2-1) or (2-2), the correlated color temperature $T_{SSL2}$ (K) and the distance $D_{uv}(\varphi_{SSL2}(\lambda)$ from the black-body radiation locus is changed.

[36] The method for driving a light-emitting device according to [34], wherein a luminous flux and/or a radiant flux emitted from the light-emitting device in the main radiant direction is decreased when the index $A_{cg}(\varphi_{SSL2}(\lambda))$ represented by the formula (2-1) or (2-2) is decreased.

[37] The method for driving a light-emitting device according to [34], wherein a luminous flux and/or a radiant flux emitted from the light-emitting device in the main radiant direction is increased when the correlated color temperature $T_{SSL2}$ (K) is increased.

[38] The method for driving a light-emitting device according to [34], wherein a luminous flux and/or a radiant flux emitted from the light-emitting device in the main radiant direction is decreased when the distance $D_{uv}(\varphi_{SSL2}(\lambda))$ from the black-body radiation locus is decreased.

[39] The method for driving a light-emitting device according to any one of [27] to [38], further comprising supplying power such that $\varphi_{SSL2}(\lambda)$ further satisfies the following Conditions I to IV:

Condition I:

when $a^*_{nSSL2}$ and $b^*_{nSSL2}$ (where n is a natural number from 1 to 15) respectively denote the a* value and b* value in the CIE 1976 L*a*b* color space of the following 15 Munsell renotation color samples of #01 to #15 based on a mathematical assumption that illumination is performed by the light emitted in the radiant direction, and when $a^*_{nref2}$ and $b^*_{nref2}$ (where n is a natural number from 1 to 15) respectively denote the a* value and b* value in the CIE 1976 L*a*b* color space of the 15 Munsell renotation color samples based on a mathematical assumption that illumination is performed by reference light which is selected in accordance with the correlated color temperature $T_{SSL2}$ (K) of the light emitted in the radiant direction, each saturation difference $\Delta_{nSSL2}$ satisfies $$-4.00 \leq \Delta C_{nSSL2} \leq 8.00 \text{ (where } n \text{ is a natural number from 1 to 15),}$$

Condition II:

an average saturation difference $SAT_{ave}(\varphi_{SSL2}(\lambda))$ represented by formula (2-3) satisfies $0.50 \leq SAT_{ave}(\varphi_{SSL2}(\lambda)) \leq 4.00$, (2-3)

$$SAT_{ave}(\phi_{SSL2}(\lambda)) = \frac{\sum_{n=1}^{15} \Delta C_{nSSL2}}{15},$$

[Expression 21]

Condition III:

when a maximum saturation difference value is denoted by $\Delta C_{SSL-max2}$ and a minimum saturation difference value is denoted by $\Delta C_{SSL-min2}$, a difference $|\Delta C_{SSL-max2} - \Delta C_{SSL-min2}|$ between the maximum saturation difference value and the minimum saturation difference value satisfies $$2.00 \leq |\Delta C_{SSL-max2} - \Delta C_{SSL-min2}| \leq 10.00,$$

where $\Delta C_{nSSL2} = \sqrt{\{(a^*_{nSSL2})^2 + (b^*_{nSSL2})^2\}} - \sqrt{\{(a^*_{nref2})^2 + (b^*_{nref2})^2\}}$ with the 15 Munsell renotation color samples being:

| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12 |

Condition IV:

when $\theta_{nSSL2}$ (degrees) (where n is a natural number from 1 to 15) denotes a hue angle in the CIE 1976 L*a*b* color space of the 15 Munsell renotation color samples based on a mathematical assumption that illumination is performed by the light emitted in the radiant direction, and when $\theta_{nref2}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature $T_{SSL2}$ (K) of the light emitted in the radiant direction, an absolute value of each difference in hue angles $|\Delta h_{nSSL2}|$ satisfies 0.00 degrees $\leq |\Delta h_{nSSL2}| \leq$ 12.50 degrees (where $n$ is a natural number from 1 to 15), where $\Delta h_{nSSL2} = \theta_{nSSL2} - \theta_{nref2}$.

[40] An illumination method comprising:

illuminated objects preparation step of preparing illuminated objects; and an illumination step of illuminating the objects by light emitted from a light-emitting devices which includes M number of light-emitting areas (M is 2 or greater natural number), and has a blue semiconductor light-emitting element, a green phosphor, and a red phosphor as light-emitting elements in at least one of the light-emitting areas, in the illumination step, when light emitted from the light-emitting devices illuminate the objects, the objects are illuminated so that the light measured at a position of the objects satisfies Condition 1 and Conditions I to IV below:

Condition 1:

a distance $D_{uv}(\varphi_{SSL2}(\lambda))$ from a black-body radiation locus as defined by ANSI C78.377 of the light measured at the position of the objects satisfies $$-0.0220 \leq D_{uv}(\varphi_{SSL2}(\lambda)) \leq -0.0070;$$

Condition I:

if an a* value and a b* value in CIE 1976 L*a*b* color space of 15 Munsell renotation color samples from #01 to #15 listed below when mathematically assuming illumination by the light measured at the position of the objects are respectively denoted by $a^*_{nSSL2}$ and $b^*_{nSSL2}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL2}$ (K) of the light measured at the position of the objects are respectively denoted by $a^*_{nref2}$ and $b^*_{nref2}$ (where n is a natural number from 1 to 15), then each saturation difference $\Delta C_{nSSL2}$ satisfies $-4.00 \leq \Delta C_{nSSL2} \leq 8.00$ (where $n$ is a natural number from 1 to 15);

Condition II:

an average saturation difference $SAT_{ave}(\varphi_{SSL2}(\lambda))$ represented by formula (2-3) satisfies $0.50 \leq SAT_{ave}(\varphi_{SSL2}(\lambda)) \leq 4.00$,

[Expression 22]

$$SAT_{ave}(\phi_{SSL2}(\lambda)) = \frac{\sum_{n=1}^{15} \Delta C_{nSSL2}}{15} \quad (2\text{-}3)$$

Condition III:

when a maximum saturation difference value is denoted by $\Delta C_{SSL-max2}$ and a minimum saturation difference value is denoted by $\Delta C_{SSL-min2}$, a difference $|\Delta C_{SSL-max} - \Delta C_{SSL-min2}|$ between the maximum saturation difference value and the minimum saturation difference value satisfies $$2.00 \leq |\Delta C_{SSL-max2} - \Delta C_{SSL-min2}| \leq 10.00,$$

where $\Delta C_{nSSL2} = \sqrt{\{(a^*_{nSSL2})^2 + (b^*_{nSSL2})^2\}} - \sqrt{\{(a^*_{nref2})^2 + (b^*_{nref2})^2\}}$ with the 15 Munsell renotation color samples being:

| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12 |

Condition IV:

if hue angles in CIE 1976 L*a*b* color space of the 15 Munsell renotation color samples when mathematically assuming illumination by the light measured at the position of the objects are denoted by $\theta_{nSSL2}$ (degrees) (where n is a natural number from 1 to 15), and if hue angles in CIE 1976 L*a*b* color space of the 15 Munsell renotation color samples when mathematically assuming illumination by a reference light that is selected according to the correlated color temperature $T_{SSL2}$ (K) of the light measured at the position of the objects are denoted by $\theta_{nref2}$ (degrees) (where n is a natural number from 1 to 15), then an absolute value of each difference in hue angles $|\Delta h_{nSSL2}|$ satisfies 0.00 degrees≤$|\Delta h_{nSSL2}|$≤12.50 degrees (where $n$ is a natural number from 1 to 15), here $\Delta h_{nSSL2}=\theta_{nSSL2}-\theta_{nref2}$

[41] The illumination method according to [40], wherein when $\varphi_{SSL2}N(\lambda)$ (N is 1 to M) is a spectral power distribution of a light which has been emitted from each light-emitting element and has reached the position of the objects, and $\varphi_{SSL2}(\lambda)$ is a spectral power distribution of the light measured at the position of the objects is represented by $$\phi_{SSL2}(\lambda) = \sum_{N=1}^{M} \phi_{SSL2}N(\lambda),$$ [Expression 23]

all the $\varphi_{SSL2}N(\lambda)$ (N is 1 to M) can satisfy the Condition 1 and the Conditions I to IV.

[42] The illumination method according to [40] or [41], wherein at least one light-emitting area of the M number of light-emitting areas is electrically driven independently from other light-emitting areas for performing the illumination.

[43] The illumination method according to [42], wherein all the M number of light-emitting areas are electrically driven independently from other light-emitting areas.

[44] The illumination method according to any one of [40] to [43], wherein at least one selected from the group consisting of an average saturation difference $SAT_{ave}(\varphi_{SSL2}(\lambda))$ represented by the formula (2-3), the correlated color temperature $T_{SSL2}(K)$, and the distance $D_{uv}(\varphi_{SSL2}(\lambda))$ from the black-body radiation locus is changed.

[45] The illumination method according to [44], wherein the luminance in the object is independently controlled when at least one selected from the group of an average saturation difference $SAT_{ave}(\varphi_{SSL2}(\lambda))$ represented by the formula (2-3), the correlated color temperature $T_{SSL2}(\lambda)$, and the distance $D_{uv}(\varphi_{SSL2}(\lambda))$ from the black-body radiation locus is changed.

[46] The illumination method according to [45], wherein the luminance in the object is unchangeable when at least one selected from the group of an average saturation difference $SAT_{ave}(\varphi_{SSL2}(\lambda))$ represented by the formula (2-3), the correlated color temperature $T_{SSL2}(K)$, and the distance $D_{uv}(\varphi_{SSL2}(\lambda))$ from the black-body radiation locus is changed.

[47] The illumination method according to [45], wherein the luminance in the object is decreased when the average saturation difference $SAT_{ave}(\varphi_{SSL2}(\lambda))$ represented by the formula (2-3) is increased.

[48] The illumination method according to [45], wherein the illuminance in the object is increased when the correlated color temperature $T_{SSL2}(\lambda)$ is increased.

[49] The illumination method according to [45], wherein the luminance in the object is decreased when the distance $D_{uv}(\varphi_{SSL2}(\lambda))$ from the black-body radiation locus is decreased.

[50] The illumination method according to any one of [40] to [49], wherein if a maximum distance between two arbitrary points on a virtual outer periphery enveloping the entire light-emitting areas closest to each other is denoted by L, and a distance between the light-emitting device and the illumination object is denoted by H, the distance H is set so as to satisfy

5×L≤H≤500×L.

According to the second invention of the present invention, both favorable color appearance and high light source efficiency can be achieved in "a light-emitting device capable of realizing a natural, vivid, highly visible and comfortable appearance of colors or an appearance of objects".

The conveniences implemented by the second invention of the present invention follow.

In other words, optimum illumination differs depending on age, gender, country and the like, or depending on the space and the purpose of illumination, but if the light-emitting device according to the second invention of the present invention, or the method for driving the light-emitting device according to the second invention of the present invention is used, more suitable illumination conditions can be easily selected from a variable range.

Hereinafter, while the second invention of the present invention will be described in detail, the following description presents differences from the description of the second invention of the present invention. For descriptions common to the first invention and the second invention of the present invention, the description of the first invention of the present invention provided earlier will apply.

While the second invention of the present invention will be described in detail hereinafter, it is to be understood that the second invention of the present invention is not limited to the embodiments described below and that various modifications can be made without departing from the spirit and scope of the invention.

Moreover, in a light-emitting device according to the first to third aspects of the second invention of the present invention specify the invention based on light in a "main radiant direction" among light emitted from a light-emitting device. Therefore, light-emitting devices capable of radiating light including light in a "main radiant direction" which meets requirements of the second invention of the present invention are to be included in the spirit and scope of the second invention of the present invention.

In addition, an illumination method according to the fourth aspect of the second invention of the present invention specifies the invention based on light at a position where an object is illuminated in a case where light emitted from a light-emitting device used in the illumination method illuminates the object. Therefore, illumination methods used by light-emitting devices capable of emitting light at a "position where an object is illuminated" which meets requirements of the second invention of the present invention are to be included in the spirit and scope of the second invention of the present invention.

The spectral power distribution of light emitted from a light-emitting device in the main radiant direction according to the second invention of the present invention is preferably measured at a distance where luminance at a measurement point is practical luminance (as will be described later, 150 lx or higher and 5000 lx or lower).

The light-emitting device according to the first aspect of the second invention of the present invention includes M number of light-emitting areas (M is 2 or greater natural number). In this description, light-emitting areas that emit light in an equivalent spectral power distribution (allowing a general dispersion generated in the manufacturing steps) are called the "same type of light-emitting areas". In other words, even if the light-emitting areas are physically separated and disposed with a distance, these light-emitting areas are of a same type if they emit lights in an equivalent spectral power distribution (allowing a general dispersion generated in the manufacturing steps). This means that the light-emitting device, according to the first aspect of the second invention of the present invention, includes two or more types of light-emitting areas from which lights in mutually different spectral power distributions are emitted.

At least one light-emitting area of the plurality of types of light-emitting areas includes a blue semiconductor light-emitting element, a green phosphor, and a red phosphor as the light-emitting element. Only if at least one light-emitting area includes a blue semiconductor light-emitting element, a green phosphor, and a red phosphor as the light-emitting element, the light-emitting elements included in each light-emitting area are not limited. The light-emitting elements, other than the semiconductor light-emitting element and the phosphors, can be any light-emitting element if various supplied energies can be converted into electromagnetic radiation energy, and the electromagnetic radiation energy includes visible light in a range from 380 nm to 780 nm. For example, a hot filament, a fluorescent tube, a high pressure sodium lamp, a laser, and a secondary harmonic generation (SHG) source that can convert electric energy can be used.

The configuration of the light-emitting device according to the first aspect of the second invention of the present invention is not especially limited, only if a plurality of light-emitting areas, including a light-emitting area which has a blue semiconductor light-emitting element, a green phosphor, and a red phosphor as the light-emitting element, exists therein. An individual semiconductor light-emitting element to which a lead or the like as a conducting mechanism is added or a packaged LED to which a heat dissipating mechanism is further added and integrated with a phosphor or the like may be adopted as the light-emitting area.

In addition, the light-emitting device can be an LED module in which a robust heat dissipating mechanism is added to one or more packaged LEDs and which is generally mounted with a plurality of packaged LEDs may be adopted as the light-emitting device. Furthermore, an LED lighting fixture in which a lens, a reflecting mechanism, and the like are added to a packaged LED may be adopted. Moreover, a lighting system which supports a large number of LED lighting fixtures or the like and which is configured to be capable of illuminating an object may be adopted. The light-emitting device according to the first aspect of the second invention of the present invention encompasses all of the above.

In the light-emitting device according to the first aspect of the second invention of the present invention, when $\varphi_{SSL2}N(\lambda)$ (N is in the 1 to M range) is the spectral power distribution of the light emitted from each light-emitting area, $\varphi_{SSL2}(\lambda)$, which is the spectral power distribution of all the lights emitted from the light-emitting device in the radiant direction, is represented by $$\phi_{SSL2}(\lambda) = \sum_{N=1}^{M} \phi_{SSL2}N(\lambda). \quad \text{[Expression 24]}$$

This will be described with reference to FIG. 2-47.

The light-emitting device 200 in FIG. 2-47 is one mode of the light-emitting device according to the first aspect of the second invention of the present invention. The light-emitting device 200 is the case when M in the above expression is M=5, and 5 (five types of) light-emitting areas, that is, the light-emitting area 201 to the light-emitting area 205, are included. Each light-emitting area has a packaged LED 206 which is mounted with a blue semiconductor light-emitting element, a green phosphor, and a red phosphor as the light-emitting element.

When $\varphi_{SSL2}1(\lambda)$ is the spectral power distribution of the light emitted from the light-emitting area 201, $\varphi_{SSL2}2(\lambda)$ is the spectral power distribution of the light emitted from the light-emitting area 202, $\varphi_{SSL2}3(\lambda)$ is the spectral power distribution of the light emitted from the light-emitting area 203, $\varphi_{SSL2}4(\lambda)$ is the spectral power distribution of the light emitted from the light-emitting area 204, and $\varphi_{SSL2}5(\lambda)$ is the spectral power distribution of the light emitted from the light-emitting area 205, then the spectral power distribution $\varphi_{SSL2}(\lambda)$ of all the lights emitted from the light-emitting device in the radiant direction is represented by $$\phi_{SSL2}(\lambda) = \phi_{SSL2}1(\lambda) + \phi_{SSL2}2(\lambda) + \quad \text{[Expression 25]}$$
$$\phi_{SSL2}3(\lambda) + \phi_{SSL2}4(\lambda) + \phi_{SSL2}5(\lambda)$$
$$= \sum_{N=1}^{5} \phi_{SSL2}N(\lambda).$$

In other words, when N is 1 to M, $\varphi_{SSL2}(\lambda)$ can be represented by $$\phi_{SSL2}(\lambda) = \sum_{N=1}^{M} \phi_{SSL2}N(\lambda). \quad \text{[Expression 26]}$$

According to the second invention of the present invention, light source efficiency is improved and color appearance can be made variable while realizing a natural, vivid, highly visible and comfortable appearance of colors and appearance of objects as if the objects are seen outdoors. In concrete terms, the light-emitting device, including light-emitting areas that can satisfy predetermined conditions by changing the luminous flux amount and/or radiant flux amount emitted from each light-emitting area, is provided.

Hereinafter, the second invention of the present invention will be described in detail.

The present inventor has discovered a radiometric property or a photometric property common to spectra or spectral power distributions capable of realizing a color appearance or an object appearance which is as natural, vivid, highly visible, and comfortable as though perceived outdoors in a high-illuminance environment even in an ordinary indoor illuminance environment. The present inventor further ascertained, from a colorimetric perspective, in what way the color appearance of the color samples having specific spectral reflectance characteristics when assuming that the color is illuminated by light having the aforementioned spectrum or spectral power distribution changes (or does not change) when the object described above is achieved in comparison with a case where illumination by calculational reference light is assumed, and collectively reached the present invention. In addition, the invention described above was improved from the perspective of light source efficiency to arrive at a light-emitting device having high light source efficiency. In addition, the present inventor discovered that the appearance of colors can be variable if a plurality of light-emitting areas is included.

<Emission by Single Light-Emitting Element and Emission by Light-Emitting Device>

A light-emitting device according to a first aspect of the second invention of the present invention includes a plurality of light-emitting areas and may be, for example, a packaged LED including a semiconductor light-emitting element and a phosphor, an LED light bulb including a packaged LED, or a light-emitting module, a light-emitting system, or the like which integrates such light-emitting devices. Hereinafter, a member/material which constitutes a light-emitting device according to the first aspect of the second invention of the present invention and which is capable of emitting light either spontaneously or as a result of being excited by another member/material will be described as a light-emitting element. Therefore, in the first aspect of the second invention of the present invention, a semiconductor light-emitting element, a phosphor, and the like may be light-emitting elements.

On the other hand, a spectral power distribution $\varphi_{SSL2}(\lambda)$ of the light-emitting device itself according to the first aspect of the second invention of the present invention is based on characteristics when power is being continuously supplied thereto and is characterized by the following indexes.

Specifically, the spectral power distribution $\varphi_{SSL2}(\lambda)$ of the light-emitting device is characterized by a maximum value $\varphi_{SSL2\text{-}BM\text{-}max}$ of spectral intensity and a wavelength $\lambda_{SSL2\text{-}BM\text{-}max}$ that provides the maximum value $\varphi_{SSL2\text{-}BM\text{-}max}$ of spectral intensity in a range of 430 nm or more and 495 nm or less, a minimum value $\varphi_{SSL2\text{-}BG\text{-}min}$ of spectral intensity and a wavelength $\lambda_{SSL2\text{-}BG\text{-}min}$ that provides the minimum value $\varphi_{SSL2\text{-}BG\text{-}min}$ of spectral intensity in a range of 465 nm or more and 525 nm or less, a maximum value $\lambda_{SSL2\text{-}RM\text{-}max}$ of spectral intensity and a wavelength $\lambda_{SSL2\text{-}RM\text{-}max}$ that provides the maximum value $\lambda_{SSL2\text{-}RM\text{-}max}$ of spectral intensity in a range of 590 nm or more and 780 nm or less, and $\lambda_{SSL2\text{-}RL\text{-}max}$ that provides a longest wavelength local maximum value $\varphi_{SSL2\text{-}RL\text{-}max}$ of a normalized spectral power distribution $S_{SSL2}(\lambda)$ which is derived from the spectral power distribution $\varphi_{SSL2}(\lambda)$ in a range of 380 nm or more and 780 nm or less which is used in the definition of, an index $A_{cg}(\varphi_{SSL2}(\lambda))$ to be described later.

Therefore, for example, $\lambda_{CHIP\text{-}BM\text{-}dom}$ generally differs from $\lambda_{SSL2\text{-}BM\text{-}max}$ and $\lambda_{PHOS\text{-}RM\text{-}max}$ also generally differs from $\lambda_{SSL2\text{-}RM\text{-}max}$. On the other hand, $\lambda_{SSL2\text{-}RL\text{-}max}$ may sometimes assume a same value as $\lambda_{SSL2\text{-}RM\text{-}max}$.

<Index $A_{cg}(\varphi_{SSL2}(\lambda))$>

The index $A_{cg}(\varphi_{SSL2}(\lambda))$ is defied as below, as disclosed as the index $A_{cg}$ in Japanese Patent No. 5252107 and Japanese Patent No. 5257538.

Let $\varphi_{ref2}(\lambda)$ and $\varphi_{SSL2}(\lambda)$ respectively denote spectral power distributions of calculational reference light and test light which represent color stimuli that differ from one another when measuring light emitted in a main radiant direction from a light-emitting device of the first aspect of the second invention of the present invention, $x(\lambda)$, $y(\lambda)$, and $z(\lambda)$ denote a color-matching function, and $(X_{ref2}, Y_{ref2}, Z_{ref2})$ and $(X_{SSL1}, Y_{SSL2}, Z_{SSL2})$ respectively denote tristimulus values corresponding to the calculational reference light and the test light. In this case, the following is satisfied regarding the calculational reference light and the test light, where k denotes a constant.

$Y_{ref2} = k \int \varphi_{ref2}(\lambda) \cdot y(\lambda) d\lambda$ $Y_{SSL2} = k \int \varphi_{SSL2}(\lambda) \cdot y(\lambda) d\lambda$ At this point, normalized spectral power distributions obtained by normalizing the spectral power distributions of the calculational reference light and the test light by their respective Y were defined as $S_{ref2}(\lambda) = \varphi_{ref2}(\lambda)/Y_{ref2}$ and $S_{SSL2}(\lambda) = \varphi_{SSL2}(\lambda)/Y_{SSL2}$, and a difference between the normalized reference light spectral power distribution and the normalized test light spectral power distribution was represented by $\Delta S_{SSL2}(\lambda) = S_{ref2}(\lambda) - S_{SSL2}(\lambda)$.

Furthermore, at this point, the index $A_{cg}(\varphi_{SSL2}(\lambda))$ was defined as follows.

$A_{cg}(\varphi_{SSL2}(\lambda)) = \int_{\Lambda_1}^{\Lambda_2} \Delta S_{SSL2}(\lambda) d\lambda + \int_{\Lambda_2}^{\Lambda_3} (-\Delta S_{SSL2}(\lambda)) d\lambda + \int_{\Lambda_3}^{\Lambda_4} \Delta S_{SSL2}(\lambda) d\lambda$ [Expression 27]

Moreover, upper and lower limit wavelengths of the integrals were respectively set to $\Lambda_1 = 380$ nm, $\Lambda_2 = 495$ nm, and $\Lambda_3 = 590$ nm.

In addition, $\Lambda_4$ is defined by dividing $\Lambda_4$ into the two cases described below. First, if a wavelength that provides a longest wavelength local maximum value in a range of 380 nm or more and 780 nm or less in a normalized test light spectral power distribution $S_{SSL2}(\lambda)$ is denoted by $\lambda_{SSL2\text{-}RL\text{-}max}$ (nm) and a normalized spectral intensity thereof is denoted by $S_{SSL2}(\lambda_{SSL2\text{-}RL\text{-}max})$, then a wavelength which is on a longer wavelength-side of $\lambda_{SSL2\text{-}RL\text{-}max}$ and which has an intensity of $S_{SSL2}(\lambda_{SSL2\text{-}RL\text{-}max})/2$ is denoted as $\Lambda_4$. If such a wavelength does not exist in a range up to 780 nm, then $\Lambda_4$ is assumed to be 780 nm.

<$\varphi_{SSL2\text{-}BG\text{-}min}/\varphi_{SSL2\text{-}BM\text{-}max}$ and $\varphi_{SSL2\text{-}BG\text{-}min}/\varphi_{SSL2\text{-}RM\text{-}max}$>

$\varphi_{SSL2\text{-}BG\text{-}min}$ mainly appears in a portion where a longer wavelength-side tail (a base portion where spectral radiant flux intensity decreases) of a spectral radiant flux due to emission of light by a blue semiconductor light-emitting element and a shorter wavelength side tail (a base portion where spectral radiant flux intensity decreases) of a spectral radiant flux due to emission of light by a light-emitting element responsible for the intermediate wavelength region overlap with each other. In other words, $\varphi_{SSL2\text{-}BG\text{-}min}$ often occurs as a recess with a shape of $\varphi_{SSL2}(\lambda)$ in a range of 465 nm or more and 525 nm or less which straddles the short wavelength region and the intermediate wavelength region.

In order to relatively uniformly improve saturation of color appearance of the 15 specific mathematically-derived Munsell renotation color samples to be described later, $\varphi_{SSL2\text{-}BG\text{-}min}/\varphi_{SSL2\text{-}BM\text{-}max}$ obtained by normalizing $\varphi_{SSL2\text{-}BG\text{-}min}$ with a maximum value of spectral intensity in a range of 430 nm to 495 nm and $\varphi_{SSL2\text{-}BG\text{-}min}/\varphi_{SSL2\text{-}RM\text{-}max}$ obtained by normalizing $\varphi_{SSL2\text{-}BG\text{-}min}$ with a maximum value of spectral intensity in a range of 590 nm to 780 nm must be controlled with care. In other words, in the light-emitting device according to the first aspect of the second invention $\varphi_{SSL2\text{-}BG\text{-}min}/\varphi_{SSL2\text{-}BM\text{-}max}$ and $\varphi_{SSL2\text{-}BG\text{-}min}/\varphi_{SSL2\text{-}RM\text{-}max}$ have optimum ranges as will be described later.

When the light-emitting device according to the first aspect of the second invention of the present invention emits test light in the main radiant direction, the a* values and the b* values of the 15 color samples in the CIE 1976 L*a*b* color space of the test light (related to the light-emitting device according to the first aspect of the second invention of the present invention) are to be respectively denoted by $a^*_{nSSL2}$ and $b^*_{nSSL2}$ (where n is a natural number from 1 to 15), and hue angles of the 15 color samples are to be respectively denoted by $\theta_{nSSL2}$ (degrees) (where n is a natural number from 1 to 15). In addition, when mathematically assuming illumination by a calculation reference light (black-body radiation light when lower than 5000 K and CIE daylight when equal to or higher than 5000 K) which is selected in accordance with the correlated color temperature $T_{SSL2}$ of the test light described above, the a* values and the b* values of the 15 color samples in the CIE 1976 L*a*b* color space are to be respectively denoted by $a^*_{nref2}$ and $b^*_{nref2}$ (where n is a natural number from 1 to 15), and hue angles of the 15 color samples are to be respectively denoted by $\theta_{nref2}$ (degrees) (where n is a natural number from 1 to 15). In this case, an absolute value $|\Delta h_{nSSL2}|$ of each difference in hue angles $\Delta h_{nSSL2}$ (degrees) (where n is a natural number from 1 to 15) of each of the 15 Munsell renotation color samples when illuminated by the two types of light may be represented by $$|\Delta h_{nSSL2}| = |\theta_{nSSL2} - \theta_{ref2}|.$$

In addition, each saturation difference $\Delta C_{nSSL2}$ (where n is a natural number from 1 to 15) of the 15 Munsell renotation color samples when assuming illumination by the test light and the calculation reference light is represented by $$\Delta C_{nSSL2} = \sqrt{\{(a^*_{nSSL2})^2 + (b^*_{nSSL2})^2\}} - \sqrt{\{(a^*_{nref2})^2 + (b^*_{nref2})^2\}}.$$

Furthermore, an average saturation difference $SAT_{ave}(\varphi_{SSL2}(\lambda))$ of the 15 Munsell renotation color samples is represented by the following formula (2-3)

$$SAT_{ave}(\phi_{SSL2}(\lambda)) = \frac{\sum_{n=1}^{15} \Delta C_{nSSL2}}{15}. \quad \text{[Expression 28]}$$

(2-3)

Moreover, when a maximum saturation difference value of the 15 Munsell renotation color samples is denoted by $\Delta C_{SSL-max2}$ and a minimum saturation difference value is denoted by $\Delta C_{SSL-min2}$, a difference between a maximum saturation difference and a minimum saturation difference (difference among differences between maximum and minimum degrees of saturation) is represented by $$|\Delta C_{SSL-max2} - \Delta C_{SSL-min2}|.$$

<Luminous Efficacy of Radiation $K_{ssL2}$ (lm/W) and Luminous Efficacy of a Source $\eta_{ssL2}$ (lm/W)>

Furthermore, when evaluating the test light spectral power distribution $\varphi_{SSL2}(\lambda)$ when measuring light emitted in a main radiant direction from a light-emitting device of the first aspect of the second invention of the present invention, the widely-used definition below was adopted for luminous efficacy of radiation $K_{SSL2}$ (lm/W).

$$K_{SSL2} = Km \times [\int_{380}^{780} \{\varphi_{SSL2}(\lambda) \times V(\lambda)\} d\lambda] / [\int_{380}^{780} \varphi_{SSL2}(\lambda) d\lambda] \quad \text{[Expression 29]}$$

In the equation above,
$K_m$: maximum luminous efficacy (lm/W),
$V(\lambda)$: spectral luminous efficiency, and
$\lambda$: wavelength (nm).

Therefore, a luminous efficacy of radiation $K_{SSL2}$ (lm/W) of a test light spectral power distribution $\varphi_{SSL2}(\lambda)$ when measuring light in the main radiant direction emitted from the light-emitting device according to the first aspect of the second invention of the present invention can be described as efficiency inherent in the shape of the spectral power distribution.

On the other hand, light source efficiency $\eta_{SSL2}$ (lm/W) is a quantity indicating how much of power supplied to the light-emitting device according to the first aspect of the second invention of the present invention is converted into a luminous flux.

Furthermore, the luminous efficacy of radiation $K_{SSL2}$ (lm/W) of a test light spectral power distribution $\varphi_{SSL2}(\lambda)$ when measuring light in the main radiant direction emitted from the light-emitting device is efficiency inherent in the shape of the spectral power distribution itself and may be described as a quantity that equals light source efficiency $\eta_{SSL2}$ (lm/W) when assuming that characteristics of all materials constituting the light-emitting device (for example, internal quantum efficiency of semiconductor light-emitting elements, light extraction efficiency, internal quantum efficiency of phosphors, external quantum efficiency, and efficiency related to light transmission characteristics of encapsulants) have 100% efficiency.

<Conception of Invention Related to Light Source Efficiency>

The present inventor mathematically and experimentally evaluated whether or not both preferable color appearance and high light source efficiency can be achieved when the index $A_{cg}(\varphi_{SSL2}(\lambda))$ has a value outside a range of −360 or more and −10 or less and particularly a value larger than −10. The description of the first invention of the present invention will be applied to this evaluation.

[Examination with Light-Emitting Device Including a Plurality of Light-Emitting Areas]

Hereinafter, the second invention of the present invention will be described in further detail with reference to experimental examples and the like.

In the experimental examples, the inventor assumed that the light-emitting device included a plurality of light-emitting areas, and examined how the appearance of colors of the light-emitting device change by adjusting the radiant flux amount (luminous flux amount) of each light-emitting area. In other words, the characteristics of numeric values, such as the index $A_{cg}(\varphi_{SSL2}(\lambda))$, CCT (K), $D_{uv}(\varphi_{SSL2}(\lambda))$, the luminous efficacy of radiation $K_{SSL2}$ (lm/W), $\lambda_{SSL2-BM-max}$, $\varphi_{SSL2-BG-min}/\varphi_{SSL2-BM-max}$, $\lambda_{SSL2-RM-max}$, and $\varphi_{SSL2-BG-min}/\varphi_{SSL2-RM-max}$ of the light emitted from each light-emitting area and the light-emitting device in the main radiant direction, were extracted. At the same time, differences between color appearances of the 15 color samples when assuming illumination by calculational reference lights and color appearances of the 15 color samples when assuming a test light spectral power distribution actually measured were also compiled using $|\Delta h_{nSSL2}|$, $SAT_{ave}(\varphi_{SSL2}(\lambda))$, $\Delta C_{nSSL2}$, and $|\Delta C_{SSL-max2} - \Delta C_{SSL-min2}|$ as indices. Moreover, while values of $|\Delta h_{nSSL2}|$ and $\Delta C_{nSSL2}$ vary when n is selected, in this case, maximum and minimum values are shown. These values are also described in Tables 2-16 to 2-22.

In concrete terms, the inventor experimented on how $\varphi_{SSL2}(\lambda)$, which is the sum of the spectral power distribution of the light emitted from each light-emitting area in the main radiant direction, will change by changing the luminous flux amount and/or radiant flux amount emitted from each light-emitting area in the main radiant direction.

Experimental Example 201

A 5 mm diameter resin package 10 in which two light-emitting units exist, as shown in FIG. 2-1, is prepared. In the light-emitting area 211, a blue semiconductor light-emitting element (dominant wavelength: 452.5 nm), a green phosphor (LuAG, peak wavelength: 530 nm, full-width at half-maximum: 104 nm) and a red phosphor (CASN, peak wavelength: 645 nm, full-width at half-maximum: 89 nm) are mounted and encapsulated. The blue semiconductor light-emitting element in the light-emitting area 201 constitutes a wiring of the packaged LED, so as to be one independent circuit configuration, and is connected to a power supply. In the light-emitting area 212, on the other hand, a blue semiconductor light-emitting element (dominant wavelength 452.5 nm), a green phosphor (LuAG, peak wavelength 530 nm, full-width at half-maximum 104 nm) and a red phosphor (CASN, peak wavelength 645 nm, full-width at half-maximum 89 nm) which are adjusted differently are mounted and encapsulated. The blue semiconductor light-emitting element in the light-emitting area 202 constitutes a wiring of the packaged LED, so as to be one independent circuit configuration, and is connected to another independent power supply. In this way, current can be injected independently into the light-emitting area 211 and the light-emitting area 212 respectively.

Figures 1, 2, 3, 4:
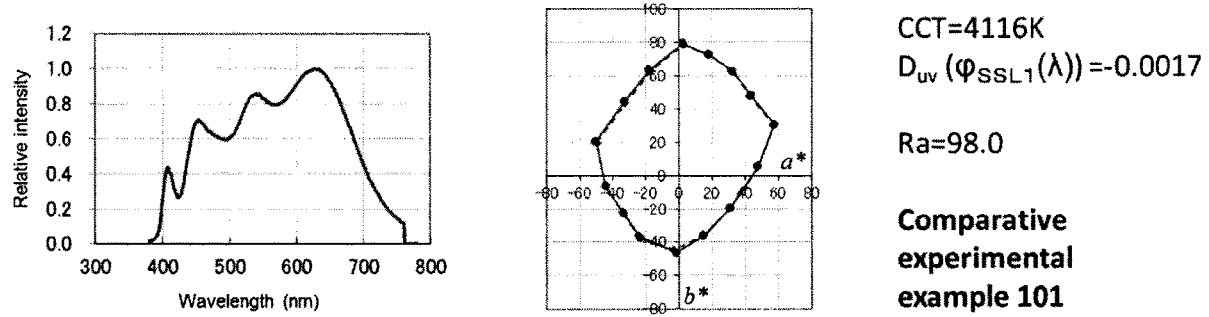

Next, if the current value of the current supplied to each light-emitting area of the packaged LED 210, which includes the light-emitting area 211 and the light-emitting area 212, is appropriately adjusted, then five types of spectral power distributions shown in FIG. 2-2 to FIG. 2-6, irradiated onto the axis of the packaged LED for example, are implemented. FIG. 2-2 is the case when the current is injected only into the light-emitting area 211, and the radiant flux ratio of the light-emitting area 211 and the light-emitting area 212 is set to 3:0, and FIG. 2-6 is a case when current is injected only into the light-emitting area 212, and the radiant flux ratio of the light-emitting area 211 and the light-emitting area 212 is set to 0:3. FIG. 2-3 is a case when the radiant flux ratio of the light-emitting area 211 and the light-emitting area 212 is set to 2:1, FIG. 2-4 is a case when the radiant flux ratio is set to 1.5:1.5, and FIG. 2-5 is a case when the radiant flux ratio is set to 1:2. By changing the current that is injected into each area of the packaged LED 210, the radiant flux irradiated from the packaged LED main body onto the axis can be changed. The CIELAB plot in each drawing indicates the a* values and the b* values which are plotted: when 15 Munsell renotation color samples #01 to #15 are mathematically assumed as the illumination objects, and these illumination objects are illuminated using this packaged LED; and when these illumination objects are illuminated by a reference light derived from the correlated color temperature of the packaged LED. Here, the drive point names A to E are assigned to the radiant flux of the light-emitting device in descending order of contribution of the radiant flux of the light-emitting area 211. FIG. 2-7 shows the chromaticity point at each of the drive points A to E on the CIE 1976 u'v' chromaticity diagram. Table 2-16 shows the photometric characteristics and colormetric characteristics that are expected at each drive point.

TABLE 2-16-1

| | (*1)(*2) | Light emitting device ||||||||
|---|---|---|---|---|---|---|---|---|---|
| | | $T_{SSL2}$ (K) | $D_{uv}$ ($\varphi_{SSL2}(\lambda)$) | $A_{cg}$ ($\varphi_{SSL2}(\lambda)$) | $\lambda_{SSL2\text{-}BM\text{-}max}$ (nm) | $\varphi_{SSL2\text{-}BG\text{-}min}/\varphi_{SSL2\text{-}BM\text{-}max}$ | $\lambda_{SSL2\text{-}RM\text{-}max}$ (nm) | $\varphi_{SSL2\text{-}BG\text{-}min}/\varphi_{SSL2\text{-}RM\text{-}max}$ | $K_{SSL2}$ (lm/w) |
| Experimental example 201-A | 3:0 | 3207 | −0.0072 | 68.1 | 450 | 0.3691 | 635 | 0.2553 | 259.8 |
| Experimental example 201-B | 2:1 | 3466 | −0.0106 | 45.7 | 450 | 0.3619 | 630 | 0.3103 | 258.8 |
| Experimental example 201-C | 1.5:1.5 | 3619 | −0.0120 | 37.5 | 450 | 0.3558 | 630 | 0.3383 | 258.3 |
| Experimental example 201-D | 1:2 | 3791 | −0.0133 | 31.8 | 450 | 0.3504 | 630 | 0.3662 | 257.8 |
| Experimental example 201-E | 0:3 | 4204 | −0.0155 | 29.6 | 450 | 0.3404 | 630 | 0.4307 | 256.8 |

(*1) Light emitting area, radiant flux ratio (*2) Ratio of radiant flux $\varphi_{SSL2}1$ of light emitting area 1 and radiant flux $\varphi_{SSL2}2$ of light emitting area 2 ($\varphi_{SSL2}1$:$\varphi_{SSL2}2$)

TABLE 2-16-2

| | Indexes extracted from calculations on 15 specific Munsell renotation color samples |||||||
|---|---|---|---|---|---|---|---|
| | $|\Delta h_{nSSL2}|$ maximum value (degrees) | $|\Delta h_{nSSL2}|$ minimum value (degrees) | $SAT_{ave}$ ($\varphi_{SSL2}(\lambda)$) | $\Delta C_{SSL\text{-}max2}$ | $\Delta C_{SSL\text{-}min2}$ | $|\Delta C_{SSL\text{-}max2} - \Delta C_{SSL\text{-}min2}|$ | Ra | Drawing number |
| Experimental example 201-A | 3.65 | 0.01 | 1.95 | 4.64 | −0.46 | 5.10 | 95.6 | FIG. 2-2 |
| Experimental example 201-B | 4.75 | 0.02 | 2.22 | 5.30 | −0.66 | 5.96 | 94.8 | FIG. 2-3 |
| Experimental example 201-C | 5.29 | 0.01 | 2.28 | 5.47 | −0.75 | 6.23 | 94.5 | FIG. 2-4 |

TABLE 2-16-2-continued

Indexes extracted from calculations on 15 specific Munsell renotation color samples

| | $|\Delta h_{nSSL2}|$ maximum value (degrees) | $|\Delta h_{nSSL2}|$ minimum value (degrees) | $SAT_{ave}$ ($\varphi_{SSL2}(\lambda)$) | $\Delta C_{SSL\text{-}max2}$ | $\Delta C_{SSL\text{-}min2}$ | $|\Delta C_{SSL\text{-}max2} - \Delta C_{SSL\text{-}min2}|$ | Ra | Drawing number |
|---|---|---|---|---|---|---|---|---|
| Experimental example 201-D | 5.82 | 0.15 | 2.32 | 5.56 | −0.85 | 6.42 | 94.1 | FIG. 2-5 |
| Experimental example 201-E | 6.82 | 0.08 | 2.32 | 5.56 | −1.07 | 6.62 | 93.5 | FIG. 2-6 |

The spectral power distributions in FIG. 2-2 to FIG. 2-6, the CIELAB plots in FIG. 2-2 to FIG. 2-6, the CIE 1976 u'v' chromaticity diagram in FIG. 2-7, and Table 2-16-1 and Table 2-16-2 clarify the following.

At drive points A to E and in intervals between the drive points, both a natural, vivid, highly visible and comfortable appearance of colors and appearance of objects as if the objects are seen outdoors and high light source efficiency can conceivably be achieved. For example, between the drive point A and the drive point E, the correlated color temperature of the packaged LED can be variable in a 3207 K to 4204 K range, and $D_{uv}(\varphi_{SSL2}(\lambda))$ can also be variable in the −0.0072 to −0.0155 range. Further, the average saturation difference of the 15 Munsell renotation color samples can also be variable in a 1.95 to 2.32 range while implementing such an appearance of colors. Accordingly, in an area where both a preferable appearance of colors and high light source efficiency can be achieved, illumination conditions that are conceivably more optimal can be readily selected from a variable range in accordance with the age, the gender or the like of a user of the light-emitting device or in accordance with a space, a purpose, or the like of the illumination.

In this case, the following drive control is also possible.

First, when at least one of the index $A_{cg}(\varphi_{SSL2}(\lambda))$, correlated color temperature $T_{SSL2}$ (K), and distance $D_{uv}(\varphi_{SSL2}(\lambda))$ from the black-body radiation locus, is changed, the luminous flux and/or radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}(\varphi_{SSL2}(\lambda))$ is decreased in an appropriate range, the luminous flux and/or radiant flux of the light-emitting device can be decreased, so as to decrease the luminance of the illumination object.

Third, when $D_{uv}(\varphi_{SSL2}(\lambda))$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Experimental Example 202

A ceramic package, in which a 7 mm diameter light-emitting unit is divided into six sub-light-emitting units, as shown in FIG. 2-8, is prepared. Here a blue semiconductor light-emitting element (dominant wavelength: 463 nm), a green phosphor (LuAG, peak wavelength: 530 nm, full-width at half-maximum: 104 nm) and a red phosphor (CASN, peak wavelength: 645 nm, full-width at half-maximum: 89 nm) are mounted and encapsulated in a light-emitting area 221, whereby equivalent light-emitting areas are formed. The semiconductor light-emitting elements in the light-emitting area 221 are connected in series, and connected to one independent power supply. On the other hand, a blue semiconductor light-emitting element (dominant wavelength: 453 nm), a green phosphor (LuAG, peak wavelength: 530 nm, full-width at half-maximum: 104 nm) and a red phosphor (CASN, peak wavelength: 645 nm, full-width at half-maximum: 89 nm) which are adjusted differently are mounted and encapsulated in a light-emitting area 222, whereby equivalent light-emitting areas are formed. The semiconductor light-emitting elements in the light-emitting area 222 are connected in series, and connected to another independent power supply. Further, a blue semiconductor light-emitting element (dominant wavelength: 455 nm), a green phosphor (LuAG, peak wavelength: 530 nm, full-width at half-maximum: 104 nm) and a red phosphor (CASN, peak wavelength: 645 nm, full-width at half-maximum: 89 nm), which are adjusted differently from the light-emitting area 221 and the light-emitting area 221, are mounted and encapsulated in the light-emitting area 223, so as to be equivalent light-emitting areas. The semiconductor light-emitting elements of the light-emitting area 223 are connected in series and connected to another independent power supply. Current can be injected into the light-emitting area 221, the light-emitting area 222 and the light-emitting area 223 independently from each other.

Next, if the current value of current injected into each light-emitting area of the packaged LED having the light-emitting area 221, the light-emitting area 222 and the light-emitting area 223 is appropriately adjusted, and four types of spectral power distributions shown in FIG. 2-9 to FIG. 2-12 irradiated onto the axis of the packaged LED, for example, are implemented. FIG. 2-9 is a case when current is injected only into the light-emitting area 221, and the radiant flux ratio of the light-emitting area 221, the light-emitting area 222 and the light-emitting area 223 is set to 3:0:0. FIG. 2-10 is a case when current is injected only into the light-emitting area 222, and the radiant flux ratio of the light-emitting area 221, the light-emitting area 222 and the light-emitting area 223 is set to 0:3:0. FIG. 2-11 is a case when current is injected only into the light-emitting area 223, and the radiant flux ratio of the light-emitting area 221, the light-emitting are 222 and the light-emitting area 223 is set to 0:0:3. And FIG. 2-12 is a case when current is injected into all of the light-emitting area 221, the light-emitting area 222 and the light-emitting area 223, and the radiant flux ratio thereof is set to 1:1:1. By changing the current to be injected into each area of the packaged LED 220 shown in FIG. 2-8, the radiant flux irradiated from the packaged LED main body onto the axis can be changed. The CIELAB plot in each drawing indicates the a* values and the b* values which are plotted respectively: when 15 Munsell renotation color samples #01 to #15 are mathematically assumed as the illumination objects and these illumination objects are illuminated by the packaged LED; and when these illumination objects are illuminated by a reference light derived from the correlated color temperature of the packaged LED. Here the drive point names A to D are assigned to the radiant flux of the light-emitting device. FIG. 2-13 shows the chromaticity points at each of the drive points A to D on the CIE 1976 u'v' chromaticity diagram. Table 2-17 shows the photometric characteristics and colormetric characteristics that are expected at each drive point.

TABLE 2-17-1

| | (*1)<br>(*2) | $T_{SSL2}$<br>(K) | $D_{uv}$<br>($\varphi_{SSL2}(\lambda)$) | $A_{cg}$<br>($\varphi_{SSL2}(\lambda)$) | Light-emitting device | | | | |
| --- | --- | --- | --- | --- | --- | --- | --- | --- | --- |
| | | | | | $\lambda_{SSL2-BM-max}$<br>(nm) | $\varphi_{SSL2-BG-min}/$<br>$\varphi_{SSL2-BM-max}$ | $\lambda_{SSL2-RM-max}$<br>(nm) | $\varphi_{SSL2-BG-min}/$<br>$\varphi_{SSL2-RM-max}$ | $K_{SSL2}$<br>(lm/W) |
| Experimental example 202-A | 3:0:0 | 2934 | −0.0102 | 49.2 | 465 | 0.6402 | 630 | 0.3493 | 255.7 |
| Experimental example 202-B | 0:3:0 | 3133 | −0.0073 | 75.8 | 455 | 0.4836 | 630 | 0.2944 | 262.1 |
| Experimental example 202-C | 0:0:3 | 3926 | −0.0104 | 32.6 | 460 | 0.5389 | 620 | 0.5392 | 263.1 |
| Experimental example 202-D | 1:1:1 | 3323 | −0.0100 | 45.4 | 460 | 0.5948 | 630 | 0.4049 | 260.5 |

(*1) Light emitting area, radiant flux ratio
(*2) Ratio of radiant flux $\varphi_{SSL2}1$ of light emitting area 1, radiant flux $\varphi_{SSL2}2$ of light emitting area 2 and radiant flux $\varphi_{SSL2}3$ of light emitting area 3 ($\varphi_{SSL2}1:\varphi_{SSL2}2:\varphi_{SSL2}3$)

TABLE 2-17-2

| | Indexes extracted from calculations on 15 specific Munsell renotation color samples | | | | | | | |
| --- | --- | --- | --- | --- | --- | --- | --- | --- |
| | $\|\Delta h_{nSSL2}\|$<br>maximum value<br>(degrees) | $\|\Delta h_{nSSL2}\|$<br>minimum value<br>(degrees) | $SAT_{ave}$<br>($\varphi_{SSL2}(\lambda)$) | $\Delta C_{SSL-max2}$ | $\Delta C_{SSL-min2}$ | $\|\Delta C_{SSL-max2} -$<br>$\Delta C_{SSL-min2}\|$ | Ra | Drawing number |
| Experimental example 202-A | 1.87 | 0.16 | 1.91 | 5.27 | −1.43 | 6.70 | 92.4 | FIG. 2-9 |
| Experimental example 202-B | 3.18 | 0.14 | 1.67 | 4.39 | −0.34 | 4.73 | 96.4 | FIG. 2-10 |
| Experimental example 202-C | 3.96 | 0.15 | 0.94 | 3.32 | −1.80 | 5.13 | 93.3 | FIG. 2-11 |
| Experimental example 202-D | 2.74 | 0.02 | 1.53 | 3.97 | −1.05 | 5.02 | 94.2 | FIG. 2-12 |

The spectral power distributions in FIG. 2-9 to FIG. 2-12, the CIELAB plots in FIG. 2-9 to FIG. 2-12, the CIE 1976 u'v' chromaticity diagram in FIG. 2-13 and Table 2-17-1 and Table 2-17-2 clarify the following.

At drive points A to C, both a natural, vivid, highly visible and comfortable appearance of colors and appearance of objects as if the objects are seen outdoors and high light source efficiency can conceivably be achieved. In addition, even at a drive point D which exists in a range enclosed by the drive points A to C, both a natural, vivid, highly visible and comfortable appearance of colors and appearance of objects as if the objects are seen outdoors and high light source efficiency can conceivably be achieved. Therefore, for example, in an area enclosed by the drive point A, the drive point B, and the drive point C as well as in a vicinity of the area, a correlated color temperature of the package LED is variable from 2934 K to 3926 K and $D_{uv}(\varphi_{SSL2}(\lambda))$ is also variable from −0.0104 to −0.0073 while achieving the appearance of colors described above. Further, the average saturation difference of the 15 Munsell renotation color samples can also be variable in a 0.94 to 1.91 range. Accordingly, in an area where both a preferable appearance of colors and high light source efficiency can be achieved, illumination conditions that are conceivably more optimal can be readily selected from a variable range in accordance with the age, the gender or the like of a user of the light-emitting device or in accordance with a space, a purpose, or the like of the illumination.

This experimental example is especially preferable since one light-emitting device includes three types of light-emitting areas for which colors are adjusted differently, and the variable ranges can be wider compared with the case when one light-emitting device includes two types of light-emitting areas for which colors are adjusted differently.

In this case, the following drive control is also possible.

First, when at least one of the index $A_{cg}(\varphi_{SSL2}(\lambda))$, correlated color temperature $T_{SSL2}$ (K), and distance $D_{uv}(\varphi_{SSL2}(\lambda))$ from the black-body radiation locus, is changed, the luminous flux and/or the radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}(\varphi_{SSL2}(\lambda))$ is decreased in an appropriate range, the luminous flux and/or radiant flux of the light-emitting device can be decreased, so as to decrease the luminance of the illumination object.

Third, when $D_{uv}(\varphi_{SSL2}(\lambda))$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Experimental Example 203

As shown in FIG. 2-14, a light-emitting device that is an illumination system in which a total of 90 (9×10) LED light bulbs as light-emitting units are embedded in a ceiling is prepared. Here each portion shaded by solid lines is a light-emitting area 231, where the same LED bulb is mounted to form an equivalent light-emitting area. Each portion shaded by the dotted lines in FIG. 2-14 is a light-emitting area 232, where the same LED bulb is mounted to form an equivalent light-emitting area. The LED light bulbs mounted in the plurality of light-emitting areas 231 are connected in parallel, and connected to one independent power supply. On the other hand, the LED light bulbs mounted in the plurality of light-emitting areas 232 are connected in parallel and connected to another independent power supply. The light-emitting areas 231 and the light-emitting areas 232 can be driven independently. The LED light bulb constituting the light-emitting area 231 includes a blue semiconductor light-emitting element (dominant wavelength: 446 nm), an yellow phosphor (YAG, peak wavelength 545 nm, full-width at half-maximum: 108 nm) and a red phosphor (SCASN, peak wavelength: 640 nm, full-width at half-maximum: 90 nm), and the LED light bulb constituting the light-emitting area 232 includes a blue semiconductor light-emitting element (dominant wavelength: 450 nm), a green phosphor (LuAG, peak wavelength: 530 nm, full-width at half-maximum: 104 nm) and a red phosphor (CASN, peak wavelength: 645 nm, full-width at half-maximum: 89 nm) which are adjusted differently.

Next, if the radiant fluxes of the LED light bulbs constituting the light-emitting area 231 and the light-emitting area 232 are appropriately adjusted using dimming controllers connected to the independent power supplies respectively, five types of spectral power distributions shown in FIG. 2-15 to FIG. 2-19 irradiated onto the central axis of the illumination system, for example, are implemented. FIG. 2-15 is a case when only the LED light bulbs constituting the light-emitting areas 231 are driven, and the radiant flux ratio of the light-emitting area 231 and the light-emitting area 232 is set to 90:0, and FIG. 2-19 is a case when only the LED light bulbs constituting the light-emitting areas 232 are driven and the radiant flux ratio of the light-emitting area 231 and the light-emitting area 232 is set to 0:90. FIG. 2-16 is a case when the radiant flux ratio of the LED light bulbs constituting the light-emitting area 231 and the LED light-emitting area 232 is set to 70:20. FIG. 2-17 is a case when the radiant flux ratio is set to 45:45, and FIG. 2-18 is a case when the radiant flux ratio is set to 30:60. By changing the driving conditions of the LED light values constituting each light-emitting area, the radiant flux irradiated onto the central axis of the illumination system can be changed.

The CIELAB plot in each drawing indicates the a* values and the b* values which are plotted respectively: when 15 Munsell renotation color samples #01 to #15 are mathematically assumed as the illumination objects and these illumination objects are illuminated using this illumination system; and when these illumination objects are illuminated by a reference light derived from the correlated color temperature of the light-emitting device of this illumination system. Here the drive point names A to E are assigned to the radiant flux of the illumination system (light-emitting device) in descending order of contribution of the radiant flux of the LED light bulb constituting the light-emitting area 231. FIG. 2-20 shows the chromaticity points at each of the drive points A to E on the CIE 1976 u'v' chromaticity diagram. Table 2-18 shows the photometric characteristics and colormetric characteristics that are expected at each drive point.

TABLE 2-18-1

| | (*1) (*2) | $T_{SSL2}$ (K) | $D_{uv}$ ($\varphi_{SSL2}(\lambda)$) | $A_{cg}$ ($\varphi_{SSL2}(\lambda)$) | $\lambda_{SSL2-BM-max}$ (nm) | $\varphi_{SSL2-BG-min}/\varphi_{SSL2-BM-max}$ | $\lambda_{SSL2-RM-max}$ (nm) | $\varphi_{SSL2-BG-min}/\varphi_{SSL2-RM-max}$ | $K_{SSL2}$ (lm/W) |
|---|---|---|---|---|---|---|---|---|---|
| Experimental example 203-A | 90:0 | 4156 | −0.0112 | 92.0 | 450 | 0.1269 | 585 | 0.1960 | 299.5 |
| Experimental example 203-B | 70:20 | 3849 | −0.0118 | 76.5 | 450 | 0.1918 | 610 | 0.2488 | 287.3 |
| Experimental example 203-C | 45:45 | 3544 | −0.0121 | 67.5 | 450 | 0.2970 | 620 | 0.2931 | 274.8 |
| Experimental example 203-D | 30:60 | 3393 | −0.0120 | 48.0 | 455 | 0.3763 | 625 | 0.3097 | 268.3 |
| Experimental example 203-E | 0:90 | 3146 | −0.0116 | 39.8 | 455 | 0.5087 | 630 | 0.3318 | 257.3 |

(*1) Light emitting area, radiant flux ratio
(*2) Ratio of radiant flux $\varphi_{SSL2}1$ of light emitting area 1 and radiant flux $\varphi_{SSL2}2$ of light emitting area 2 ($\varphi_{SSL2}1:\varphi_{SSL2}2$)

TABLE 2-18-2

Indexes extracted from calculations on 15 specific Munsell renotation color samples

| | $|\Delta h_{nSSL2}|$ maximum value (degrees) | $|\Delta h_{nSSL2}|$ minimum value (degrees) | $SAT_{ave}$ ($\varphi_{SSL2}(\lambda)$) | $\Delta C_{SSL-max2}$ | $\Delta C_{SSL-min2}$ | $|\Delta C_{SSL-max2} - \Delta C_{SSL-min2}|$ | Ra | Drawing number |
|---|---|---|---|---|---|---|---|---|
| Experimental example 203-A | 15.62 | 0.75 | 0.94 | 8.17 | −6.32 | 14.49 | 83.4 | FIG. 2-15 |
| Experimental example 203-B | 11.89 | 0.90 | 1.28 | 7.58 | −4.69 | 12.27 | 88.3 | FIG. 2-16 |
| Experimental example 203-C | 8.20 | 1.10 | 1.65 | 7.02 | −2.89 | 9.91 | 93.4 | FIG. 2-17 |
| Experimental example 203-D | 6.49 | 0.57 | 1.84 | 6.69 | −1.86 | 8.55 | 95.3 | FIG. 2-18 |
| Experimental example 203-E | 3.30 | 0.14 | 2.17 | 5.99 | −0.46 | 6.45 | 94.4 | FIG. 2-19 |

The spectral power distributions in FIG. 2-15 to FIG. 2-19, the CIELAB plots in FIG. 2-15 to FIG. 2-19, the CIE 1976 u'v' chromaticity diagram in FIG. 2-20 and Table 2-18-1 and Table 2-18-2 clarify the following.

Although at least one of $\varphi_{SSL2-SG-min}/\varphi_{SSL2-BM-max}$ and $\lambda_{SSL2-RM-max}$ is not within an appropriate range according to the second invention of the present invention at the drive points A and B, both a natural, vivid, highly visible and comfortable appearance of colors and appearance of objects as if the objects are seen outdoors and high light source efficiency can conceivably be achieved at the drive point C, the drive point D, and the drive point E as well as in intervals therebetween and in a vicinity thereof. For example, between the drive point C and the drive point E, the correlated color temperature of the illumination system can be variable in a 3146 K to 3544 K range, and $D_{uv}(\varphi_{SSL2}(\lambda))$ can also be variable in a −0.0121 to −0.0116 range, while implementing the above mentioned appearance of colors. Further, the average saturation difference of the 15 Munsell renotation color samples can also be variable in a 1.65 to 2.17 range. Accordingly, in an area where both a preferable appearance of colors and high light source efficiency can be achieved, illumination conditions that are conceivably more optimal can be readily selected from a variable range in accordance with the age, the gender or the like of a user of the light-emitting device or in accordance with a space, a purpose, or the like of the illumination.

In this case, the following drive control is also possible.

First, when at least one of the index $A_{cg}(\varphi_{SSL2}(\lambda))$, correlated color temperature $T_{SSL2}$ (K), and distance $D_{uv}$ ($\varphi_{SSL2}(\lambda)$) from the black-body radiation locus, is changed, the luminous flux and/or the radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}(\varphi_{SSL2}(\lambda))$ is decreased in an appropriate range, the luminous flux and/or radiant flux of the light-emitting device can be decreased, so as to decrease the luminance of the illumination object.

Third, when $D_{uv}(\varphi_{SSL2}(\lambda))$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Experimental Example 204

As the same as the case of the Experimental Example 203, as shown in FIG. 2-14, a light-emitting device that is an illumination system in which a total of 90 (9×10) LED light bulbs as light-emitting units are embedded in a ceiling is prepared. The LED light bulb forming a light-emitting area 231 may be a commercially-available LED light bulb that includes a blue semiconductor light-emitting element and a yellow phosphor as light-emitting elements and the LED light bulb forming a light-emitting area 232 can include a purple semiconductor light-emitting element (dominant wavelength: 408 nm), a blue phosphor (SBCA, peak wavelength: 455 nm, full-width at half-maximum: 54 nm), a green phosphor (β-SiAlON, peak wavelength: 545 nm, full-width at half-maximum: 55 nm), and a red phosphor (CASON, peak wavelength: 645 nm, full-width at half-maximum: 99 nm).

Next, if the radiant fluxes of the LED light bulbs constituting the light-emitting area 231 and the light-emitting area 232 are appropriately adjusted using dimming controllers connected to the independent power supplies respectively, five types of spectral power distributions shown in FIG. 2-21 to FIG. 2-25 irradiated onto the central axis of the illumination system, for example, are implemented. FIG. 2-21 is a case when only the LED light bulbs constituting the light-emitting areas 231 are driven, and the radiant flux ratio of the light-emitting area 231 and the light-emitting area 232 is set to 90:0, and FIG. 2-25 is a case when only the LED light bulbs constituting the light-emitting areas 232 are driven and the radiant flux ratio of the light-emitting area 231 and the light-emitting area 232 is set to 0:90. FIG. 2-22 is a case when the radiant flux ratio of the LED light bulbs constituting the light-emitting area 231 and the LED light-emitting area 232 is set to 70:20. FIG. 2-23 is a case when the radiant flux ratio is set to 49:41, and FIG. 2-24 is a case when the radiant flux ratio is set to 30:60. By changing the driving conditions of the LED light values constituting each light-emitting area, the radiant flux irradiated onto the central axis of the illumination system can be changed.

The CIELAB plot in each drawing indicates the a* values and the b* values which are plotted respectively: when 15 Munsell renotation color samples #01 to #15 are mathematically assumed as the illumination objects and these illumination objects are illuminated using this illumination system; and when these illumination objects are illuminated by a reference light derived from the correlated color temperature of the light-emitting device of this illumination system. Here the drive point names A to E are assigned to the radiant flux of the illumination system (light-emitting device) in descending order of contribution of the radiant flux of the LED light bulb constituting the light-emitting area 231. FIG. 2-26 shows the chromaticity points at each of the drive points A to E on the CIE 1976 u'v' chromaticity diagram. Table 2-19 shows the photometric characteristics and colormetric characteristics that are expected at each drive point.

TABLE 2-19-1

| | | | | Light-emitting device | | | | | |
|---|---|---|---|---|---|---|---|---|---|
| | (*1) (*2) | $T_{SSL2}$ (K) | $D_{uv}$ ($\varphi_{SSL2}(\lambda)$) | $A_{cg}$ ($\varphi_{SSL2}(\lambda)$) | $\lambda_{SSL2\text{-}BM\text{-}max}$ (nm) | $\varphi_{SSL2\text{-}BG\text{-}min}/\varphi_{SSL2\text{-}BM\text{-}max}$ | $\lambda_{SSL2\text{-}RM\text{-}max}$ (nm) | $\varphi_{SSL2\text{-}BG\text{-}min}/\varphi_{SSL2\text{-}RM\text{-}max}$ | $K_{SSL2}$ (lm/W) |
| Experimental example 204-A | 90:0 | 6814 | 0.0038 | 116.8 | 465 | 0.2509 | 590 | 0.6315 | 293.8 |
| Experimental example 204-B | 70:20 | 5114 | −0.0040 | 35.3 | 465 | 0.3096 | 600 | 0.5783 | 273.5 |
| Experimental example 204-C | 49:41 | 4067 | −0.0081 | 14.7 | 465 | 0.3925 | 625 | 0.4545 | 258.4 |
| Experimental example 204-D | 30:60 | 3475 | −0.0092 | −27.8 | 465 | 0.5065 | 630 | 0.3659 | 248.2 |
| Experimental example 204-E | 0:90 | 2907 | −0.0082 | −36.6 | 455 | 0.7897 | 635 | 0.2674 | 236.3 |

(*1) Light emitting area, radiant flux ratio (*2) Ratio of radiant flux $\varphi_{SSL2}1$ of light emitting area 1 and radiant flux $\varphi_{SSL2}2$ of light emitting area 2 ($\varphi_{SSL2}1:\varphi_{SSL2}2$)

TABLE 2-19-2

Indexes extracted from calculations on 15 specific Munsell renotation color samples

| | $|\Delta h_{nSSL2}|$ maximum value (degrees) | $|\Delta h_{nSSL2}|$ minimum value (degrees) | $SAT_{ave}$ ($\varphi_{SSL2}(\lambda)$) | $\Delta C_{SSL-max2}$ | $\Delta C_{SSL-min2}$ | $|\Delta C_{SSL-max2} - \Delta C_{SSL-min2}|$ | Ra | Drawing number |
|---|---|---|---|---|---|---|---|---|
| Experimental example 204-A | 18.10 | 0.31 | −3.20 | 5.55 | −9.51 | 15.06 | 81.5 | FIG. 2-21 |
| Experimental example 204-B | 10.63 | 0.16 | −0.82 | 4.48 | −4.73 | 9.20 | 90.4 | FIG. 2-22 |
| Experimental example 204-C | 6.11 | 0.55 | 0.55 | 3.71 | −2.14 | 5.85 | 94.6 | FIG. 2-23 |
| Experimental example 204-D | 3.36 | 0.14 | 1.62 | 3.83 | −0.16 | 3.99 | 95.0 | FIG. 2-24 |
| Experimental example 204-E | 2.18 | 0.02 | 2.69 | 6.57 | −0.41 | 6.98 | 92.4 | FIG. 2-25 |

The spectral power distributions in FIG. 2-21 to FIG. 2-25, the CIELAB plots in FIG. 2-21 to FIG. 2-15, the CIE 1976 u'v' chromaticity diagram in FIG. 2-26 and Table 2-19-1 and Table 2-19-2 clarify the following.

At the drive point A, the drive point B, the drive point D, and the drive point E, at least one from $D_{uv}(\varphi_{SSL2}(\lambda))$, $A_{cg}(\varphi_{SSL2}(\lambda))$, $\varphi_{SSL2-BG-min}/\varphi_{SSL2-BM-max}$, and $\lambda_{SSL2-RM-max}$ are not in an appropriate range of the second invention of the present invention, but at the drive point C and areas between and near the drive point, a natural, vivid, highly visible and comfortable appearance of colors and appearance of objects, as of the objects are seen outdoors, and high light source efficiency can be implemented. Moreover, at the drive point D and the drive point E, in an interval therebetween, and in a vicinity thereof, conceivably, while preferable color appearance is realized, relatively high light source efficiency cannot be realized due to relatively low luminous efficacy of radiation.

Experimental Example 205

A ceramic package LED 240, in which two 5 mm×5 mm ceramic packages, including one light-emitting area respectively, are disposed close to each other, is prepared as shown in FIG. 2-27. Here one of the ceramic package LED becomes the light-emitting area 241 and the other becomes the light-emitting area 242. In the light-emitting area 241, a blue semiconductor light-emitting element (dominant wavelength: 453 nm), a green phosphor (LuAG, peak wavelength: 530 nm, full-width at half-maximum: 104 nm) and a red phosphor (CASON, peak wavelength: 645 nm, full-width at half-maximum: 99 nm) are mounted and encapsulated. The light-emitting area 241 is connected to one independent power supply. In the light-emitting area 242, on the other hand, a purple semiconductor light-emitting element (dominant wavelength: 408 nm), a blue phosphor (SBCA, peak wavelength: 455 nm, full-width at half-maximum: 54 nm), a green phosphor (β-SiAlON, peak wavelength: 545 nm, full-width at half-maximum: 55 nm), and a red phosphor (CASON, peak wavelength: 645 nm, full-width at half-maximum: 99 nm) are mounted and encapsulated. The light-emitting area 242 is connected to another independent power supply. Thereby current can be injected into the light-emitting area 241 and the light-emitting area 242 independently.

Next, if the current value of the current injected into each light-emitting area of the pair of packaged LEDs 240, which are the light-emitting area 241 and the light-emitting area 242, is appropriately adjusted, five types of spectral power distributions shown in FIG. 2-28 to FIG. 2-32 irradiated onto the axis of the pair of packaged LEDs 240, for example, are implemented. FIG. 2-28 is a case when current is injected only into the light-emitting area 241 and the radiant flux ratio of the light-emitting area 241 and the light-emitting area 242 is set to 9:0, and FIG. 2-32 is a case when current is injected only into the light-emitting area 242 and the radiant flux ratio of the light-emitting area 241 and the light-emitting area 242 is set to 0:9. FIG. 2-29 is a case when the radiant flux ratio of the light-emitting area 241 and the light-emitting area 242 is set to 7:2, FIG. 2-30 is a case when the radiant flux ratio is set to 4.5:4.5, and FIG. 2-31 is a case when the radiant flux ratio is set to 2:7. By changing the current to be injected into each area of the pair of packaged LEDs 240, the radiant flux irradiated from the main body of the pair of packaged LEDs onto the central axis can be changed.

The CIELAB plot in each drawing indicates the a* values and the b* values which are plotted respectively: when 15 Munsell renotation color samples #01 to #15 are mathematically assumed as the illumination objects, and these illumination objects are illuminated by the pair of packaged LEDs; and when these illumination objects are illuminated by a reference light derived from the correlated color temperature of the pair of packaged LEDs. Here the drive point names A to E are assigned to the radiant flux of the light-emitting device in descending order of contribution of the radiant flux of the light-emitting area 241. FIG. 2-33 shows the chromaticity points at each of the drive points A to E on the CIE 1976 u'v' chromaticity diagram. Table 2-20 shows the photometric characteristics and colormetric characteristics that are expected at each drive point.

TABLE 2-20-1

| | (*1) (*2) | $T_{SSL2}$ (K) | $D_{uv}$ ($\varphi_{SSL2}(\lambda)$) | $A_{cg}$ ($\varphi_{SSL2}(\lambda)$) | $\lambda_{SSL2\text{-}BM\text{-}max}$ (nm) | $\varphi_{SSL2\text{-}BG\text{-}min}/\varphi_{SSL2\text{-}BM\text{-}max}$ | $\lambda_{SSL2\text{-}RM\text{-}max}$ (nm) | $\varphi_{SSL2\text{-}BG\text{-}min}/\varphi_{SSL2\text{-}RM\text{-}max}$ | $K_{SSL2}$ (lm/W) |
|---|---|---|---|---|---|---|---|---|---|
| Experimental example 205-A | 9:0 | 3168 | −0.0123 | 63.1 | 455 | 0.3774 | 630 | 0.3081 | 263.2 |
| Experimental example 205-B | 7:2 | 3365 | −0.0122 | 23.7 | 455 | 0.4614 | 630 | 0.3697 | 255.4 |
| Experimental example 205-C | 4.5:4.5 | 3636 | −0.0118 | −17.0 | 455 | 0.5689 | 630 | 0.4451 | 246.5 |
| Experimental example 205-D | 2:7 | 3937 | −0.0109 | −48.5 | 455 | 0.6687 | 630 | 0.5104 | 238.4 |
| Experimental example 205-E | 0:9 | 4199 | −0.0100 | −67.2 | 455 | 0.7452 | 635 | 0.5550 | 232.4 |

(*1) Light emitting area, radiant flux ratio
(*2) Ratio of radiant flux $\varphi_{SSL2}1$ of light emitting area 1 and radiant flux $\varphi_{SSL2}2$ of light emitting area 2 ($\varphi_{SSL2}1:\varphi_{SSL2}2$)

TABLE 2-20-2

| | Indexes extracted from calculations on 15 specific Munsell renotation color samples | | | | | | | |
|---|---|---|---|---|---|---|---|---|
| | $|\Delta h_{nSSL2}|$ maximum value (degrees) | $|\Delta h_{nSSL2}|$ minimum value (degrees) | $SAT_{ave}$ ($\varphi_{SSL2}(\lambda)$) | $\Delta C_{SSL\text{-}max2}$ | $\Delta C_{SSL\text{-}min2}$ | $|\Delta C_{SSL\text{-}max2} - \Delta C_{SSL\text{-}min2}|$ | Ra | Drawing number |
| Experimental example 205-A | 5.68 | 0.21 | 1.95 | 7.21 | −1.72 | 8.93 | 94.6 | FIG. 2-28 |
| Experimental example 205-B | 4.69 | 0.23 | 1.99 | 5.89 | −0.67 | 6.56 | 95.4 | FIG. 2-29 |
| Experimental example 205-C | 3.45 | 0.35 | 2.09 | 4.42 | 0.24 | 4.18 | 93.6 | FIG. 2-30 |
| Experimental example 205-D | 2.21 | 0.18 | 2.23 | 3.97 | 0.79 | 3.18 | 90.5 | FIG. 2-31 |
| Experimental example 205-E | 3.22 | 0.13 | 2.35 | 4.60 | 0.95 | 3.66 | 88.0 | FIG. 2-32 |

The spectral power distributions in FIG. 2-28 to FIG. 2-32, the CIELAB plots in FIG. 2-28 to FIG. 2-32, the CIE 1976 u'v' chromaticity diagram in FIG. 2-33 and Table 2-20-1 and Table 2-20-2 clarify the following.

At the drive point C, the drive point D, and the drive point E, while $A_{cg}(\varphi_{SSL2}(\lambda))$ is not in an appropriate range according to the second invention of the present invention, at the drive point A and the drive point B, in an interval therebetween, and in a vicinity thereof, conceivably, light source efficiency is improved compared to other drive points due to relatively high luminous efficacy of radiation and, at the same time, a natural, vivid, highly visible and comfortable appearance of colors and appearance of objects as if the objects are seen outdoors can be achieved. For example, between the drive point A and the drive point B, the correlated color temperature as the packaged LED can be variable in a 3168 K to 3365 K, and $D_{uv}(\varphi_{SSL2}(\lambda))$ can also be variable in a −0.0123 to −0.0122 range, while implementing the above mentioned appearance of colors. Further, the average saturation difference of the 15 Munsell renotation color samples can also be variable in a 1.95 to 1.99 range. Accordingly, in an area where both a preferable appearance of colors and high light source efficiency can be achieved, illumination conditions that are conceivably more optimal can be readily selected from a variable range in accordance with the age, the gender or the like of a user of the light-emitting device or in accordance with a space, a purpose, or the like of the illumination. Moreover, at the drive point C, the drive point D, and the drive point E, in an interval therebetween, and in a vicinity thereof, conceivably, while preferable color appearance is realized, relatively high light source efficiency cannot be realized due to relatively low luminous efficacy of radiation.

In this case, the following drive control is also possible.

First, when at least one of the index $A_{cg}(\varphi_{SSL2}(\lambda))$, correlated color temperature $T_{SSL2}$ (K), and distance $D_{uv}$ ($\varphi_{SSL2}(\lambda)$) from the black-body radiation locus, is changed, the luminous flux and/or radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}(\varphi_{SSL2}(\lambda))$ is decreased in an appropriate range, the luminous flux and/or radiant flux of the light-emitting device can be decreased, so as to decrease the luminance of the illumination object.

Third, when $D_{uv}(\varphi_{SSL2}(\lambda))$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Experimental Example 206

A 6 mm×9 mm ceramic package 50, which includes a total of sixteen light-emitting units, as shown in FIG. 2-34, is prepared. Here a blue semiconductor light-emitting element (dominant wavelength: 448 nm), a green phosphor (LSN, peak wavelength: 535 nm, full-width at half-maximum: 107 nm) and a red phosphor (CASN, peak wavelength: 660 nm, full-width at half-maximum: 88 nm) are mounted and encapsulated in a light-emitting area 251 so as to be equivalent light-emitting areas. The semiconductor light-emitting elements in the light-emitting area 251 are connected in series and connected to one independent power supply. On the other hand, a blue semiconductor light-emitting element (dominant wavelength: 447 nm), a green phosphor (CSO, peak wavelength: 520 nm, full-width at half-maximum: 96 nm) and a red phosphor (SCASN, peak wavelength: 625 nm, full-width at half-maximum: 87 nm) are mounted and encapsulated in a light-emitting area 252, so as to be equivalent light-emitting areas. The semiconductor light-emitting elements in the light-emitting area 252 are connected in series and connected to another independent power supply. Current can be injected into the light-emitting area 251 and the light-emitting area 252 independently from each other.

Next, if the current value of current injected into each light-emitting area of the packaged LED having the light-emitting area 251 and the light-emitting are 252 is appropriately adjusted, five types of spectral power distributions shown in FIG. 2-35 to FIG. 2-39 irradiated onto the axis of the packaged LED, for example, are implemented. FIG. 2-35 is a case when current is injected only into the light-emitting area 251, and the radiant flux ratio of the light-emitting area 251 and the light-emitting area 252 is set to 16:0, and FIG. 2-39 is a case when current is injected only into the light-emitting area 252, and the radiant flux ratio of the light-emitting area 251 and the light-emitting area 252 is set to 0:16. FIG. 2-36 is a case when the radiant flux ratio of the light-emitting area 251 and the light-emitting area 252 is set to 4:12, FIG. 2-37 is a case when the radiant flux ratio is set to 3:13, and FIG. 2-38 is a case when the radiant flux is set to 1:15. By changing the current to be injected into each area of the packaged LED 50, the radiant flux irradiated from the packaged LED main body onto the axis can be changed.

The CIELAB plot in each drawing indicates the a* values and the b* values which are plotted respectively: when 15 Munsell renotation color samples #01 to #15 are mathematically assumed as the illumination objects and these illumination objects are illuminated by the packaged LED; and when these illumination objects are illuminated by a reference light derived from the correlated color template of the packaged LED. Here the drive point names A to E are assigned to the radiant flux of the light-emitting device in descending order of contribution of the radiant flux of the light-emitting area 251. FIG. 2-40 shows the chromaticity points at each of the drive points A to E on the CIE 1976 u'v' chromaticity diagram. Table 2-21 shows the photometric characteristics and colormetric characteristics that are expected at each drive point.

TABLE 2-21-1

| | | | | | Light-emitting device | | | | |
|---|---|---|---|---|---|---|---|---|---|
| | (*1) (*2) | $T_{SSL2}$ (K) | $D_{uv}$ ($\varphi_{SSL2}(\lambda)$) | $A_{cg}$ ($\varphi_{SSL2}(\lambda)$) | $\lambda_{SSL2\text{-}BM\text{-}max}$ (nm) | $\varphi_{SSL2\text{-}BG\text{-}min}/\varphi_{SSL2\text{-}BM\text{-}max}$ | $\lambda_{SSL2\text{-}RM\text{-}max}$ (nm) | $\varphi_{SSL2\text{-}BG\text{-}min}/\varphi_{SSL2\text{-}RM\text{-}max}$ | $K_{SSL2}$ (lm/W) |
| Experimental example 206-A | 16:0 | 2576 | −0.0064 | 130.4 | 450 | 0.1257 | 635 | 0.0573 | 254.5 |
| Experimental example 206-B | 4:12 | 3968 | −0.0116 | 100.3 | 450 | 0.2475 | 610 | 0.3209 | 281.3 |
| Experimental example 206-C | 3:13 | 4164 | −0.0112 | 85.8 | 450 | 0.2527 | 605 | 0.3502 | 284.0 |
| Experimental example 206-D | 1:15 | 4611 | −0.0101 | 111.5 | 450 | 0.2619 | 590 | 0.4058 | 289.8 |
| Experimental example 206-E | 0:16 | 4866 | −0.0093 | 123.4 | 450 | 0.2660 | 585 | 0.4324 | 292.9 |

(*1) Light emitting area, radiant flux ratio
(*2) Ratio of radiant flux $\varphi_{SSL2}1$ of light emitting area 1 and radiant flux $\varphi_{SSL2}2$ of light emitting area 2 ($\varphi_{SSL2}1:\varphi_{SSL2}2$)

TABLE 2-21-2

Indexes extracted from calculations on 15 specific Munsell renotation color samples

| | $|\Delta h_{nSSL2}|$ maximum value (degrees) | $|\Delta h_{nSSL2}|$ minimum value (degrees) | $SAT_{ave}$ ($\varphi_{SSL2}(\lambda)$) | $\Delta C_{SSL-max2}$ | $\Delta C_{SSL-min2}$ | $|\Delta C_{SSL-max2} - \Delta C_{SSL-min2}|$ | Ra | Drawing number |
|---|---|---|---|---|---|---|---|---|
| Experimental example 206-A | 11.15 | 0.30 | 2.80 | 11.93 | −4.73 | 16.66 | 90.1 | FIG. 2-35 |
| Experimental example 206-B | 10.47 | 1.03 | 1.11 | 6.18 | −3.56 | 9.74 | 91.2 | FIG. 2-36 |
| Experimental example 206-C | 10.99 | 0.92 | 0.89 | 5.70 | −3.71 | 9.41 | 90.9 | FIG. 2-37 |
| Experimental example 206-D | 12.11 | 0.05 | 0.43 | 5.99 | −4.50 | 10.49 | 89.9 | FIG. 2-38 |
| Experimental example 206-E | 12.70 | 0.50 | 0.17 | 6.22 | −5.01 | 11.23 | 89.3 | FIG. 2-39 |

The spectral power distributions in FIG. 2-35 to FIG. 2-39, the CIELAB plots in FIG. 2-35 to FIG. 2-39, the CIE 1976 u'v' chromaticity diagram in FIG. 2-40 and Table 2-21-1 and Table 2-21-2 clarify the following.

At the drive point A, the drive point D, and the drive point E, while at least any one of $D_{uv}(\varphi_{SSL2}(\lambda))$, $A_{cg}(\varphi_{SSL2}(\lambda))$, $\varphi_{SSL2-BG-min}/\varphi_{SSL2-BM-max}$, and $\lambda_{SSL2-RM-max}$ is not in an appropriate range according to the second invention of the present invention, at the drive point B and the drive point C, in an interval therebetween, and in a vicinity thereof, conceivably, both a natural, vivid, highly visible and comfortable appearance of colors and appearance of objects as if the objects are seen outdoors and high light source efficiency can be achieved. Therefore, for example, in an interval between the drive point B and the drive point C and in a vicinity thereof, a correlated color temperature of the package LED is variable from 3968 K to 4164 K and $D_{uv}(\varphi_{SSL2}(\lambda))$ is also variable from −0.0112 to −0.0116 while realizing preferable appearance of colors. Further, the average saturation difference of the 15 Munsell renotation color samples can also be variable in a 0.89 to 1.11 range. Accordingly, in an area where both a preferable appearance of colors and high light source efficiency can be achieved, illumination conditions that are conceivably more optimal can be readily selected from a variable range in accordance with the age, the gender or the like of a user of the light-emitting device or in accordance with a space, a purpose, or the like of the illumination.

In this case, the following drive control is also possible.

First, when at least one of the index $A_{cg}(\varphi_{SSL2}(\lambda))$, correlated color temperature $T_{SSL2}$ (K), and distance $D_{uv}$ ($\varphi_{SSL2}(\lambda)$) from the black-body radiation locus, is changed, the luminous flux and/or the radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}(\varphi_{SSL2}(\lambda))$ is decreased in an appropriate range, the luminous flux and/or radiant flux of the light-emitting device can be decreased, so as to decrease the luminance of the illumination object.

Third, when $D_{uv}(\varphi_{SSL2}(\lambda))$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Comparative Experimental Example 201

A resin packaged LED similar to Experimental Example 201 is prepared except for the following difference.

In the light-emitting area 211, a blue semiconductor light-emitting element (dominant wavelength: 438 nm), a green phosphor (β-SiAlON, peak wavelength: 545 nm, full-width at half-maximum: 55 nm) and a red phosphor (CASON, peak wavelength: 645 nm, full-width at half-maximum: 99 nm) are mounted and encapsulated.

In the light-emitting area 212, a blue semiconductor light-emitting element (dominant wavelength: 448 nm), a green phosphor (LSN, peak wavelength: 535 nm, full-width at half-maximum: 107 nm) and a red phosphor (CASN, peak wavelength: 660 nm, full-width at half-maximum: 88 nm) are mounted and encapsulated.

Next, if the current value of current injected into each light-emitting area of the packaged LED having the light-emitting area 211 and the light-emitting are 212 is appropriately adjusted, five types of spectral power distributions shown in FIG. 2-41 to FIG. 2-45 irradiated onto the axis of the packaged LED, for example, are implemented. FIG. 2-41 is a case when current is injected only into the light-emitting area 211, and the radiant flux ratio of the light-emitting area 211 and the light-emitting area 212 is set to 3:0, and FIG. 2-45 is a case when current is injected only into the light-emitting area 212, and the radiant flux ratio of the light-emitting area 211 and the light-emitting area 212 is set to 0:3. FIG. 2-42 is a case when the radiant flux ratio of the light-emitting area 211 and the light-emitting area 212 is set to 2:1, FIG. 2-43 is a case when the radiant flux ratio is set to 1.5:1.5, and FIG. 2-44 is a case when the radiant flux is set to 1:2. By changing the current to be injected into each area of the packaged LED, the radiant flux irradiated from the packaged LED main body onto the axis can be changed. The CIELAB plot in each drawing indicates the a* values and the b* values which are plotted respectively: when 15 Munsell renotation color samples #01 to #15 are mathematically assumed as the illumination objects and these illumination objects are illuminated by the packaged LED; and when these illumination objects are illuminated by a reference light derived from the correlated color template of the packaged LED. Here the drive point names A to E are assigned to the radiant flux of the light-emitting device in descending order of contribution of the radiant flux of the light-emitting area 211. FIG. 2-46 shows the chromaticity points at each of the drive points A to E on the CIE 1976 u'v' chromaticity diagram. Table 2-22 shows the photometric characteristics and colormetric characteristics that are expected at each drive point.

TABLE 2-22-1

| | (*1) (*2) | $T_{SSL2}$ (K) | $D_{uv}$ ($\varphi_{SSL2}(\lambda)$) | $A_{cg}$ ($\varphi_{SSL2}(\lambda)$) | $\lambda_{SSL2\text{-}BM\text{-}max}$ (nm) | $\varphi_{SSL2\text{-}BG\text{-}min}/\varphi_{SSL2\text{-}BM\text{-}max}$ | $\lambda_{SSL2\text{-}RM\text{-}max}$ (nm) | $\varphi_{SSL2\text{-}BG\text{-}min}/\varphi_{SSL2\text{-}RM\text{-}max}$ | $K_{SSL2}$ (lm/W) |
|---|---|---|---|---|---|---|---|---|---|
| Comparative experimental example 201-A | 3:0 | 4134 | −0.0097 | 109.7 | 440 | 0.0981 | 630 | 0.1498 | 274.1 |
| Comparative experimental example 201-B | 2:1 | 4429 | −0.0136 | 95.7 | 445 | 0.0985 | 625 | 0.1619 | 270.8 |
| Comparative experimental example 201-C | 1.5:1.5 | 4645 | −0.0159 | 90.2 | 445 | 0.0948 | 620 | 0.1693 | 268.7 |
| Comparative experimental example 201-D | 1:2 | 4939 | −0.0184 | 87.5 | 450 | 0.0888 | 610 | 0.1766 | 266.3 |
| Comparative experimental example 201-E | 0:3 | 6013 | −0.0239 | 10.7 | 450 | 0.0700 | 585 | 0.1865 | 259.9 |

(*1) Light emitting area, radiant flux ratio
(*2) Ratio of radiant flux $\varphi_{SSL2}1$ of light emitting area 1 and radiant flux $\varphi_{SSL2}2$ of light emitting area 2 ($\varphi_{SSL2}1$:$\varphi_{SSL2}2$)

TABLE 2-22-2

| | Indexes extracted from calculations on 15 specific Munsell renotation color samples | | | | | | | |
|---|---|---|---|---|---|---|---|---|
| | $|\Delta h_{nSSL2}|$ maximum value (degrees) | $|\Delta h_{nSSL2}|$ minimum value (degrees) | $SAT_{ave}$ ($\varphi_{SSL2}(\lambda)$) | $\Delta C_{SSL\text{-}max2}$ | $\Delta C_{SSL\text{-}min2}$ | $|\Delta C_{SSL\text{-}max2} - \Delta C_{SSL\text{-}min2}|$ | Ra | Drawing number |
| Comparative experimental example 201-A | 16.69 | 0.36 | 2.12 | 11.20 | −7.73 | 18.94 | 80.8 | FIG. 2-41 |
| Comparative experimental example 201-B | 18.07 | 0.07 | 2.43 | 11.00 | −7.22 | 18.22 | 83.0 | FIG. 2-42 |
| Comparative experimental example 201-C | 18.91 | 0.33 | 2.60 | 10.82 | −6.92 | 17.73 | 84.2 | FIG. 2-43 |
| Comparative experimental example 201-D | 19.92 | 0.64 | 2.78 | 10.57 | −6.58 | 17.15 | 85.6 | FIG. 2-44 |
| Comparative experimental example 201-E | 22.21 | 0.11 | 3.64 | 11.62 | −5.85 | 17.46 | 86.6 | FIG. 2-45 |

The spectral power distributions in FIG. 2-41 to FIG. 2-45, the CIELAB plots in FIG. 2-41 to FIG. 2-45, the CIE 1976 u'v' chromaticity diagram in FIG. 2-46, and Table 2-22-1 and Table 2-22-2 clarify the following.

At all of the drive points from A to E, at least any one of $D_{uv}(\varphi_{SSL2}(\lambda))$, $S_{cg}(\varphi_{SSL2}(\lambda))$, $\varphi_{SSL2\text{-}BG\text{-}min}/\varphi_{SSL2\text{-}BM\text{-}max}$, and $\lambda_{SSL2\text{-}RM\text{-}max}$ is not in an appropriate range according to the second invention of the present invention. Therefore, there is no drive point in the variable range as a packaged LED at which both a natural, vivid, highly visible and comfortable appearance of colors and appearance of objects as if the objects are seen outdoors and high light source efficiency can be achieved.

[Examination]

The following invention issues can be derived from the above experimental examples.

In other words, the effect of the second invention of the present invention can be implemented if the light-emitting area allows $\varphi_{SSL2}(\lambda)$ to satisfy the following conditions by changing the luminous flux amount and/or radiant flux amount emitted from the light-emitting area, where $\varphi_{SSL2}N(\lambda)$ (N is 1 to M) is a spectral power distribution of a light emitted from each light-emitting area in a main radiant direction of the light-emitting device, and $\varphi_{SSL2}(\lambda)$ is a spectral power distribution of all the lights emitted from the light-emitting device in the radiant direction and satisfies $$\phi_{SSL2}(\lambda) = \sum_{N=1}^{M} \phi_{SSL2}N(\lambda). \qquad \text{[Expression 30]}$$

The following conditions can be applied in the same manner to the method for designing the light-emitting device according to the second aspect of the second invention of the present invention, and the method for driving the light-emitting device according to the third aspect of the second invention of the present invention.

Condition 1:

light emitted from the light-emitting device includes, in the main radiant direction thereof, light whose distance $D_{uv}(\varphi_{SSL2}(\lambda))$ from a black-body radiation locus as defined by ANSI C78.377 satisfies $$-0.0220 \leq D_{uv}(\varphi_{SSL2}(\lambda)) \leq -0.0070,$$

Condition 2:

$\varphi_{SSL2}(\lambda)$ denotes a spectral power distribution of light emitted from the light-emitting device in the radiant direction, $\varphi_{ref2}(\lambda)$ denotes a spectral power distribution of reference light which is selected in accordance with a correlated color temperature $T_{SSL2}$ (K) of the light emitted from the light-emitting device in the radiant direction, $(X_{SSL2}, Y_{SSL2}, Z_{SSL2})$ denote tristimulus values of the light emitted from the light-emitting device in the radiant direction, and $(X_{ref2}, Y_{ref2}, Z_{ref2})$ denote tristimulus values of the reference light which is selected in accordance with the correlated color temperature $T_{SSL2}$ (K) of the light emitted from the light-emitting device in the radiant direction, and a normalized spectral power distribution $S_{SSL2}(\lambda)$ of the light emitted from the light-emitting device in the radiant direction, a normalized spectral power distribution $S_{ref2}(\lambda)$ of the reference light which is selected in accordance with the correlated color temperature $T_{SSL2}$ ($\lambda$) of the light emitted from the light-emitting device in the radiant direction, and a difference $\Delta S_{SSL2}(\lambda)$ of between normalized spectral power distributions are respectively defined as $$S_{SSL2}(\lambda) = \varphi_{SSL2}(\lambda)/Y_{SSL2},$$

$$S_{ref2}(\lambda) = \varphi_{ref2}(\lambda)/Y_{ref2} \text{ and}$$

$$\Delta S_{SSL2}(\lambda) = S_{ref2}(\lambda) - S_{SSL2}(\lambda) \text{ and}$$

in a case where $\lambda_{SSL2\text{-}RL\text{-}max}$ (nm) represents a wavelength that provides a longest wavelength local maximum value of $S_{SSL2}(\lambda)$ in a wavelength range of 380 nm or more and 780 nm or less, and when a wavelength $\Lambda 4$ that is represented by $S_{SSL2}(\lambda_{SSL2\text{-}RL\text{-}max})/2$ exists on a longer wavelength-side of $\lambda_{SSL2\text{-}RL\text{-}max}$, an index $A_{cg}(\varphi_{SSL2}(\lambda))$ represented by the following formula (2-1) satisfies $$-10.0 < A_{cg}(\varphi_{SSL2}(\lambda)) \leq 120.0,$$

but in a case where $\lambda_{SSL2\text{-}RL\text{-}max}$ (nm) represents a wavelength that provides the longest wavelength local maximum value of $S_{SSL2}(\lambda)$ in a wavelength range of 380 nm or more and 780 nm or less, and when the wavelength $\Lambda 4$ that is represented by $S_{SSL2}(\lambda_{SSL2\text{-}RL\text{-}max})/2$ does not exist on the longer wavelength-side of $\lambda_{SSL2\text{-}RL\text{-}max}$, an index $A_{cg}(\varphi_{SSL2}(\lambda))$ represented by the following formula (2-2) satisfies $$-10.0 < A_{cg}(\varphi_{SSL2}(\lambda)) \leq 120.0;$$

[Expression 31]

$$A_{cg}(\varphi_{SSL2}(\lambda)) = \int_{380}^{495} \Delta S_{SSL2}(\lambda) d\lambda + \int_{495}^{590} (-\Delta S_{SSL2}(\lambda)) d\lambda + \int_{590}^{\Lambda 4} \Delta S_{SSL2}(\lambda) d\lambda \qquad (2\text{-}1)$$

[Expression 32]

$$A_{cg}(\varphi_{SSL2}(\lambda)) = \int_{380}^{495} \Delta S_{SSL2}(\lambda) d\lambda + \int_{495}^{590} (-\Delta S_{SSL2}(\lambda)) d\lambda + \int_{590}^{780} \Delta S_{SSL2}(\lambda) d\lambda \qquad (2\text{-}2)$$

Condition 3:

when a maximum value of spectral intensity in a range of 430 nm or more and 495 nm or less is defined as $\varphi_{SSL2\text{-}BM\text{-}max}$ and a minimum value of spectral intensity in a range of 465 nm or more and 525 nm or less is defined as $\varphi_{SSL2\text{-}BG\text{-}min}$, the spectral power distribution $\varphi_{SSL2}(\lambda)$ of light satisfies $$0.2250 \leq \varphi_{SSL2\text{-}BG\text{-}min}/\varphi_{SSL2\text{-}BM\text{-}max} \leq 0.7000; \text{ and}$$

Condition 4:

in the spectral power distribution $\varphi_{SSL2}(\lambda)$ of light, when a maximum value of spectral intensity in a range of 590 nm or more and 780 nm or less is defined as $\varphi_{SSL2\text{-}RM\text{-}max}$, a wavelength $\lambda_{SSL2\text{-}RM\text{-}max}$ that provides $\varphi_{SSL2\text{-}RM\text{-}max}$ satisfies $$605 \text{ (nm)} \leq \lambda_{SSL2\text{-}RN\text{-}max} \leq 653 \text{ (nm)}.$$

In the experimental examples, the light-emitting device includes two types or three types of light-emitting areas, but a number of types of the light-emitting area is not limited to two or three.

If there are two types of light-emitting areas, control of the light-emitting device is easy, which is preferable.

If there are three types of light-emitting areas, the control area becomes not a line but a plane on the chromaticity coordinates, and the appearance of colors can be adjusted in a wide range, which is preferable.

If there are four types or more of light-emitting areas, not only does the control area become a plane on the chromaticity coordinates, as mentioned above, but also the correlated color temperature, $D_{uv}(\varphi_{SSL2}(\lambda))$ and the appearance of colors can be independently controlled, which is preferable.

Furthermore, the appearance of colors can be adjusted without changing chromaticity, which is preferable.

If there are too many light-emitting areas, on the other hand, control in the actual light-emitting device becomes complicated, therefore a number of light-emitting areas is preferably ten or less, and even more preferable is eight or less.

In the light-emitting device which includes a plurality of types of light-emitting areas according to the second invention of the present invention, a following method can be used to change the luminous flux amount or radiant flux amount of each type of the light-emitting areas. One method is changing the power to supply each light-emitting area. For this, a method of changing current is preferable because it is easy to do. Another method is changing the luminous flux amount and/or radiant flux amount emitted from the light-emitting areas by allowing an optical ND filter to be disposed in each light-emitting area and exchanging the filter physically, or by electrically changing the transmittance of the polarizing filter or the like.

It is preferable to satisfy the following Condition 5 and/or Condition 6.

Condition 5:

In the spectral power distribution $\varphi_{SSL2}(\lambda)$ of light described above, a wavelength $\lambda_{SSL2-BM-max}$ that provides $\varphi_{SSL2-BM-max}$ satisfies 430 (nm)≤$\lambda_{SSL2-BM-max}$≤480 (nm).

Condition 6:

0.1800≤$\varphi_{SSL2-BG-min}/\varphi_{SSL2-RM-max}$≤0.8500.

To improve the appearance of colors, it is preferable to satisfy the following Conditions I to IV.

Condition I:

when $a^*_{nSSL2}$ and $b^*_{nSSL2}$ (where n is a natural number from 1 to 15) respectively denote the $a^*$ value and $b^*$ value in the CIE 1976 L*a*b* color space of the following 15 Munsell renotation color samples of #01 to #15 based on a mathematical assumption that illumination is performed by the light emitted in the radiant direction, and when $a^*_{nref2}$ and $b^*_{nref2}$ (where n is a natural number from 1 to 15) respectively denote the $a^*$ value and $b^*$ value in the CIE 1976 L*a*b* color space of the 15 Munsell renotation color samples based on a mathematical assumption that illumination is performed by reference light which is selected in accordance with the correlated color temperature $T_{SSL2}$ (K) of the light emitted in the radiant direction, each saturation difference $\Delta C_{nSSL2}$ satisfies −4.00≤$\Delta C_{nSSL2}$≤8.00 (where n is a natural number from 1 to 15), Condition II:

an average saturation difference $SAT_{ave}(\varphi_{SSL2}(\lambda))$ represented by the formula (2-3) satisfies 0.50≤$SAT_{ave}(\varphi_{SSL2}(\lambda))$ ≤4.00 and $$SAT_{ave}(\phi_{SSL2}(\lambda)) = \frac{\sum_{n=1}^{15} \Delta C_{nSSL2}}{15}, \quad \text{[Expression 33]}$$

(2-3)

Condition III:

when a maximum saturation difference value is denoted by $\Delta C_{SSL-max2}$ and a minimum saturation difference value is denoted by $\Delta C_{SSL-min2}$, a difference $|\Delta C_{SSL-max2} - \Delta C_{SSL-min2}|$ between the maximum saturation difference value and the minimum saturation difference value satisfies 2.00≤$|\Delta C_{SSL-max2} - \Delta C_{SSL-min2}|$≤10.00, where $\Delta C_{nSSL2} = \sqrt{\{(a^*_{nSSL2})^2+(b^*_{nSSL2})^2\}} - \sqrt{\{(a^*_{nref2})_2+(b^*_{nref2})^2\}^2})$

| | | |
|---|---|---|
| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12 |

Condition IV:

when $\theta_{nSSL2}$ (degrees) (where n is a natural number from 1 to 15) denotes a hue angle in the CIE 1976 L*a*b* color space of the 15 Munsell renotation color samples based on a mathematical assumption that illumination is performed by the light emitted in the radiant direction, and when $\theta_{nref2}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature $T_{SSL2}$ (K) of the light emitted in the radiant direction, an absolute value of each difference in hue angles $|\Delta h_{nSSL2}|$ satisfies 0.00 degrees≤$|\Delta h_{nSSL2}|$≤12.50 degrees (where n is a natural number from 1 to 15), where $\Delta h_{nSSL2} = \theta_{nSSL2} - \theta_{nref2}$.

It is also preferable that all the $\varphi_{SSL2}N(\lambda)$ (N is 1 to M) of the light-emitting device satisfies Conditions 1 to 4 as shown in the Experimental Example 201 and the Experimental Example 202. In the case of this mode, both a natural, vivid, highly visible and comfortable appearance of colors and appearance of objects as if the objects are seen outdoors and high light source efficiency can be realized regardless of a ratio at which light emitted from the light-emitting areas are supplied. To determine whether $\varphi_{SSL2}N(\lambda)$ (N is 1 to M) satisfies Conditions 1 to 4, it is assumed that only this $\varphi_{SSL2}N(\lambda)$ is emitted from the light-emitting device.

On the other hand, as demonstrated by Experimental example 204 and Experimental example 206, with only light emitted from a single light-emitting area, there may be cases where both a natural, vivid, highly visible and comfortable appearance of colors and appearance of objects as if the objects are seen outdoors and high light source efficiency cannot be realized. Even in such cases, both preferable color appearance and high light source efficiency may be realized by appropriately adjusting a ratio of light emitted from each light-emitting area. Needless to say, this type of light-emitting device still is within the scope of the second invention of the present invention.

One of the features of the second invention of the present invention is that, for example, as demonstrated by Experimental Example 204 and Experimental Example 206, "both preferable color appearance and high light source efficiency can be realized" even when combining "light sources incapable of achieving both preferable color appearance and high light source efficiency". Another feature is that, as demonstrated by Experimental Example 203 and Experimental Example 205, "both preferable color appearance and high light source efficiency can be realized" even if combining "a light-emitting area incapable of achieving both preferable color appearance and high light source efficiency" and "a light-emitting area capable of achieving both preferable color appearance and high light source efficiency".

Presented below are guidelines for implementing a light-emitting device according to the second invention of the present invention so as to realize a light-emitting device "capable of achieving both a natural, vivid, highly visible and comfortable appearance of colors and appearance of objects as if the objects are seen outdoors and high light source efficiency" in "cases of combinations including light-emitting areas incapable of achieving both preferable color appearance and high light source efficiency" and, in particular, a case of a combination that is "solely constituted by light-emitting areas incapable of achieving both preferable color appearance and high light source efficiency".

In order to realize "a light-emitting device achieving both preferable color appearance and high light source efficiency" with "a combination solely constituted by light-emitting areas incapable of achieving both preferable color appearance and high light source efficiency", all of $D_{uv}(\varphi_{SSL2}(\lambda))$ represented in Condition 1, $A_{cg}(\varphi_{SSL2}(\lambda))$ represented in Condition 2, $\varphi_{SSL2\text{-}BG\text{-}min}/\varphi_{SSL2\text{-}BM\text{-}max}$ represented in Condition 3, and $\lambda_{SSL2\text{-}RM\text{-}max}$ represented in Condition 4 must be set within appropriate numerical value ranges as a result of the combination. In addition, favorably, $\lambda_{SSL2\text{-}BM\text{-}max}$ represented in Condition 5 and $\varphi_{SSL2\text{-}BG\text{-}min}/\varphi_{SSL2\text{-}RM\text{-}max}$ represented in Condition 6 are also set within appropriate numerical value ranges as a result of the combination. This is conceivably accomplished using methods such as those described below.

First, $D_{uv}(\varphi_{SSL2}(\lambda))$ may be adjusted as follows.

When distances $D_{uv}(\varphi_{SSL2}(\lambda))$ from a black-body radiation locus of light emitted from the respective light-emitting areas are all outside of proper ranges, for example, (a), (b), and (c) below are effective.
(a) Create the light-emitting device by combining light-emitting areas of which chromaticity coordinates on various chromaticity diagrams are completely different from each other.
(b) Create the light-emitting device by combining a plurality of light-emitting areas of which correlated color temperatures are completely different if the color temperatures can be defined.
(c) Create the light-emitting device by combining a plurality of light-emitting areas of which distance $D_{uv}(\varphi_{SSL2}(\lambda))$ from the black-body radiation locus are completely different if this distance can be defined.

The reason for this follows.

For example, in a case where there are two light-emitting areas, $D_{uv}(\varphi_{SSL2}(\lambda))$ of light emitted from one of the light-emitting areas is larger than a proper range (−0.0220 or more and −0.0070 or less), and $D_{uv}(T_{SSL2}(\lambda))$ of light emitted from the other light-emitting area has a value that is smaller than the proper range (−0.0220 or more and −0.0070 or less), it is readily understood that a drive point combining light from both light sources at a specific ratio may assume a numerical value that achieves both preferable color appearance and high light source efficiency.

However, even in a case where there are two light-emitting areas and values of $D_{uv}(\varphi_{SSL2}(\lambda))$ of light emitted from the light-emitting areas are both larger than the proper range (−0.0220 or more and −0.0070 or less), since a black-body radiation locus is curved on a CIE 1976 u'v' chromaticity diagram, a drive point combining light from both light sources at a specific ratio may assume a numerical value that achieves both preferable color appearance and high light source efficiency. This is also why, for example, in FIG. 2-40 and Table 2-21 which illustrate Experimental Example 206, even though $D_{uv}(\varphi_{SSL2}(\lambda))$ of the light-emitting area 251 (in other words, $D_{uv}(\varphi_{SSL2}(\lambda))$ at the drive point A) is −0.0064 and $D_{uv}(\varphi_{SSL2}(\lambda))$ of the light-emitting area 252 (in other words, $D_{uv}(\varphi_{SSL2}(\lambda))$ at the drive point E) is −0.0093, $D_{uv}(\varphi_{SSL2}(\lambda))$ at the drive point C, which is a combination thereof, is −0.0112 that is smaller than either of the numerical values. The requirements of (a), (b), and (c) described above are favorably satisfied in order to utilize such tendencies.

Second, $A_{cg}(\varphi_{SSL2}(\lambda))$ may be adjusted as follows.

When $A_{cg}(\varphi_{SSL2}(\lambda))$ of light emitted from the respective light-emitting areas are all outside of proper ranges, (a), (b), and (c) below are effective in a similar manner to $D_{uv}(\varphi_{SSL2}(\lambda))$.
(a) Create the light-emitting device by combining light-emitting areas of which chromaticity coordinates on various chromaticity diagrams are completely different from each other.
(b) Create the light-emitting device by combining a plurality of light-emitting areas of which correlated color temperatures are completely different if the color temperatures can be defined.
(c) Create the light-emitting device by combining a plurality of light-emitting areas of which distance $D_v(\varphi_{SSL2}(\lambda))$ from the black-body radiation locus are completely different if this distance can be defined.

The reason for this follows.

For example, in a case where there are two light-emitting areas, $A_{cg}(\varphi_{SSL2}(\lambda))$ of light emitted from one of the light-emitting areas is larger than a proper range (more than −10 and 120 or less), and $A_{cg}(\varphi_{SSL2}(\lambda))$ of light emitted from the other light-emitting area has a value that is smaller than the proper range (more than −10 and 120 or less), it is readily understood that a drive point combining light from both light sources at a specific ratio may assume a numerical value that achieves both preferable color appearance and high light source efficiency.

However, even in a case where there are two light-emitting areas and values of $A_{cg}(\varphi_{SSL2}(\lambda))$ of light emitted from the light-emitting areas are both larger than the proper range (more than −10 and 120 or less), since a change with respect to color temperature of a spectral power distribution of reference light is nonlinear, a drive point combining light from both light sources at a specific ratio may assume a numerical value that achieves both preferable color appearance and high light source efficiency. This is also why, for example, in FIG. 2-35 to FIG. 2-39 and Table 2-21 which illustrate Experimental Example 206, even though $A_{cg}(\varphi_{SSL2}(\lambda))$ of the light-emitting area 251 (in other words, $A_{cg}(\varphi_{SSL2}(\lambda))$ at the drive point A) is 130.4 and $A_{cg}(\varphi_{SSL2}(\lambda))$ of the light-emitting area 252 (in other words, $A_{cg}(\varphi_{SSL2}(\lambda))$ at the drive point E) is 123.4, $A_{cg}(\varphi_{SSL2}(\lambda))$ at the drive point C, which is a combination thereof, is 85.8 that is smaller than either of the numerical values. The requirements of (a), (b), and (c) described above are favorably satisfied in order to utilize such tendencies.

Third, $\varphi_{SSL2\text{-}BG\text{-}min}/\varphi_{SSL2\text{-}BM\text{-}max}$ and $\varphi_{SSL2\text{-}BG\text{-}min}/\varphi_{SSL2\text{-}RM\text{-}max}$ may be adjusted as follows.

Since these parameters assume values obtained by weighting a characteristic of light emitted from a light-emitting area constituting a light-emitting device by a radiant flux proportion thereof and averaging the weighted values, for example, in a case where there are two light-emitting areas and the parameters of light emitted from one of the light-emitting areas are larger than proper ranges, a drive point combining light from both light sources at a specific ratio may assume a numerical value that achieves both preferable color appearance and high light source efficiency when parameters of light emitted from the other light-emitting area have values that are smaller than the proper ranges. For this reason, a combination of light sources such as that described below is effective.

(a'): a light-emitting device combining light-emitting areas which emit light with different irregularity positions in a spectral power distribution For example, FIGS. 2-21 to 2-25 and Table 2-19 which illustrate Experimental Example 204 correspond to this case.

Fourth, $\lambda_{SSL2\text{-}RM\text{-}max}$ and $\lambda_{SSL2\text{-}BM\text{-}max}$ may be adjusted as follows. While these indexes are provided by a shape of a spectral radiant flux distribution obtained by weighting characteristics of light emitted from light-emitting areas constituting a light-emitting device by a radiant flux proportion thereof and averaging the weighted characteristics, values of the indexes may change continuously or, depending on the shape of the spectral radiant flux distribution, the values may change discontinuously. The former corresponds to cases where distributions of spectral radiant flux emitted from all light-emitting areas are relatively gradual and the latter corresponds to cases where at least one spectral radiant flux distribution has a steep peak. Therefore, favorably, a combination of light-emitting areas is appropriately selected and the respective indexes are set in proper ranges in accordance with a distribution of spectral radiant flux emitted by each light-emitting area constituting the light-emitting device.

Concerning Condition (b), the correlated color temperature difference between two light-emitting areas, of which correlated color temperatures are most different among the plurality of light-emitting areas constituting the light-emitting device, is favorably 2000 K or more, more favorably 2500 K or more, extremely favorably 3000 K or more, dramatically favorably 3500 K or more, and most favorably 4000 K or more. Concerning Condition (c), the absolute value of the $D_{uv}$ difference between two light-emitting areas, of which correlated color temperatures are most different among the plurality of light-emitting areas constituting the light-emitting device, is favorably 0.005 or more, more favorably 0.010 or more, extremely favorably 0.015 or more, and dramatically favorably 0.020 or more.

Presented below are additional guidelines for implementing a light-emitting device according to the second invention of the present invention so as to realize a light-emitting device "capable of achieving both a natural, vivid, highly visible and comfortable appearance of colors and appearance of objects as if the objects are seen outdoors and high light source efficiency" in "cases of combinations including light-emitting areas incapable of achieving both a natural, vivid, highly visible and comfortable appearance of colors and appearance of objects as if the objects are seen outdoors and high light source efficiency" and, in particular, a case of a combination that is "solely constituted by light-emitting areas incapable of achieving both a natural, vivid, highly visible and comfortable appearance of colors and appearance of objects as if the objects are seen outdoors and high light source efficiency".

(d) Create the light-emitting device by combining a plurality of light-emitting areas of which respective $A_{cg}$ is completely different from each other in the appearance of colors.

(e) Create the light-emitting device by combining a plurality of light-emitting areas of which each saturation difference $\Delta C_n$ is completely different from each other in the appearance of colors.

(f) Create the light-emitting device by combining a plurality of light-emitting areas of which an average saturation difference $SAT_{ave}$ is completely different from each other in the appearance of colors.

In (d), (e) and (f) as well, it is preferable that the respective range disclosed in the second invention of the present invention and the range of each parameter that can be implemented by the combination of the light-emitting area overlap at least partially, and it is more preferable that these ranges overlap on a plane of the chromaticity diagram by using three or more light-emitting areas.

Furthermore, using four or more light-emitting areas enables all of the items (a) (or (a')) to (f) to be adjusted to ranges disclosed in the second invention of the present invention relatively easily even when the light-emitting areas are "all light-emitting areas incapable of achieving both a natural, vivid, highly visible and comfortable appearance of colors and appearance of objects as if the objects are seen outdoors and high light source efficiency" and is therefore preferable.

In the second invention of the present invention, it is preferable that at least one of the light-emitting areas is a light-emitting area having wiring that can be electrically driven independently from the other light-emitting areas, and it is more preferable that all the light-emitting areas have wiring that can be electrically driven independently from the other light-emitting areas. It is also preferable to drive the light-emitting device in this way. In this mode, power to be supplied to each light-emitting area can be easily controlled, and the appearance of colors suitable to the taste of the user can be implemented.

In the second invention of the present invention, one light-emitting area may be driven so as to be electrically subordinate to another light-emitting area. For example, when current is injected into two light-emitting areas, one light-emitting area may be electrically subordinate to the other, such that when current to be injected into one light-emitting area is increased, current to be injected into the other light-emitting area is decreased. This circuit is easily implemented by a configuration using a variable resistor or the like, for example, and does not require a plurality of power supplies, which is preferable.

In the light-emitting device, it is preferable that at least one selected from the group consisting of: the index $A_{cg}(\varphi_{SSL2}(\lambda))$, the correlated color temperature $T_{SSL2}$ (K), and the distance $D_{uv}(\varphi_{SSL2}(\lambda))$ from the black-body radiation locus, can be changed, and it is also preferable that the luminous flux and/or radiant flux emitted from the light-emitting device in the main radiant direction can be independently controlled when at least one selected from the group consisting of: the index $A_{cg}(\varphi_{SSL2}(\lambda))$, the correlated color temperature $T_{SSL2}$ (K) and the distance $D_{uv}(\varphi_{SSL2}(\lambda))$ from the black-body radiation locus is changed. It is preferable to drive the light-emitting device in this way. In this mode, parameters to implement appearance of colors are variable, and an appearance of colors suitable to the taste of the user can be easily implemented.

It is preferable that the maximum distance L between two arbitrary points on a virtual outer periphery enveloping the entire light-emitting areas closest to each other is 0.4 mm or more and 200 mm or less. In this mode, the color separation of the lights emitted from a plurality of light-emitting areas is not visually recognized clearly, and the strange feeling of seeing an image generated by the light-emitting device can be reduced. Further, the spatial additive color mixing in the illumination light functions sufficiently, and when this light is irradiated onto the illumination object, color unevenness in the illuminated area can be reduced, which is preferable.

The maximum distance L between two arbitrary points on a virtual outer periphery enveloping the entire light-emitting areas will be described with reference to drawings.

FIG. 2-34 shows the packaged LED 50 used for Experimental Example 206, where the light-emitting areas closest to the light-emitting area 251 is the light-emitting area 252. Out of these light-emitting areas, the virtual outer periphery 253 enveloping the both light-emitting areas 251 and 252 is the largest virtual outer periphery, and the arbitrary two points 254 on this outer periphery is the maximum distance L. In other words, the maximum distance L is the distance 255 between these two points, which is preferably 0.4 mm or more and 200 mm or less.

This is the same for the illumination system 230 (details not shown) used for Experimental Example 202 and Experimental Example 203 in FIG. 2-14 and the pair of packaged LEDs 240 used for Experimental Example 205 in FIG. 2-27.

The maximum distance L between two arbitrary points on a virtual outer periphery enveloping the entire light-emitting areas closest to each other is favorably 0.4 mm or more, more favorably 2 mm or more, extremely favorably 5 mm or more, and dramatically favorably 10 mm or more. This is because the higher radiant flux (and/or higher luminous flux) can be emitted as the virtual outer periphery enveloping one light-emitting area is larger. The maximum distance L between two arbitrary points on the virtual outer periphery enveloping the entire light-emitting areas closest to each other is favorably 200 mm or less, more favorably 150 mm or less, extremely favorably 100 mm or less, and dramatically favorably 50 mm or less. This is critical in terms of suppressing the generation of spatial color unevenness in the illuminated area.

On the other hand, in the driving method according to the second invention of the present invention, when $\varphi_{SSL2\text{-}BG\text{-}min}/\varphi_{SSL2\text{-}BM\text{-}max}$ of Condition 3 and $\lambda_{SSL2\text{-}RM\text{-}max}$ of Condition 4 are within proper ranges, a luminous flux and/or a radiant flux emitted from the light-emitting device in a main radiant direction can be made invariable when changing at least one of $A_{cg}(\varphi_{SSL2}(\lambda))$ of Condition 2 in a proper range, a correlated color temperature $T_{SSL2}$ (K), and a distance $D_{uv}(\varphi_{SSL2}(\lambda))$ from a black-body radiation locus of Condition 1 in a proper range. If this control is performed, the difference of appearance of colors caused by the change of the shape of the spectral power distribution can be easily checked without depending on the luminance of the illumination object, which is preferable.

In addition, as the method for driving the light-emitting device, when $\varphi_{SSL2\text{-}BG\text{-}min}/\varphi_{SSL2\text{-}BM\text{-}max}$ of Condition 3 and $\lambda_{SSL2\text{-}RM\text{-}max}$ of Condition 4 are within proper ranges, favorable driving methods include a driving method of reducing a luminous flux and/or a radiant flux emitted from the light-emitting device in a main radiant direction when reducing the index $A_{cg}(\varphi_{SSL2}(\lambda))$ of Condition 2 in a proper range by an appropriate range, a driving method of increasing a luminous flux and/or a radiant flux emitted from the light-emitting device in a main radiant direction when increasing the correlated color temperature $T_{SSL2}$ (K), and a driving method of reducing a luminous flux and/or a radiant flux emitted from the light-emitting device in a main radiant direction when reducing $D_{uv}(\varphi_{SSL2}(\lambda))$ of Condition 1 in a proper range by an appropriate range. This also means that favorable driving methods include a driving method of increasing a luminous flux and/or a radiant flux emitted from the light-emitting device in a main radiant direction when increasing the index $A_{cg}(\varphi_{SSL2}(\lambda))$ of Condition 2 in a proper range, a driving method of reducing a luminous flux and/or a radiant flux emitted from the light-emitting device in a main radiant direction when reducing the correlated color temperature $T_{SSL2}$ (K), and a driving method of increasing a luminous flux and/or a radiant flux emitted from the light-emitting device in a main radiant direction when increasing $D_{uv}(\varphi_{SSL2}(\lambda))$ of Condition 1 in a proper range by an appropriate range.

Reducing the index $A_{cg}(\varphi_{SSL2}(\lambda))$ of Condition 2 in a proper range by an appropriate range when $D_{uv}(\varphi_{SSL2}(\lambda))$ of Condition 1, $\varphi_{SSL2\text{-}BG\text{-}min}/\varphi_{SSL2\text{-}BM\text{-}max}$ of Condition 3, and $\lambda_{SSL2\text{-}RM\text{-}max}$ of Condition 4 are in proper ranges enables a light-emitting device which achieves both a natural, vivid, highly visible and comfortable appearance of colors and appearance of objects as if the objects are seen outdoors and high light source efficiency and which further emphasizes color appearance to be realized. Various visual experiments show that, since a sense of brightness is improved when reducing the index $A_{cg}(\varphi_{SSL2}(\lambda))$ in this manner, an illuminated object can maintain a preferable color appearance even when reducing a luminous flux and/or a radiant flux or luminance to be measured, and reducing the index $A_{cg}(\varphi_{SSL2}(\lambda))$ in this manner favorably enables energy consumption of the light-emitting device to be further suppressed. In a similar manner, since a light-emitting device which further emphasizes efficiency is realized when the index $A_{cg}(\varphi_{SSL2}(\lambda))$ is increased by an appropriate range, an increase in a luminous flux and/or a radiant flux or luminance to be measured can be readily realized.

In addition, in a case of increasing the correlated color temperature $T_{SSL2}$ (K) when $D_{uv}(\varphi_{SSL2}(\lambda))$ of Condition 1, $A_{cg}(\varphi_{SSL2}(\lambda))$ of Condition 2, $\varphi_{SSL2\text{-}BG\text{-}min}/\varphi_{SSL2\text{-}BM\text{-}max}$ of Condition 3, and $\lambda_{SSL2\text{-}RM\text{-}max}$ of Condition 4 are in proper ranges, comfortable illumination can be realized due to the Kruithof Effect by performing driving so as to increase a luminous flux and/or a radiant flux. Furthermore, conversely, when lowering the color temperature, control can be performed to reduce luminance of an illuminated object by reducing a luminous flux and/or a radiant flux of the light-emitting device. These controls incorporate the Kruithof Effect and are therefore favorable.

Reducing $D_{uv}(\varphi_{SSL2}(\lambda))$ of Condition 1 in a proper range by an appropriate range when the index $A_{cg}(\varphi_{SSL2}(\lambda))$ of Condition 2, $\varphi_{SSL2\text{-}BG\text{-}min}/\varphi_{SSL2\text{-}BM\text{-}max}$ of Condition 3, and $\lambda_{SSL2\text{-}RM\text{-}max}$ of Condition 4 are in proper ranges enables a light-emitting device which achieves both a natural, vivid, highly visible and comfortable appearance of colors and appearance of objects as if the objects are seen outdoors and high light source efficiency and which further emphasizes color appearance to be realized. Various visual experiments show that, since a sense of brightness is improved when reducing the distance $D_{uv}(\varphi_{SSL2}(\lambda))$ from a black-body radiation locus by an appropriate range, an illuminated object can maintain a preferable color appearance even when reducing a luminous flux and/or a radiant flux or luminance to be measured, and reducing the distance $D_{uv}(\varphi_{SSL2}(\lambda))$ in this manner favorably enables energy consumption of the light-emitting device to be suppressed. In a similar manner, since a light-emitting device which further emphasizes efficiency is realized when the index $D_{uv}(\varphi_{SSL2}(\lambda))$ is increased by an appropriate range, an increase in a luminous flux and/or a radiant flux or luminance to be measured can be readily realized.

In the second invention of the present invention, it is also possible to perform the opposite of the above mentioned control, and needless to say, that the control method can be appropriately selected depending on the illumination object, the illumination environment, the purpose or the like.

On the other hand, the following invention issues can be derived from the experiment results.

In other words, the effect of the second invention of the present invention can be implemented by using an illumination method comprising:

illuminated objects preparation step of preparing illuminated objects; and an illumination step of illuminating the objects by light emitted from a light-emitting devices which includes M number of light-emitting areas (M is 2 or greater natural number), and has a blue semiconductor light-emitting element, a green phosphor, and a red phosphor as light-emitting elements in at least one of the light-emitting areas, in the illumination step, when light emitted from the light-emitting devices illuminate the objects, the objects are illuminated so that the light measured at a position of the objects satisfies Condition 1 and Conditions I to IV below:

Condition 1:

a distance $D_{uv}(\varphi_{SSL2}(\lambda))$ from a black-body radiation locus as defined by ANSI C78.377 of the light measured at the position of the objects satisfies $-0.0220 \leq D_{uv}(\varphi_{SSL2}(\lambda)) \leq -0.0070$;

Condition I:

if an a* value and a b* value in CIE 1976 L*a*b* color space of 15 Munsell renotation color samples from #01 to #15 listed below when mathematically assuming illumination by the light measured at the position of the objects are respectively denoted by $a^*_{nSSL2}$ and $b^*_{nSSL2}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL2}$ (K) of the light measured at the position of the objects are respectively denoted by $a^*_{nref2}$ and $b^*_{nref2}$ (where n is a natural number from 1 to 15), then each saturation difference $\Delta C_{nSSL2}$ satisfies $-4.00 \leq \Delta C_{nSSL2} \leq 8.00$ (where n is a natural number from 1 to 15);

Condition II:

an average saturation difference $SAT_{ave}(\varphi_{SSL2})$ represented by formula (2-3) above satisfies $0.50 \leq SAT_{ave}(\varphi_{SSL2}(\lambda)) \leq 4.00$, Condition III:

when a maximum saturation difference value is denoted by $\Delta C_{SSL-max2}$ and a minimum saturation difference value is denoted by $\Delta C_{SSL-min2}$, a difference $|\Delta C_{SSL-max2} - \Delta C_{SSL-min2}|$ between the maximum saturation difference value and the minimum saturation difference value satisfies $2.00 \leq |\Delta C_{SSL-max2} - \Delta C_{SSL-min2}| \leq 10.00$, where $\Delta C_{nSSL2} = \sqrt{\{(a^*_{nSSL2})^2 + (b^*_{nSSL2})^2\}} - \sqrt{\{(a^*_{nref2})^2 + (b^*_{nref2})^2\}}$ with the 15 Munsell renotation color samples being:

| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12 |

Condition IV:

if hue angles in CIE 1976 L*a*b* color space of the 15 Munsell renotation color samples when mathematically assuming illumination by the light measured at the position of the objects are denoted by $\theta_{nSSL2}$ (degrees) (where n is a natural number from 1 to 15), and if hue angles in CIE 1976 L*a*b* color space of the 15 Munsell renotation color samples when mathematically assuming illumination by a reference light that is selected according to the correlated color temperature $T_{SSL2}$ (K) of the light measured at the position of the objects are denoted by $\theta_{nref2}$ (degrees) (where n is a natural number from 1 to 15), then an absolute value of each difference in hue angles $|\Delta h_{nSSL2}|$ satisfies 0.00 degrees $\leq |\Delta h_{nSSL2}| \leq 12.50$ degrees (where n is a natural number from 1 to 15), here $\Delta h_{nSSL2} = \theta_{nSSL2} - \theta_{nref2}$.

It is preferable that when $\varphi_{SSL2}N(\lambda)$ (N is 1 to M) is a spectral power distribution of a light which was emitted from each light-emitting element and reached the position of the object, and $\varphi_{SSL2}(\lambda)$ is a spectral power distribution of the light measured at the position of the object is represented by $$\phi_{SSL2}(\lambda) = \sum_{N=1}^{M} \phi_{SSL2}N(\lambda), \qquad \text{[Expression 34]}$$

all of $\varphi_{SSL2}N(\lambda)$ can satisfy the above mentioned Condition 1 and Conditions I to IV.

In the illumination method, it is preferable that at least one light-emitting area of the M number of light-emitting areas is electrically driven independently from the other light-emitting areas for performing the illumination, and it is more preferable that all of the light-emitting areas of the M number of light-emitting areas are electrically driven independently from the other light-emitting areas.

In the illumination method, it is preferable that at least one of: the index $SAT_{ave}(\varphi_{SSL2}(\lambda))$, the correlated color temperature $T_{SSL2}$ (K), and the distance $D_{uv}(\varphi_{SSL2}(\lambda))$ from the black-body radiation locus is changed, or it is preferable that when at least one of the indexes is changed, the luminance in the object is independently controlled, or it is preferable that when at least one of the indexes is changed, the luminance in the object is made to be unchangeable.

Making the luminance unchangeable means that the luminance is not substantially changed, and the change of the luminance is favorably ±20% or less, more favorably ±15% or less, further favorably ±10% or less, particularly favorably ±5% or less, and most favorably ±3% or less. If this method is used, the difference of appearance of colors caused by the change of the shape of the spectral power distribution can be easily checked without depending on the luminance of the illumination object, and optimum spectral power distribution depending on the illumination environment, the object, the purpose or the like can be easily detected, which is preferable.

In the illumination method, it is preferable that when the index $SAT_{ave}(\varphi_{SSL2}(\lambda))$ is increased, the luminance in the object is decreased. If the index is increased, a more vivid appearance can be implemented, and a sense of brightness normally increased in this situation, hence the luminance can be decreased, whereby energy consumption can be conserved. This also means that it is preferable that when the index $SAT_{ave}(\varphi_{SSL2}(\lambda))$ is decreased, the luminance in the object is increased.

In the illumination method, it is preferable that when the correlated color temperature $T_{SSL2}$ (K) is increased, the luminance in the object is increased. If it is driven such that the luminance is increased when the correlated color temperature $T_{SSL2}$ (K) is increased, a comfortable illumination can be implemented by the Kruithof Effect. When the color temperature is decreased, on the other hand, it may be controlled to decrease the luminance of the illumination object. These are control techniques applying the Kruithof effect, and are preferable.

In the illumination method, it is preferable that when the distance $D_{uv}(\varphi_{SSL2}(\lambda))$ from the black-body radiation locus is decreased, the luminance in the object is decreased. According to various visual experiments, if the distance $D_{uv}(\varphi_{SSL2}(\lambda))$ from the black-body radiation locus is decreased, a sense of brightness improves, hence even if the luminance is decreased, a good appearance of colors can still be maintained in the illumination object, and therefore energy consumption of the light-emitting device can be conserved, which is preferable. In the same manner, when the distance $D_{uv}(\varphi_{SSL2}(\lambda))$ from the black-body radiation locus is increased, it is preferable to maintain a good appearance of colors in the illumination object by increasing the luminance.

In the illumination method, it is preferable that when L is a maximum distance between two arbitrary points on a virtual outer periphery enveloping the entire light-emitting areas closest to each other, and H is a distance between the light-emitting device and the illumination object, the distance H is set so as to satisfy $5 \times L \leq H \leq 500 \times L$.

In this case, the base point of the light-emitting device to measure the distance is the irradiation port.

If this illumination method is used, color separation of lights from the light sources is not visually recognized clearly when the light-emitting device is observed from the position of the illumination object, and spatial color unevenness is hardly generated in the illumination object, which is preferable.

In the maximum distance L between two arbitrary points on a virtual outer periphery enveloping the entire light-emitting areas closest to each other, and the distance H between the light-emitting device and the illumination object, H is favorably 5×L or more, more favorably 10×L or more, extremely favorably 15×L or more, and dramatically favorably 20×L or more. Because as H is greater within an appropriate range, that is, as H is more distant from the maximum distance L between two arbitrary points on a virtual outer periphery enveloping different light-emitting areas, the colors of the lights emitted from different light-emitting areas are more thoroughly mixed spatially, which is preferable. On the other hand, H is favorably 500×L or less, more favorably 250×L or less, extremely favorably 100×L or less, and dramatically favorably 50×L or less. Because if H is more distant than necessary, sufficient luminance cannot be assured for the illumination object, and maintaining the distance of H and L within this range is important to implement a good luminance environment with driving power in an appropriate range.

The description of a light-emitting device according to the first aspect of the first invention of the present invention applies to favorable embodiments for implementing a light-emitting device according to the first aspect of the second invention of the present invention. In addition, modes for implementing a light-emitting device according to the first aspect of the second invention of the present invention are not limited to these embodiments.

<3. Third Invention>

The third invention of the present invention includes an aspect related to the light-emitting device (a first aspect of the third invention) as well as an aspect related to a method for designing the light-emitting device (a second aspect of the third invention), an aspect related to an illumination method (a fourth aspect of the third invention), and an aspect related to a method for manufacturing the light-emitting device (a fifth aspect of the third invention). It should be noted that a third aspect of the third invention of the present invention will not be described for the sake of convenience.

In order to solve the problems described in the section titled "Technical Problem" presented earlier, the present inventor has arrived with a light-emitting device having improved light source efficiency and a design guideline for the light-emitting device in Japanese Patent Application No. 2014-159784.

The light sources that satisfy the requirements which Japanese Patent Application No. 2014-159784 defined and which the present inventor have already discovered can implement a natural, vivid, highly visible, and comfortable appearance of colors and an appearance of objects under an indoor luminance environment as if the objects were seen under an outdoor environment.

However, LED illumination is already common, but many products which do not consider the appearance of colors are on the market. Many LED lighting fixtures/lighting systems are already in practical use. However even if a user experiences an unnatural feeling and is unsatisfied with the appearance of colors, it is impractical to replace the target lighting fixtures/systems or the like to improve the appearance of colors thereof, if time constraints and economic issues of the user are considered.

The third invention of the present invention has been made in order to solve such problems and to improve the appearance of colors of a light-emitting device which currently exists or is in use, and which includes a semiconductor light-emitting device of which appearance of colors is inferior. Further, the third invention of the present invention discloses a method for designing and a method for manufacturing this light-emitting device, and also discloses an illumination method using this light-emitting device.

Moreover, the third invention of the present invention also discloses a method or the like for further adjusting the appearance of colors of a semiconductor light-emitting device having good appearance of colors and having improved light source efficiency in accordance with the taste of the user using similar techniques.

To achieve the above objects, the first aspect of the third invention of the present invention relates to the following matters.

[1]

A light-emitting device having a light-emitting element and a control element, the light-emitting device at least including as the light-emitting element
   a blue semiconductor light-emitting element,
   a green phosphor, and
   a red phosphor,
   wherein when $\lambda$(nm) denotes wavelength,
   $\Phi_{elm3}(\lambda)$ denotes a spectral power distribution of light emitted from the light-emitting element in a main radiant direction, and $\varphi_{SSL3}(\lambda)$ denotes a spectral power distribution of light emitted from the light-emitting device in the main radiant direction,
   light having $\Phi_{elm3}(\lambda)$ does not satisfy at least one of Conditions 1 to 4 described below but light having $\varphi_{SSL3}(\lambda)$ satisfies all of the Conditions 1 to 4 described below.

Condition 1:
   When $\varphi(\lambda)$ denotes a spectral power distribution of object light, $\varphi_{ref}(\lambda)$ denotes a spectral power distribution of reference light which is selected in accordance with a correlated color temperature T of the object light,
   (X, Y, Z) denote tristimulus values of the object light,
   ($X_{ref}$, $Y_{ref}$, $Z_{ref}$) denote tristimulus values of reference light which is selected in accordance with the correlated color temperature T,
   a normalized spectral power distribution $S(\lambda)$ of the object light, a normalized spectral power distribution $S_{ref}(\lambda)$ of reference light of the object light, and a difference $\Delta S(\lambda)$ of between normalized spectral power distributions are respectively defined as $S(\lambda)=\varphi(\lambda)/Y$, $S_{ref}(\lambda)=\varphi_{ref}(\lambda)/Y_{ref}$, $\Delta S(\lambda)=S_{ref}(\lambda)-S(\lambda)$, and in a case where $\lambda_{RL-max}$ (nm) represents a wavelength that provides a longest wavelength local maximum value of $S(\lambda)$ in a wavelength range of 380 nm or more and 780 nm or less, and when a wavelength $\Lambda 4$ that is represented by $S(\lambda_{RL-max})/2$ exists on a longer wavelength-side of $\lambda_{RL-max}$,
   an index $A_{cg}$ represented by the following formula (3-1) satisfies $-10.0 < A_{cg} \leq 120.0$, but in a case where $\lambda_{RL-max}$ (nm) represents a wavelength that provides the longest wavelength local maximum value of $S(\lambda)$ in a wavelength range of 380 nm or more and 780 nm or less, and when the wavelength $\Lambda 4$ that is represented by $S(\lambda_{RL-max})/2$ does not exist on the longer wavelength-side of $\lambda_{RL-max}$,
   an index $A_{cg}$ represented by the following formula (3-2) satisfies $-10.0 < A_{cg} \leq 120.0$.

[Expression 35]

$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda$ (3-1)

[Expression 36]

$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda$ (3-2)

Condition 2:
   a distance $D_{uv}$ of the spectral power distribution $\varphi(\lambda)$ of object light from a black-body radiation locus defined by ANSI C78.377 satisfies $-0.0220 \leq D_{uv} \leq -0.0070$;

Condition 3:
   when a maximum value of spectral intensity in a range of 430 nm or more and 495 nm or less is defined as $\varphi_{BM-max}$ and a minimum value of spectral intensity in a range of 465 nm or more and 525 nm or less is defined as $\varphi_{BG-min}$, the spectral power distribution $\varphi(\lambda)$ of object light satisfies $0.2250 \leq \varphi_{BG-min}/\varphi_{BM-max} \leq 0.7000$; and Condition 4:
   in the spectral power distribution $\varphi(\lambda)$ of object light, when a maximum value of spectral intensity in a range of 590 nm or more and 780 nm or less is defined as $\varphi_{RM-max}$, a wavelength $\lambda_{RM-max}$ that provides $\varphi_{RM-max}$ satisfies $605 \text{ (nm)} \leq \lambda_{RM-max} \leq 653 \text{ (nm)}$.

[2]

The light-emitting device according to [1], wherein light having $\Phi_{elm3}(\lambda)$ does not satisfy at least one of Conditions I to IV described below but light having $\varphi_{SSL3}(\lambda)$ satisfies all of the Conditions I to IV described below.

Condition I:
   when $a^*_n$ and $b^*_n$ (where n is a natural number from 1 to 15) respectively denote the a* value and b* value in the CIE 1976 L*a*b* color space of the following 15 Munsell renotation color samples of #01 to #15 based on a mathematical assumption that illumination is performed by the object light, and
   when $a^*_{nref}$ and $b^*_{nref}$ (where n is a natural number from 1 to 15) respectively denote the a* value and b* value in the CIE 1976 L*a*b* color space of the 15 Munsell renotation color samples based on a mathematical assumption that illumination is performed by reference light which is selected in accordance with the correlated color temperature T (K) of the object light, each saturation difference $\Delta C_n$ satisfies $-4.00 \leq \Delta C_n \leq 8.00$ (where n is a natural number from 1 to 15);

Condition II:
   an average saturation difference of the object light represented by the following formula (3-3) satisfies (3-3)

[Expression 37]

$$\frac{\sum_{n=1}^{15} \Delta C_n}{15}$$

[Expression 38]

$$0.50 \leq \frac{\sum_{n=1}^{15} \Delta C_n}{15} \leq 4.00;$$

Condition III:
   when a maximum saturation difference value of the object light is denoted by $\Delta C_{max}$ and a minimum saturation difference value of the object light is denoted by $\Delta C_{min}$, a difference $|\Delta C_{max} - \Delta C_{min}|$ between the maximum saturation difference value and the minimum saturation difference value satisfies $2.00 \leq |\Delta C_{max} - \Delta C_{min}| \leq 10.00$, where $\Delta C_n = \sqrt{\{(a^*_n)^2 + (b^*_n)^2\}} - \sqrt{\{(a^*_{nref})^2 + (b^*_{nref})^2\}}$,
   with the 15 Munsell renotation color samples being:

| #01 | 7.5P | 4/10 |
| #02 | 10PB | 4/10 |

-continued

| | | |
|---|---|---|
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12; | and

Condition IV:

when $\theta_n$ (degrees) (where n is a natural number from 1 to 15) denotes a hue angle in the CIE 1976 L*a*b* color space of the 15 Munsell renotation color samples based on a mathematical assumption that illumination is performed by the object light, and when $\theta_{nref}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature T of the object light, an absolute value of each difference in hue angles $|\Delta h_n|$ satisfies 0.00 degrees $\leq |\Delta h_n| \leq$ 12.50 degrees (where n is a natural number from 1 to 15), where $\Delta h_n = \theta_n - \theta_{nref}$.

[3]

A light-emitting device having a light-emitting element and a control element, the light-emitting device at least including as the light-emitting element a blue semiconductor light-emitting element, a green phosphor, and a red phosphor, wherein when $\lambda$(nm) denotes wavelength, $\Phi_{elm3}(\lambda)$ denotes a spectral power distribution of light emitted from the light-emitting element in a main radiant direction, and $\varphi_{SSL3}(\lambda)$ denotes a spectral power distribution of light emitted from the light-emitting device in the main radiant direction, light having $\varphi_{elm3}(\lambda)$ satisfies all of the Conditions 1 to 4 described below and light having $\varphi_{SSL3}(\lambda)$ also satisfies all of the Conditions 1 to 4 described below.

Condition 1:

When $\varphi(\lambda)$ denotes a spectral power distribution of object light, $\varphi_{ref}(\lambda)$ denotes a spectral power distribution of reference light which is selected in accordance with a correlated color temperature T of the object light, (X, Y, Z) denote tristimulus values of the object light, ($X_{ref}$, $Y_{ref}$, $Z_{ref}$) denote tristimulus values of reference light which is selected in accordance with the correlated color temperature T, a normalized spectral power distribution $S(\lambda)$ of the object light, a normalized spectral power distribution $S_{ref}(\lambda)$ of reference light of the object light, and a difference $\Delta S(\lambda)$ of between normalized spectral power distributions are respectively defined as $S(\lambda) = \varphi(\lambda)/Y$, $S_{ref}(\lambda) = \varphi_{ref}(\lambda)/Y_{ref}$, $\Delta S(\lambda) = S_{ref}(\lambda) - S(\lambda)$, and in a case where $\lambda_{RL-max}$ (nm) represents a wavelength that provides a longest wavelength local maximum value of $S(\lambda)$ in a wavelength range of 380 nm or more and 780 nm or less, and when a wavelength $\Lambda 4$ that is represented by $S(\lambda_{RL-max})/2$ exists on a longer wavelength-side of $\lambda_{RL-max}$, an index $A_{cg}$ represented by the following formula (3-1) satisfies $-10.0 < A_{cg} \leq 120.0$, but in a case where $\lambda_{RL-max}$ (nm) represents a wavelength that provides the longest wavelength local maximum value of $S(\lambda)$ in a wavelength range of 380 nm or more and 780 nm or less, and when the wavelength $\lambda 4$ that is represented by $S(\lambda_{RL-max})/2$ does not exist on the longer wavelength-side of $\lambda_{RL-max}$, an index $A_{cg}$ represented by the following formula (3-2) satisfies $-10.0 < A_{cg} \leq 120.0$.

[Expression 39]

$$A_{cg} = \int_{380}^{495} \Delta S(\lambda) d\lambda + \int_{495}^{590}(-\Delta S(\lambda))d\lambda + \int_{590}^{\Lambda 4} \Delta S(\lambda) d\lambda \quad (3\text{-}1)$$

[Expression 40]

$$A_{cg} = \int_{380}^{495} \Delta S(\lambda) d\lambda + \int_{495}^{590}(-\Delta S(\lambda))d\lambda + \int_{590}^{780} \Delta S(\lambda) d\lambda \quad (3\text{-}2)$$

Condition 2:

a distance $D_{uv}$ of the spectral power distribution $\varphi(\lambda)$ of object light from a black-body radiation locus defined by ANSI C78.377 satisfies $-0.0220 \leq D_{uv} \leq -0.0070$;

Condition 3:

when a maximum value of spectral intensity in a range of 430 nm or more and 495 nm or less is defined as $\varphi_{BM-max}$ and a minimum value of spectral intensity in a range of 465 nm or more and 525 nm or less is defined as $\varphi_{BG-min}$, the spectral power distribution $\varphi(\lambda)$ of object light satisfies $0.2250 \leq \varphi_{BG-min}/\varphi_{BM-max} \leq 0.7000$; and Condition 4:

in the spectral power distribution $\varphi(\lambda)$ of object light, when a maximum value of spectral intensity in a range of 590 nm or more and 780 nm or less is defined as $\varphi_{RM-max}$, a wavelength $\lambda_{RM-max}$ that provides $\varphi_{RM-max}$ satisfies 605 (nm) $\leq \lambda_{RM-max} \leq$ 653 (nm).

[4]

The light-emitting device according to [3], wherein light having $\Phi_{elm3}(\lambda)$ satisfies all of Conditions I to IV described below and light having $\varphi_{SSL3}(\lambda)$ also satisfies all of the Conditions I to IV described below.

Condition I:

when $a^*_n$ and $b^*_n$ (where n is a natural number from 1 to 15) respectively denote the a* value and b* value in the CIE 1976 L*a*b* color space of the following 15 Munsell renotation color samples of #01 to #15 based on a mathematical assumption that illumination is performed by the object light, and when $a^*_{nref}$ and $b^*_{nref}$ (where n is a natural number from 1 to 15) respectively denote the a* value and b* value in the CIE 1976 L*a*b* color space of the 15 Munsell renotation color samples based on a mathematical assumption that illumination is performed by reference light which is selected in accordance with the correlated color temperature T (K) of the object light, each saturation difference $\Delta C_n$ satisfies $-4.00 \leq \Delta C_n \leq 8.00$ (where $n$ is a natural number from 1 to 15);

Condition II:

an average saturation difference of the object light represented by the following formula (3-3) satisfies (3-3)

$$\sum_{n=1}^{15} \Delta C_n \over 15$$ [Expression 41]

$$0.50 \leq {\sum_{n=1}^{15} \Delta C_n \over 15} \leq 4.00;$$ [Expression 42]

Condition III:

when a maximum saturation difference value of the object light is denoted by $\Delta C_{max}$ and a minimum saturation difference value of the object light is denoted by $\Delta C_{min}$, a difference $|\Delta C_{max} - \Delta C_{min}|$ between the maximum saturation difference value and the minimum saturation difference value satisfies $2.00 \leq |\Delta C_{max} - \Delta C_{min}| \leq 10.00$, where $\Delta C_n = \sqrt{\{(a^*_n)^2 + (b^*_n)^2\}} - \sqrt{\{(a^*_{nref})_2 + (b^*_{nref})^2\}}$, with the 15 Munsell renotation color samples being:

| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12; | and

Condition IV:

when $\theta_n$ (degrees) (where n is a natural number from 1 to 15) denotes a hue angle in the CIE 1976 L*a*b* color space of the 15 Munsell renotation color samples based on a mathematical assumption that illumination is performed by the object light, and when $\theta_{nref}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature T of the object light, an absolute value of each difference in hue angles $|\Delta h_n|$ satisfies $0.00$ degrees $\leq |\Delta h_n| \leq 12.50$ degrees (where $n$ is a natural number from 1 to 15), where $\Delta h_n = \theta_n - \theta_{nref}$.

[5]

The light-emitting device according to [1] or [3], wherein if $D_{uv}$ derived from the spectral power distribution of the light emitted from the light-emitting element in the main radiant direction is denoted by $D_{uv}(\varphi_{elm3}(\lambda))$, and $D_{uv}$ derived from the spectral power distribution of the light emitted from the light-emitting device in the main radiant direction is denoted by $D_{uv}(\varphi_{SSL3}(\lambda))$, $D_{uv}(\varphi_{SSL3}(\lambda)) < D_{uv}(\Phi_{elm3}(\lambda))$ is satisfied.

[6]

The light-emitting device according to [1] or [3], wherein if $A_{cg}$ derived from the spectral power distribution of the light emitted from the light-emitting element in the main radiant direction is denoted by $A_{cg}(\Phi_{elm3}(\lambda))$, and $A_{cg}$ derived from the spectral power distribution of the light emitted from the light-emitting device in the main radiant direction is denoted by $A_{cg}(\varphi_{SSL3}(\lambda))$, $A_{cg}(\varphi_{SSL3}(\lambda)) < A_{cg}(\Phi_{elm3}(\lambda))$ is satisfied.

[7]

The light-emitting device according to [2] or [4], wherein if an average saturation difference derived from the spectral power distribution of the light emitted from the light-emitting element in the main radiant direction is denoted by $SAT_{ave}(O_{elm3}(\lambda))$, and if an average saturation difference derived from the spectral power distribution of the light emitted from the light-emitting device in the main radiant direction is denoted by $SAT_{ave}(\varphi_{SSL3}(\lambda))$, $SAT_{ave}(\Phi_{elm3}(\lambda)) < SAT_{ave}(\varphi_{SSL3}(\lambda))$ is satisfied.

[8]

The light-emitting device according to any one of [1] to [7], wherein the control element is an optical filter that absorbs or reflects light in a range of 380 nm $\leq$ (nm) $\leq$ 780 nm.

[9]

The light-emitting device according to any one of [1] to [8], wherein the control element has a collection function and/or a diffusion function of the light emitted from the light-emitting element.

[10]

The light-emitting device according to [9], wherein the collection function and/or the diffusion function of the control element is implemented by at least one of the functions of a concave lens, a convex lens and a Fresnel lens.

[11]

The light-emitting device according to any one of [1] to [10], wherein illuminance at which the light emitted from the light-emitting device in the radiant direction illuminates objects is 51 lx or more and 10000 lx or less.

[12]

The light-emitting device according to any one of [1] to [11], wherein in Condition 2, the light-emitting device satisfies $-0.0184 \leq D_{uv} \leq -0.0084$.

[13]

The light-emitting device according to [1] or [12], wherein in Condition 4, $625$ (nm) $\leq \lambda_{RM-max} \leq 647$ (nm) is satisfied.

[14]

The light-emitting device according to any one of [1] to [13], wherein light having $\Phi_{elm3}(\lambda)$ does not satisfy Condition 5 described below but light having $\varphi_{SSL3}(\lambda)$ satisfies Condition 5 described below.

Condition 5:

In the spectral power distribution $\varphi(\lambda)$ of object light, a wavelength $\lambda_{BM\text{-}max}$ that provides $\varphi_{BM\text{-}max}$ satisfies $$430 \text{ (nm)} \leq \lambda_{BM\text{-}max} \leq 480 \text{ (nm)}.$$

[15]

The light-emitting device according to any one of [1] to [13], wherein light having $\Phi_{elm3}(\lambda)$ does not satisfy Condition 6 described below but light having $\varphi_{SSL3}(\lambda)$ satisfies Condition 6 described below.

Condition 6:

The spectral power distribution $\varphi(\lambda)$ of object light satisfies $$0.1800 \leq \varphi_{BG\text{-}min}/\varphi_{RM\text{-}max} \leq 0.8500.$$

[16]

The light-emitting device according to [15], wherein in Condition 6, $$0.1917 \leq \varphi_{BG\text{-}min}/\varphi_{RM\text{-}max} \leq 0.7300 \text{ is satisfied.}$$

[17]

The light-emitting device according to any one of [1] to [13], wherein light having $\Phi_{elm3}(\lambda)$ does not satisfy Condition 7 described below but light having $\varphi_{SSL3}(\lambda)$ satisfies Conditions 7 described below.

Condition 7:

A luminous efficacy of radiation K (lm/W) in a wavelength range of 380 nm to 780 nm derived from a spectral power distribution $\varphi(\lambda)$ of object light satisfies $$210.0 \text{ lm/W} \leq K \leq 290.0 \text{ lm/W}.$$

[18]

The light-emitting device according to any one of [1] to [13], wherein light having $\Phi_{elm3}(\lambda)$ does not satisfy Condition 8 described below but light having $\varphi_{SSL3}(\lambda)$ satisfies Conditions 8 described below.

Condition 8:

A correlated color temperature T (K) of object light satisfies $$2600 \text{ K} \leq T \leq 7700 \text{ K}.$$

[19]

The light-emitting device according to [14], wherein light having $\Phi_{elm3}(\lambda)$ satisfies at least one of Conditions 6 to 8 described below but if there are conditions not satisfied by light having $\Phi_{elm3}(\lambda)$ among the Conditions 6 to 8 described below, light having $\varphi_{SSL3}(\lambda)$ satisfies at least one of such conditions.

Condition 6:

The spectral power distribution $\varphi(\lambda)$ of object light satisfies $$0.1800 \leq \varphi_{BG\text{-}min}/\varphi_{RM\text{-}max} \leq 0.8500.$$

Condition 7:

A luminous efficacy of radiation K (lm/W) in a wavelength range of 380 nm to 780 nm derived from a spectral power distribution $\varphi(\lambda)$ of object light satisfies $$210.0 \text{ lm/W} \leq K \leq 290.0 \text{ lm/W}.$$

Condition 8:

A correlated color temperature T (K) of object light satisfies $$2600 \text{ K} \leq T \leq 7700 \text{ K}.$$

[20]

The light-emitting device according to [15] or [16], wherein light having $\Phi_{elm3}(\lambda)$ satisfies at least one of Conditions 5, 7 and 8 described below but if there are conditions not satisfied by light having $\Phi_{elm3}(\lambda)$ among the Conditions 5, 7 and 8 described below, light having $\varphi_{SSL3}(\lambda)$ satisfies at least one of such conditions.

Condition 5:

In the spectral power distribution $\varphi(\lambda)$ of object light, a wavelength $\lambda_{BM\text{-}max}$ that provides $\varphi_{BM\text{-}max}$ satisfies $$430 \text{ (nm)} \leq \lambda_{BM\text{-}max} \leq 480 \text{ (nm)}.$$

Condition 7:

A luminous efficacy of radiation K (lm/W) in a wavelength range of 380 nm to 780 nm derived from a spectral power distribution $\varphi(\lambda)$ of object light satisfies $$210.0 \text{ lm/W} \leq K \leq 290.0 \text{ lm/W}.$$

Condition 8:

A correlated color temperature T (K) of object light satisfies $$2600 \text{ K} \leq T \leq 7700 \text{ K}.$$

[21]

The light-emitting device according to [17], wherein light having $\Phi_{elm3}(\lambda)$ satisfies at least one of Conditions 5, 6 and 8 described below but if there are conditions not satisfied by light having $\Phi_{elm3}(\lambda)$ among the Conditions 5, 6 and 8 described below, light having $\varphi_{SSL3}(\lambda)$ satisfies at least one of such conditions.

Condition 5:

In the spectral power distribution $\varphi(\lambda)$ of object light, a wavelength $\lambda_{BM\text{-}max}$ that provides $\varphi_{BM\text{-}max}$ satisfies $$430 \text{ (nm)} \leq \lambda_{BM\text{-}max} \leq 480 \text{ (nm)}.$$

Condition 6:

The spectral power distribution $\varphi(\lambda)$ of object light satisfies $$0.1800 \leq \varphi_{BG\text{-}min}/\varphi_{RM\text{-}max} \leq 0.8500.$$

Condition 8:

A correlated color temperature T (K) of object light satisfies $$2600 \text{ K} \leq T \leq 7700 \text{ K}.$$

[22]

The light-emitting device according to [18], wherein light having $\Phi_{elm3}(\lambda)$ satisfies at least one of Conditions 5 to 7 described below but if there are conditions not satisfied by light having $\Phi_{elm3}(\lambda)$ among the Conditions 5 to 7 described below, light having $\varphi_{SSL3}(\lambda)$ satisfies at least one of such conditions.

Condition 5:

In the spectral power distribution $\varphi(\lambda)$ of object light, a wavelength $\lambda_{BM\text{-}max}$ that provides $\varphi_{BM\text{-}max}$ satisfies $$430 \text{ (nm)} \leq \lambda_{BM\text{-}max} \leq 480 \text{ (nm)}.$$

Condition 6:

The spectral power distribution $\varphi(\lambda)$ of object light satisfies $$0.1800 \leq \varphi_{BG\text{-}min}/\varphi_{RM\text{-}max} \leq 0.8500.$$

Condition 7:

A luminous efficacy of radiation K (lm/W) in a wavelength range of 380 nm to 780 nm derived from a spectral power distribution $\varphi(\lambda)$ of object light satisfies 210.0 lm/W≤K≤290.0 lm/W.

[23]

The light-emitting device according to any one of [1] to [13], wherein light having $\Phi_{elm3}(\lambda)$ satisfies all of the Conditions 5 to 8 described below and light having $\varphi_{SSL3}(\lambda)$ also satisfies all of the Conditions 5 to 8 described below.

Condition 5:

In the spectral power distribution $\varphi(\lambda)$ of object light, a wavelength $\lambda_{BM-max}$ that provides $\varphi_{BM-max}$ satisfies 430 (nm)≤$\lambda_{BM-max}$≤480 (nm).

Condition 6:

The spectral power distribution $\varphi(\lambda)$ of object light satisfies 0.1800≤$\varphi_{BG-min}/\varphi_{RM-max}$≤0.8500.

Condition 7:

A luminous efficacy of radiation K (lm/W) in a wavelength range of 380 nm to 780 nm derived from a spectral power distribution $\varphi(\lambda)$ of object light satisfies 210.0 lm/W≤K≤290.0 lm/W.

Condition 8:

A correlated color temperature T (K) of object light satisfies

2600 K≤T≤7700 K.

[24]

The light-emitting device according to any one of [1] to [23], wherein light having $\varphi_{SSL3}(\lambda)$ does not have effective intensity derived from the light-emitting element in a range of 380 nm or more and 405 nm or less.

[25]

The light-emitting device according to any one of [1] to [24], wherein the blue semiconductor light-emitting element is configured such that a dominant wavelength $\lambda_{CHIP-BM-dom}$ of the blue semiconductor light-emitting element alone when pulse-driven is 445 nm or more and 475 nm or less.

[26]

The light-emitting device according to any one of [1] to [25], wherein the green phosphor is a wide-band green phosphor.

[2 7]

The light-emitting device according to any one of [1] to [26], wherein the green phosphor is configured such that a wavelength $\lambda_{PHOS-GM-max}$ that provides maximum emission intensity when light is excited by the green phosphor alone is 511 nm or more and 543 nm or less, and a full-width at half-maximum $W_{PHOS-GM-fwhm}$ thereof is 90 nm or more and 110 nm or less.

[28]

The light-emitting device according to any one of [1] to [27], wherein wherein the light-emitting device includes substantially no yellow phosphor.

[29]

The light-emitting device according to any one of [1] to [28], wherein the red phosphor is configured such that a wavelength $\lambda_{PHOS-RM-max}$ that provides maximum emission intensity when light is excited by the red phosphor alone is 622 nm or more and 663 nm or less, and a full-width at half-maximum $W_{PHOS-RM-fwhm}$ thereof is 80 nm or more and 105 nm or less.

[30]

The light-emitting device according to any one of [1] to [29], wherein the blue semiconductor light-emitting element is an AlInGaN light-emitting element.

[31]

The light-emitting device according to any one of [1] to [30], wherein the green phosphor is $Ca_3(Sc,Mg)_2Si_3O_{12}$:Ce (CSMS phosphor), $CaSc_2O_4$:Ce (CSO phosphor), $Lu_3Al_5O_{12}$:Ce (LuAG phosphor), or $Y_3(Al,Ga)_5O_{12}$:Ce (G-YAG phosphor).

[32]

The light-emitting device according to any one of [1] to [31], wherein the red phosphor includes $(Sr,Ca)AlSiN_3$:Eu (SCASN phosphor), $CaAlSi(ON)_3$:Eu (CASON phosphor), or $CaAlSiN_3$:Eu (CASN phosphor).

[33]

The light-emitting device according to any one of [1] to [32], wherein the blue semiconductor light-emitting element is an AlInGaN light-emitting element with a dominant wavelength $\lambda_{CHIP-BM-dom}$ when the blue semiconductor light-emitting element alone is pulse-driven, of 452.5 nm or more and 470 nm or less, the green phosphor is a $CaSc_2O_4$:Ce (CSO phosphor) or a $Lu_3Al_5O_{12}$:Ce (LuAG phosphor) with a wavelength $\lambda_{PHOS-GM-max}$ that provides maximum emission intensity when light is excited by the green phosphor alone is 515 nm or more and 535 nm or less and a full-width at half-maximum $\lambda_{PHOS-GM-fwhm}$ thereof is 90 nm or more and 110 nm or less, and the red phosphor is a $CaAlSi(ON)_3$:Eu (CASON phosphor) or a $CaAlSiN_3$:Eu (CASN phosphor) with a wavelength that provides maximum emission intensity $\lambda_{PHOS-RM-max}$ when light is excited by the red phosphor alone is 640 nm or more and 663 nm or less and a full-width at half-maximum $W_{PHOS-RM-fwhm}$ thereof is 80 nm or more and 105 nm or less.

[34]

The light-emitting device according to any one of [1] to [33], wherein the light-emitting device is a packaged LED, a chip-on-board LED, an LED module, an LED light bulb, an LED lighting fixture, or an LED lighting system.

[35]

The light-emitting device according to any one of [1] to [34], which is used as a residential uses' illumination device.

[36]

The light-emitting device according to any one of [1] to [34], which is used as an exhibition illumination device.

[37]

The light-emitting device according to any one of [1] to [34], which is used as a presentation illumination device.

[38]

The light-emitting device according to any one of [1] to [34], which is used as a medical illumination device.

[39]

The light-emitting device according to any one of [1] to [34], which is used as a work illumination device.

[40]

The light-emitting device according to any one of [1] to [34], which is used as an illumination device incorporated in industrial equipments.

[41]

The light-emitting device according to any one of [1] to [34], which is used as an illumination device for interior of transportation.

[42]

The light-emitting device according to any one of [1] to [34], which is used as an illumination device for works of art.

[43]

The light-emitting device according to any one of [1] to [34], which is used as an illumination device for aged persons.

To achieve the above objects, the fifth aspect of the third invention of the present invention relates to the following matters.

[44]

A method for manufacturing a light-emitting device having a light-emitting element and a control element, the manufacturing method comprising the steps of:

preparing a first light-emitting device which at least includes a blue semiconductor light-emitting element, a green phosphor, and a red phosphor as the light-emitting element; and manufacturing a second light-emitting device by arranging the control element so as to act on at least a part of light emitted from the first light-emitting device in a main radiant direction, and when $\lambda$(nm) denotes wavelength, $\Phi_{elm3}(\lambda)$ denotes a spectral power distribution of light emitted from the first light-emitting device in the main radiant direction, and $\varphi_{SSL3}(\lambda)$ denotes a spectral power distribution of light emitted from the second light-emitting device in the main radiant direction, light having $\Phi_{elm3}(\lambda)$ does not satisfy at least one of Conditions 1 to 4 described below but light having $\varphi_{SSL3}(\lambda)$ satisfies all of the Conditions 1 to 4 described below.

Condition 1:

When $\varphi(\lambda)$ denotes a spectral power distribution of object light, $\varphi_{ref}(\lambda)$ denotes a spectral power distribution of reference light which is selected in accordance with a correlated color temperature T of the object light, (X, Y, Z) denote tristimulus values of the object light, $(X_{ref}, Y_{ref}, Z_{ref})$ denote tristimulus values of reference light which is selected in accordance with the correlated color temperature T, a normalized spectral power distribution $S(\lambda)$ of the object light, a normalized spectral power distribution $S_{ref}(\lambda)$ of reference light of the object light, and a difference $\Delta S(\lambda)$ of between normalized spectral power distributions are respectively defined as $S(\lambda)=\varphi(\lambda)/Y$, $S_{ref}(\lambda)=\varphi_{ref}(\lambda)/Y_{ref}$, $\Delta S(\lambda)=S_{ref}(\lambda)-S(\lambda)$, and in a case where $\lambda_{RL\text{-}max}$ (nm) represents a wavelength that provides a longest wavelength local maximum value of $S(\lambda)$ in a wavelength range of 380 nm or more and 780 nm or less, and when a wavelength Λ4 that is represented by $S(\lambda_{RL\text{-}max})/2$ exists on a longer wavelength-side of $\lambda_{RL\text{-}max}$, an index $A_{cg}$ represented by the following formula (3-1) satisfies $-10.0 < A_{cg} \le 120.0$, but in a case where $\lambda_{RL\text{-}max}$ (nm) represents a wavelength that provides the longest wavelength local maximum value of $S(\lambda)$ in a wavelength range of 380 nm or more and 780 nm or less, and when the wavelength Λ4 that is represented by $S(\lambda_{RL\text{-}max})/2$ does not exist on the longer wavelength-side of $\lambda_{RL\text{-}max}$, an index $A_{cg}$ represented by the following formula (3-2) satisfies $-10.0 < A_{cg} \le 120.0$.

[Expression 43]

$$A_{cg} = \int_{380}^{495} \Delta S(\lambda)d\lambda + \int_{495}^{590}(-\Delta S(\lambda))d\lambda + \int_{590}^{\Lambda 4} \Delta S(\lambda))d\lambda \quad (3\text{-}1)$$

[Expression 44]

$$A_{cg} = \int_{380}^{495} \Delta S(\lambda)d\lambda + \int_{495}^{590}(-\Delta S(\lambda))d\lambda + \int_{590}^{780} \Delta S(\lambda))d\lambda \quad (3\text{-}2)$$

Condition 2:

a distance $D_{uv}$ of the spectral power distribution $\varphi(\lambda)$ of object light from a black-body radiation locus defined by ANSI C78.377 satisfies $-0.0220 \le D_{uv} \le -0.0070$;

Condition 3:

when a maximum value of spectral intensity in a range of 430 nm or more and 495 nm or less is defined as $\varphi_{BM\text{-}max}$ and a minimum value of spectral intensity in a range of 465 nm or more and 525 nm or less is defined as $\varphi_{BG\text{-}min}$, the spectral power distribution $\varphi(\lambda)$ of object light satisfies $0.2250 \le \varphi_{BG\text{-}min}/\varphi_{BM\text{-}max} \le 0.7000$; and Condition 4:

in the spectral power distribution $\varphi(\lambda)$ of object light, when a maximum value of spectral intensity in a range of 590 nm or more and 780 nm or less is defined as m r $\varphi_{RM\text{-}max}$, a wavelength $\lambda_{RM\text{-}max}$ that provides $\varphi_{RM\text{-}max}$ satisfies $605 \text{ (nm)} \le \lambda_{RM\text{-}max} \le 653 \text{ (nm)}$.

[45]

The method for manufacturing a light-emitting device according to [44], wherein light having $\Phi_{elm3}(\lambda)$ does not satisfy at least one of Conditions I to IV described below but light having $\varphi_{SSL3}(\lambda)$ satisfies all of the Conditions I to IV described below.

Condition I:

when $a*_n$ and $b*_n$ (where n is a natural number from 1 to 15) respectively denote the a* value and b* value in the CIE 1976 L*a*b* color space of the following 15 Munsell renotation color samples of #01 to #15 based on a mathematical assumption that illumination is performed by the object light, and when $a*_{nref}$ and $b*_{nref}$ (where n is a natural number from 1 to 15) respectively denote the a* value and b* value in the CIE 1976 L*a*b* color space of the 15 Munsell renotation color samples based on a mathematical assumption that illumination is performed by reference light which is selected in accordance with the correlated color temperature T (K) of the object light, each saturation difference $\Delta C_n$ satisfies $-4.00 \le \Delta C_n \le 8.00$ (where $n$ is a natural number from 1 to 15);

Condition II:

an average saturation difference of the object light represented by the following formula (3-3) satisfies (3-3)

$$\frac{\sum_{n=1}^{15} \Delta C_n}{15}$$ [Expression 45]

$$0.50 \leq \frac{\sum_{n=1}^{15} \Delta C_n}{15} \leq 4.00;$$ [Expression 46]

Condition III:

when a maximum saturation difference value of the object light is denoted by $\Delta C_{max}$ and a minimum saturation difference value of the object light is denoted by $\Delta C_{min}$, a difference $|\Delta C_{max} - \Delta C_{min}|$ between the maximum saturation difference value and the minimum saturation difference value satisfies $2.00 \leq |\Delta C_{max} - \Delta C_{min}| \leq 10.00,$ where $\Delta C_n = \sqrt{\{(a^*_n)^2 + (b^*_n)^2\}} - \sqrt{\{(a^*_{nref})^2 + (b^*_{nref})^2\}}$, with the 15 Munsell renotation color samples being:

| #01 | 7.5P   | 4/10   |
| --- | ------ | ------ |
| #02 | 10PB   | 4/10   |
| #03 | 5PB    | 4/12   |
| #04 | 7.5B   | 5/10   |
| #05 | 10BG   | 6/8    |
| #06 | 2.5BG  | 6/10   |
| #07 | 2.5G   | 6/12   |
| #08 | 7.5GY  | 7/10   |
| #09 | 2.5GY  | 8/10   |
| #10 | 5Y     | 8.5/12 |
| #11 | 10YR   | 7/12   |
| #12 | 5YR    | 7/12   |
| #13 | 10R    | 6/12   |
| #14 | 5R     | 4/14   |
| #15 | 7.5RP  | 4/12;  | and
Condition IV:

when $\theta_n$ (degrees) (where n is a natural number from 1 to 15) denotes a hue angle in the CIE 1976 L*a*b* color space of the 15 Munsell renotation color samples based on a mathematical assumption that illumination is performed by the object light, and when $\theta_{nref}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature T of the object light, an absolute value of each difference in hue angles $|\Delta h_n|$ satisfies 0.00 degrees $\leq |\Delta h_n| \leq 12.50$ degrees (where $n$ is a natural number from 1 to 15), where $\Delta h_n = \theta_n - \theta_{nref}$.
[46]

A method for manufacturing a light-emitting device having a light-emitting element and a control element, the manufacturing method comprising the steps of:

preparing a first light-emitting device which at least includes a blue semiconductor light-emitting element, a green phosphor, and a red phosphor as the light-emitting element; and manufacturing a second light-emitting device by arranging the control element so as to act on at least a part of light emitted from the first light-emitting device in a main radiant direction, and when $\lambda$(nm) denotes wavelength, $\Phi_{elm3}(\lambda)$ denotes a spectral power distribution of light emitted from the first light-emitting device in the main radiant direction, and $\varphi_{SSL3}(\lambda)$ denotes a spectral power distribution of light emitted from the second light-emitting device in the main radiant direction, light having $\Phi_{elm3}(\lambda)$ satisfies all of Conditions 1 to 4 described below and light having $\varphi_{SSL3}(\lambda)$ also satisfies all of the Conditions 1 to 4 described below.

Condition 1:

when $\varphi(\lambda)$ denotes a spectral power distribution of object light, $\varphi_{ref}(\lambda)$ denotes a spectral power distribution of reference light which is selected in accordance with a correlated color temperature T of the object light, (X, Y, Z) denote tristimulus values of the object light, ($X_{ref}$, $Y_{ref}$, $Z_{ref}$) denote tristimulus values of reference light which is selected in accordance with the correlated color temperature T, a normalized spectral power distribution $S(\lambda)$ of the object light, a normalized spectral power distribution $S_{ref}(\lambda)$ of reference light of the object light, and a difference $\Delta S(\lambda)$ of between normalized spectral power distributions are respectively defined as $S(\lambda) = \varphi(\lambda)/Y,$ $S_{ref}(\lambda) = \varphi_{ref}(\lambda)/Y_{ref},$ $\Delta S(\lambda) = S_{ref}(\lambda) - S(\lambda),$ and in a case where $\lambda_{RL-max}$ (nm) represents a wavelength that provides a longest wavelength local maximum value of $S(\lambda)$ in a wavelength range of 380 nm or more and 780 nm or less, and when a wavelength $\lambda 4$ that is represented by $S(\lambda_{RL-max})/2$ exists on a longer wavelength-side of $\lambda_{RL-max}$, an index $A_{cg}$ represented by the following formula (3-1) satisfies $-10.0 \leq A_{cg} \leq 120.0,$ but in a case where $\lambda_{RL-max}$ (nm) represents a wavelength that provides the longest wavelength local maximum value of $S(\lambda)$ in a wavelength range of 380 nm or more and 780 nm or less, and when the wavelength $\lambda 4$ that is represented by $S(\lambda_{RL-max})/2$ does not exist on the longer wavelength-side of $\lambda_{RL-max}$, an index $A_{cg}$ represented by the following formula (3-2) satisfies $-10.0 < A_{cg} \leq 120.0.$

[Expression 47]

$$A_{cg} = \int_{380}^{495} \Delta S(\lambda) d\lambda + \int_{495}^{590} (-\Delta S(\lambda)) d\lambda + \int_{590}^{\lambda 4} \Delta S(\lambda) d\lambda \quad (3\text{-}1)$$

[Expression 48]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (3\text{-}2)$$

Condition 2:

a distance D of the spectral power distribution $\varphi(\lambda)$ of object light from a black-body radiation locus defined by ANSI C78.377 satisfies $-0.0220 \leq D_{uv} \leq -0.0070;$ Condition 3:

when a maximum value of spectral intensity in a range of 430 nm or more and 495 nm or less is defined as $\varphi_{BM-max}$ and a minimum value of spectral intensity in a range of 465 nm or more and 525 nm or less is defined as $\varphi_{BG-min}$, the spectral power distribution $\varphi(\lambda)$ of object light satisfies $$0.2250 \leq \varphi_{BG-min}/\varphi_{BM-max} \leq 0.7000; \text{ and}$$

Condition 4:

in the spectral power distribution $\varphi(\lambda)$ of object light, when a maximum value of spectral intensity in a range of 590 nm or more and 780 nm or less is defined as $\varphi_{RM-max}$, a wavelength $\lambda_{RM-max}$ that provides $\varphi_{RM-max}$ satisfies $$605 \text{ (nm)} \leq \lambda_{RM-max} \leq 653 \text{ (nm)}.$$

[47]

The method for manufacturing a light-emitting device according to [46], wherein light having $\Phi_{elm3}(\lambda)$ satisfies all of Conditions I to IV described below and light having $\varphi_{SSL3}(\lambda)$ also satisfies all of the Conditions I to IV described below.

Condition I:

when $a^*_n$ and $b^*_n$ (where n is a natural number from 1 to 15) respectively denote the a* value and b* value in the CIE 1976 L*a*b* color space of the following 15 Munsell renotation color samples of #01 to #15 based on a mathematical assumption that illumination is performed by the object light, and when $a^*_{nref}$ and $b^*_{nref}$ (where n is a natural number from 1 to 15) respectively denote the a* value and b* value in the CIE 1976 L*a*b* color space of the 15 Munsell renotation color samples based on a mathematical assumption that illumination is performed by reference light which is selected in accordance with the correlated color temperature T (K) of the object light, each saturation difference $\Delta C_n$ satisfies $$-4.00 \leq \Delta C_n \leq 8.00 \text{ (where } n \text{ is a natural number from 1 to 15);}$$

Condition II:

an average saturation difference of the object light represented by the following formula (3-3) satisfies (3-3)

$$\frac{\sum_{n=1}^{15} \Delta C_n}{15}$$ [Expression 49]

$$0.50 \leq \frac{\sum_{n=1}^{15} \Delta C_n}{15} \leq 4.00;$$ [Expression 50]

Condition III:

when a maximum saturation difference value of the object light is denoted by $\Delta C_{max}$ and a minimum saturation difference value of the object light is denoted by $\Delta C_{min}$, a difference $|\Delta C_{max} - \Delta C_{min}|$ between the maximum saturation difference value and the minimum saturation difference value satisfies $$2.00 \leq |\Delta C_{max} - \Delta C_{min}| \leq 10.00,$$

where $\Delta C_n = \sqrt{\{(a^*_n)^2 + (b^*_n)^2\}} - \sqrt{\{(a^*_{nref})^2 + (b^*_{nref})^2\}}$, with the 15 Munsell renotation color samples being:

| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12; | and

Condition IV:

when $\theta_n$ (degrees) (where n is a natural number from 1 to 15) denotes a hue angle in the CIE 1976 L*a*b* color space of the 15 Munsell renotation color samples based on a mathematical assumption that illumination is performed by the object light, and when $\theta_{nref}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature T of the object light, an absolute value of each difference in hue angles $|\Delta h_n|$ satisfies $$0.00 \text{ degrees} \leq |\Delta h_n| \leq 12.50 \text{ degrees (where } n \text{ is a natural number from 1 to 15),}$$

where $\Delta h_n = \theta_n - \theta_{nref}$.

In addition, to achieve the above objects, the second aspect of the third invention of the present invention relates to the following matters.

[43]

A method for designing a light-emitting device having a light-emitting element and a control element, the light-emitting device at least including as the light-emitting element a blue semiconductor light-emitting element, a green phosphor, and a red phosphor, wherein the method for designing involves designing the light-emitting device so that when $\lambda$(nm) denotes wavelength, $\Phi_{elm3}(\lambda)$ denotes a spectral power distribution of light emitted from the light-emitting element in a main radiant direction, and $\varphi_{SSL3}(\lambda)$ denotes a spectral power distribution of light emitted from the light-emitting device in the main radiant direction, light having $\Phi_{elm3}(\lambda)$ does not satisfy at least one of Conditions 1 to 4 described above but light having $\varphi_{SSL3}(\lambda)$ satisfies all of the Conditions 1 to 4 described above.

[44]

The method for designing a light-emitting device according to [43], wherein light having $\Phi_{elm3}(\lambda)$ does not satisfy at least one of Conditions I to IV described above but light having $\varphi_{SSL3}(\lambda)$ satisfies all of the Conditions I to IV described above.

[45]

A method for designing a light-emitting device having a light-emitting element and a control element, the light-emitting device at least including as the light-emitting element a blue semiconductor light-emitting element, a green phosphor, and a red phosphor, wherein the method for designing involves designing the light-emitting device so that when λ(nm) denotes wavelength, $\Phi_{elm3}(\lambda)$ denotes a spectral power distribution of light emitted from the light-emitting element in a main radiant direction, and $\varphi_{SSL3}(\lambda)$ denotes a spectral power distribution of light emitted from the light-emitting device in the main radiant direction, light having $\Phi_{elm3}(\lambda)$ satisfies all of Conditions 1 to 4 described above and light having $\varphi_{SSL3}(\lambda)$ also satisfies all of the Conditions 1 to 4 described above.

[46]

The method for designing a light-emitting device according to [45], wherein light having $\Phi_{elm3}(\lambda)$ satisfies all of Conditions I to IV described above and light having $\varphi_{SSL3}(\lambda)$ also satisfies all of the Conditions I to IV described above.

In addition, to achieve the above objects, the fourth aspect of the third invention of the present invention relates to the following matters.

[47]

An illumination method comprising an illuminated object preparing step of preparing an illuminated object and an illuminating step of illuminating an object by light emitted from a light-emitting device having a light-emitting element and a control element, wherein the light-emitting device at least includes as the light-emitting element a blue semiconductor light-emitting element, a green phosphor, and a red phosphor, and in the illuminating step, when light emitted from the light-emitting element illuminates the object, light measured at a position of the object does not satisfy at least one of <1> to <4> described below, but when light emitted from the light-emitting device illuminates the object, light measured at a position of the object satisfies all of <1> to <4> described below.

<1>

When $a^*_n$ and $b^*_n$ (where n is a natural number from 1 to 15) respectively denote the a* value and the b* value in the CIE 1976 L*a*b* color space of the following 15 Munsell renotation color samples of #01 to #15 based on a mathematical assumption that illumination is performed by light emitted from the light-emitting device as measured at a position of the object, and when $a^*_{nref}$ and $b^*_{nref}$ (where n is a natural number from 1 to 15) respectively denote the a* value and the b* value in the CIE 1976 L*a*b* color space of the 15 Munsell renotation color samples based on a mathematical assumption that illumination is performed by reference light which is selected in accordance with a correlated color temperature T(K) of light emitted from the light-emitting device as measured at a position of the object, each saturation difference $\Delta C_n$ satisfies $-4.00 \leq \Delta C_n \leq 8.00$ (where $n$ is a natural number from 1 to 15);

<2> an average saturation difference represented by the following formula (3-3) satisfies (3-3)

[Expression 51]
$$\frac{\sum_{n=1}^{15} \Delta C_n}{15}$$

[Expression 52]
$$0.50 \leq \frac{\sum_{n=1}^{15} \Delta C_n}{15} \leq 4.00;$$

<3> when a maximum saturation difference value is denoted by $\Delta C_{max}$ and a minimum saturation difference value is denoted by $\Delta C_{min}$, a difference $|\Delta C_{max}-\Delta C_{min}|$ between the maximum saturation difference value and the minimum saturation difference value satisfies $2.00 \leq |\Delta C_{max}-\Delta C_{min}| \leq 10.00$, where $\Delta C_n = \sqrt{\{(a^*_n)^2+(b^*_n)^2\}} - \sqrt{\{(a^*_{nref})^2+(b^*_{nref})^2\}}$, with the 15 Munsell renotation color samples being:

| | | |
|---|---|---|
| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12; | and

<4>

When $\theta_n$ (degrees) (where n is a natural number from 1 to 15) denotes a hue angle in the CIE 1976 L*a*b* color space of the 15 Munsell renotation color samples based on a mathematical assumption that illumination is performed by the light emitted from the light-emitting device as measured at a position of the object, and when $\theta_{nref}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature T of the light emitted from the light-emitting device as measured at a position of the object, an absolute value of each difference in hue angles $|\Delta h_n|$ satisfies $0.00$ degrees $\leq |\Delta h_n| \leq 12.50$ degrees (where $n$ is a natural number from 1 to 15), where $\Delta h_n = \theta_n - \theta_{nref}$.

[48]

The illumination method according to [47], wherein illumination is provided so as to further satisfy all of <5> to <8> described below.

<5>

When λ denotes wavelength, $\varphi(\lambda)$ denotes a spectral power distribution of light emitted from the light-emitting device as measured at a position of the object, $\varphi_{ref}(\lambda)$ denotes a spectral power distribution of reference light which is selected in accordance with a correlated color temperature T of the light emitted from the light-emitting device as measured at a position of the object, (X, Y, Z) denote tristimulus values of the light emitted from the light-emitting device as measured at a position of the object, ($X_{ref}$, $Y_{ref}$, $Z_{ref}$) denote tristimulus values of reference light which is selected in accordance with T of the light emitted from the light-emitting device as measured at a position of the object, a normalized spectral power distribution S(λ) of the light emitted from the light-emitting device as measured at a position of the object, a normalized spectral power distribution $S_{ref}(\lambda)$ of reference light which is selected in accordance with T (K) of the light emitted from the light-emitting device as measured at a position of the object, and a difference ΔS(λ) of between normalized spectral power distributions are respectively defined as $$S(\lambda)=\varphi(\lambda)/Y,$$

$$S_{ref}(\lambda)=\varphi_{ref}(\lambda)/Y_{ref},$$

$$\Delta S(\lambda)=S_{ref}(\lambda)-S(\lambda), \text{ and}$$

in a case where $\lambda_{RL-max}$ (nm) represents a wavelength that provides a longest wavelength local maximum value of S(λ) in a wavelength range of 380 nm or more and 780 nm or less, and when a wavelength Λ4 that is represented by $S(\lambda_{RL-max})/2$ exists on a longer wavelength-side of $\lambda_{RL-max}$, an index $A_{cg}$ represented by the following formula (3-1) satisfies $$-10.0 < A_{cg} \le 120.0,$$

but in a case where $\lambda_{RL-max}$ (nm) represents a wavelength that provides the longest wavelength local maximum value of S(λ) in a wavelength range of 380 nm or more and 780 nm or less, and when the wavelength Λ4 that is represented by $S(\lambda_{RL-max})/2$ does not exist on the longer wavelength-side of $\lambda_{RL-max}$, an index $A_{cg}$ represented by the following formula (3-2) satisfies $$-10.0 < A_{cg} \le 120.0.$$

[Expression 53]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (3\text{-}1)$$

[Expression 54]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (3\text{-}2)$$

<6> a distance $D_{uv}$ of the spectral power distribution φ(λ) of light from a black-body radiation locus defined by ANSI C78.377 satisfies $$-0.0220 \le D_{uv} \le -0.0070;$$

<7> when a maximum value of spectral intensity in a range of 430 nm or more and 495 nm or less is defined as $\varphi_{BM-max}$ and a minimum value of spectral intensity in a range of 465 nm or more and 525 nm or less is defined as $\varphi_{BG-min}$, the spectral power distribution φ(λ) of light satisfies $$0.2250 \le \varphi_{BG-min}/\varphi_{BM-max} \le 0.7000; \text{ and}$$

<8> in the spectral power distribution φ(λ) of light, when a maximum value of spectral intensity in a range of 590 nm or more and 780 nm or less is defined as $\varphi_{RM-max}$, a wavelength $\lambda_{RM-max}$ that provides $\varphi_{RM-max}$ satisfies $$605 \text{ (nm)} \le \lambda_{RM-max} \le 653 \text{ (nm)}.$$

[49]

An illumination method comprising an illuminated object preparing step of preparing an illuminated object and an illuminating step of illuminating an object by light emitted from a light-emitting device having a semiconductor light-emitting element as a light-emitting element and a control element, wherein the light-emitting device at least includes as the light-emitting element a blue semiconductor light-emitting element, a green phosphor, and a red phosphor, and in the illuminating step, when light emitted from the light-emitting element illuminates the object, light measured at a position of the object satisfies all of <1> to <4> described above, and when light emitted from the light-emitting device illuminates the object, light measured at a position of the object also satisfies all of <1> to <4> described above.

[50]

The illumination method according to [49], the light measured at a position of the object satisfies <5> to <8> described above.

The third invention of the present invention can realize a light-emitting device and an illumination method that are capable of realizing a truly favorable appearance of colors of object which, even with substantially similar CCT and substantially similar luminance, many test subjects would statistically determine to be better than a case where illumination is provided by reference light (also referred to as "experimental reference light"), a case where illumination is provided by a light-emitting device that irradiates light of which appearance of colors is close to reference light and which has high $R_a$ and high $R_i$ (also referred to as "experimental pseudo-reference light"), and can improve the appearance of colors of a light-emitting device which currently exists or is currently in use and which includes a semiconductor light-emitting device with inferior appearance of colors to the favorable appearance of colors mentioned above. Furthermore, according to the third invention of the present invention, the appearance of colors of the semiconductor light-emitting device, which excels in the appearance of colors, can be further adjusted according to the taste of the user using a similar technique.

In particular, even with a semiconductor light-emitting device with inferior color appearance when used for illumination purposes, a natural, vivid, highly visible and comfortable appearance of colors and appearance of objects, as if the object are seen outdoors, can be realized. Effects of such a color appearance can be illustrated in more concrete terms as follows.

First, when illuminating by a light-emitting device according to the third invention of the present invention such as a light source, a fixture, or a system or illuminating with the illumination method according to the third invention of the present invention, compared to cases where illumination is performed with experimental reference light or experimental pseudo-reference light, white appears whiter, more natural, and more comfortable even at an approximately similar CCT and/or an approximately similar illuminance.

Furthermore, differences in lightness among achromatic colors such as white, gray, and black become more visible. As a result, for example, black letters or the like on an ordinary sheet of white paper become more legible. Moreover, while details will be given later, such an effect is completely unexpected in the context of conventional wisdom.

Second, with illuminance that is realized by a light-emitting device according to the third invention of the present invention or illuminance when illuminating with the illumination method according to the third invention of the present invention, a truly natural color appearance as though viewed under several tens of thousands of lx such as under outdoor illuminance on a sunny day is achieved for a majority of colors such as purple, bluish purple, blue, greenish blue, green, yellowish green, yellow, reddish yellow, red, and reddish purple, and in some cases, all colors even in an ordinary indoor environment of around several thousand lx to several hundred lx. In addition, the skin colors of subjects (Japanese), various foods, clothing, wooden colors, and the like which have intermediate chroma also acquire a natural color appearance which many of the subjects feel more favorable.

Third, when illuminating by a light-emitting device according to the third invention of the present invention or illuminating with the illumination method according to the third invention of the present invention, colors among close hues can be identified more easily and work or the like can be performed as comfortably as though under a high-illuminance environment as compared to cases where illumination is performed with experimental reference light or experimental pseudo-reference light even at an approximately similar CCT and/or an approximately similar illuminance. Furthermore, specifically, for example, a plurality of lipsticks with similar red colors can be more readily distinguished from each other.

Fourth, when illuminating by a light source, a fixture, or a system according to the third invention of the present invention or illuminating with the illumination method according to the third invention of the present invention, objects can be viewed more clearly and readily as though viewed under a high-illuminance environment as compared to cases where illumination is performed with experimental reference light or experimental pseudo-reference light even at an approximately similar CCT and/or an approximately similar illuminance.

In addition to these effects, the appearance of colors can be further adjusted in accordance with the taste of the user, even in a semiconductor ligh-emitting device which excels in the appearance of colors when used for illumination purposes.

Hereinafter, while the third invention of the present invention will be described in detail, the following description presents differences from the description of the first invention of the present invention. For descriptions common to the first invention and the third invention of the present invention, the description of the first invention of the present invention provided earlier will apply.

While the third invention of the present invention will be described in detail hereinafter, it is to be understood that the third invention of the present invention is not limited to the embodiments described below and that various modifications can be made without departing from the spirit and scope of the invention.

A first aspect of the third invention of the present invention is a light-emitting device. A light-emitting device according to the first aspect of the third invention of the present invention has a light-emitting element and a control element.

The control element according to the first aspect of the third invention of the present invention is a passive element that itself has no amplifying function, and is not especially limited if the intensity modulation for each wavelength can be performed in an appropriate range, on light that is emitted from a light-emitting element or a light-emitting device having relatively low level processing, in the main direction, and can constitute a light-emitting device having high level processing. Examples of the control element of the first aspect of the third invention of the present invention are passive devices, such as a reflection mirror, an optical filter and an optical lens. The control element according to the first aspect of the third invention of the present invention may be an absorption material that is disposed in the sealing material of the packaged LED, so as to perform intensity modulation for each wavelength in an appropriate range. However, a light-emitting element and a reflection mirror, optical filter, an absorption material or the like that can perform intensity modulation, of which wavelength dependency is low, on the light emitted from a light-emitting device having relatively low level processing, are not included in the control element.

An overview of the light-emitting device according to the first aspect of the third invention of the present invention will be further described with reference to FIG. 3-3. In the example of FIG. 3-3, a blue LED chip 302, which is a semiconductor light-emitting element, a green phosphor 341 and a red phosphor 342 are included as light-emitting elements, and a packaged LED 310, which is a light-emitting device having low level processing, is constituted by this light-emitting element and by other constituents, such as encapsulant 306 and packaging material 303. In this case, an optical filter 305 that performs intensity modulation for each wavelength in an appropriate range is disposed in the reliant direction of the light of the packaged LED 310 as the control element, and thereby an LED light bulb 320, which is a light-emitting device having high level processing, is configured as a result. This LED light bulb 320 can be the light-emitting device according to the first aspect of the third invention of the present invention.

An overview of the light-emitting device according to the first aspect of the third invention of the present invention will be further described with reference to FIG. 3-4. It is assumed that a blue LED chip 302, which are semiconductor light-emitting elements, a green phosphor 341 and a red phosphor 342 are included as the light-emitting element, and the packaged LED 310, which is a light-emitting device having low level processing, is constituted by these light-emitting elements and other constituents, such as sealing material 306 and packaging material 303. In this case, an optical filter 305 which functions as a control element is disposed in the radiant direction of the packaged LED 310, and thereby an LED light bulb 320, which is a light-emitting device having high level processing, is configured as a result. This LED light bulb 320 can be the light-emitting device according to the first aspect of the third invention of the present invention. Further, n number of LED light bulbs 320 are disposed and m number of incandescent bulbs 311, which are light-emitting devices having mid-level processing, including a heat filament 52d as the light-emitting element, are disposed, whereby an illumination system 330, which is a light-emitting device having high level processing, is constructed. The illumination system can be the light-emitting device according to the first aspect of the third invention of the present invention.

The light (radiant flux) emitted from the light-emitting element in the main radiant direction that is referred to in this description is a total of the light (radiant flux) emitted from all the light-emitting elements in the main radiant direction, and here this spectral power distribution is denoted as $\Phi_{elm3}$. $\Phi_{elm3}$ is a function of the wavelength λ. $\Phi_{elm3}(\lambda)$ can be measured by performing radiant measurement for the light-emitting device, from which the control element according to this description is removed. In the case of the light-emitting device which includes the LED chip and the phosphor as the light-emitting element, and which has an optical filter that performs intensity modulation for each wavelength in an appropriate range as the control element, as shown in FIG. 3-3, $\Phi_{elm3}(\lambda)$ is acquired if the spectral power distribution of the light irradiated in the main radiant direction from the light-emitting device from which the optical filter is removed is measured. In other words, $\Phi_{elm3}(\lambda)$ can be acquired if the spectral power distribution of the light emitted in the main radiant direction of the packaged LED, which is the light-emitting device having a low level processing is measured.

If there is "a light-emitting device having mid-level processing or a light-emitting device having high level processing" which partially exists in "a light-emitting device having even higher level processing" as shown in FIG. 3-4, then the spectral power distribution of light, which is irradiated in the main radiant direction from the light-emitting device including n number of packaged LEDs and m number of incandescent bulbs in a state where the control element is disabled, can be regarded as $\Phi_{elm3}(\lambda)$.

According to the first aspect of the third invention of the present invention, on the other hand, the spectral power distribution $\Phi_{elm3}(\lambda)$ of the light, emitted from a light-emitting element included in the light-emitting device in a main radiant direction, is controlled by a control element included in the light-emitting device, and the light is then emitted in the "main radiant direction". Therefore, light-emitting devices capable of radiating light including light in a "main radiant direction" which meets requirements of the third invention of the present invention controlled by the control element are to be included in the spirit and scope of the third invention of the present invention. According to the fifth and second aspect of the third invention of the present invention, a method for manufacturing and a method for designing a light-emitting device that can irradiate light, including light in the "main radiant direction" which satisfies the requirement of the third invention of the present invention controlled by the control element, are provided, and manufacturing and designing of the light-emitting device by disposing the control element that belongs to the scope of the third invention of the present invention. In addition, an illumination method according to a fourth aspect of the third invention of the present invention specifies the invention based on light at a position where an object is illuminated in a case where light emitted from the light-emitting device illuminates the object. Therefore, illumination methods used by light-emitting devices capable of emitting light at a "position where an object is illuminated" which meets requirements of the third invention of the present invention by disposing the control element are to be included in the spirit and scope of the third invention of the present invention.

The spectral power distribution of light emitted from the light-emitting device in the main radiant direction is preferably measured at a distance where luminance at the measurement is practical luminance such as between 5 lx and 10000 lx.

Although a light-emitting device according to the first aspect of the third invention of the present invention includes a light-emitting element and has at least a blue semiconductor light-emitting element, a green phosphor and a red phosphor as the light-emitting element, the light-emitting device may include other light-emitting elements. The other light-emitting elements are not particularly limited as long as it can emit light corresponding to a range of 380 nm to 780 nm in some way, and examples of the light-emitting element include thermal emission light from a hot filament or the like, electric discharge emission light from a fluorescent tube, a high-pressure sodium lamp, or the like, stimulated emission light from a laser or the like, spontaneous emission light from a semiconductor light-emitting element, and spontaneous emission light from a phosphor. The light-emitting device according to the first aspect of the third invention of the present invention includes a control element as well, but other configurations are not especially limited. An individual semiconductor light-emitting element to which a lead or the like as a conducting mechanism is added or a packaged LED to which a heat dissipating mechanism is further added and integrated with a phosphor, chip-on-board or the like may be adopted as the light-emitting element. The light-emitting device can be an LED module in which a robust heat dissipating mechanism is added to one or more packaged LEDs and which is generally mounted with a plurality of packaged LEDs may be adopted as the light-emitting device. Furthermore, an LED lighting fixture in which a lens, a reflecting mechanism, and the like are added to a packaged LED may be adopted. Moreover, a lighting system which supports a large number of LED lighting fixtures or the like and which is configured to be capable of illuminating an object may be adopted. Still further, for example, an individual electric discharge tube to which a mechanism capable of applying a high voltage is added or an electric discharge tube having a phosphor arranged in the interior or circumference thereof may be adopted as the light-emitting device according to the first aspect of the third invention of the present invention when the light-emitting device includes an electric discharge tube as the light-emitting element. A lighting fixture in which a plurality of fluorescent tubes incorporating one or more phosphors are disposed may also be adopted. Furthermore, a lighting fixture to which a reflecting mechanism or the like is added may be adopted. Moreover, a control circuit or the like may be added to the lighting fixture to provide a lighting system. The light-emitting device according to the first aspect of the third invention of the present invention encompasses all of the above.

In the third invention of the present invention, the light-emitting element may be a light-emitting device. In other words, the light-emitting element according to the third invention of the present invention may be an LED module, an LED lighting fixture, a lighting system, or a lighting fixture having another mechanism.

On the other hand, a spectral power distribution $\varphi_{SSL3}(\lambda)$ of the light-emitting device itself according to the first aspect of the third invention is based on characteristics when power is being continuously supplied thereto and is characterized by the following indexes.

Specifically, the spectral power distribution $\varphi_{SSL3}(\lambda)$ of the light-emitting device is characterized by a maximum value $\varphi_{SSL3-BM-max}$ of spectral intensity and a wavelength $\lambda_{SSL3\text{-}BM\text{-}max}$ that provides the maximum value $\varphi_{SSL3\text{-}BM\text{-}max}$ of spectral intensity in a range of 430 nm or more and 495 nm or less, a minimum value $\varphi_{SSL3\text{-}BG\text{-}min}$ of spectral intensity and a wavelength $\lambda_{SSL3\text{-}BG\text{-}min}$ that provides the minimum value $\varphi_{SSL3\text{-}BG\text{-}min}$ of spectral intensity in a range of 465 nm or more and 525 nm or less, a maximum value $\varphi_{SSL3\text{-}RM\text{-}max}$ of spectral intensity and a wavelength $\lambda_{SSL3\text{-}RM\text{-}max}$ that provides the maximum value $\varphi_{SSL3\text{-}RM\text{-}max}$ of spectral intensity in a range of 590 nm or more and 780 nm or less, and $\lambda_{SSL3\text{-}RL\text{-}max}$ that provides a longest wavelength local maximum value $\varphi_{SSL3\text{-}RL\text{-}max}$ of a normalized spectral power distribution $S_{SSL3}(\lambda)$ which is derived from the spectral power distribution $\varphi_{SSL3}(\lambda)$ in a range of 380 nm or more and 780 nm or less which is used in the definition of an index $A_{cg}(\varphi_{SSL3}(\lambda))$ to be described later.

Therefore, for example, $\lambda_{CHIP\text{-}BM\text{-}dom}$ generally differs from $\lambda_{SSL3\text{-}BM\text{-}max}$ and $\lambda_{PHOS\text{-}RM\text{-}max}$ also generally differs from $\lambda_{SSL3\text{-}RM\text{-}max}$. On the other hand, $\lambda_{SSL3\text{-}RL\text{-}max}$ may sometimes assume a same value as $\lambda_{SSL3\text{-}RM\text{-}max}$.

Moreover, while a spectral power distribution of light emitted from a light-emitting element may be denoted by $\Phi_{elm3}(\times)$ and a spectral power distribution of light emitted from a light-emitting device may be denoted by $\varphi_{SSL3}(\lambda)$ in the present specification, the spectral power distribution of both lights may be denoted by $\varphi(\lambda)$ in cases of generalization. In a similar manner, in a general spectral power distribution $\varphi(\lambda)$ of light, indexes derived according to same concepts as $\varphi_{SSL3\text{-}BM\text{-}max}$, $\lambda_{SSL3\text{-}BM\text{-}max}$, and the like may sometimes be represented by omitting the suffix SSL3 as $\varphi_{BM\text{-}max}$, $\lambda_{BM\text{-}max}$, and the like.

<Index $A_{cg}(\varphi_{SSL3}(\lambda))$>

The index $A_{cg}(\varphi_{SSL3}(\lambda))$ is defied as below, as disclosed as the index $A_{cg}$ in Japanese Patent No. 5252107 and Japanese Patent No. 5257538.

Let $\varphi_{SSL\text{-}ref3}(\lambda)$ and $\varphi_{SSL3}(\lambda)$ respectively denote spectral power distributions of calculational reference light and test light which represent color stimuli that differ from one another when measuring light emitted in a main radiant direction from a light-emitting device of the first aspect of the third invention of the present invention, $x(\lambda)$, $y(\lambda)$, and $z(\lambda)$ denote a color-matching function, and $(X_{SSL\text{-}ref3}, Y_{SSL\text{-}ref3}, Z_{SSL\text{-}ref3})$ and $(X_{SSL3}, Y_{SSL3}, Z_{SSL3})$ respectively denote tristimulus values corresponding to the calculational reference light and the test light. In this case, the following is satisfied regarding the calculational reference light and the test light, where k denotes a constant.

$$Y_{SSL\text{-}ref3} = k\int \varphi_{SSL\text{-}ref3}(\lambda) \cdot y(\lambda) d\lambda$$

$$Y_{SSL3} = k\int \varphi_{SSL3}(\lambda) \cdot y(\lambda) d\lambda$$

At this point, normalized spectral power distributions obtained by normalizing the spectral power distributions of the calculational reference light and the test light by their respective Y were defined as $$S_{SSL\text{-}ref3}(\lambda) = \varphi_{SSL\text{-}ref3}(\lambda)/Y_{SSL\text{-}ref3} \text{ and}$$

$$S_{SSL3}(\lambda) = \varphi_{SSL3}(\lambda)/Y_{SSL3},$$

and a difference between the normalized reference light spectral power distribution and the normalized test light spectral power distribution was represented by $$\Delta S_{SSL3}(\lambda) = S_{SSL\text{-}ref3}(\lambda) - S_{SSL3}(\lambda).$$

Furthermore, at this point, the index $A_{cg}(\varphi_{SSL3}(\lambda))$ was defined as follows.

$$A_{cg}(\varphi_{SSL3}(\lambda)) = \int_{\Lambda_1}^{\Lambda_2} \Delta S_{SSL3}(\lambda) d\lambda + \int_{\Lambda_2}^{\Lambda_3} (-\Delta S_{SSL3}(\lambda)) d\lambda + \int_{\Lambda_3}^{\Lambda_4} \Delta S_{SSL3}(\lambda) d\lambda \quad \text{[Expression 55]}$$

Moreover, upper and lower limit wavelengths of the integrals were respectively set to $\Lambda 1 = 380$ nm, $\Lambda 2 = 495$ nm, and $\Lambda 3 = 590$ nm.

In addition, $\Lambda 4$ is defined by dividing $\Lambda 4$ into the two cases described below. First, if a wavelength that provides a longest wavelength local maximum value in a range of 380 nm or more and 780 nm or less in a normalized test light spectral power distribution $S_{SSL3}(\lambda)$ is denoted by $\lambda_{SSL3\text{-}RL\text{-}max}$ (nm) and a normalized spectral intensity thereof is denoted by $S_{SSL3}(\lambda_{SSL3\text{-}RL\text{-}max})$, then a wavelength which is on a longer wavelength-side of $\lambda_{SSL3\text{-}RL\text{-}max}$ and which has an intensity of $S_{SSL3}(\lambda_{SSL3\text{-}RL\text{-}max})/2$ is denoted as $\Lambda 4$. If such a wavelength does not exist in a range up to 780 nm, then $\Lambda 4$ is assumed to be 780 nm.

Moreover, while a spectral power distribution of light emitted from a light-emitting element may be denoted by $\Phi_{elm3}(\lambda)$ and a spectral power distribution of light emitted from a light-emitting device may be denoted by $\varphi_{SSL3}(\lambda)$ in the present specification, the spectral power distribution of both lights may be denoted by $\varphi(\lambda)$ in cases of generalization. In a similar manner, in a general spectral power distribution $\varphi(\lambda)$ of light, indexes derived according to same concepts as $S_{SSL3}(\lambda)$ and the like may sometimes be represented by omitting the suffix SSL3 as $S_{SSL3}(\lambda)$ and the like.

<$\varphi_{SSL3\text{-}BG\text{-}min}/\varphi_{SSL3\text{-}BM\text{-}max}$ and $\varphi_{SSL3\text{-}BG\text{-}min}/\varphi_{SSL3\text{-}RM\text{-}max}$>

$\varphi_{SSL3\text{-}BG\text{-}min}$ mainly appears in a portion where a longer wavelength-side tail (a base portion where spectral radiant flux intensity decreases) of a spectral radiant flux due to emission of light by a blue semiconductor light-emitting element and a shorter wavelength side tail (a base portion where spectral radiant flux intensity decreases) of a spectral radiant flux due to emission of light by a light-emitting element responsible for the intermediate wavelength region overlap with each other. In other words, $\varphi_{SSL3\text{-}BG\text{-}min}$ often occurs as a recess with a shape of $\varphi_{SSL3}(\lambda)$ in a range of 465 nm or more and 525 nm or less which straddles the short wavelength region and the intermediate wavelength region.

In order to relatively uniformly improve saturation of color appearance of the 15 specific mathematically-derived Munsell renotation color samples to be described later, $\varphi_{SSL3\text{-}BG\text{-}min}/\varphi_{SSL3\text{-}BM\text{-}max}$ obtained by normalizing $\varphi_{SSL3\text{-}BG\text{-}min}$ with a maximum value of spectral intensity in a range of 430 nm to 495 nm and $\varphi_{SSL3\text{-}BG\text{-}min}/\varphi_{SSL3\text{-}RM\text{-}max}$ obtained by normalizing $\varphi_{SSL3\text{-}BG\text{-}min}$ with a maximum value of spectral intensity in a range of 590 nm to 780 nm must be controlled with care. In other words, in the light-emitting device according to the first aspect of the third invention of the first invention, $\varphi_{SSL3\text{-}BG\text{-}min}/\varphi_{SSL3\text{-}BM\text{-}max}$ and $\varphi_{SSL3\text{-}BG\text{-}min}/\varphi_{SSL3\text{-}RM\text{-}max}$ have optimum ranges as will be described later.

Moreover, while a spectral power distribution of light emitted from a light-emitting element may be denoted by $\Phi_{elm3}(\lambda)$ and a spectral power distribution of light emitted from a light-emitting device may be denoted by $\varphi_{SSL3}(\lambda)$ in the present specification, the spectral power distribution of both lights may be denoted by $\varphi(\lambda)$ in cases of generalization. In a similar manner, in a general spectral power distribution $\varphi(\lambda)$ of light, indexes derived according to same concepts as $\varphi_{SSL3\text{-}BG\text{-}min}$, $\varphi_{SSL3\text{-}RM\text{-}max}$, and the like may sometimes be represented by omitting the suffix SSL3 as $\varphi_{BG\text{-}min}$, $\lambda_{RM\text{-}max}$, and the like.

When the light-emitting device according to the first aspect of the third invention emits test light in the main radiant direction, the a* values and the b* values of the 15 color samples in the CIE 1976 L*a*b* color space of the test light (related to the light-emitting device according to the first aspect of the third invention of the present invention) are to be respectively denoted by $a^*_{nSSL3}$ and $b^*_{nSSL3}$ (where n is a natural number from 1 to 15), and hue angles of the 15 color samples are to be respectively denoted by $\theta_{nSSL3}$ (degrees) (where n is a natural number from 1 to 15). In addition, when mathematically assuming illumination by a calculation reference light (black-body radiation light when lower than 5000 K and CIE daylight when equal to or higher than 5000 K) which is selected in accordance with the correlated color temperature $T_{SSL3}$ of the test light described above, the a* values and the b* values of the 15 color samples in the CIE 1976 L*a*b* color space are to be respectively denoted by $a^*_{nSSL\text{-}ref3}$ and $b^*_{nSSL\text{-}ref3}$ (where n is a natural number from 1 to 15), and hue angles of the 15 color samples are to be respectively denoted by $\theta_{nSSL\text{-}ref3}$ (degrees) (where n is a natural number from 1 to 15). In this case, an absolute value $|\Delta h_{nSSL3}|$ of each difference in hue angles $\Delta h_{nSSL3}$ (degrees) (where n is a natural number from 1 to 15) of each of the 15 Munsell renotation color samples when illuminated by the two types of light may be represented by $|\Delta h_{nSSL3}| = |\theta_{nSSL3} - \theta_{nSSL\text{-}ref3}|$.

Moreover, while a spectral power distribution of light emitted from a light-emitting element may be denoted by $\Phi_{elm3}(\lambda)$ and a spectral power distribution of light emitted from a light-emitting device may be denoted by $\varphi_{SSL3}(\lambda)$ in the present specification, the spectral power distribution of both lights may be denoted by $\varphi(\lambda)$ in cases of generalization. In a similar manner, in a general spectral power distribution $\varphi(\lambda)$ of light, indexes derived according to same concepts as $\Delta h_{nSSL3}$, $\theta_{nSSL3}$, $a^*_{nSSL3}$, and the like may sometimes be represented by omitting the suffix SSL3 as $\Delta h_n$, $\theta_n$, $a^*_n$, and the like. In addition, indexes derived according to same concepts as $\theta_{nSSL\text{-}ref3}$, and the like may sometimes be represented by omitting the suffix SSL3 as $\theta_{nref}$, and the like.

In addition, each saturation difference $\Delta C_{nSSL3}$ (where n is a natural number from 1 to 15) of the 15 Munsell renotation color samples when assuming illumination by the test light and the calculation reference light is represented by $\Delta C_{nSSL3} = \sqrt{\{(a^*_{nSSL3})^2 + (b^*_{nSSL3})^2\}} - \sqrt{\{(a^*_{nSSL\text{-}ref3})^2 + (b^*_{nSSL\text{-}ref3})^2\}}$.

Furthermore, an average saturation difference of the 15 Munsell renotation color samples is represented by $$\frac{\sum_{n=1}^{15} \Delta C_{nSSL3}}{15},$$ [Expression 56]

(hereinafter, may be denoted as $SAT_{ave}(\varphi_{SSL3}(\lambda))$) Moreover, when a maximum saturation difference value of the 15 Munsell renotation color samples is denoted by $\Delta C_{SSL\text{-}max3}$ and a minimum saturation difference value is denoted by $\Delta C_{SSL\text{-}min3}$, a difference between a maximum saturation difference and a minimum saturation difference (difference among differences between maximum and minimum degrees of saturation) is represented by $|\Delta C_{SSL\text{-}max3} - \Delta C_{SSL\text{-}min3}|$.

Moreover, while a spectral power distribution of light emitted from a light-emitting element may be denoted by $\Phi_{elm3}(\lambda)$ and a spectral power distribution of light emitted from a light-emitting device may be denoted by $\varphi_{SSL3}(\lambda)$ in the present specification, the spectral power distribution of both lights may be denoted by $\varphi(\lambda)$ in cases of generalization. In a similar manner, in a general spectral power distribution $\varphi(\lambda)$ of light, indexes derived according to same concepts as $\theta_{nSSL3}$, $a^*_{nSSL3}$, and the like may sometimes be represented by omitting the suffix SSL3 as $\theta_n$, $a^*_n$, and the like. In addition, indexes derived according to same concepts as $\Delta C_{SSL3\text{-}max}$, and the like may sometimes be represented by omitting the suffix SSL3 as $\Delta C_{max}$, and the like.

<Luminous Efficacy of Radiation $K_{SSL3}$ (lm/W) and Luminous Efficacy of a Source $\eta_{SSL3}$ (lm/W)>

Furthermore, when evaluating the test light spectral power distribution $\varphi_{SSL3}(\lambda)$ when measuring light emitted in a main radiant direction from a light-emitting device of the first aspect of the third invention of the present invention, the widely-used definition below was adopted for luminous efficacy of radiation $K_{SSL3}$ (lm/W).

$K_{SSL3} = K_m \times [\int_{380}^{780} \{\varphi_{SSL3}(\lambda) \times V(\lambda)\} d\lambda] / [\int_{380}^{780} \varphi_{SSL3}(\lambda) d\lambda]$ [Expression 57]

In the equation above,
$K_m$: maximum luminous efficacy (lm/W),
$V(\lambda)$: spectral luminous efficiency, and
$\lambda$: wavelength (nm).

Therefore, a luminous efficacy of radiation $K_{SSL3}$ (lm/W) of a test light spectral power distribution $\varphi_{SSL3}(\lambda)$ when measuring light in the main radiant direction emitted from the light-emitting device according to the first aspect of the third invention of the present invention can be described as efficiency inherent in the shape of the spectral power distribution.

On the other hand, light source efficiency $\eta_{SSL3}$ (lm/W) is a quantity indicating how much of power supplied to the light-emitting device according to the first aspect of the third invention of the present invention is converted into a luminous flux.

Furthermore, the luminous efficacy of radiation $K_{SSL3}$ (lm/W) of a test light spectral power distribution $\varphi_{SSL3}(\lambda)$ when measuring light in the main radiant direction emitted from the light-emitting device is efficiency inherent in the shape of the spectral power distribution itself and may be described as a quantity that equals light source efficiency $\eta_{SSL3}$ (lm/W) when assuming that characteristics of all materials constituting the light-emitting device (for example, internal quantum efficiency of semiconductor light-emitting elements, light extraction efficiency, internal quantum efficiency of phosphors, external quantum efficiency, and efficiency related to light transmission characteristics of encapsulants) have 100% efficiency.

Moreover, while a spectral power distribution of light emitted from a light-emitting element may be denoted by $\Phi_{elm3}(\lambda)$ and a spectral power distribution of light emitted from a light-emitting device may be denoted by $\varphi_{SSL3}(\lambda)$ in the present specification, the spectral power distribution of both lights may be denoted by $\varphi(\lambda)$ in cases of generalization. In a similar manner, in a general spectral power distribution $\varphi(\lambda)$ of light, indexes derived according to same concepts as $K_{SSL3}$, $\eta_{SSL3}$, and the like may sometimes be represented by omitting the suffix SSL3 as K, $\eta$, and the like.

The present inventor, first, mathematically and experimentally evaluated whether or not both preferable color appearance and high light source efficiency can be achieved when the index $A_{cg}$ has a value outside a range of −360 or more and −10 or less and particularly a value larger than −10 without a function of a control element. The description of the first invention of the present invention will be applied to this evaluation.

Results of experimental examples and the like presented in the description of the first aspect of the first invention of the present invention reveal that, even with a light-emitting device including a control element according to the first aspect of the third invention of the present invention, the various indexes shown in Tables 1-2 to 1-15 are favorably within appropriate ranges in order to obtain such perception. This requirement also applies to each parameter related to the method for manufacturing a light-emitting device according to the fifth aspect of the third invention of the present invention and to each parameter related to the method for designing a light-emitting device according to the second aspect of the third invention in a similar manner to a light-emitting device according to the first aspect of the third invention described above.

In addition, it was found that, in order to obtain such perception with a illumination method according to the fourth aspect of the third invention of the present invention, the various indexes shown in Tables 1-2 to 1-15 are favorably within appropriate ranges.

In particular, from the results of the test lights judged to be favorable in the visual experiments, in consideration of the characteristics of $|\Delta h_n|$, $SAT_{ave}$, $\Delta C_n$, and $|\Delta C_{max} - \Delta C_{min}|$, it was found that the following trends exist. Specifically, test lights which produced a favorable color appearance or a favorable object appearance had the following characteristics with respect to the color appearance of the 15 color samples when illumination by calculational reference light is assumed and the color appearance of the 15 color samples when illumination by an actually measured test light spectral power distribution is assumed.

The difference in hue angles ($|\Delta h_n|$) of the 15 color samples between illumination by test lights and illumination by calculational reference light is relatively small, and an average saturation, $SAT_{ave}$, of the 15 color samples when illuminated by the test lights had increased in an appropriate range as compared to that when illuminated by the calculational reference light. Moreover, in addition to the average values, individual saturations ($\Delta C_n$) of the 15 color samples also show that none of the respective $\Delta C_n$ of the 15 color samples when illuminated by the test lights was excessively lower or higher than the same values when illuminated by the calculational reference light and were all in appropriate ranges. As a result, the difference among differences between maximum and minimum degrees of saturation $|\Delta C_{max} - \Delta C_{min}|$ was narrow in an appropriate range. When further simplified, it is inferable that an ideal case features small differences in hue angles among the hues of all 15 color samples and a relatively uniform increase in saturation of the 15 color samples within appropriate ranges when assuming illumination by test light as compared to when assuming illumination of the 15 color samples by reference light.

A solid line in FIG. 3-1 represents a normalized test light spectral power distribution of Experimental Example 1 judged to be "dramatically favorable" in the comprehensive judgment shown in Table 1-2. In addition, a dotted line in FIG. 3-1 represents a normalized spectral power distribution of calculational reference light (black-body radiator) calculated based on a CCT of the test light. On the other hand, FIG. 1-7 represents a CIELAB plot related to color appearances of the 15 color samples when assuming illumination in Experimental Example 1 (solid line) and assuming illumination by the calculational reference light (black-body radiator) (dotted line). Moreover, while a direction perpendicular to the plane of paper represents lightness, only a* and b* axes were plotted for the sake of convenience.

Furthermore, FIGS. 1-14 and 3-2 summarize results of Experimental Example 50 judged to be "dramatically favorable" in the comprehensive judgment shown in Table 1-7 in a similar manner to that described above.

In this manner, it is shown that when a favorable color appearance or a favorable object appearance is obtained in the visual experiments, differences in hue angles among the hues of all 15 color samples are small and saturation of the 15 color samples increase relatively uniformly within appropriate ranges when assuming illumination by the test light as compared to when assuming illumination of the 15 color samples by the reference light.

Furthermore, the selection of each saturation difference $\Delta C_n$ described in Condition I is conceivably characterized as follows when considering the results classified into ranks +1 to +5.

Each saturation difference $\Delta C_n$ can be selected from a range of −4.00 or more and 8.00 or less, based on the results of all experimental examples, slightly favorably, each saturation difference $\Delta C_n$ is −3.49 or more and 7.11 or less, based on the results of ranks +2 to +5, favorably, each saturation difference $\Delta C_n$ is −3.33 or more and 7.11 or less, based on the results of ranks +4 to +5, extremely favorably, each saturation difference $\Delta C_n$ is −1.73 or more and 6.74 or less, and based on the result of rank +5, dramatically favorably, each saturation difference $\Delta C_n$ is −0.93 or more and 6.74 or less.

Furthermore, the selection of the $SAT_{ave}$ described in Condition II is conceivably characterized as follows when considering the results classified into ranks +1 to +5.

The $SAT_{ave}$ can be selected from a range of 0.50 or more and 4.00 or less, based on the results of all experimental examples, slightly favorably, the value of $SAT_{ave}$ is 0.53 or more and 3.76 or less, based on the results of ranks +2 to +5, favorably, the $SAT_{ave}$ is 1.04 or more and 3.76 or less, based on the results of ranks +3 to +5, more favorably, the $SAT_{ave}$ is 1.11 or more and 3.76 or less, based on the results of ranks +4 to +5, extremely favorably, the $SAT_{ave}$ is 1.40 or more and 3.76 or less, and based on the result of rank +5, dramatically favorably, the $SAT_{ave}$ is 1.66 or more and 3.76 or less.

Furthermore, the selection of a difference $|\Delta C_{max} - \Delta C_{min}|$ between the maximum saturation difference value and the minimum saturation difference value described in Condition III is conceivably characterized as follows when considering the results classified into ranks +1 to +5.

A difference $|\Delta C_{max} - \Delta C_{min}|$ can be selected from a range of 2.00 or more and 10.00 or less, based on the results of all experimental examples, slightly favorably, the difference $|\Delta C_{max} - \Delta C_{min}|$ is 3.22 or more and 9.52 or less, based on the results of ranks +4 to +5, extremely favorably, the difference $|\Delta C_{max} - \Delta C_{min}|$ is 4.12 or more and 7.20 or less, and based on the result of rank +5, dramatically favorably, the difference $|\Delta C_{max} - \Delta C_{min}|$ is 4.66 or more and 7.10 or less.

Furthermore, the selection of an absolute value of each difference in hue angles $|\Delta h_n|$ described in Condition IV is conceivably characterized as follows when considering the results classified into ranks +1 to +5.

A absolute value of each difference in hue angles $|\Delta h_n|$ can be selected from a range of 0.00 or more and 12.50 or less, based on the results of all experimental examples, slightly favorably, the absolute value of each difference in hue angles $|\Delta h_n|$ is 0.00 or more and 12.43 or less, based on the results of ranks +2 to +5, favorably, the absolute value of each difference in hue angles $|\Delta h_n|$ is 0.01 or more and 12.43 or less, based on the results of ranks +3 to +5, more favorably, the absolute value of each difference in hue angles $|\Delta h_n|$ is 0.02 or more and 12.43 or less, and based on the results of ranks +4 to +5, extremely favorably, the absolute value of each difference in hue angles $|\Delta h_n|$ is 0.02 or more and 9.25 or less.

Moreover, since an absolute value of each difference in hue angles $|\Delta h_n|$ is conceivably desirably 0, by adjusting a lower limit of values thereof, ideally, a range of 0.00 or more and 12.43 or less is more favorably selected, a range of 0.00 or more and 9.25 or less is extremely favorably selected, a range of 0.00 or more and 7.00 or less is more extremely favorably selected, and a range of 0.00 or more and 5.00 or less is further extremely favorably selected.

Furthermore, the selection of an index $A_{cg}$ described in Condition 1 is conceivably characterized as follows when considering the results classified into ranks +1 to +5.

An index $A_{cg}$ can be selected from a range of more than −10.0 and 120.0 or less, based on the results of all experimental examples, slightly favorably, the index is −4.6 or more and 116.3 or less, based on the results of ranks +3 to +5, more favorably, the index is −4.6 or more and 87.7 or less, based on the results of ranks +4 to +5, extremely favorably, the index is −4.6 or more and 70.9 or less, and based on the result of rank +5, dramatically favorably, the index is −1.5 or more and 26.0 or less.

Furthermore, the selection of a $D_{uv}$ described in Condition 2 is conceivably characterized as follows when considering the results classified into ranks +1 to +5.

A distance $D_{uv}$ can be selected from a range of −0.0220 or more and −0.0070 or less, based on the results of all experimental examples, slightly favorably, the distance $D_{uv}$ is −0.0212 or more and −0.0071 or less, based on the results of ranks +3 to +5, more favorably, the distance $D_{uv}$ is −0.0184 or more and −0.0084 or less, based on the results of ranks +4 to +5, extremely favorably, the distance D is −0.0161 or more and −0.0084 or less, and based on the result of rank +5, dramatically favorably, the distance $D_{uv}$ is −0.0145 or more and −0.0085 or less.

Moreover, based on an overall trend, $D_{uv}$ is further dramatically favorably selected from a range of −0.0145 or more and −0.0090 or less, even more dramatically favorably selected from a range of −0.0140 or more and less than −0.0100, and still even more dramatically favorably selected from a range of −0.0135 or more and less than −0.0120.

Furthermore, the selection of a value of $\varphi_{BG\text{-}min}/\varphi_{BM\text{-}max}$ described in Condition 3 is conceivably characterized as follows when considering the results classified into ranks +1 to +5.

A value of $\varphi_{BG\text{-}min}/\varphi_{BM\text{-}max}$ can be selected from a range of 0.2250 or more and 0.7000 or less, based on the results of all experimental examples, slightly favorably, the value of $\varphi_{BG\text{-}min}/\varphi_{BM\text{-}max}$ is 0.2278 or more and 0.6602 or less, based on the results of ranks +4 to +5, extremely favorably, the value of $\varphi_{BG\text{-}min}/\varphi_{BM\text{-}max}$ is 0.2427 or more and 0.6225 or less, and based on the result of rank +5, dramatically favorably, the value of $\varphi_{BG\text{-}min}/\varphi_{BM\text{-}max}$ is 0.2427 or more and 0.5906 or less.

Furthermore, the selection of a wavelength $\lambda_{RM\text{-}max}$ described in Condition 4 is conceivably characterized as follows when considering the results classified into ranks +1 to +5.

A wavelength $\lambda_{RM\text{-}max}$ can be selected from a range of 605 nm or more and 653 nm or less, based on the results of all experimental examples, slightly favorably, the wavelength $\lambda_{RM\text{-}max}$ is selected from a range of 606 nm or more and 652 nm or less, based on the results of ranks +3 to +5, more favorably, the wavelength $\lambda_{RM\text{-}max}$ is 607 nm or more and 647 nm or less, and based on the results of ranks +4 to +5, extremely favorably, the wavelength $\lambda_{RM\text{-}max}$ is 622 nm or more and 647 nm or less.

In addition, based on the trends described so far, $\lambda_{RM\text{-}max}$ is conceivably further extremely favorably selected from a range of 625 nm or more and 647 nm or less.

Furthermore, based on the result of rank +5, $\lambda_{RM\text{-}max}$ is dramatically favorably selected from a range of 630 nm or more and 647 nm or less.

Moreover, based on an overall trend, $\lambda_{RM\text{-}max}$ is conceivably further dramatically favorably selected from a range of 631 nm or more and 647 nm or less.

These are trends that are conceivably required by the light-emitting device according to the first aspect of the third invention of the present invention to have irregularities of appropriate sizes at appropriate positions of the spectral power distribution $\varphi(\lambda)$.

Furthermore, the selection of a wavelength $\lambda_{BM\text{-}max}$ described in Condition 5 is conceivably characterized as follows when considering the results classified into ranks +1 to +5.

A wavelength $\lambda_{BM\text{-}max}$ can be selected from a range of 430 nm or more and 480 nm or less, based on the results of all experimental examples, slightly favorably, the wavelength $\lambda_{BM\text{-}max}$ is selected from a range of 440 nm or more and 460 nm or less, based on the results of ranks +4 to +5, extremely favorably, the wavelength $\lambda_{BM\text{-}max}$ is 447 nm or more and 460 nm or less, and based on the results of rank +5, dramatically favorably, the wavelength $\lambda_{BM\text{-}max}$ is 450 nm or more and 457 nm or less.

In addition, based on an overall trend, $\lambda_{BM\text{-}max}$ is conceivably further dramatically favorably selected from a range of 451 nm or more and 456 nm or less.

These are trends that are conceivably required by the light-emitting device according to the first aspect of the third invention of the present invention to have irregularities of appropriate sizes at appropriate positions of the spectral power distribution $\varphi(\lambda)$.

Furthermore, the selection of a value of $\varphi_{BG\text{-}min}/\varphi_{RM\text{-}max}$ described in Condition 6 is conceivably characterized as follows when considering the results classified into ranks +1 to +5.

A value of $\varphi_{BG\text{-}min}/\varphi_{RM\text{-}max}$ can be selected from a range of 0.1800 or more and 0.8500 or less, based on the results of all experimental examples, slightly favorably, the value of $\varphi_{BG\text{-}min}/\varphi_{RM\text{-}max}$ is 0.1917 or more and 0.8326 or less, based on the results of ranks +3 to +5, more favorably, the value of $\varphi_{BG\text{-}min}/\varphi_{RM\text{-}max}$ is 0.1917 or more and 0.6207 or less, based on the results of ranks +4 to +5, extremely favorably, the value of $\varphi_{BG\text{-}min}/\varphi_{RM\text{-}max}$ is 0.1917 or more and 0.6202 or less, and based on the result of rank +5, dramatically favorably, the value of $\varphi_{BG\text{-}min}/\varphi_{RM\text{-}max}$ is 0.1917 or more and 0.5840 or less.

Furthermore, based on an overall trend, $\varphi_{BG\text{-}min}/\varphi_{RM\text{-}max}$ is conceivably favorably selected from a range of 0.1917 or more and 0.7300 or less.

These are trends that are conceivably required by the light-emitting device according to the first aspect of the third invention of the present invention to have irregularities of appropriate sizes at appropriate positions of the spectral power distribution $\varphi(\lambda)$.

Furthermore, the selection of a luminous efficacy of radiation K (lm/W) described in Condition 7 is conceivably characterized as follows when considering the results classified into ranks +1 to +5.

A luminous efficacy of radiation K (lm/W) can be selected from a range of 210.0 (lm/W) or more and 290.0 (lm/W) or less, based on the results of all experimental examples, slightly favorably, the luminous efficacy of radiation K (lm/W) is selected from a range of 212.2 (lm/W) or more and 286.9 (lm/W) or less, based on the results of ranks +2 to +5, favorably, the luminous efficacy of radiation K (lm/W) is 212.2 (lm/W) or more and 282.3 (lm/W) or less, based on the results of ranks +4 to +5, extremely favorably, the luminous efficacy of radiation K (lm/W) is 212.2 (lm/W) or more and 261.1 (lm/W) or less, and based on the results of rank +5, dramatically favorably, the luminous efficacy of radiation K (lm/W) is 212.2 (lm/W) or more and 256.4 (lm/W) or less.

Furthermore, the selection of a correlated color temperature T (K) described in Condition 8 is conceivably characterized as follows when considering the results classified into ranks +1 to +5.

A correlated color temperature T (K) can be selected from a range of 2600 (K) or more and 7700 (K) or less, based on the results of all experimental examples, slightly favorably, the correlated color temperature T (K) is 2644 (K) or more and 7613 (K) or less, and based on the results of ranks +4 to +5, dramatically favorably, the correlated color temperature T (K) is 2644 (K) or more and 6797 (K) or less.

Next, the inventor introduced a control element, which was produced in the experiment described above, to the LED light source/fixture/system which does not include a control element, and extracted the meteorological characteristics and photometric characteristics of the spectral power distribution of the light irradiated from the light-emitting device which includes the control element, based on the measured spectrum. In other words, the characteristics of numeric values, such as the index $A_{cg}$, the luminous efficacy of radiation K (lm/W), CCT (K) and $D_{uv}$ of the light emitted from each light-emitting area and the light-emitting device in the main radiant direction, were extracted. At the same time, differences between color appearances of the 15 color samples when assuming illumination by calculational reference lights and color appearances of the 15 color samples when assuming a test light spectral power distribution actually measured were also compiled using $|\Delta h_n|$, $SAT_{ave}$, $\Delta C_n$, and $|\Delta C_{max} - \Delta C_{min}|$ as indices. Moreover, while values of $|\Delta h_n|$ and $\Delta C_n$ vary when n is selected, in this case, maximum and minimum values are shown. These values are also described in Tables 3-16, 3-17 and 3-18.

In concrete terms, the inventor experimented how $\Phi_{elm3}(\lambda)$, which is the spectral power distribution of the light emitted from the light-emitting element in the main radiant direction, and $\varphi_{SSL3}(\lambda)$, which is the spectral power distribution of the light emitted from the light-emitting device in the main radiant direction, will change if the control element is included.

The experiments related to the third invention of the present invention will now be described.

Experimental Example 301

Figures 1, 2, 3, 4, 5:
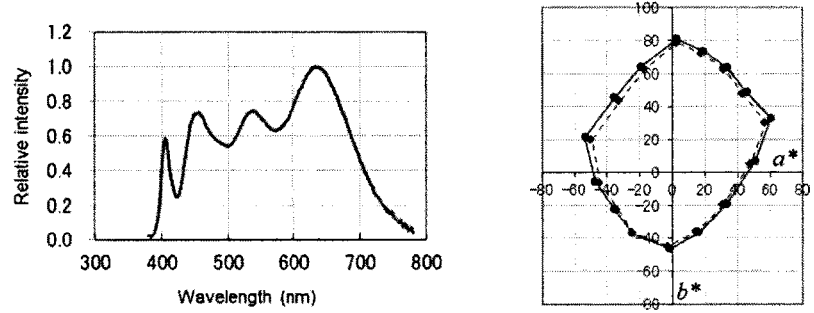
Figures 1, 2, 3, 4, 5, 6, 7:
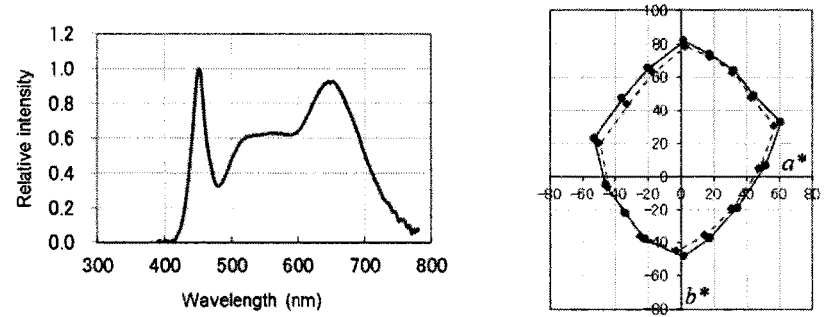
Figures 1, 2, 3, 4, 5, 6, 7, 8:
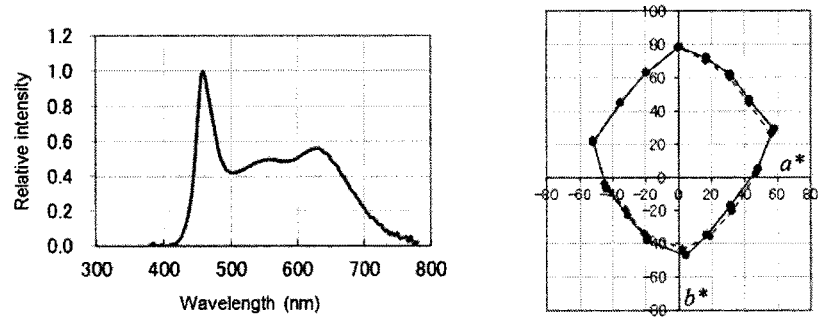
Figures 1, 2, 3, 4, 5, 6, 7, 8, 9, 10:
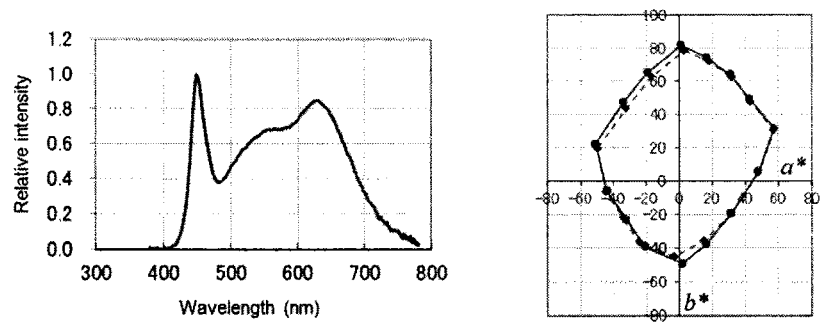
Figures 1, 2, 3, 4, 5, 6, 7, 8, 9, 10, 11:
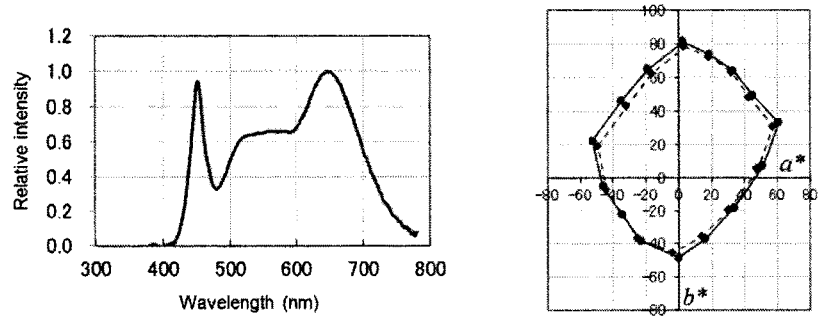
Figures 1, 2, 3, 4, 5, 6, 7, 8, 9, 10, 11, 12:
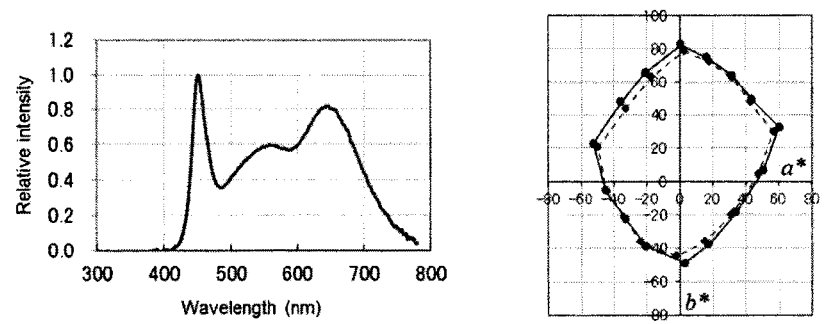
Figures 1, 2, 3, 4, 5, 6, 7, 8, 9, 10, 11, 12, 13:
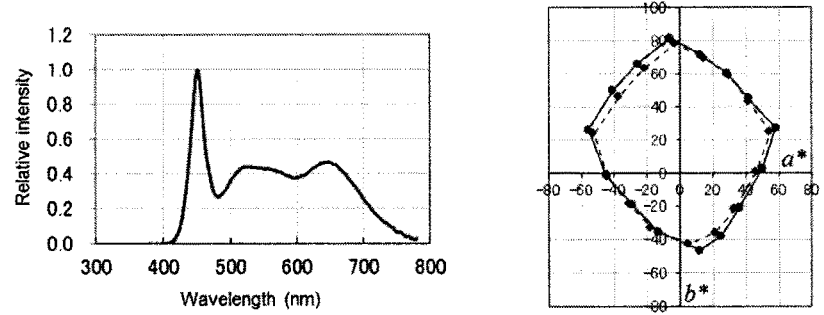
Figures 1, 2, 3, 4, 5, 6, 7, 8, 9, 10, 11, 12, 13, 14:
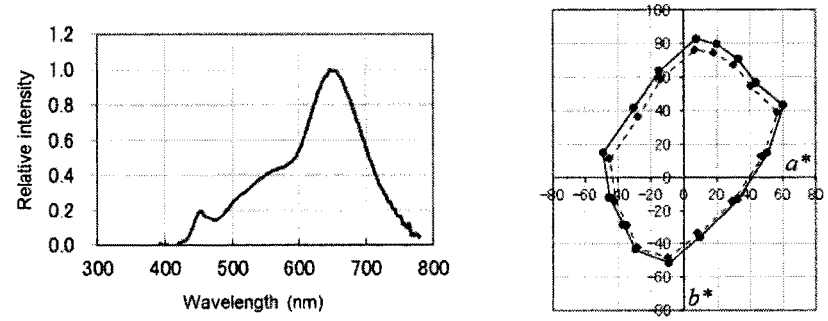
Figures 1, 2, 3, 4, 5, 6, 7, 8, 9, 10, 11, 12, 13, 14, 15:
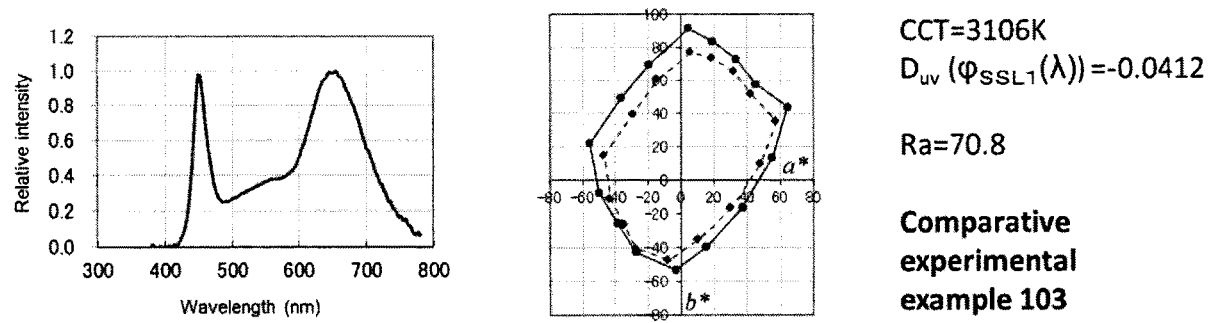
Figures 1, 2, 3, 4, 5, 6, 7, 8, 9, 10, 11, 12, 13, 14, 15, 16:
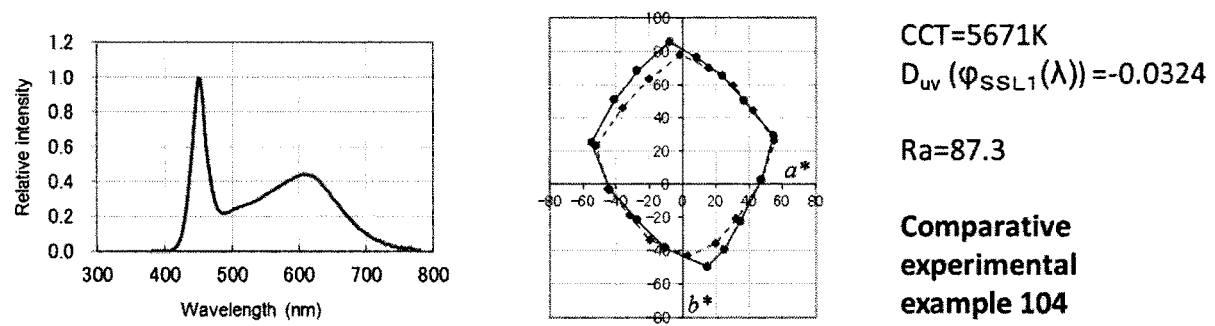
Figures 1, 2, 3, 4, 5, 6, 7, 8, 9, 10, 11, 12, 13, 14, 15, 16, 17:
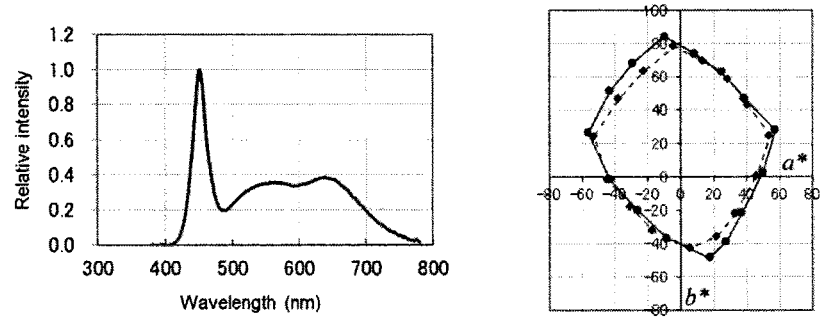
Figures 1, 2, 3, 4, 5, 6, 7, 8, 9, 10, 11, 12, 13, 14, 15, 16, 17, 18:
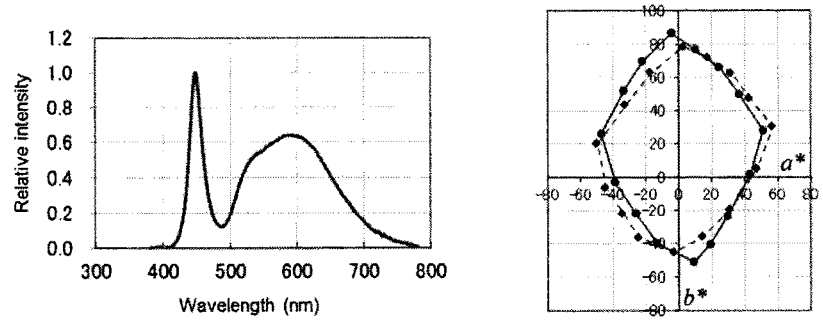
Figures 1, 2, 3, 4, 5, 6, 7, 8, 9, 10, 11, 12, 13, 14, 15, 16, 17, 18, 19:
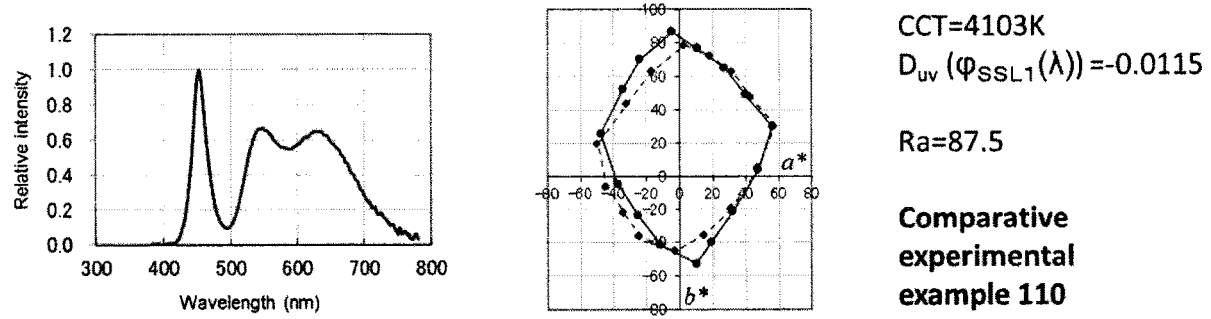
Figures 1, 2, 3, 4, 5, 6, 7, 8, 9, 10, 11, 12, 13, 14, 15, 16, 17, 18, 19, 20:
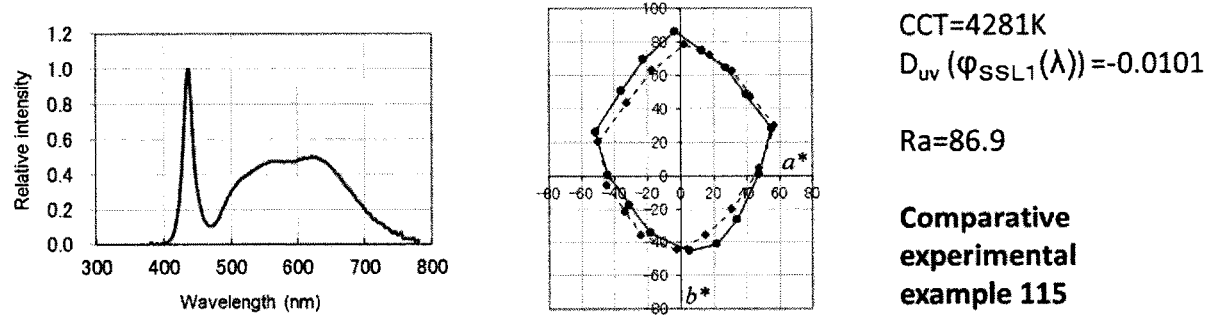
Figures 1, 2, 3, 4, 5, 6, 7, 8, 9, 10, 11, 12, 13, 14, 15, 16, 17, 18, 19, 20, 21:
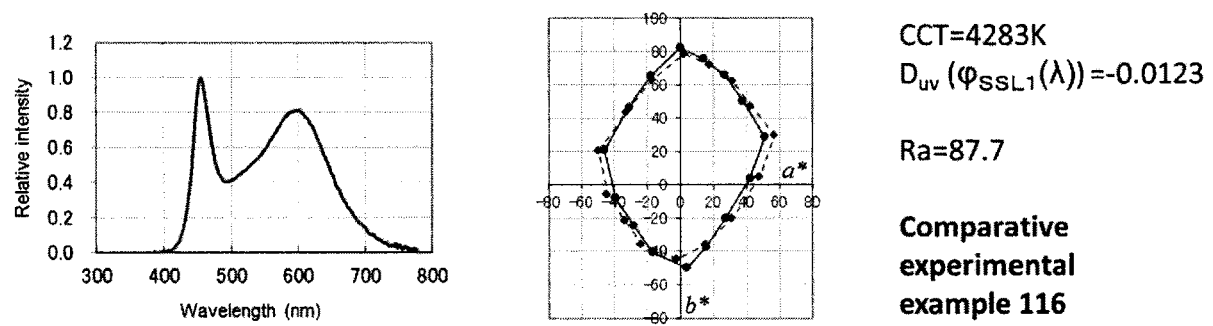
Figures 1, 2, 3, 4, 5, 6, 7, 8, 9, 10, 11, 12, 13, 14, 15, 16, 17, 18, 19, 20, 21, 22:
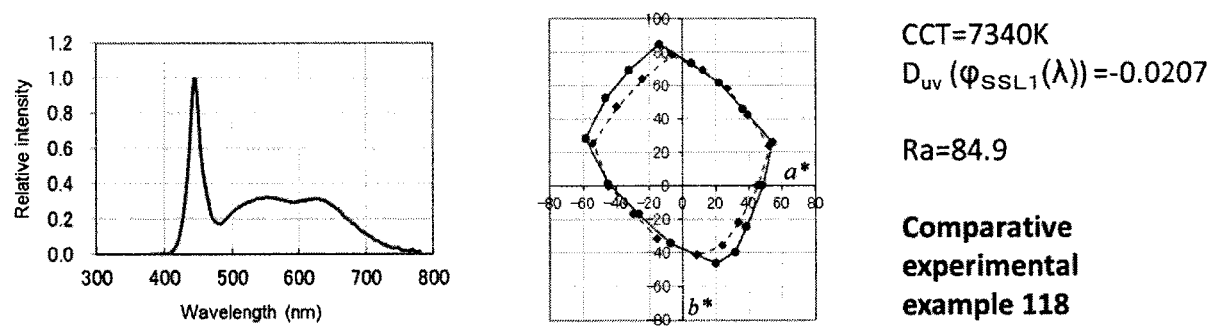
Figures 1, 2, 3, 4, 5, 6, 7, 8, 9, 10, 11, 12, 13, 14, 15, 16, 17, 18, 19, 20, 21, 22, 23:
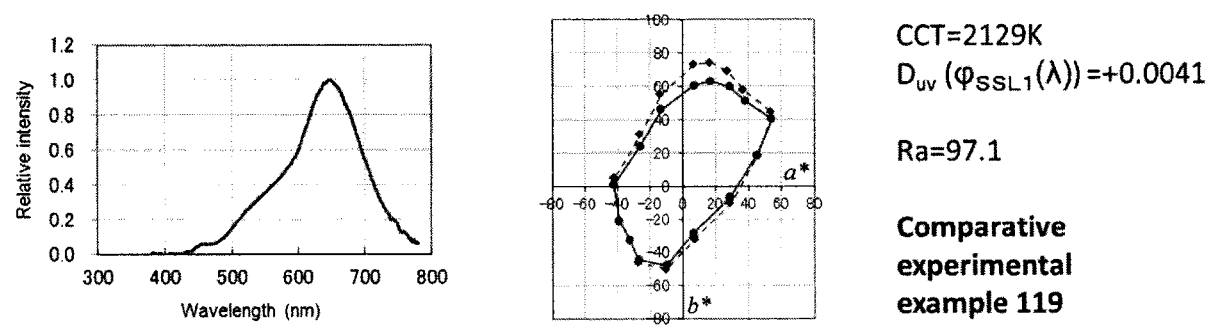
Figures 1, 2, 3, 4, 5, 6, 7, 8, 9, 10, 11, 12, 13, 14, 15, 16, 17, 18, 19, 20, 21, 22, 23, 24:
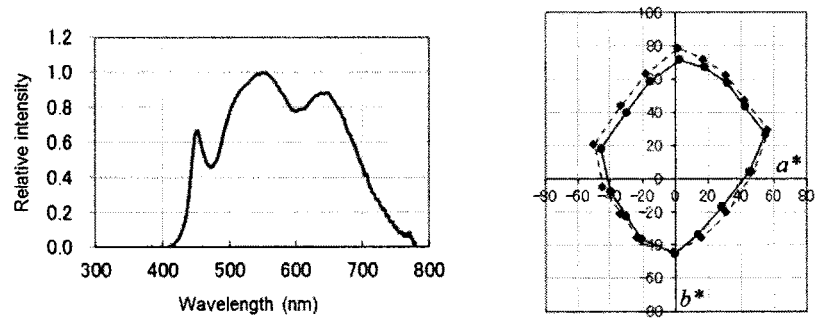
Figures 1, 2, 3, 4, 5, 6, 7, 8, 9, 10, 11, 12, 13, 14, 15, 16, 17, 18, 19, 20, 21, 22, 23, 24, 25, 26:
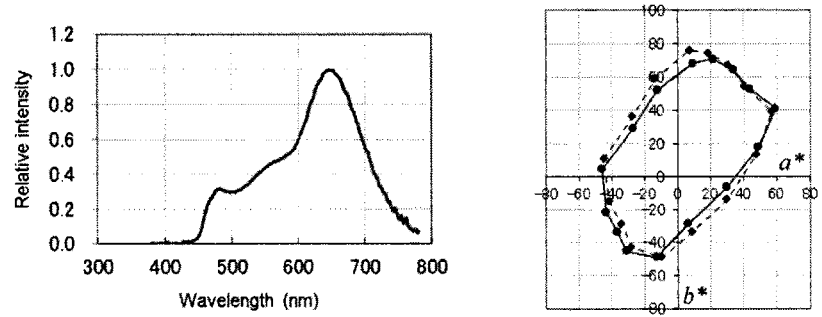
Figures 1, 2:
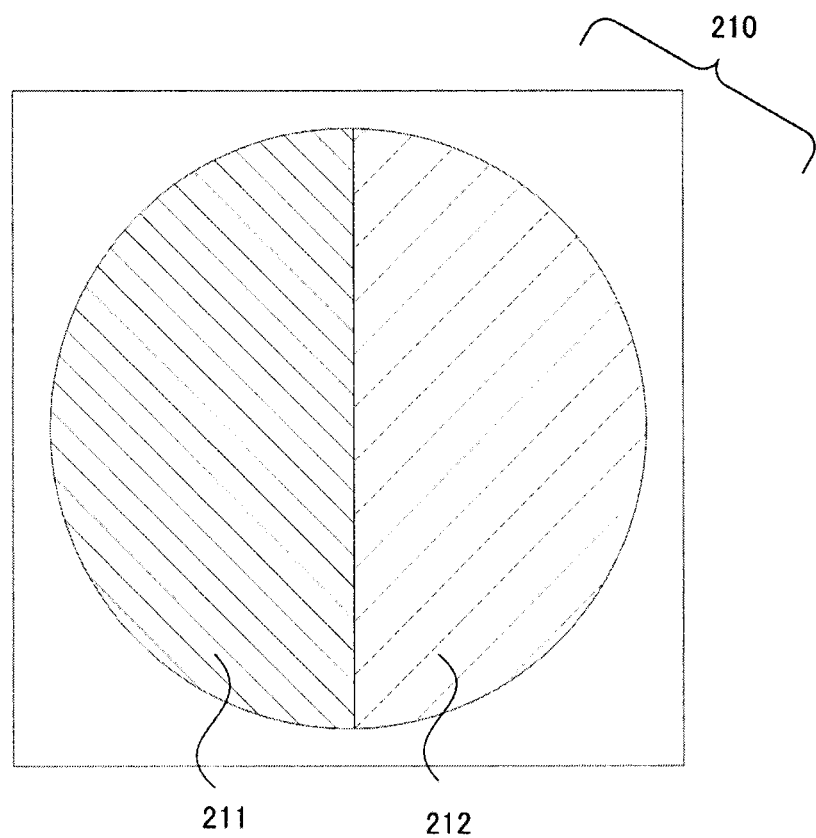
Figure 2:
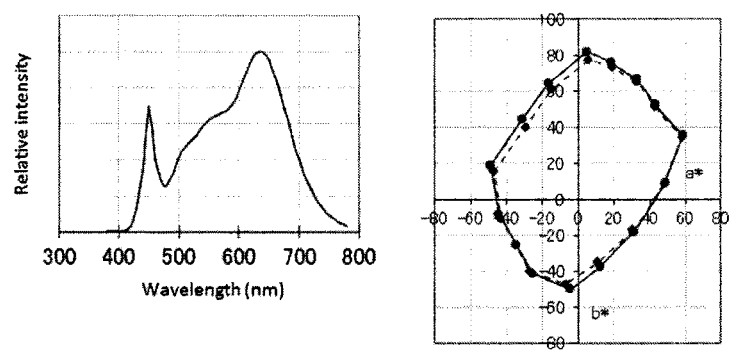
Figures 2, 3:
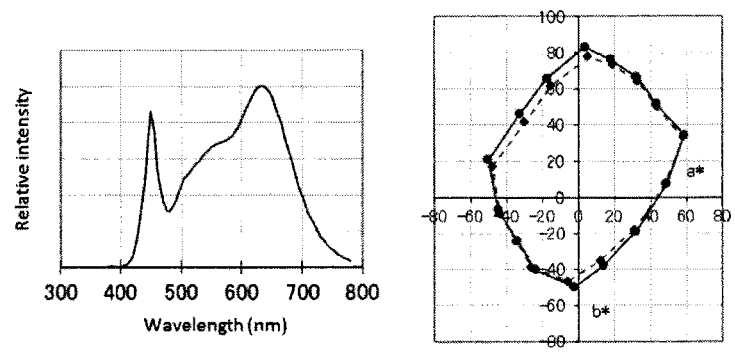
Figures 2, 3, 4, 5:
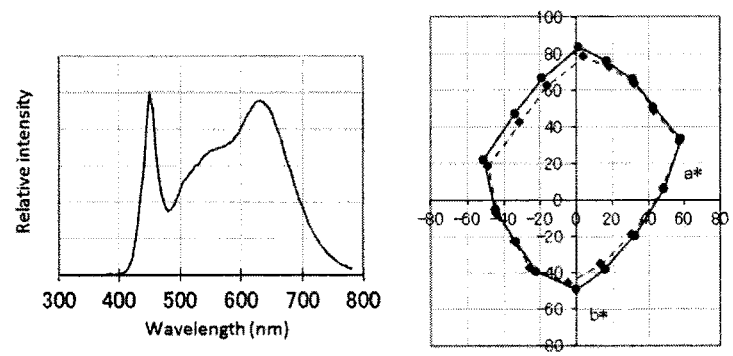
Figures 2, 3, 4, 5, 6:
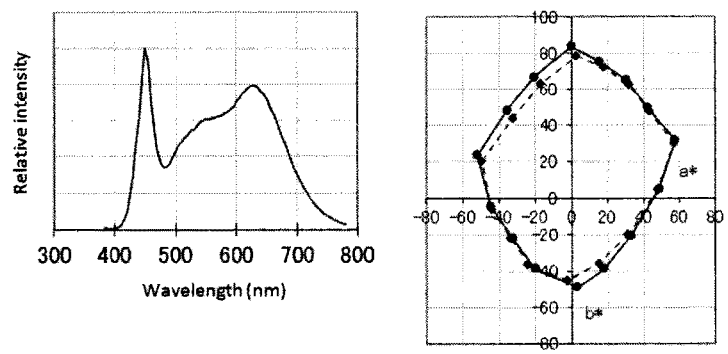
Figures 2, 3, 4, 5, 6, 7:
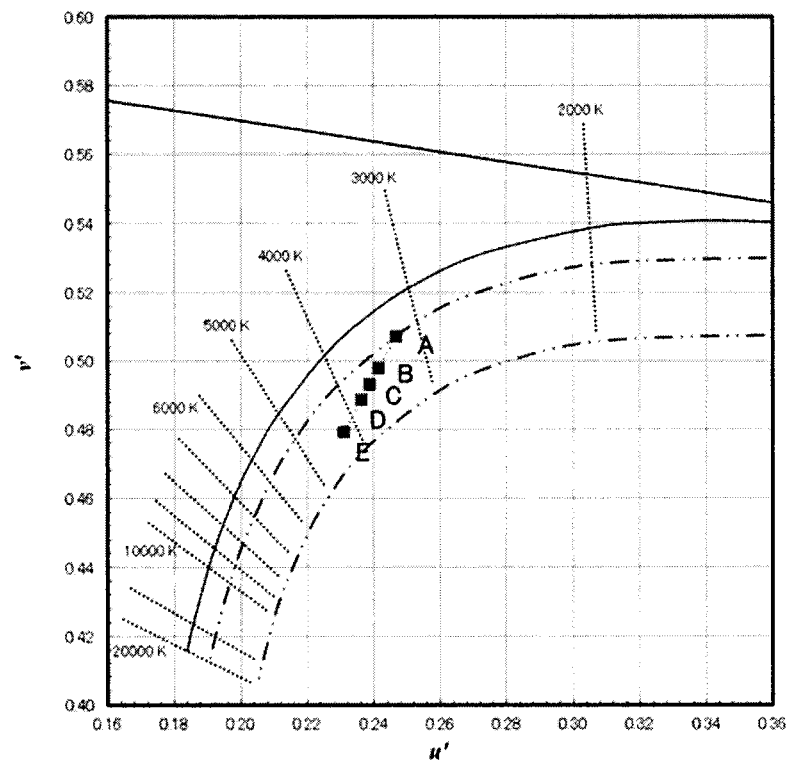
Figures 2, 3, 4, 5, 6, 7, 8:
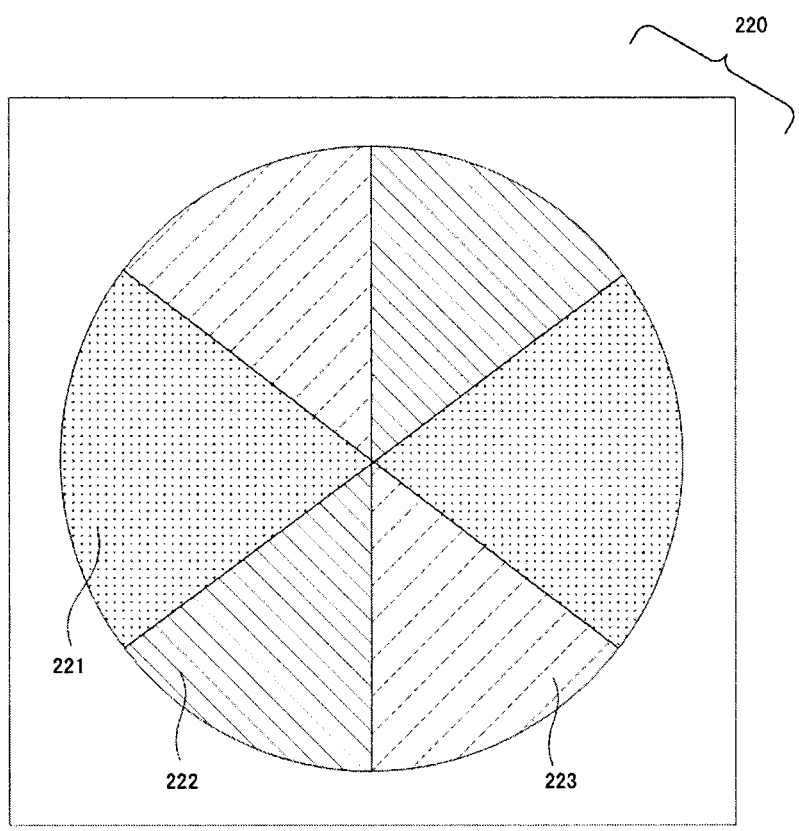
Figures 2, 3, 4, 5, 6, 7, 8, 9:
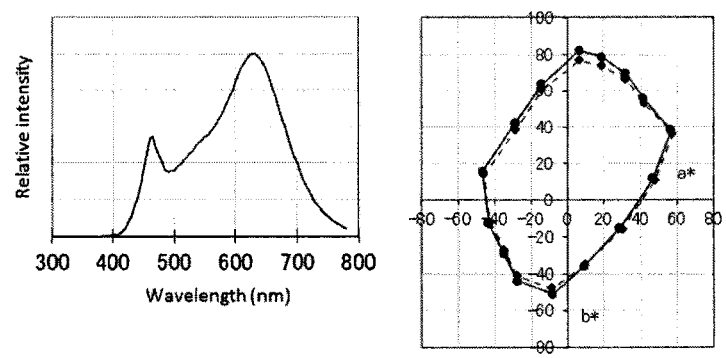
Figures 2, 3, 4, 5, 6, 7, 8, 9, 10:
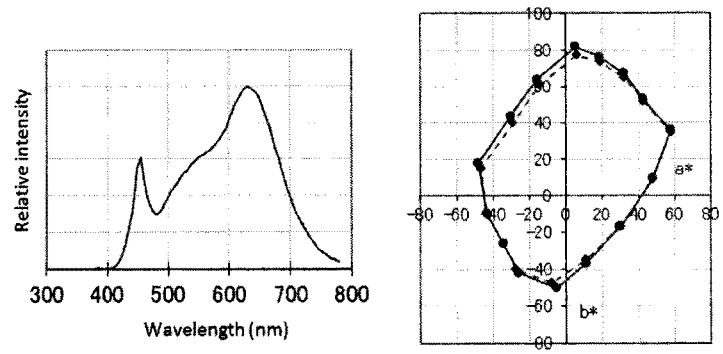
Figures 2, 3, 4, 5, 6, 7, 8, 9, 10, 11:
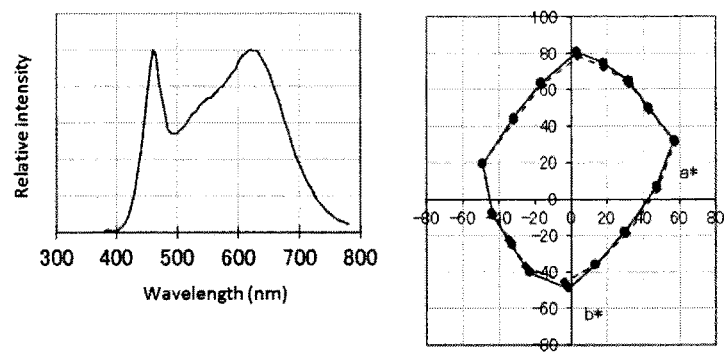
Figures 2, 3, 4, 5, 6, 7, 8, 9, 10, 11, 12, 13:
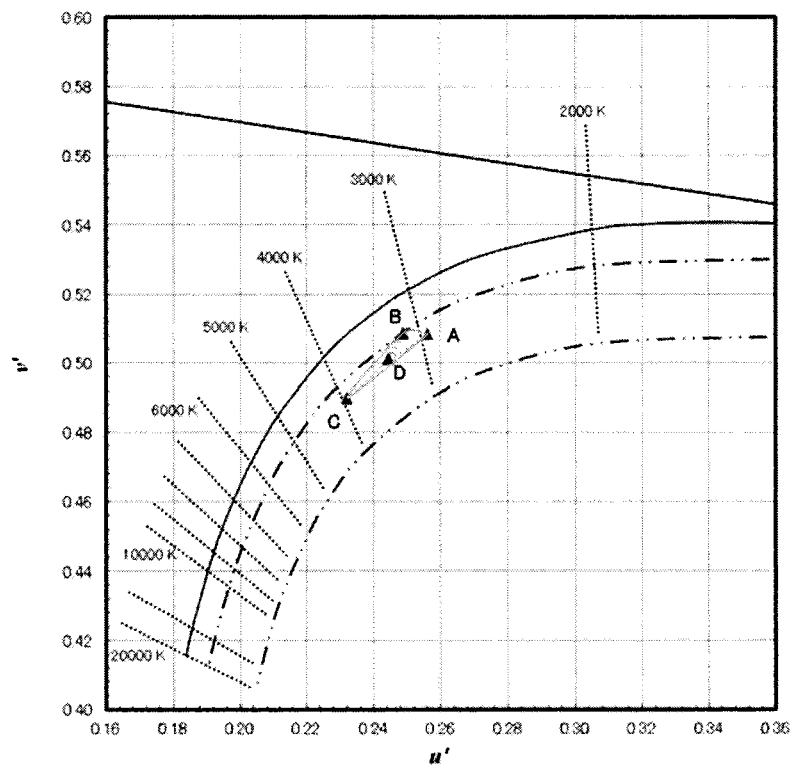
Figures 2, 3, 4, 5, 6, 7, 8, 9, 10, 11, 12, 13, 14:
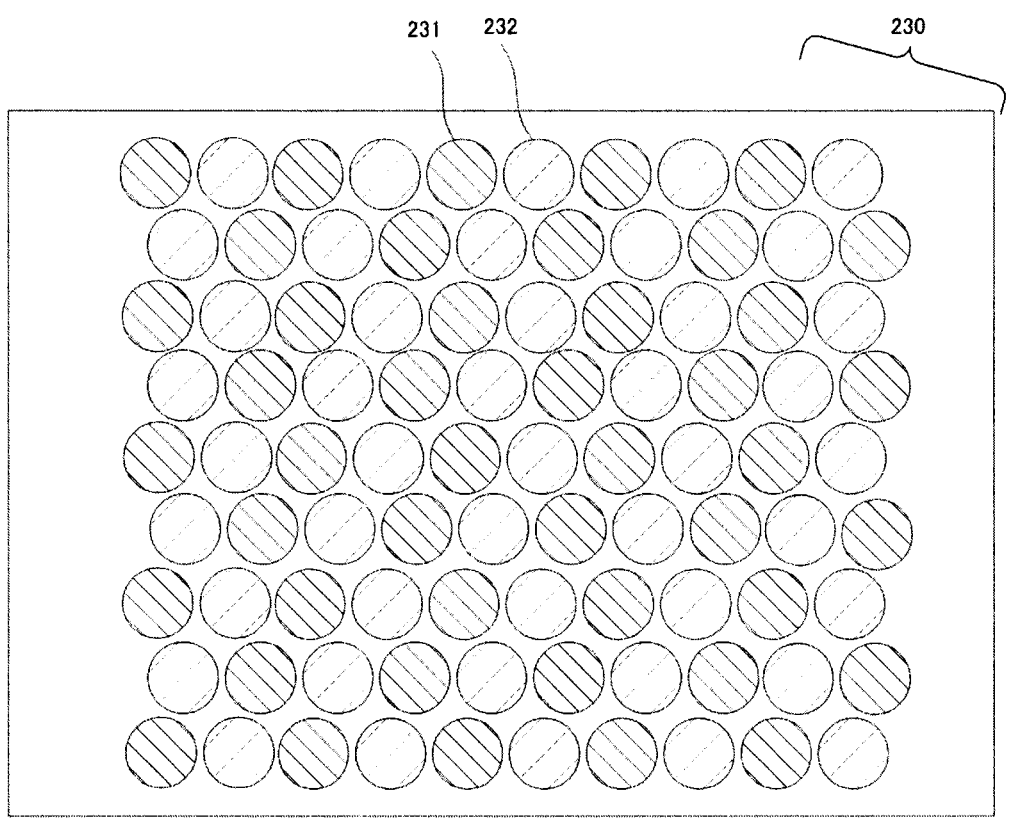
Figures 2, 3, 4, 5, 6, 7, 8, 9, 10, 11, 12, 13, 14, 15:
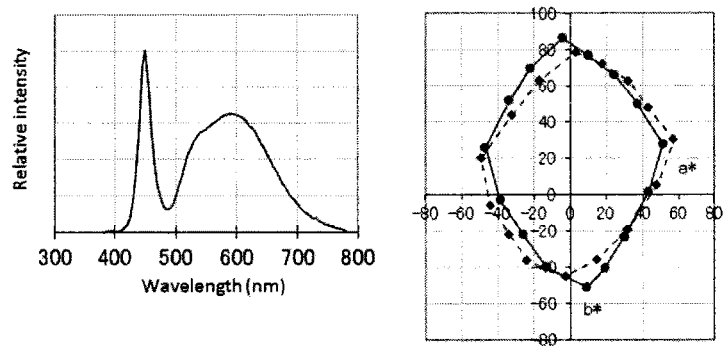
Figures 2, 3, 4, 5, 6, 7, 8, 9, 10, 11, 12, 13, 14, 15, 16, 17:
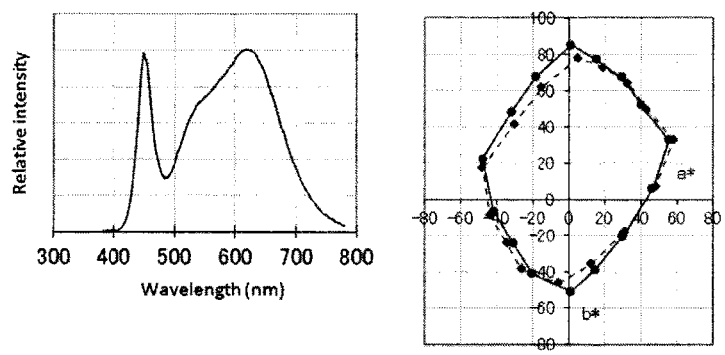
Figures 2, 3, 4, 5, 6, 7, 8, 9, 10, 11, 12, 13, 14, 15, 16, 17, 18:
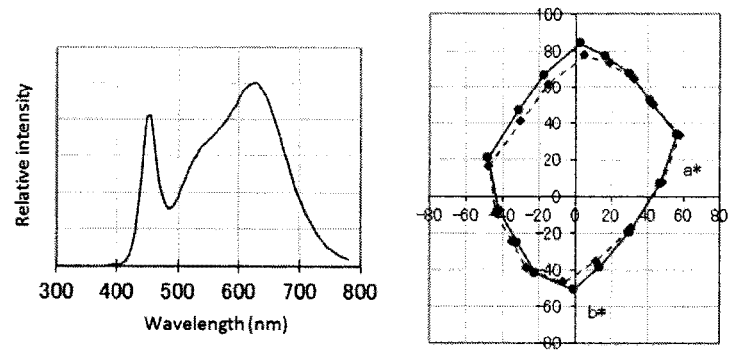
Figures 2, 3, 4, 5, 6, 7, 8, 9, 10, 11, 12, 13, 14, 15, 16, 17, 18, 19:
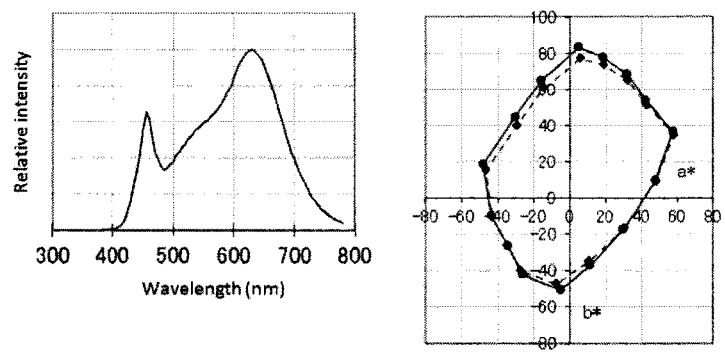
Figures 2, 3, 4, 5, 6, 7, 8, 9, 10, 11, 12, 13, 14, 15, 16, 17, 18, 19, 20:
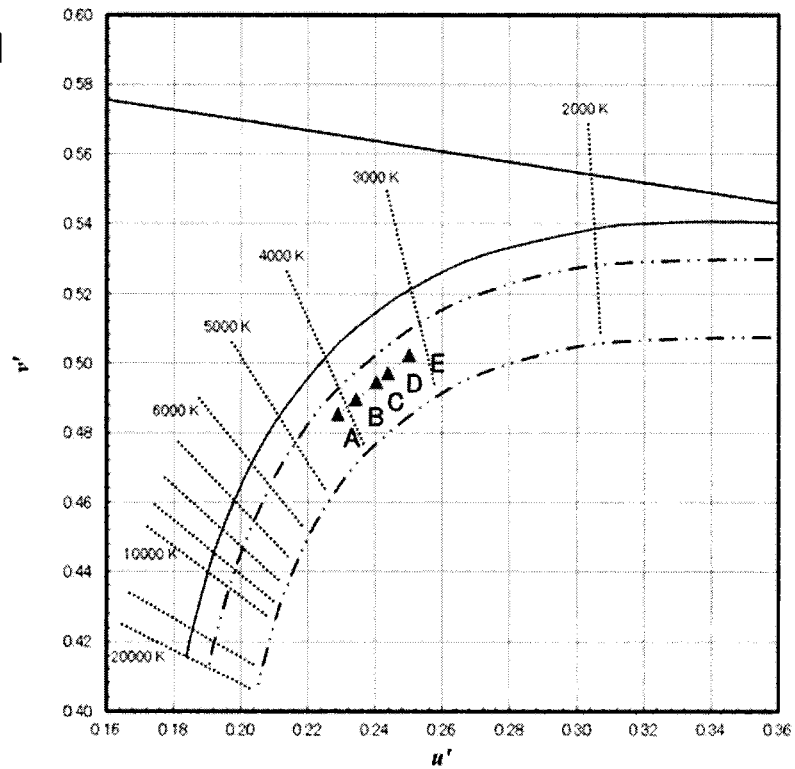
Figures 2, 3, 4, 5, 6, 7, 8, 9, 10, 11, 12, 13, 14, 15, 16, 17, 18, 19, 20, 21:
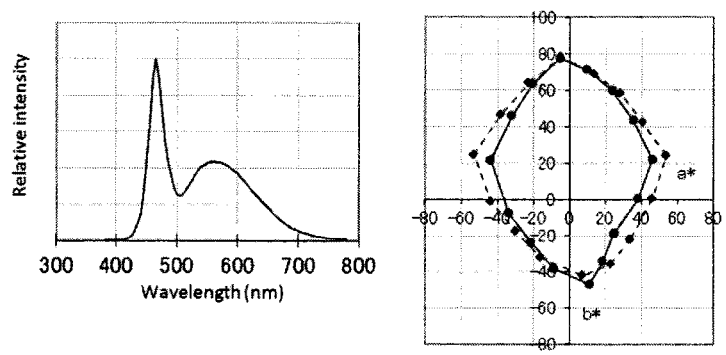
Figures 2, 3, 4, 5, 6, 7, 8, 9, 10, 11, 12, 13, 14, 15, 16, 17, 18, 19, 20, 21, 22, 23:
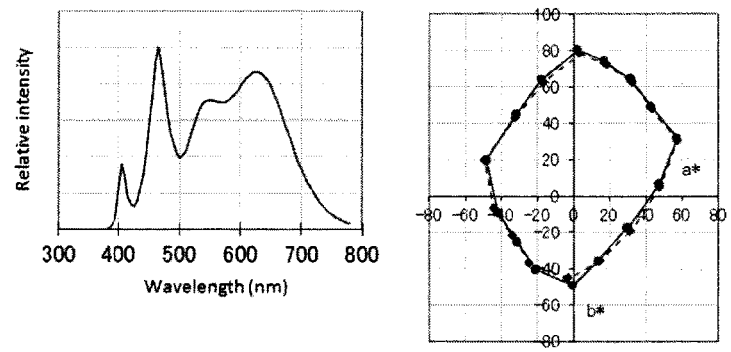
Figures 2, 3, 4, 5, 6, 7, 8, 9, 10, 11, 12, 13, 14, 15, 16, 17, 18, 19, 20, 21, 22, 23, 24, 25, 26:
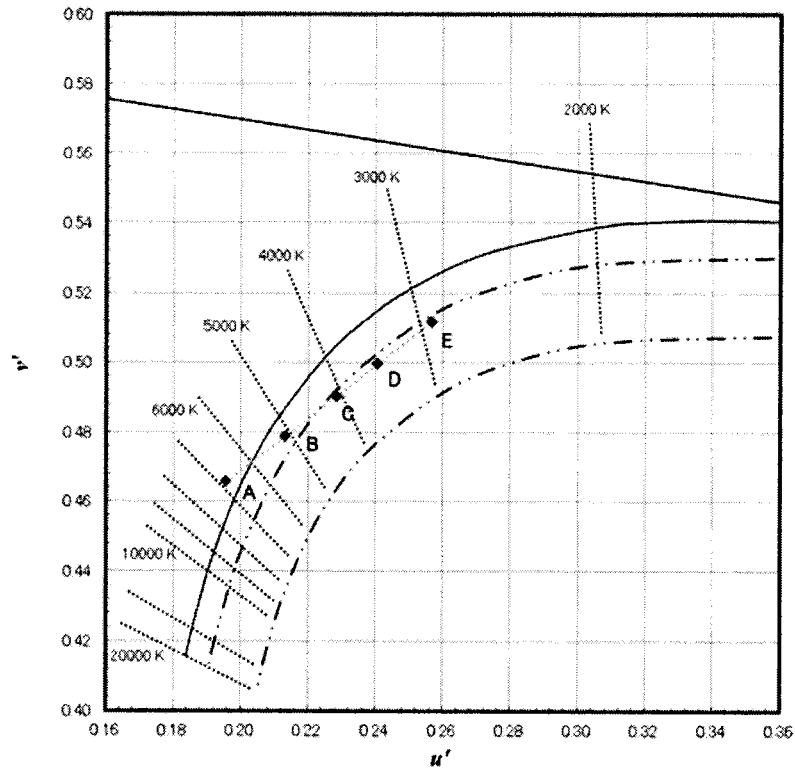
Figures 2, 3, 4, 5, 6, 7, 8, 9, 10, 11, 12, 13, 14, 15, 16, 17, 18, 19, 20, 21, 22, 23, 24, 25, 26, 27:
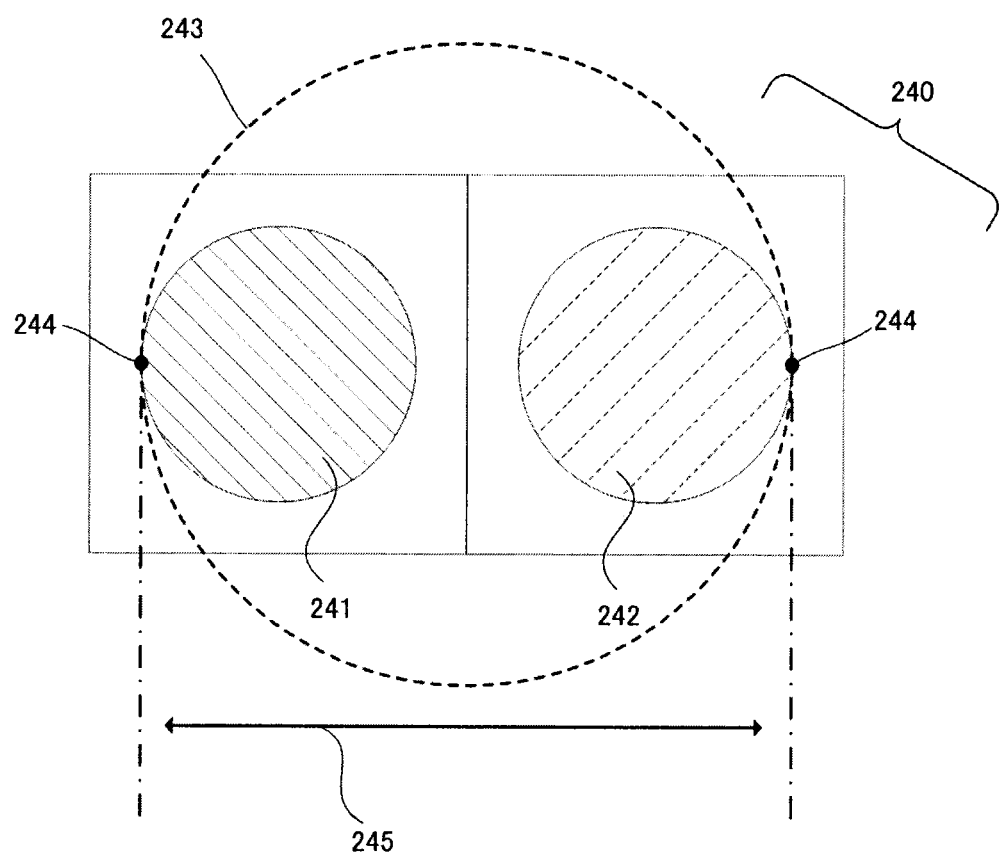
Figures 2, 3, 4, 5, 6, 7, 8, 9, 10, 11, 12, 13, 14, 15, 16, 17, 18, 19, 20, 21, 22, 23, 24, 25, 26, 27, 28:
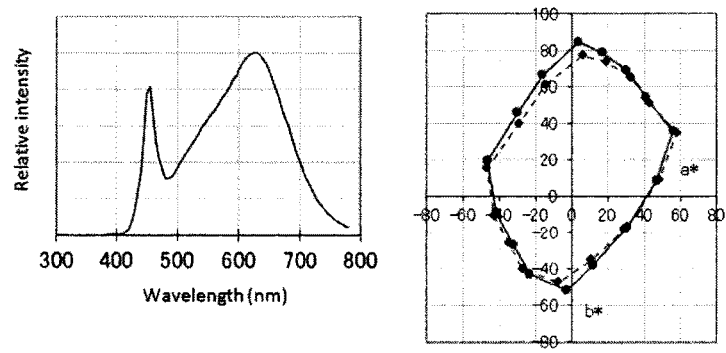
Figures 2, 3, 4, 5, 6, 7, 8, 9, 10, 11, 12, 13, 14, 15, 16, 17, 18, 19, 20, 21, 22, 23, 24, 25, 26, 27, 28, 29:
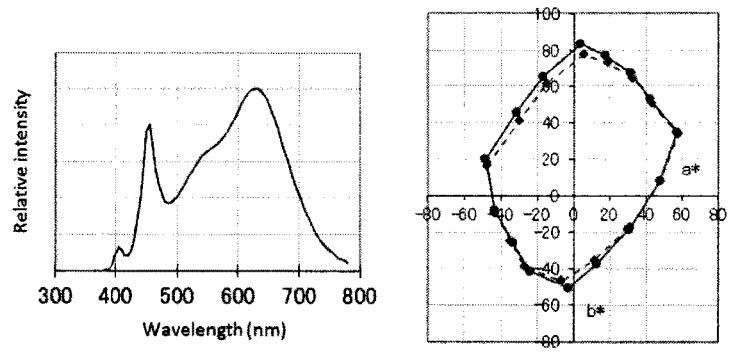
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30:
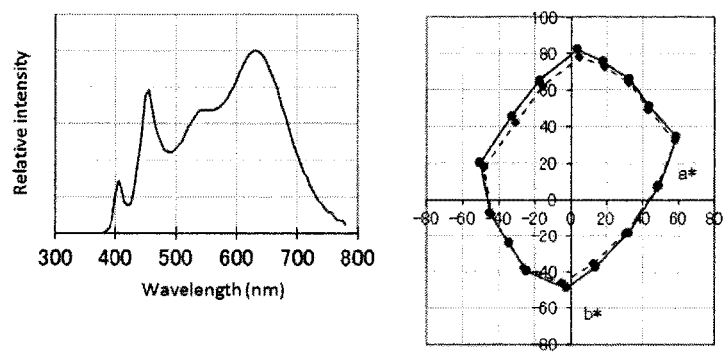
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31:
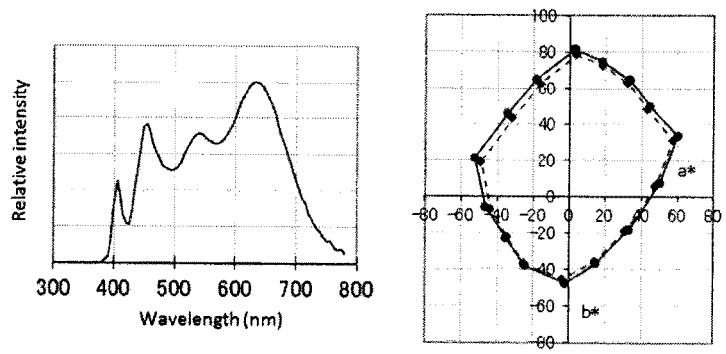
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33:
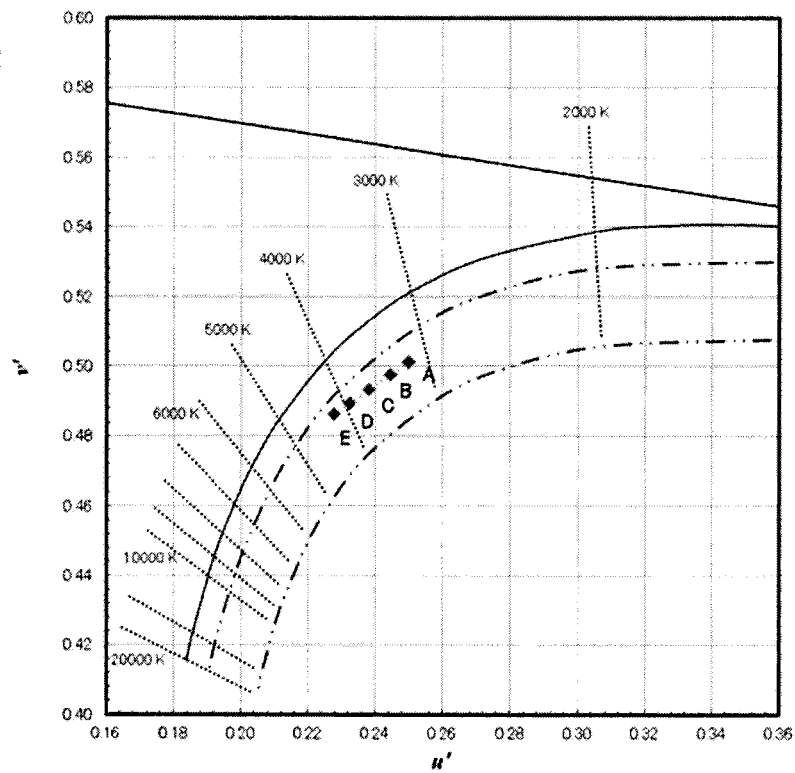
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34:
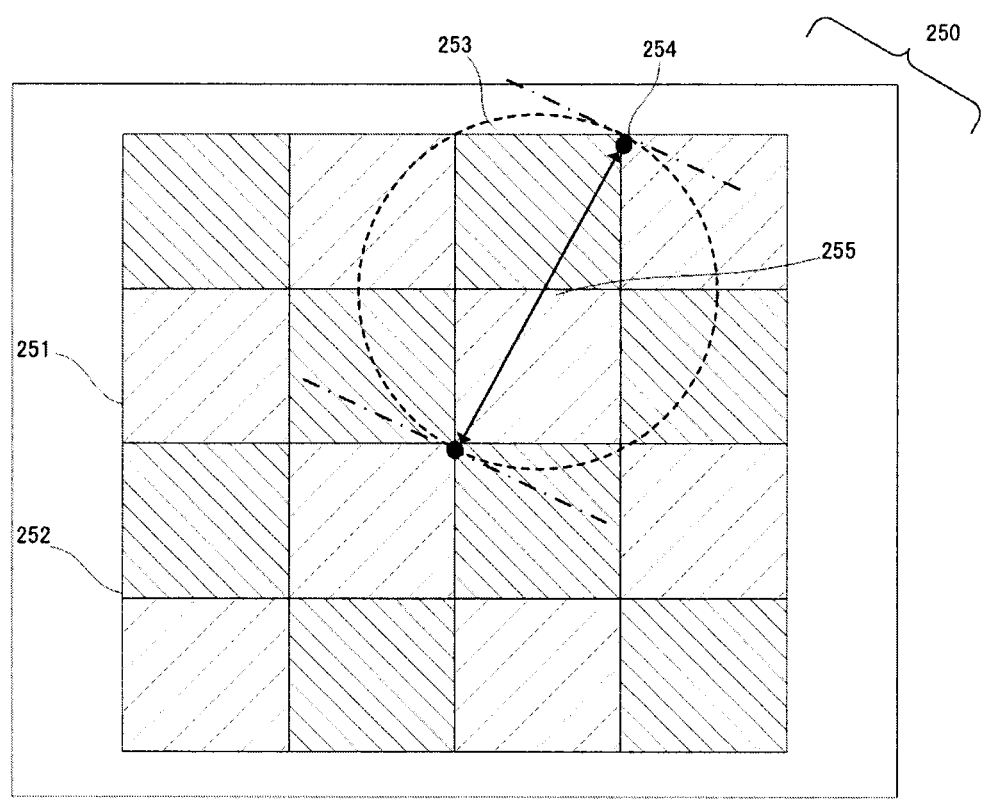
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35:
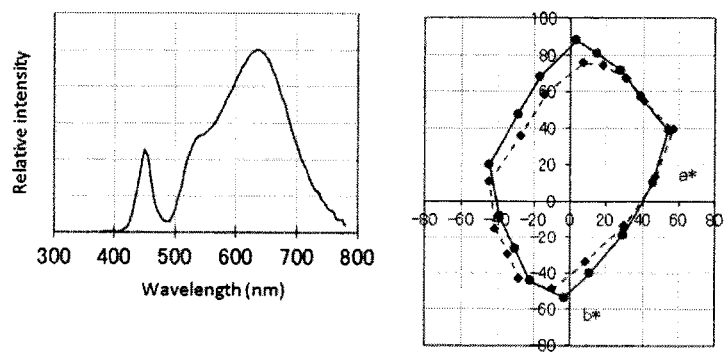
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36:
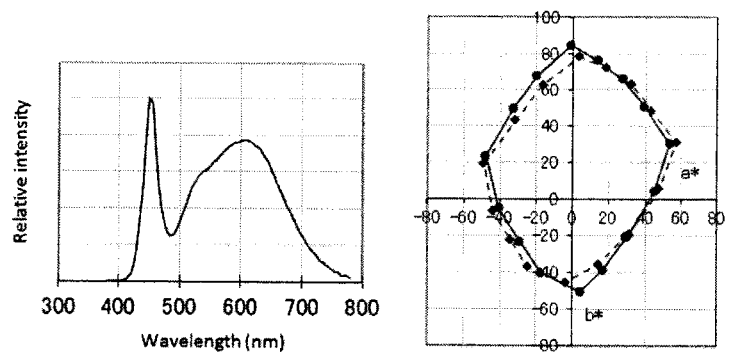
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37:
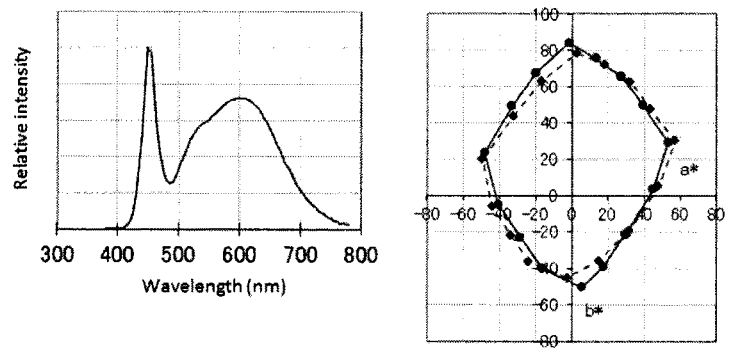
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38:
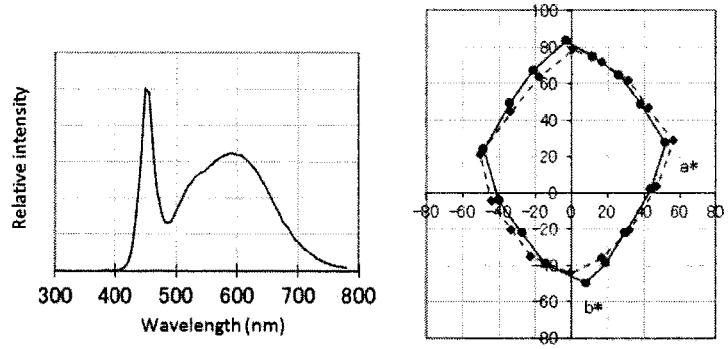
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39:
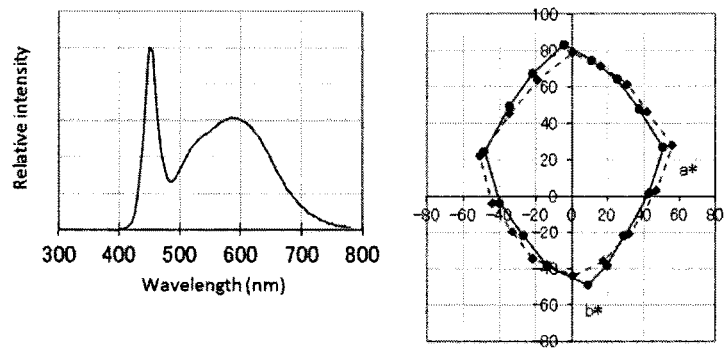
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40:
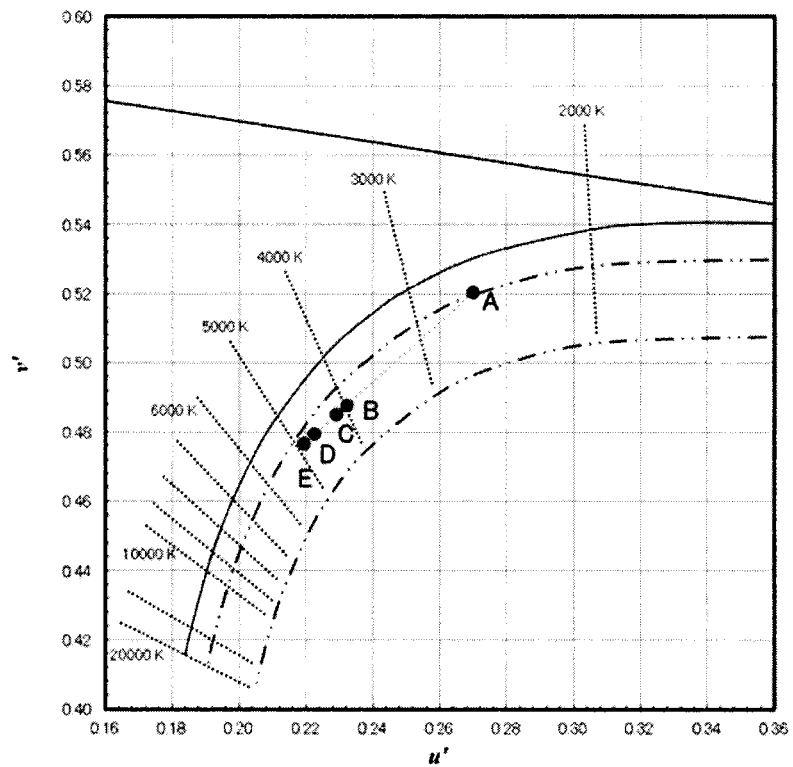
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41:
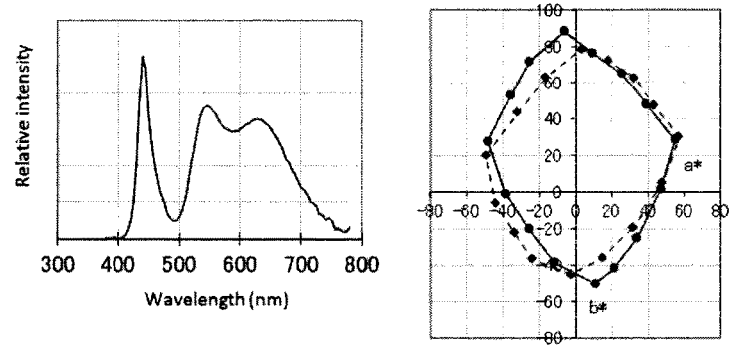
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42:
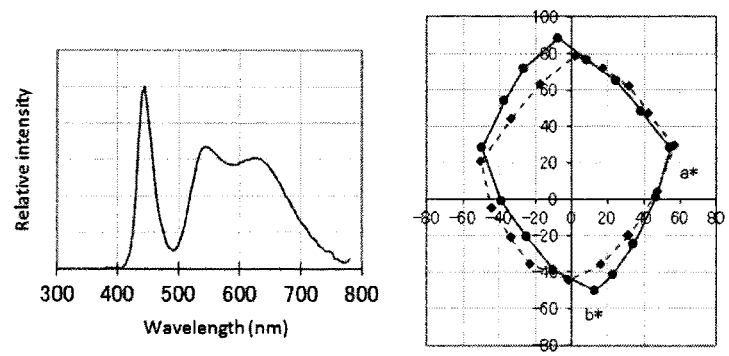
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44:
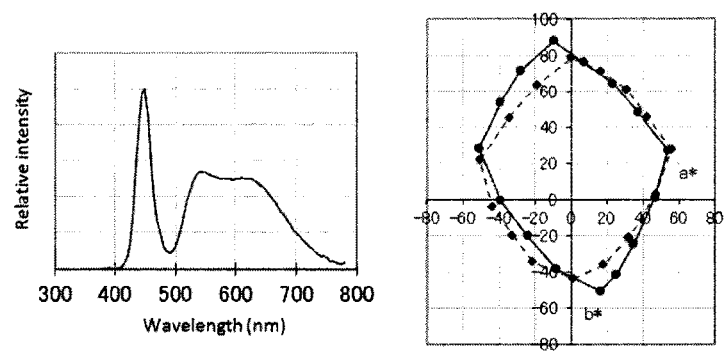
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45:
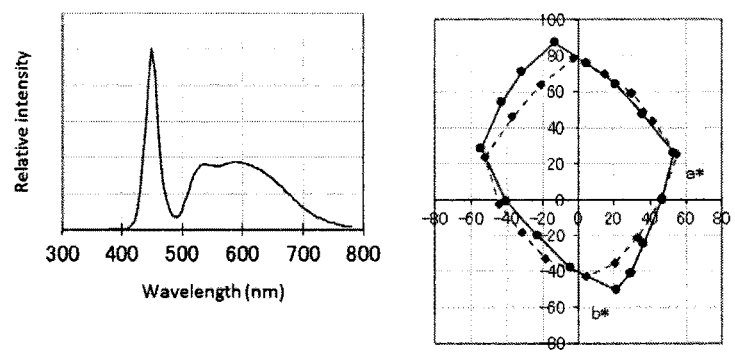
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46:
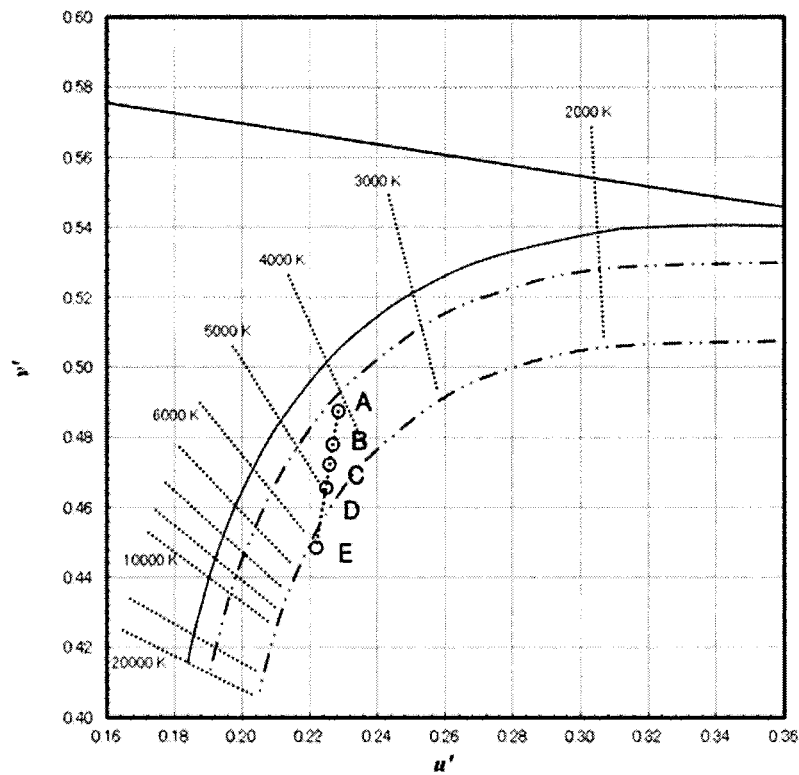
Figures 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47:
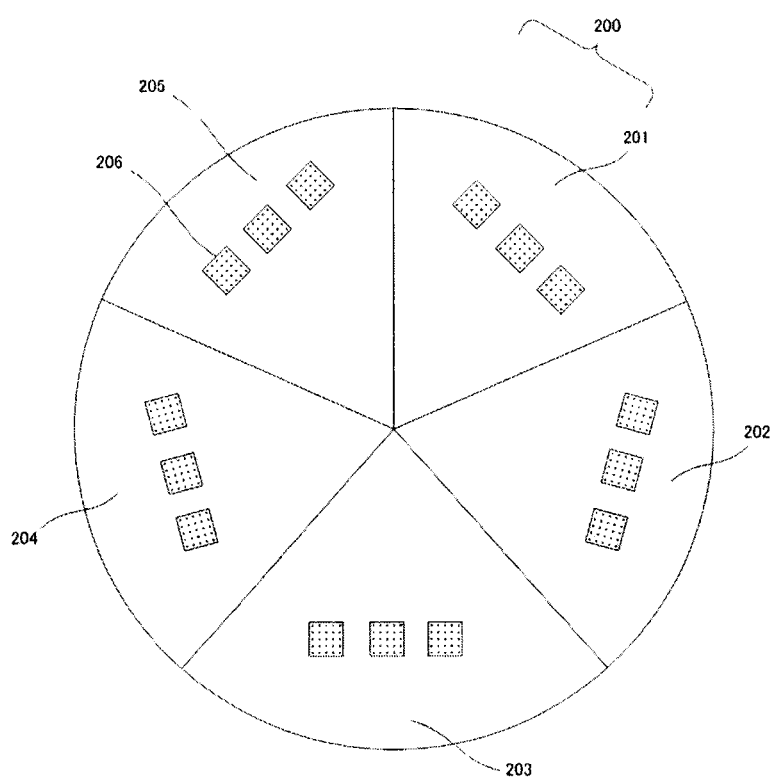
Figures 1, 3:
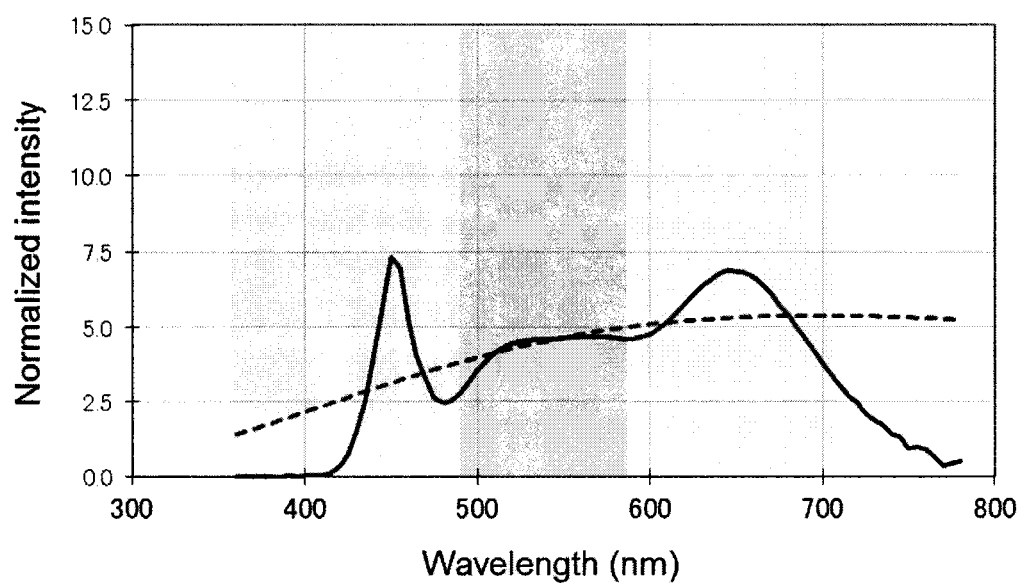
Figures 2, 3:
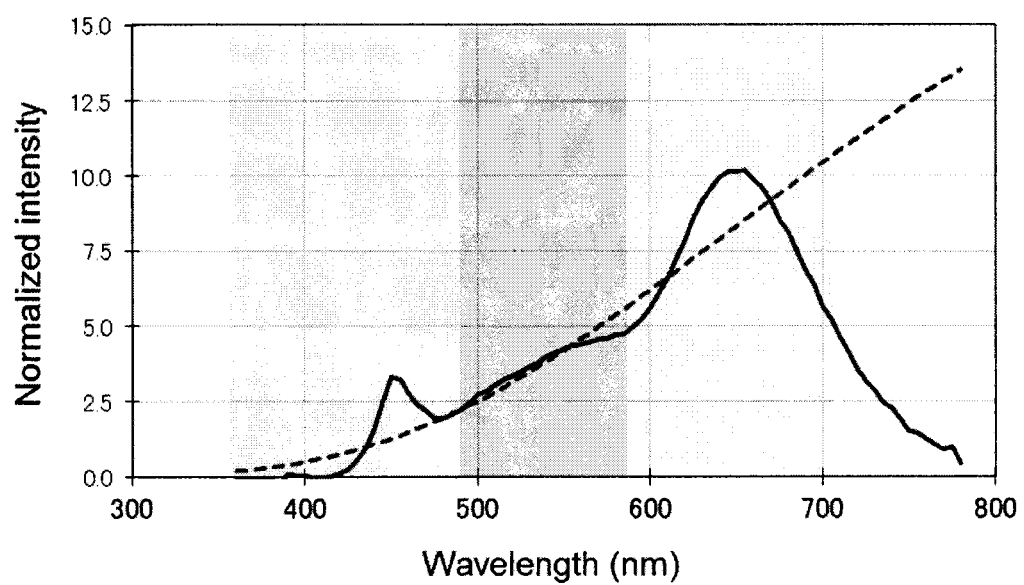
Figure 3:
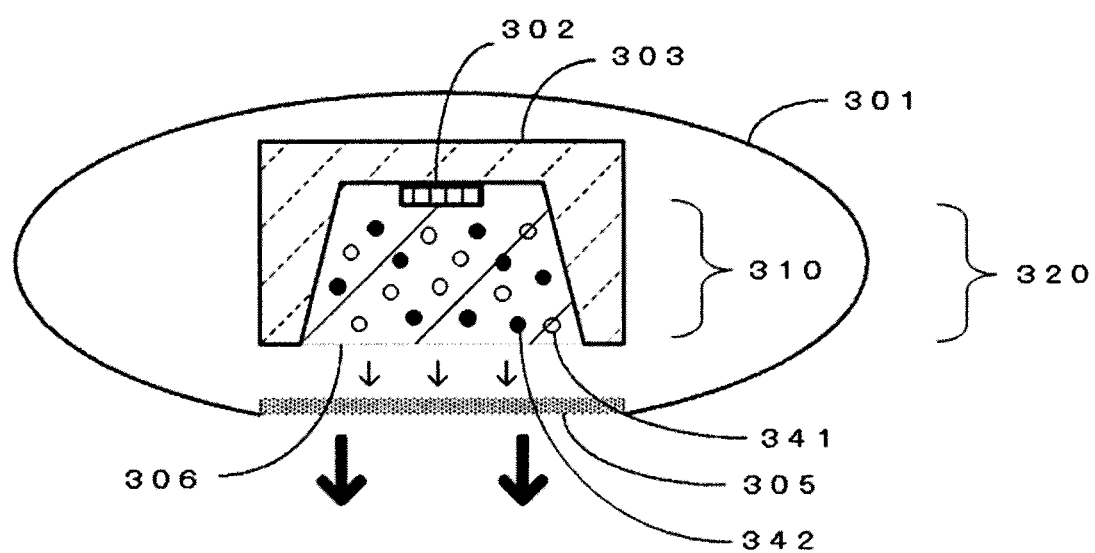
Figures 3, 4:
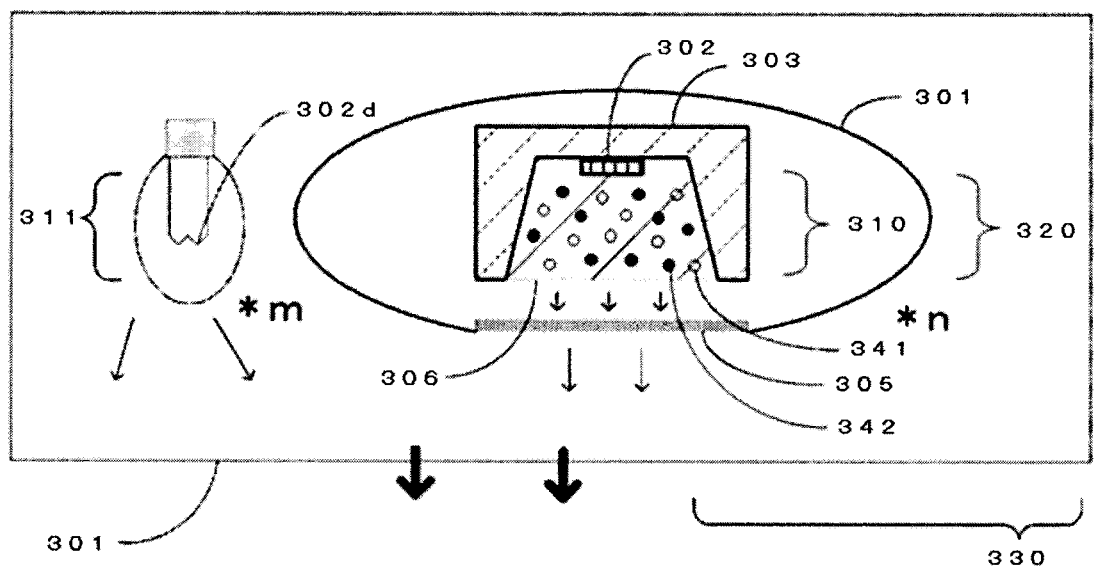
Figures 3, 4, 5:
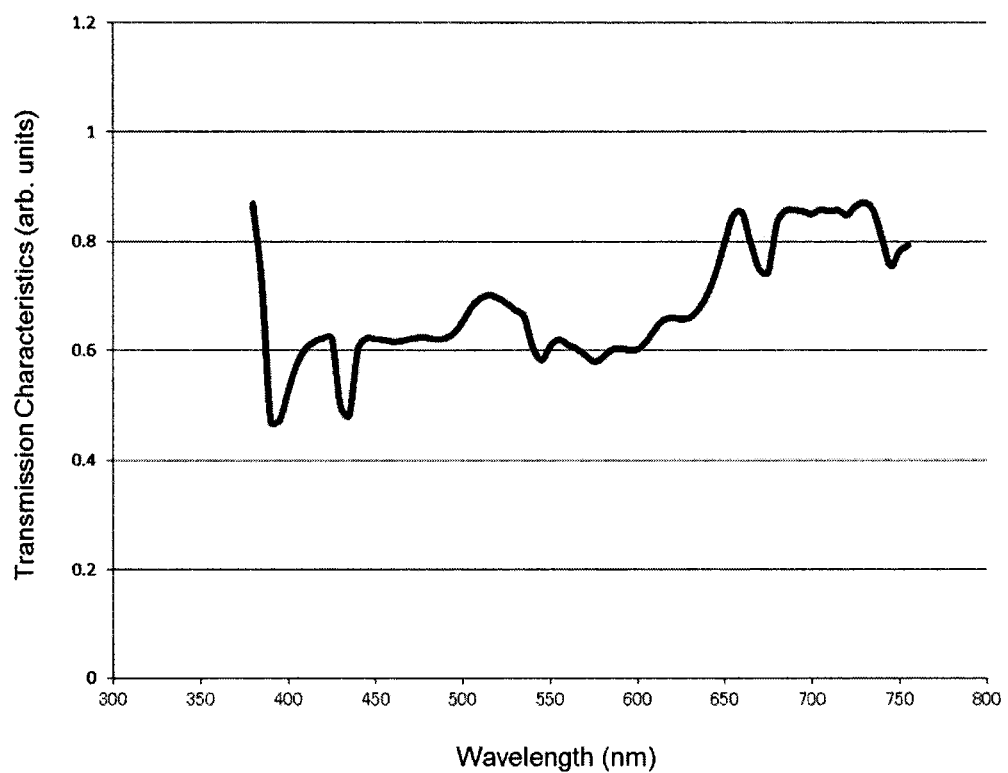
Figures 3, 4, 5, 6:
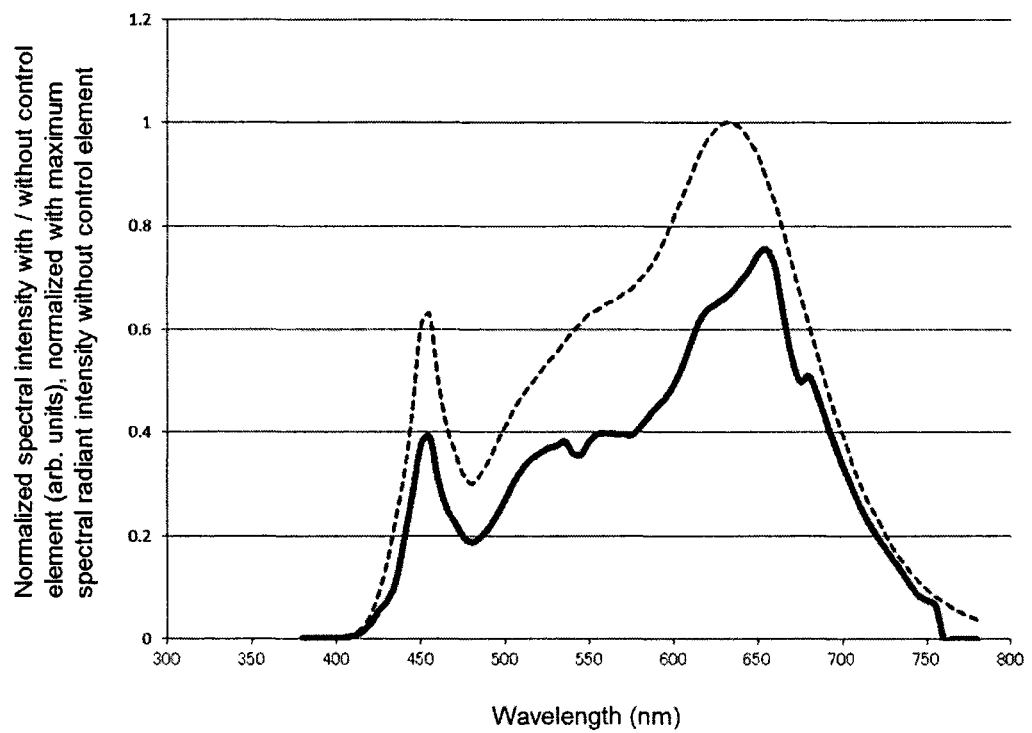
Figures 3, 4, 5, 6, 7, 8:
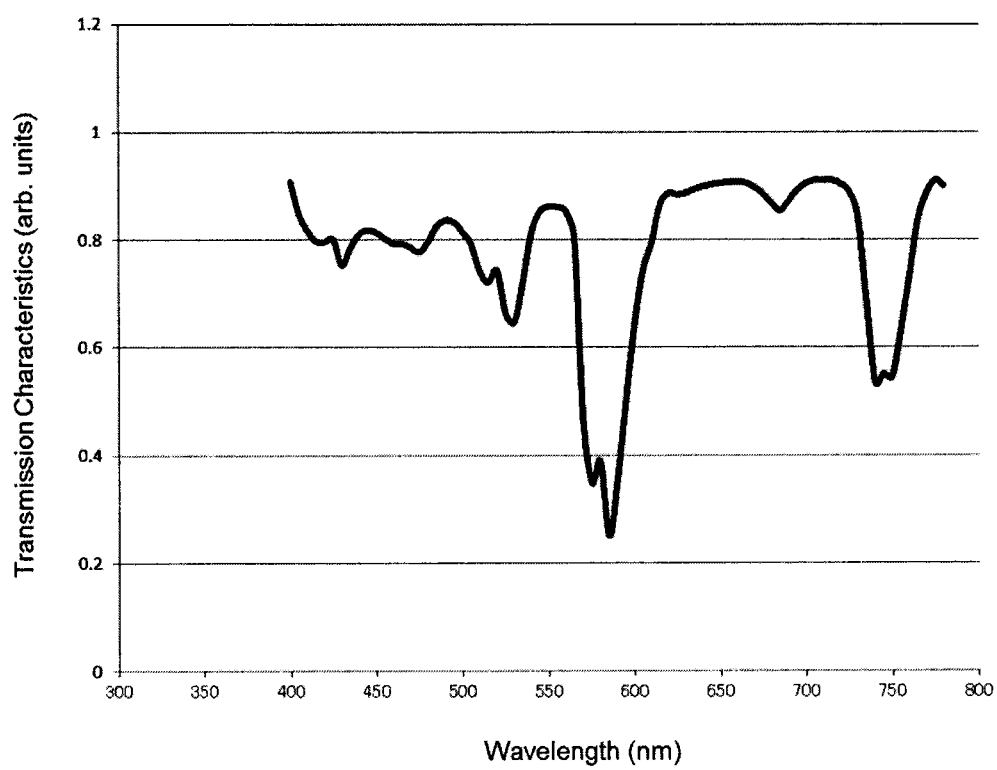
Figures 3, 4, 5, 6, 7, 8, 9:
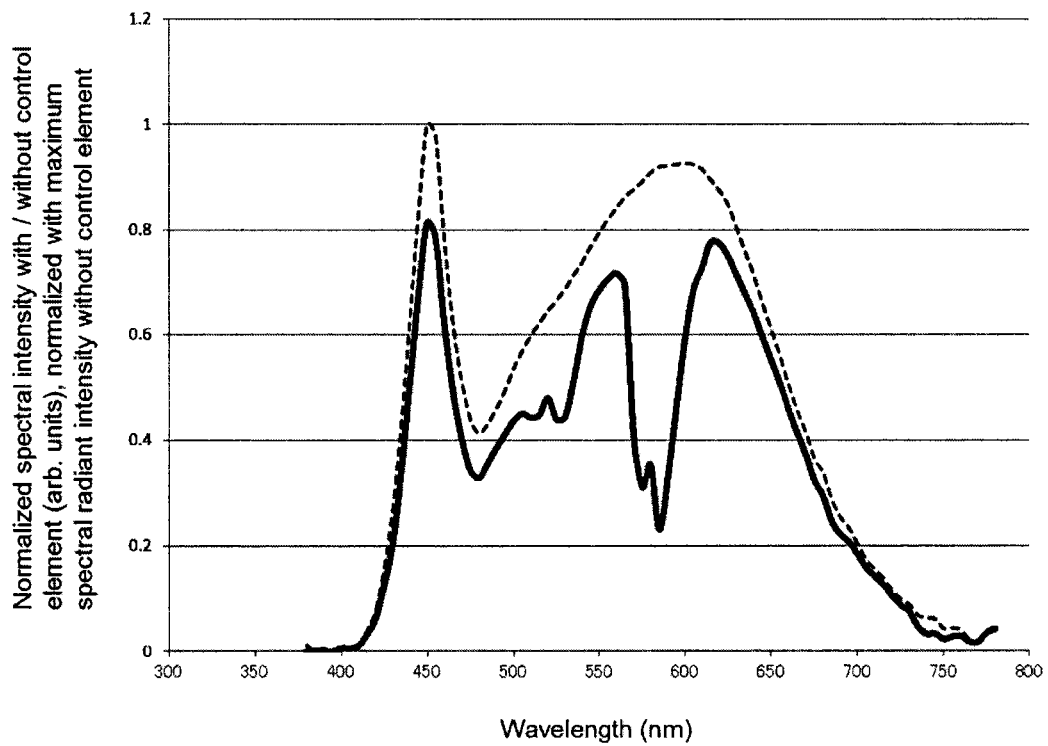
Figures 3, 4, 5, 6, 7, 8, 9, 10, 11:
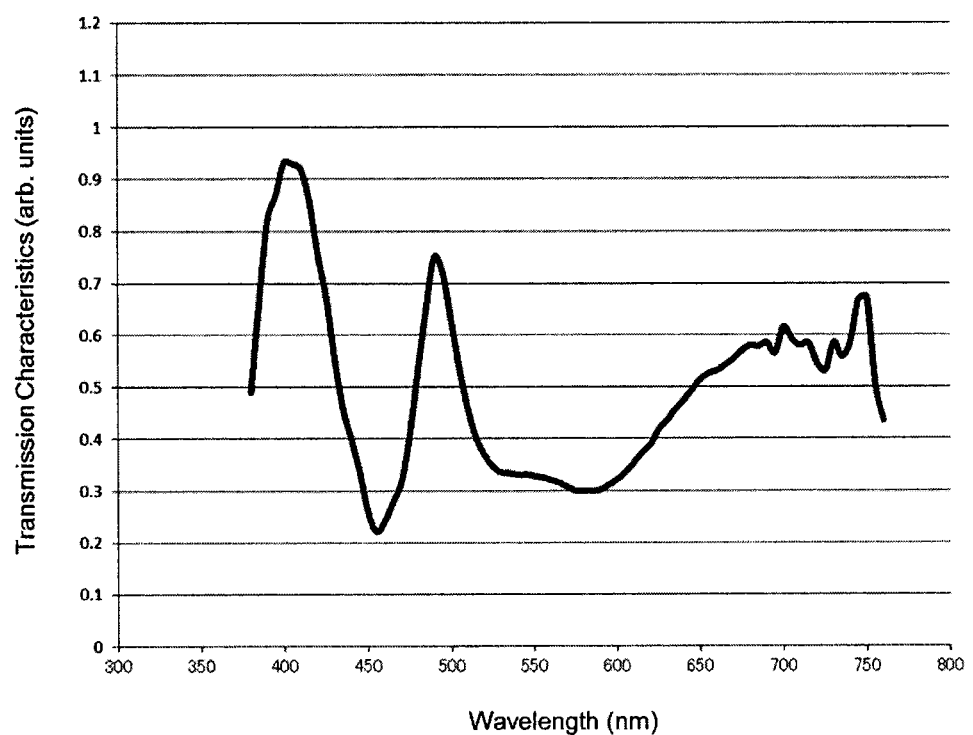
Figures 3, 4, 5, 6, 7, 8, 9, 10, 11, 12:
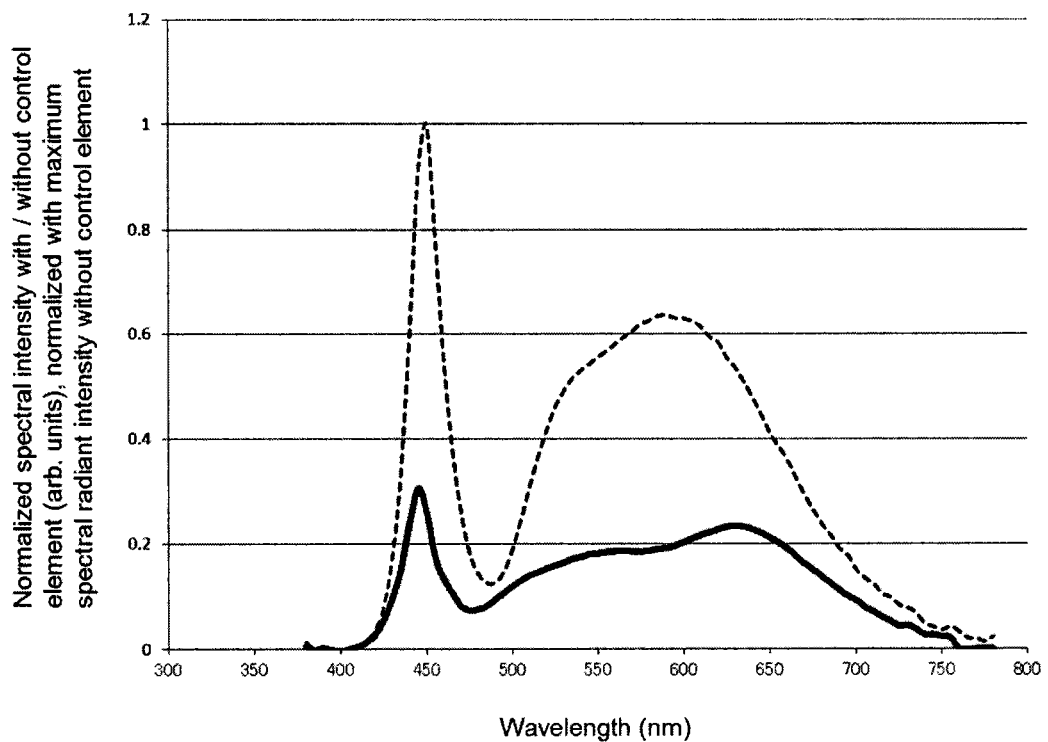
Figures 3, 4, 5, 6, 7, 8, 9, 10, 11, 12, 13, 14:
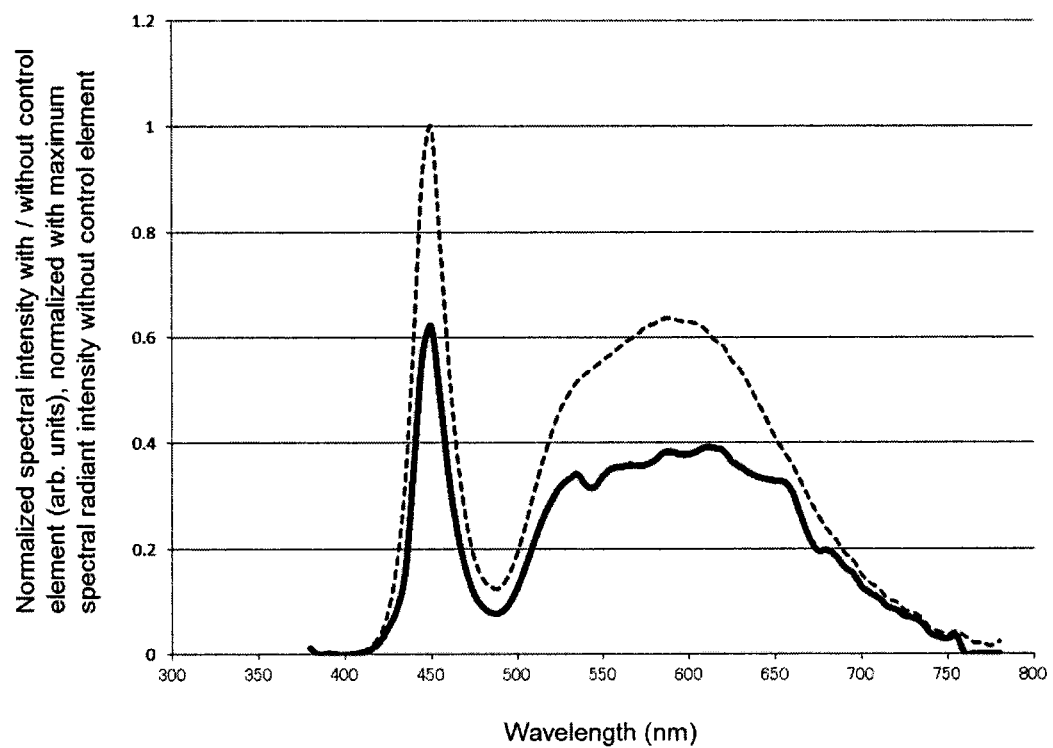

First an optical filter having spectral transmission characteristics shown in FIG. 3-5 was prepared. Then a packaged LED having a bule LED, a LuAG phosphor and a CASN phosphor, as light-emitting elements, was prepared, and six of the packaged LEDs were mounted on an LED board, whereby an LED module was fabricated. The dotted line in FIG. 3-6 indicates the spectral power distribution in this case, normalized by the maximum spectral radiant flux irradiated from the LED module onto the axis. FIG. 3-7 shows this spectral power distribution, and the CIELAB plot on which the a* values and the b* values were indicated: when the 15 Munsell renotation color samples from #01 to #15 were mathematically assumed as illumination objects and were illuminated by this LED module; and when these illumination objects were illuminated by the reference light derived from the correlated color temperature of the LED module. Further, the photometric characteristics and the colormetric characteristics in this case are shown in Reference Experimental Example 301 in Table 3-16. Here the light emitted from the LED module of Reference Experimental Example 301 onto the axis implemented a good appearance of colors, as each value clearly indicates.

Next, an LED lighting fixture of Experimental Example 301 was fabricated using the LED module. Here an optical filter having the spectral transmission characteristics shown in FIG. 3-5 was mounted in the light-emitting direction. The solid line in FIG. 3-6 is a spectral power distribution of the LED lighting fixture of Experimental Example 301, normalized by the maximum spectral radiant flux of the light irradiated from the LED module onto the axis. In the spectral power distribution of the LED lighting fixture of Experimental Example 301, convex/concave portions are added because of the characteristics of the optical filter. FIG. 3-7 shows this spectral power distribution, and the CIELAB plot on which the a* values and the b* values are indicated: when 15 Munsell renotation color samples from #01 to #15 are mathematically assumed as illumination objects and were illuminated by the LED lighting fixture of Experimental Example 301; and when these objects were illuminated by the reference light derived from the correlated color temperature of the LED lighting fixture. Further, the photometric characteristics and the colormetric characteristics in this case are shown in Experimental Example 301 in Table 3-16.

$D_{uv}(\varphi_{SSL3}(\lambda))$ of the lighting fixture of Experimental Example 301 was −0.0076, which was 0.0004 lower than −0.0072 of $D_{uv}(\Phi_{elm3}(\lambda))$ of the LED module of Reference Experimental Example 301. $A_{cg}(\varphi_{SSL3}(\lambda))$ of the lighting fixture of Experimental Example 301 was 6.1, which was 64.8 lower than 70.9 of $A_{cg}(\Phi_{elm3}(\lambda))$ of the LED module of Reference Experimental Example 301. $SAT_{ave}(\varphi_{SSL3}(\lambda))$ of the lighting fixture of Experimental Example 301 was 2.59, which was 0.92 higher than 1.67 of $SAT_{ave}(\Phi_{elm3}(\lambda))$ of the LED module of Reference Experimental Example 301, and a more clear and better appearance of colors was implemented when observed with a same luminance.

TABLE 3-16-1

| | Light-emitting element | | | Light-emitting device | | | | | | | |
|---|---|---|---|---|---|---|---|---|---|---|---|
| Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | T (K) | $D_{uv}$ | $A_{cg}$ | $\lambda_{BM\text{-}max}$ (nm) | $\varphi_{BG\text{-}min}/\varphi_{BM\text{-}max}$ | $\lambda_{RM\text{-}max}$ (nm) | $\varphi_{BG\text{-}min}/\varphi_{RM\text{-}max}$ | K (lm/W) |
| Reference experimental example 301 | 457.5 | LuAG 530 104 | CASN 645 89 | 3215 | −0.0072 | 70.9 | 455 | 0.4768 | 630 | 0.3006 | 261.7 |
| Experimental example 301 | 457.5 | LuAG 530 104 | CASN 645 89 | 3124 | −0.0076 | 6.1 | 455 | 0.4799 | 652 | 0.2482 | 243.2 |

TABLE 3-16-2

| | Indexes extracted from calculations on 15 specific Munsell renotation color samples | | | | | | | Result of comparative visual experiment | Drawing number |
|---|---|---|---|---|---|---|---|---|---|
| | $|\Delta h_n|$ maximum value (degrees) | $|\Delta h_n|$ minimum value (degrees) | $SAT_{ave}$ | $\Delta C\text{max}$ | $\Delta C\text{min}$ | $|\Delta C\text{max} - \Delta C\text{min}|$ | Ra | | |
| Reference experimental example 301 | 3.24 | 0.06 | 1.67 | 4.14 | −0.18 | 4.32 | 96.4 | 3 | FIG. 3-7 |
| Experimental example 301 | 2.13 | 0.10 | 2.59 | 4.79 | 1.12 | 3.68 | 90.5 | 4 | FIG. 3-7 |

Experimental Example 302

First an optical filter having spectral transmission characteristics shown in FIG. 3-8 was prepared. Then a packaged LED having a blue LED, a LuAG phosphor and a SCASN phosphor was fabricated as light-emitting elements. Then twelve of the packaged LEDs were mounted on an LED board, whereby an LED module was fabricated. The dotted line in FIG. 3-9 indicates the spectral power distribution in this case, normalized by the maximum spectral radiant flux irradiated from the LED module onto the axis. FIG. 3-10 shows this spectral power distribution, and the CIELAB plot on which the a* values and the b* values were indicated: when the 15 Munsell renotation color samples from #01 to #15 were mathematically assumed as illumination objects and were illuminated by this LED module; and when these illumination objects were illuminated by the reference light derived from the correlated color temperature of the LED module. Further, the photometric characteristics and the colormetric characteristics in this case are shown in Reference Comparative Experimental Example 301 in Table 3-17. Here the light emitted from the LED module of the Reference Comparative Experimental Example 301 onto the axis could not implement a good appearance of colors, as each value clearly indicates.

Next, an LED lighting fixture of Experimental Example 302 was fabricated using the LED module. Here an optical filter having the spectral transmission characteristics shown in FIG. 3-8 was mounted in the light-emitting direction. The solid line in FIG. 3-9 is a spectral power distribution of the LED lighting fixture of Experimental Example 302, normalized by the maximum spectral radiant flux of the light irradiated from the LED module onto the axis. In the spectral power distribution of the LED lighting fixture of Experimental Example 302, the relative intensity of the radiant flux changes due to the emission of the LED, and concave/convex portions are added because of the characteristics of the optical filter. FIG. 3-10 shows this spectral power distribution, and the CIELAB plot on which the a* values and the b* values are indicated: when 15 Munsell renotation color samples from #01 to #15 are mathematically assumed as illumination objects and were illuminated by the LED lighting fixture of Experimental Example 302; and when these objects were illuminated by the reference light derived from the correlated color temperature of the LED lighting fixture. Further, the photometric characteristics and the colormetric characteristics in this case are shown in Experimental Example 302 in Table 3-17.

$D_{uv}(\varphi_{SSL3}(\lambda))$ of the lighting fixture of Experimental Example 302 was −0.0073, which was 0.0033 lower than −0.0040 of $D_{uv}(\Phi_{elm3}(\lambda))$ of the LED module of Reference Comparative Experimental Example 301. $A_{cg}(\varphi_{SSL3}(\lambda))$ of the lighting fixture of Experimental Example 302 was 48.4, which was 73.9 lower than 122.3 of $A_{cg}(\Phi_{elm3}(\lambda))$ of the LED module of Reference Comparative Experimental Example 301. $SAT_{ave}(\varphi_{SSL3}(\lambda))$ of the lighting fixture of Experimental Example 302 was 2.15, which was 2.62 higher than −0.47 of $SAT_{ave}(\Phi_{elm3}(\lambda))$ of the LED module of Reference Comparative Experimental Example 301.

As a result, even if a lighting fixture uses a semiconductor light-emitting element, a packaged LED and an LED module which cannot implement a good appearance of colors, an LED lighting fixture that can implement a good appearance of colors can be fabricated by the optical characteristics of a control element.

from #01 to #15 are mathematically assumed as illumination objects and are illuminated by this LED module; and when these illumination objects are illuminated by the reference light derived from the correlated color temperature of the LED module. Further, the photometric characteristics and the colormetric characteristics in this case are shown in the Reference Comparative Experimental Example 302 in Table 3-18. Here the light emitted from the light emitted from the LED module according to Reference Comparative Experimental Example 302 onto the axis does not implement a good appearance of colors, as each value clearly indicates.

TABLE 3-17-1

| | Light-emitting element | | | Light-emitting device | | | | | | | |
|---|---|---|---|---|---|---|---|---|---|---|---|
| Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | T (K) | $D_{uv}$ | $A_{cg}$ | $\lambda_{BM\text{-}max}$ (nm) | $\varphi_{BG\text{-}min}/\varphi_{BM\text{-}max}$ | $\lambda_{RM\text{-}max}$ (nm) | $\varphi_{BG\text{-}min}/\varphi_{RM\text{-}max}$ | K (lm/W) |
| Reference comparative experimental example 301 | 457.5 | LuAG 530 104 | SCASN 625 87 | 4206 | −0.0040 | 122.3 | 450 | 0.4124 | 600 | 0.4457 | 301.4 |
| Experimental example 302 | 457.5 | LuAG 530 104 | SCASN 625 87 | 4592 | −0.0073 | 48.4 | 450 | 0.4035 | 615 | 0.4232 | 272.8 |

TABLE 3-17-2

| | Indexes extracted from calculations on 15 specific Munsell renotation color samples | | | | | | Result of | | |
|---|---|---|---|---|---|---|---|---|---|
| | $|\Delta h_n|$ maximum value (degrees) | $|\Delta h_n|$ minimum value (degrees) | $SAT_{ave}$ | ΔCmax | ΔCmin | \|ΔCmax − ΔCmin\| | Ra | comparative visual experiment | Drawing number |
| Reference comparative experimental example 301 | 8.29 | 0.03 | −0.47 | 3.81 | −5.40 | 9.21 | 89.2 | −1 | FIG. 3-10 |
| Experimental example 302 | 5.46 | 0.90 | 2.15 | 4.57 | −0.39 | 4.97 | 89.2 | 4 | FIG. 3-10 |

Experimental Example 303

First an optical filter having spectral transmission characteristics shown in FIG. 3-11 is prepared. Then a packaged LED having a blue LED, a YAG phosphor and a SCASN phosphor, as light-emitting elements, is prepared, and eighteen of the packaged LEDs are mounted on an LED board, whereby an LED module is fabricated. The dotted line in FIG. 3-12 indicates the spectral power distribution in this case, normalized by the maximum spectral radiant flux of the light irradiated from this LED module onto the axis. FIG. 3-13 shows this spectral power distribution, and the CIELAB plot on which the a* values and the b* values are indicated: when the 15 Munsell renotation color samples Next, an LED lighting fixture of Experimental Example 303 is fabricated using the LED module. Here an optical filter having spectral transmission characteristics shown in FIG. 3-11 is mounted in the light-emitting direction. The solid line in FIG. 3-12 is a spectral power distribution of the LED lighting fixture of Experimental Example 303, normalized by the maximum spectral radiant flux of the light irradiated from the LED module onto the axis. In the spectral power distribution of the LED lighting fixture of Experimental Example 303, convex/concave portions are added because of the characteristics of the optical filter. FIG. 3-13 shows this spectral power distribution, and the CIELAB plot on which the a* values and the b* values are indicated: when 15 Munsell renotation color samples from #01 to #15 are mathematically assumed as illumination objects and are illuminated by the LED lighting fixture of Experimental Example 303; and when these objects are illuminated by the reference light derived from the correlated color temperature of the LED lighting fixture. Further, the photometric characteristics and the colormetric characteristics in this case are shown in Experimental Example 303 in Table 3-18.

$D_{uv}(\varphi_{SSL3}(\lambda))$ of the lighting fixture of Experimental Example 303 is −0.0123, which is 0.0006 lower than −0.0117 of $D_{uv}(\Phi_{elm3}(\lambda))$ of the LED module of Reference Comparative Experimental Example 302. $A_{cg}(\varphi_{SSL3}(\lambda))$ of the lighting fixture of Experimental Example 303 is 66.9, which is 36.6 lower than 103.5 of $A_{cg}(\Phi_{elm3}(\lambda))$ of the LED module of Reference Comparative Experimental Example 302. $SAT_{ave}(\varphi_{SSL3}(\lambda))$ of the lighting fixture of Experimental Example 303 is 2.29, which is 1.30 higher than 0.99 of $SAT_{ave}(\Phi_{elm3}(\lambda))$ of the LED module of Reference Comparative Experimental Example 302, and a more clear and better appearance of colors is implemented when observed with a same luminance.

Comparative Experimental Example 301

An LED illumination device according to Comparative Experimental Example 301 was fabricated in a similar manner to Experimental Example 301 with the exception of preparing a package LED having a blue LED, a YAG phosphor, and a SCASN phosphor as the light-emitting element in a similar manner to Reference Comparative Experimental Example 302.

Characteristics of the LED illumination fixture according to Comparative Experimental Example 301 fabricated by mounting the optical filter shown in FIG. 3-5, which is similar to Experimental Example 301, were as follows. The solid line in FIG. 3-14 is a spectral power distribution of the LED lighting fixture of Comparative Experimental Example 301, normalized by the maximum spectral radiant flux of the light irradiated from the LED module onto the axis. In the spectral power distribution of the LED lighting fixture of Comparative Experimental Example 301, convex/concave portions are added because of the characteristics of the optical filter. FIG. 3-15 shows this spectral power distribution, and the CIELAB plot on which the a* values and the b* values are indicated: when 15 Munsell renotation color samples from #01 to #15 are mathematically assumed as illumination objects and are illuminated by the LED lighting fixture of Comparative Experimental Example 301; and when these objects are illuminated by the reference light derived from the correlated color temperature of the LED lighting fixture. Further, the photometric characteristics and colormetric characteristics in this case are shown in Comparative Experimental Example 301 in Table 3-18.

$D_{uv}(\varphi_{SSL3}(\lambda))$ of the lighting fixture of Comparative Experimental Example 301 is −0.0112, which is 0.0005 higher than −0.0117 of $D_{uv}(\Phi_{elm3}(\lambda))$ of the LED module of Reference Comparative Experimental Example 302. $A_{cg}(\varphi_{SSL3}(\lambda))$ of the lighting fixture of Comparative Experimental Example 301 is 115.2, which is 11.7 higher than 103.5 of $A_{cg}(\Phi_{elm3}(\lambda))$ of the LED module of Reference Comparative Experimental Example 302. $SAT_{ave}(\varphi_{SSL3}(\lambda))$ of the lighting fixture of Comparative Experimental Example 301 is 1.59, which is 0.60 higher than 0.99 of $SAT_{ave}(\Phi_{elm3}(\lambda))$ of the LED module of Reference Comparative Experimental Example 302.

As a result, even if a control element that can implement a good appearance of colors when combined with a specific light-emitting element, a good appearance of colors may not be implemented when this control element is combined with a lighting fixture using a different semiconductor light-emitting element, packaged LED and LED module.

TABLE 3-18-1

| | Light-emitting element | | | Light-emitting device | | | | | | |
|---|---|---|---|---|---|---|---|---|---|---|
| | Excitation source peak wavelength (nm) or dominant wavelength (nm) | Type of phosphor in intermediate wavelength region peak wavelength (nm) full-width at half-maximum (nm) | Type of phosphor in long wavelength region peak wavelength (nm) full-width at half-maximum (nm) | T (K) | $D_{uv}$ | $A_{cg}$ | $\lambda_{BM\text{-}max}$ (nm) | $\varphi_{BG\text{-}min}/\varphi_{BM\text{-}max}$ | $\lambda_{RM\text{-}max}$ (nm) | $\varphi_{BG\text{-}min}/\varphi_{RM\text{-}max}$ | K (lm/W) |
| Reference comparative experimental example 302 | 457.5 | YAG 545 108 | SCASN 640 90 | 4183 | −0.0117 | 103.5 | 450 | 0.1263 | 590 | 0.1988 | 297.7 |
| Experimental example 303 | 457.5 | YAG 545 108 | SCASN 640 90 | 3994 | −0.0123 | 66.9 | 450 | 0.2428 | 630 | 0.3176 | 264.1 |
| Comparative experimental example 301 | 457.5 | YAG 545 108 | SCASN 640 90 | 4108 | −0.0112 | 115.2 | 450 | 0.1269 | 610 | 0.2010 | 284.6 |

TABLE 3-18-2

| | Indexes extracted from calculations on 15 specific Munsell renotation color samples | | | | | | Result of | |
|---|---|---|---|---|---|---|---|---|
| | $|\Delta h_n|$ maximum value (degrees) | $|\Delta h_n|$ minimum value (degrees) | $SAT_{ave}$ | $\Delta Cmax$ | $\Delta Cmin$ | $|\Delta Cmax - \Delta Cmin|$ | Ra | comparative visual experiment | Drawing number |
| Reference comparative experimental example 302 | 15.84 | 0.79 | 0.99 | 8.23 | −6.24 | 14.48 | 83.6 | −4 | FIG. 3-13 FIG. 3-15 |
| Experimental example 303 | 7.69 | 0.50 | 2.29 | 6.60 | −2.22 | 8.81 | 93.5 | 2 | FIG. 3-13 |
| Comparative experimental example 301 | 12.70 | 0.63 | 1.59 | 7.79 | −4.89 | 12.68 | 88.3 | −4 | FIG. 3-15 |

(Discussion)

The following invention issues can be derived from the above mentioned experiment results.

As a result of Reference Comparative Experimental Example 301 and Experimental Example 302, or the result of Reference Comparative Experimental Example 302 and Experimental Example 303 show, the light-emitting devices of Experimental Example 302 and Experimental Example 303, which can implement a good appearance of colors, can be implemented respectively by disposing an appropriate control element in the light-emitting device of Reference Comparative Experimental Example 301 and Reference Comparative Experimental Example 302 (regarded as a light-emitting element in the third invention of the present invention), which cannot implement a good appearance of colors.

In other words, in a light-emitting device having a light-emitting element and a control element, wherein the light-emitting device at least has a blue semiconductor light-emitting element, a green phosphor, and a red phosphor as the light-emitting element, when λ (nm) is a wavelength, $\Phi_{elm3}(\lambda)$ is a spectral power distribution of a light which is emitted from the light-emitting element in a main radiant direction, $\varphi_{SSL3}(\lambda)$ is a spectral power distribution of a light which is emitted from the light-emitting element in the main radiant direction, and light having $\Phi_{elm3}(\lambda)$ does not satisfy at least one of the following Conditions 1 to 4, and light having $\varphi_{SSL3}(\lambda)$ satisfies all of the following Conditions 1 to 4, the light-emitting device (light-emitting element) which does not implement a good appearance of colors becomes a light-emitting device which can implement a good appearance of colors by the control element.

Particularly, if a specific control element is disposed in an LED lighting fixture which is already on the market and has not yet implemented a good appearance of colors, this LED lighting device can become a light-emitting device which can implement a good appearance of colors according to the first aspect of the third invention of the present invention.

Conditions 1 to 4 according to the first aspect of the third invention of the present invention are conditions derived from the above mentioned experimental examples.

Condition 1:

When $\varphi(\lambda)$ denotes a spectral power distribution of object light, $\varphi_{ref}(\lambda)$ denotes a spectral power distribution of reference light which is selected in accordance with a correlated color temperature T of the object light, (X, Y, Z) denote tristimulus values of the object light, ($X_{ref}$, $Y_{ref}$, $Z_{ref}$) denote tristimulus values of reference light which is selected in accordance with the correlated color temperature T, a normalized spectral power distribution $S(\lambda)$ of the object light, a normalized spectral power distribution $S_{ref}(\lambda)$ of reference light of the object light, and a difference $\Delta S(\lambda)$ of between normalized spectral power distributions are respectively defined as $S(\lambda)=\varphi(\lambda)/Y$, $S_{ref}(\lambda)=\varphi_{ref}(\lambda)/Y_{ref}$, $\Delta S(\lambda)=S_{ref}(\lambda)-S(\lambda)$, and in a case where $\lambda_{RL-max}$ (nm) represents a wavelength that provides a longest wavelength local maximum value of $S(\lambda)$ in a wavelength range of 380 nm or more and 780 nm or less, and when a wavelength λ4 that is represented by $S(\lambda_{RL-max})/2$ exists on a longer wavelength-side of $\lambda_{RL-max}$, an index $A_{cg}$ represented by the following formula (3-1) satisfies $-10.0 < A_{cg} \leq 120.0$, but in a case where $\lambda_{RL-max}$ (nm) represents a wavelength that provides the longest wavelength local maximum value of $S(\lambda)$ in a wavelength range of 380 nm or more and 780 nm or less, and when the wavelength λ4 that is represented by $S(\lambda_{RL-max})/2$ does not exist on the longer wavelength-side of $\lambda_{RL-max}$, an index $A_{cg}$ represented by the following formula (3-2) satisfies $-10.0 < A_{cg} \leq 120.0$.

[Expression 58]

$$A_{cg}=\int_{380}^{495}\Delta S(\lambda)d\lambda+\int_{495}^{590}(-\Delta S(\lambda))d\lambda+\int_{590}^{\lambda 4}\Delta S(\Delta)d\lambda \quad (3-1)$$

[Expression 59]

$$A_{cg}=\int_{380}^{495}\Delta S(\lambda)d\lambda+\int_{495}^{590}(-\Delta S(\lambda))d\lambda+\int_{590}^{780}\Delta S(\Delta)d\lambda \quad (3-2)$$

Condition 2:

a distance $D_{uv}$ of the spectral power distribution $\varphi(\lambda)$ of object light from a black-body radiation locus defined by ANSI C78.377 satisfies $-0.0220 \leq D_{uv} \leq -0.0070$;

Condition 3:

when a maximum value of spectral intensity in a range of 430 nm or more and 495 nm or less is defined as $\varphi_{BM-max}$ and a minimum value of spectral intensity in a range of 465 nm or more and 525 nm or less is defined as $\varphi_{BG-min}$, the spectral power distribution $\varphi(\lambda)$ of object light satisfies $0.2250 \leq \varphi_{BG-min}/\varphi_{BM-max} \leq 0.7000$; and Condition 4:

in the spectral power distribution $\varphi(\lambda)$ of object light, when a maximum value of spectral intensity in a range of 590 nm or more and 780 nm or less is defined as $\varphi_{RM-max}$, a wavelength $\lambda_{RM-max}$ that provides $\varphi_{RM-max}$ satisfies $605 \text{ (nm)} \leq \lambda_{RM-max} \leq 653 \text{ (nm)}$.

It is preferable that light having $\Phi_{elm3}(\lambda)$ does not satisfy at least one of the following Conditions I to IV, and light having $\varphi_{SSL3}(\lambda)$ satisfies all of Conditions I to IV. Conditions I to IV are also the conditions derived from the above mentioned experimental examples.

Condition I:

when $a^*_n$ and $b^*_n$ (where n is a natural number from 1 to 15) respectively denote the a* value and b* value in the CIE 1976 L*a*b* color space of the following 15 Munsell renotation color samples of #01 to #15 based on a mathematical assumption that illumination is performed by the object light, and when $a^*_{nref}$ and $b^*_{nref}$ (where n is a natural number from 1 to 15) respectively denote the a* value and b* value in the CIE 1976 L*a*b* color space of the 15 Munsell renotation color samples based on a mathematical assumption that illumination is performed by reference light which is selected in accordance with the correlated color temperature T (K) of the object light, each saturation difference $\Delta C_n$ satisfies $-4.00 \leq \Delta C_n \leq 8.00$ (where n is a natural number from 1 to 15);

Condition II:

an average saturation difference represented by the following formula (3-3) satisfies (3-3)

$$\sum_{n=1}^{15} \Delta C_n \over 15 \quad \text{[Expression 60]}$$

$$0.50 \leq {\sum_{n=1}^{15} \Delta C_n \over 15} \leq 4.00; \quad \text{[Expression 61]}$$

Condition III:

when a maximum saturation difference value of the object light is denoted by $\Delta C_{max}$ and a minimum saturation difference value of the object light is denoted by $\Delta C_{min}$, a difference $|\Delta C_{max} - \Delta C_{min}|$ between the maximum saturation difference value and the minimum saturation difference value satisfies $2.00 \leq |\Delta C_{max} - \Delta C_{min}| \leq 10.00$, where $\Delta C_n = \sqrt{\{(a^*_n)^2 + (b^*_n)^2\}} - \sqrt{\{(a^*_{nref})^2 + (b^*_{nref})^2\}}$, with the 15 Munsell renotation color samples being:

| #01 | 7.5P | 4/10 |
| #02 | 10PB | 4/10 |

-continued

| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12; | and

Condition IV:

when $\theta_n$ (degrees) (where n is a natural number from 1 to 15) denotes a hue angle in the CIE 1976 L*a*b* color space of the 15 Munsell renotation color samples based on a mathematical assumption that illumination is performed by the object light, and when $\theta_{nref}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature T of the object light, an absolute value of each difference in hue angles $|\Delta h_n|$ satisfies $0.00$ degrees $\leq |\Delta h_n| \leq 12.50$ degrees (where n is a natural number from 1 to 15), where $\Delta h_n = \theta_n - \theta_{nref}$.

According to the examination of the results of Reference Experimental Example 301 and Experimental Example 301, the light-emitting devices according to Experimental Example 301, which can implement an even better appearance of colors, can be implemented respectively by disposing an appropriate control element in the light-emitting device (regarded as a light-emitting element) according to Reference Experimental Example 301, which can implement a good appearance of colors.

In other words, in a light-emitting device having a light-emitting element and a control element, wherein the light-emitting device at least has a blue semiconductor light-emitting element, a green phosphor, and a red phosphor as the light-emitting element, if $\lambda$(nm) is a wavelength, $\Phi_{elm3}(\lambda)$ is the spectral power distribution of light emitted from this light-emitting element in the main radiant direction, $\varphi_{SSL3}(\lambda)$ is the spectral power distribution of light emitted from the light-emitting device in the main radiant direction, light having $\Phi_{elm3}(\lambda)$ satisfies all of the above mentioned Conditions 1 to 4, and light having $\varphi_{SSL}(\lambda)$ satisfies all of the above mentioned Conditions 1 to 4, the light-emitting device (light-emitting element), which can implemented a good appearance of colors, becomes a light-emitting device which can implement an even better appearance of colors by the control element.

Particularly, even in a semiconductor light-emitting device in which appearance of colors is excellent when used for an illumination purpose, the appearance of colors can be further adjusted according to the taste of the user.

It is preferable that light having $\Phi_{elm3}(\lambda)$ satisfies all of the above mentioned Conditions I to IV, and light having $\varphi_{SSL3}(\lambda)$ satisfies all of the above mentioned Conditions I to IV.

Furthermore, a light-emitting device (a light-emitting element) not realizing favorable color appearance more preferably becomes a light-emitting device capable of realizing favorable color appearance due to a control element when the following conditions are satisfied.

In other words, with the light-emitting device, more preferably, light having $\Phi_{elm3}(\lambda)$ does not satisfy Condition 5 described below but light having $\varphi_{SSL3}$ PO satisfies Condition 5 described below.

Condition 5:
In the spectral power distribution $\varphi(\lambda)$ of object light, a wavelength $\lambda_{BM\text{-}max}$ that provides $\varphi_{BM\text{-}max}$ satisfies 430 (nm)$\leq \lambda_{BM\text{-}max} \leq$480 (nm).

In this case, with the light-emitting device, further preferably, light having $\Phi_{elm3}(\lambda)$ satisfies at least one of Conditions 6 to 8 described below but if there are conditions not satisfied by light having $\varphi_{elm3}(\lambda)$ among the Conditions 6 to 8 described below, light having $\varphi_{SSL3}(\lambda)$ satisfies at least one of such conditions.

Moreover, in this case, the light-emitting device may be configured such that light having $\Phi_{elm3}(\lambda)$ satisfies at least one of Conditions 6 to 8 described below and light having $\varphi_{SSL3}(\lambda)$ satisfies the same condition as satisfied by light having $\varphi_{elm3}(\lambda)$.

Condition 6:
The spectral power distribution $\varphi(\lambda)$ of object light satisfies 0.1800$\leq \varphi_{BG\text{-}min}/\varphi_{RM\text{-}max} \leq$0.8500.

Condition 7:
A luminous efficacy of radiation K (lm/W) in a wavelength range of 380 nm to 780 nm derived from a spectral power distribution $\varphi(\lambda)$ of object light satisfies 210.0 lm/W$\leq K \leq$290.0 lm/W.

Condition 8:
A correlated color temperature T (K) of object light satisfies

2600 K$\leq T \leq$7700 K.

In addition, with the light-emitting device, more preferably, light having $\Phi_{elm3}(\lambda)$ does not satisfy Condition 6 described below but light having $\varphi_{SSL3}(\lambda)$ satisfies Condition 6 described below.

Condition 6:
The spectral power distribution $\varphi(\lambda)$ of object light satisfies 0.1800$\leq \varphi_{BG\text{-}min}/\varphi_{RM\text{-}max} \leq$0.8500.

In addition, in Condition 6 described above, the light-emitting device further preferably satisfies 0.1917$\leq \varphi_{BG\text{-}min}/\varphi_{RM\text{-}max} \leq$0.7300.

In this case, with the light-emitting device, further preferably, light having $\Phi_{elm3}(\lambda)$ satisfies at least one of Conditions 5, 7 and 8 described below but if there are conditions not satisfied by light having $\Phi_{elm3}(\lambda)$ among the Conditions 5, 7 and 8 described below, light having $\varphi_{SSL3}(\lambda)$ satisfies at least one of such conditions.

Moreover, in this case, the light-emitting device may be configured such that light having $\Phi_{elm3}(\lambda)$ satisfies at least one of Conditions 5, 7 and 8 described below and light having $\varphi_{SSL3}(\lambda)$ satisfies the same condition as satisfied by light having $\Phi_{elm3}(\lambda)$.

Condition 5:
In the spectral power distribution $\varphi(\lambda)$ of object light, a wavelength $\lambda_{BM\text{-}max}$ that provides $\varphi_{BM\text{-}max}$ satisfies 430 (nm)$\leq \lambda_{BM\text{-}max} \leq$480 (nm).

Condition 7:
A luminous efficacy of radiation K (lm/W) in a wavelength range of 380 nm to 780 nm derived from a spectral power distribution $\varphi(\lambda)$ of object light satisfies 210.0 lm/W$\leq K \leq$290.0 lm/W.

Condition 8:
A correlated color temperature T (K) of object light satisfies

2600 K$\leq T \leq$7700 K.

In addition, with the light-emitting device, more preferably, light having $\Phi_{elm3}(\lambda)$ does not satisfy Condition 7 described below but light having $\varphi_{SSL3}(\lambda)$ satisfies Condition 7 described below.

Condition 7:
A luminous efficacy of radiation K (lm/W) in a wavelength range of 380 nm to 780 nm derived from a spectral power distribution $\varphi(\lambda)$ of object light satisfies 210.0 lm/W$\leq K \leq$290.0 lm/W.

In this case, with the light-emitting device, further preferably, light having $\Phi_{elm3}(\lambda)$ satisfies at least one of Conditions 5, 6 and 8 described below but if there are conditions not satisfied by light having $\Phi_{elm3}(\lambda)$ among the Conditions 5, 6 and 8 described below, light having $\varphi_{SSL3}(\lambda)$ satisfies at least one of such conditions.

Moreover, in this case, the light-emitting device may be configured such that light having $\Phi_{elm3}(\lambda)$ satisfies at least one of Conditions 5, 6 and 8 described below and light having $\varphi_{SSL3}(\lambda)$ satisfies the same condition as satisfied by light having $\Phi_{elm3}(\lambda)$.

Condition 5:
In the spectral power distribution $\varphi(\lambda)$ of object light, a wavelength $\lambda_{BM\text{-}max}$ that provides $\varphi_{BM\text{-}max}$ satisfies 430 (nm)$\leq \lambda_{BM\text{-}max} \leq$480 (nm).

Condition 6:
The spectral power distribution $\varphi(\lambda)$ of object light satisfies 0.1800$\leq \varphi_{BG\text{-}min}/\varphi_{RM\text{-}max} \leq$0.8500.

Condition 8:
A correlated color temperature T (K) of object light satisfies

2600 K$\leq T \leq$7700 K.

In addition, with the light-emitting device, more preferably, light having $\Phi_{elm3}(\lambda)$ does not satisfy Condition 8 described below but light having $\varphi_{SSL3}(\lambda)$ satisfies Condition 8 described below.

Condition 8:
A correlated color temperature T (K) of object light satisfies

2600 K$\leq T \leq$7700 K.

In this case, with the light-emitting device, further preferably, light having $\Phi_{elm3}(\lambda)$ satisfies at least one of Conditions 5 to 7 described below but if there are conditions not satisfied by light having $\Phi_{elm3}(\lambda)$ among the Conditions 5 to 7 described below, light having $T_{SSL3}(\lambda)$ satisfies at least one of such conditions.

Moreover, in this case, the light-emitting device may be configured such that light having $\Phi_{elm3}(\lambda)$ satisfies at least one of Conditions 5 to 7 described below and light having $\varphi_{SSL3}(\lambda)$ satisfies the same condition as satisfied by light having $\Phi_{elm3}(\lambda)$.

Condition 5:

In the spectral power distribution φ(λ) of object light, a wavelength $\lambda_{BM\text{-}max}$ that provides $\varphi_{BM\text{-}max}$ satisfies 430 (nm)≤$\lambda_{BM\text{-}max}$≤480 (nm).

Condition 6:

The spectral power distribution 900 of object light satisfies 0.1800≤$\varphi_{BG\text{-}min}/\varphi_{RM\text{-}max}$≤0.8500.

Condition 7:

A luminous efficacy of radiation K (lm/W) in a wavelength range of 380 nm to 780 nm derived from a spectral power distribution φ(λ) of object light satisfies 210.0 lm/W≤K≤290.0 lm/W.

Furthermore, a light-emitting device (a light-emitting element) realizing favorable color appearance preferably becomes a light-emitting device capable of realizing further favorable color appearance due to a control element when the following conditions are satisfied.

In other words, with the light-emitting device, still further preferably, light having $\Phi_{elm3}(\lambda)$ satisfies all of the Conditions 5 to 8 described below and light having $\varphi p_{SSL3}(\lambda)$ also satisfies all of the Conditions 5 to 8 described below.

Condition 5:

In the spectral power distribution φ(λ) of object light, a wavelength $\lambda_{BM\text{-}max}$ that provides $\varphi_{BM\text{-}max}$ satisfies 430 (nm)≤$\lambda_{BM\text{-}max}$≤480 (nm).

Condition 6:

The spectral power distribution φ(λ) of object light satisfies 0.1800≤$\varphi_{BG\text{-}min}/\varphi_{RM\text{-}max}$≤0.8500.

Condition 7:

A luminous efficacy of radiation K (lm/W) in a wavelength range of 380 nm to 780 nm derived from a spectral power distribution φ(λ) of object light satisfies 210.0 lm/W≤K≤290.0 lm/W.

Condition 8:

A correlated color temperature T (K) of object light satisfies

2600 K≤T≤7700 K.

On the other hand, the method for manufacturing the light-emitting device according to the fifth aspect of the third invention of the present invention can be derived from the above mentioned experiment results.

In other words, this is a method for manufacturing a light-emitting device having a light-emitting element and a control element, the manufacturing method comprising: a step of preparing a first light-emitting device at least having a blue semiconductor light-emitting element, a green phosphor and a red phosphor, as the light-emitting element; and a step of manufacturing a second light-emitting device by disposing the control element so that at least a part of the light emitted from the first light-emitting device in the main radiant direction transmits through, and when λ (nm) is a wavelength, $\Phi_{elm3}(\lambda)$ is a spectral power distribution of a light emitted from the first light-emitting device in the main radiant direction, and $\varphi_{SSL3}(\lambda)$ is a spectral power distribution of a light emitted from the second light-emitting device in the main radiant direction, light having $\Phi_{elm3}(\lambda)$ does not satisfy at least one of the above mentioned Conditions 1 to 4, and $\varphi_{SSL3}(\lambda)$ satisfies all of the above mentioned Conditions 1 to 4.

Particularly, manufacturing the light-emitting device that can implement a good appearance of colors according to the fifth aspect of the third invention of the present invention, by executing a step of disposing a specific control element in an LED lighting device which is already on the market and does not implement a good appearance of colors, is within the technical scope of the fifth aspect of the third invention of the present invention.

In addition, this is a method for manufacturing a light-emitting device having a light-emitting element and a control element, the manufacturing method comprising: a step of preparing a first light-emitting device at least having a blue semiconductor light-emitting element, a green phosphor and a red phosphor, as the light-emitting element; and a step of manufacturing a second light-emitting device by disposing the control element so that at least a part of the light emitted from the first light-emitting device in the main radiant direction transmits through, and when λ (nm) is a wavelength, $\Phi_{elm3}(\lambda)$ is a spectral power distribution of a light emitted from the first light-emitting device in the main radiant direction, and $\varphi_{SSL3}(\lambda)$ is a spectral power distribution of a light emitted from the second light-emitting device in the main radiant direction, light having $\Phi_{elm3}(\lambda)$ satisfies all of the above mentioned Conditions 1 to 4, and $\varphi_{SSL3}(\lambda)$ also satisfies all of the above mentioned Conditions 1 to 4.

In addition, the method for designing the light-emitting device according to the second aspect of the third invention of the present invention can be derived from the above mentioned experiment results.

In other words, a method for designing a light-emitting device having a light-emitting element and a control element, the light-emitting device at least including, as the light-emitting element, a blue semiconductor light-emitting element, a green phosphor, and a red phosphor, wherein the method for designing involves designing the light-emitting device so that when λ (nm) denotes wavelength, $\Phi_{elm3}(\lambda)$ denotes a spectral power distribution of light emitted from the light-emitting element in a main radiant direction, and $\varphi_{SSL3}(\lambda)$ denotes a spectral power distribution of light emitted from the light-emitting device in the main radiant direction, light having $\Phi_{elm3}(\lambda)$ does not satisfy at least one of Conditions 1 to 4 described above but light having $\varphi_{SSL3}(\lambda)$ satisfies all of the Conditions 1 to 4 described above.

In addition, a method for designing a light-emitting device having a light-emitting element and a control element, the light-emitting device at least including, as the light-emitting element, a blue semiconductor light-emitting element, a green phosphor, and a red phosphor, wherein the method for designing involves designing the light-emitting device so that when λ(nm) denotes wavelength, $\Phi_{elm3}(\lambda)$ denotes a spectral power distribution of light emitted from the light-emitting element in a main radiant direction, and $\varphi_{SSL3}(\lambda)$ denotes a spectral power distribution of light emitted from the light-emitting device in the main radiant direction, light having $\Phi_{elm3}(\lambda)$ satisfies all of the Conditions 1 to 4 described above and light having $\varphi_{SSL3}(\lambda)$ also satisfies all of the Conditions 1 to 4 described above.

Further, the illumination method according to the fourth aspect of the third invention of the present invention can be derived from the above mentioned experiment results in the same manner.

In other words, an illumination method comprising an illuminated object preparing step of preparing an illuminated object and an illuminating step of illuminating an object by light emitted from a light-emitting device having a semiconductor light-emitting element that is a light-emitting element and a control element, wherein the light-emitting device at least includes, as the light-emitting element, a blue semiconductor light-emitting element, a green phosphor, and a red phosphor, and in the illuminating step, when light emitted from the light-emitting element illuminates the object, light measured at a position of the object does not satisfy at least one of <1> to <4> described below, and when light emitted from the light-emitting device illuminates the object, light measured at a position of the object satisfies all of <1> to <4> described below.

The conditions <1> to <4> are the conditions derived from the above mentioned experimental examples.

<1>

When $a^*_n$ and $b^*_n$ (where n is a natural number from 1 to 15) respectively denote the a* value and the b* value in the CIE 1976 L*a*b* color space of the following 15 Munsell renotation color samples of #01 to #15 based on a mathematical assumption that illumination is performed by light emitted from the light-emitting device as measured at a position of the object, and when $a^*_{nref}$ and $b^*_{nref}$ (where n is a natural number from 1 to 15) respectively denote the a* value and the b* value in the CIE 1976 L*a*b* color space of the 15 Munsell renotation color samples based on a mathematical assumption that illumination is performed by reference light which is selected in accordance with a correlated color temperature T(K) of light emitted from the light-emitting device as measured at a position of the object, each saturation difference $\Delta C_n$ satisfies $-4.00 \leq \Delta C_n \leq 8.00$ (where n is a natural number from 1 to 15);

<2> an average saturation difference represented by the following formula (3-3) satisfies $$0.50 \leq \frac{\sum_{n=1}^{15} \Delta C_n}{15} \leq 4.00; \quad \text{[Expression 62][Expression 63]}$$

(3-3)

<3> when a maximum saturation difference value is denoted by $\Delta C_{max}$ and a minimum saturation difference value is denoted by $\Delta C_{min}$, a difference $|\Delta C_{max} - \Delta C_{min}|$ between the maximum saturation difference value and the minimum saturation difference value satisfies $2.00 \leq |\Delta C_{max} - \Delta C_{min}| \leq 10.00$, where $\Delta C_n = \sqrt{\{(a^*_n)^2 + (b^*_n)^2\}} - \sqrt{\{(a^*_{nref})^2 + (b^*_{nref})^2\}}$, with the 15 Munsell renotation color samples being:

| #01 | 7.5P   | 4/10 |
| #02 | 10PB   | 4/10 |
| #03 | 5PB    | 4/12 |
| #04 | 7.5B   | 5/10 |
| #05 | 10BG   | 6/8  |
| #06 | 2.5BG  | 6/10 |
| #07 | 2.5G   | 6/12 |
| #08 | 7.5GY  | 7/10 |
| #09 | 2.5GY  | 8/10 |
| #10 | 5Y     | 8.5/12 |
| #11 | 10YR   | 7/12 |
| #12 | 5YR    | 7/12 |
| #13 | 10R    | 6/12 |
| #14 | 5R     | 4/14 |
| #15 | 7.5RP  | 4/12; | and

<4>

When $\theta_n$ (degrees) (where n is a natural number from 1 to 15) denotes a hue angle in the CIE 1976 L*a*b* color space of the 15 Munsell renotation color samples based on a mathematical assumption that illumination is performed by the light emitted from the light-emitting device as measured at a position of the object, and when $\theta_{nref}$ (degrees) (where n is a natural number from 1 to 15) denotes a hue angle in the CIE 1976 L*a*b* color space of the 15 Munsell renotation color samples based on a mathematical assumption that illumination is performed by reference light which is selected in accordance with the correlated color temperature T of the light emitted from the light-emitting device as measured at a position of the object, an absolute value of each difference in hue angles $|\Delta h_n|$ satisfies $0.00$ degrees $\leq |\Delta h_n| \leq 12.50$ degrees (where n is a natural number from 1 to 15), where $\Delta h_n = \theta_n - \theta_{nref}$.

In addition, a mode is preferable in which light emitted from a light-emitting device satisfies all of <5> to <8>. Moreover, <5> to <8> are also conditions derived from the experimental examples described earlier.

<5>

When $\lambda$ denotes wavelength, $\varphi(\lambda)$ denotes a spectral power distribution of light emitted from the light-emitting device as measured at a position of the object, $\varphi_{ref}(\lambda)$ denotes a spectral power distribution of reference light which is selected in accordance with a correlated color temperature T of the light emitted from the light-emitting device as measured at a position of the object, (X, Y, Z) denote tristimulus values of the light emitted from the light-emitting device as measured at a position of the object, $(X_{ref}, Y_{ref}, Z_{ref})$ denote tristimulus values of reference light which is selected in accordance with T of the light emitted from the light-emitting device as measured at a position of the object, a normalized spectral power distribution $S(\lambda)$ of the light emitted from the light-emitting device as measured at a position of the object, a normalized spectral power distribution $S_{ref}(\lambda)$ of reference light which is selected in accordance with T(K) of the light emitted from the light-emitting device as measured at a position of the object, and a difference $\Delta S(\lambda)$ of between normalized spectral power distributions are respectively defined as $S(\lambda) = \varphi(\lambda)/Y$, $S_{ref}(\lambda) = \varphi_{ref}(\lambda)/Y_{ref}$, $\Delta S(\lambda) = S_{ref}(\lambda) - S(\lambda)$, and in a case where $\lambda_{RL-max}$ (nm) represents a wavelength that provides a longest wavelength local maximum value of $S(\lambda)$ in a wavelength range of 380 nm or more and 780 nm or less, and when a wavelength λ4 that is represented by $S(\lambda_{RL-max})/2$ exists on a longer wavelength-side of $\lambda_{RL-max}$,
an index $A_{cg}$ represented by the following formula (3-1) satisfies $-10.0 < A_{cg} \leq 120.0$, but in a case where $\lambda_{RL-max}$ (nm) represents a wavelength that provides the longest wavelength local maximum value of S(λ) in a wavelength range of 380 nm or more and 780 nm or less, and when the wavelength λ4 that is represented by $S(\lambda_{RL-max})/2$ does not exist on the longer wavelength side of $\lambda_{RL-max}$,
an index $A_{cg}$ represented by the following formula (3-2) satisfies $-10.0 < A_{cg} \leq 120.0$.

[Expression 64]

$$A_{cg} = \int_{380}^{495} \Delta S(\lambda) d\lambda + \int_{495}^{590} (-\Delta S(\lambda)) d\lambda + \int_{590}^{\lambda 4} \Delta S(\lambda) d\lambda \quad (3\text{-}1)$$

[Expression 65]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (3\text{-}2)$$

<6>
a distance $D_{uv}$ of the spectral power distribution φ(λ) of light from a black-body radiation locus defined by ANSI C78.377 satisfies $-0.0220 \leq D_{uv} \leq 0.0070$;

<7>
when a maximum value of spectral intensity in a range of 430 nm or more and 495 nm or less is defined as $\varphi_{BM-max}$ and a minimum value of spectral intensity in a range of 465 nm or more and 525 nm or less is defined as $\varphi_{BG-min}$, the spectral power distribution φ(λ) of light satisfies $0.2250 \leq \varphi_{BG-min}/\varphi_{BM-max} \leq 0.7000$; and <8>
in the spectral power distribution φ(λ) of light, when a maximum value of spectral intensity in a range of 590 nm or more and 780 nm or less is defined as $\varphi_{RM-max}$, a wavelength $\lambda_{RM-max}$ that provides $\varphi_{RM-max}$ satisfies $605 \text{ (nm)} \leq \lambda_{RM-max} \leq 653 \text{ (nm)}$.

In addition, an illumination method comprising an illuminated object preparing step of preparing an illuminated object and an illuminating step of illuminating an object by light emitted from a light-emitting device having a semiconductor light-emitting element that is a light-emitting element and a control element, wherein the light-emitting device at least includes, as the light-emitting element, a blue semiconductor light-emitting element, a green phosphor, and a red phosphor, and in the illuminating step, when light emitted from the light-emitting element illuminates the object, light measured at a position of the object satisfies all of <1> to <4> described below, and when light emitted from the light-emitting device illuminates the object, light measured at a position of the object also satisfies all of <1> to <4> described below.

In addition, a mode is preferable in which light emitted from a light-emitting device satisfies <5> to <8>.

While a favorable embodiment for implementing the light-emitting device, the method for manufacturing the light-emitting device, the method for designing the light-emitting device and the illumination method according to the third invention of the present invention will be described below, it is to be understood that modes for implementing the light-emitting device, the method for manufacturing the light-emitting device, the method for designing the light-emitting device and the illumination method according to the third invention of the present invention are not limited to those used in the following description.

With the light-emitting device, the method for manufacturing the light-emitting device and the method for designing the light-emitting device according to the third invention of the present invention, no restrictions are placed on configurations, materials, and the like of the light-emitting device as long as a radiometric property and a photometric property of test light which is irradiated from the light-emitting device in a main radiant direction and which becomes a color stimulus with respect to an illuminated object are in appropriate ranges.

In the illumination method according to the third invention of the present invention, no restrictions are placed on configurations, materials, and the like of the light-emitting device as long as a photometric property of test light which is irradiated on an illuminated object and which becomes a color stimulus is in an appropriate range and, at the same time, a difference between color appearances of the 15 color samples when illumination by calculational reference light is assumed and color appearances of the 15 color samples when illumination by an actually measured test light spectral power distribution is assumed is in an appropriate range.

A light-emitting device for implementing the light-emitting device, the method for manufacturing the light-emitting device, the method for designing the light-emitting device or the illumination method according to the third invention of the present invention such as an illumination light source, a lighting fixture including the illumination light source, or a lighting system including the illumination light source or the lighting fixture includes at least a light-emitting element and at least a control element. In addition, at least a blue semiconductor light-emitting element, a green phosphor, and a red phosphor are provided as light-emitting elements.

Moreover, when the various conditions described above are satisfied and the effect of a light-emitting device, a method for manufacturing a light-emitting device, a method for designing a light-emitting device, or an illumination method according to the third invention of the present invention is produced, illuminating light sources including semiconductor light-emitting elements may include, in addition to a blue semiconductor light-emitting element, for example, a plurality of semiconductor light-emitting elements of different types such as green and red in a single illuminating light source, a single illuminating light source may include a blue semiconductor light-emitting element, another single illuminating light source may include a green semiconductor light-emitting element, yet another single illuminating light source may include a red semiconductor light-emitting element, in which case these illuminating light sources may be integrated together with a filter, a lens, a reflecting mirror, a drive circuit, and the like in a lighting fixture to be provided in an illuminating system. Furthermore, in a case where one illumination light source is included in one lighting fixture and an individual semiconductor light-emitting element is incorporated in the illumination light source, even if the illumination method or the light-emitting device according to the third invention of the present invention cannot be implemented as an individual illumination light source or an individual lighting fixture, a lighting system may be configured such that light radiated as the lighting system satisfies desired characteristics at a position of an illuminated object due to additive color mixing with light from a different lighting fixture that exists in the lighting system or the lighting system may be configured such that light in a main radiant direction among light radiated as the lighting system satisfies desired characteristics. In any mode, light in a main radiant direction among light emitted from the light-emitting device or light as a color stimulus which is ultimately irradiated on an illuminated object need only satisfy appropriate conditions according to the third invention of the present invention.

Hereinafter, characteristics will be described which are favorably attained by the light-emitting device according to the first aspect of the third invention of the present invention, a light-emitting device for implementing the method for manufacturing the light-emitting device according to the fifth aspect of the third invention of the present invention, the method for designing the light-emitting device according to the second aspect of the third invention of the present invention and the illumination method according to the fourth aspect of the third invention of the present invention on the basis of satisfying the appropriate conditions described above.

In the light-emitting device according to the first aspect of the third invention of the present invention, it is favorable to use the light-emitting elements (light-emitting materials) heretofore described because the index $A_{cg}$, the distance $D_{uv}$, the value $\varphi_{BG\text{-}min}/\varphi_{BM\text{-}max}$, the wavelength $\lambda_{RM\text{-}max}$, and the like can be more readily set to desired values. Using the light-emitting elements described above is also favorable because $\Delta C_n$, $SAT_{ave}$, $|\Delta C_{max} - \Delta C_{min}|$ and $|\Delta h_n|$ which are related, when light is treated as a color stimulus, to a difference between color appearances of the 15 color samples when illumination by the light-emitting device is assumed and color appearances when illumination by calculational reference light is assumed can also be more readily set to desired values.

Various means are conceivable for lowering $D_{uv}$ from zero to set $D_{uv}$ to an appropriate negative value. For example, when a light-emitting device having one light-emitting element in each of the three wavelength ranges is assumed, an emission position of the light-emitting element in the short wavelength range can be moved toward a shorter wavelength side, an emission position of the light-emitting element in the long wavelength range can be moved toward a longer wavelength-side, an emission position of the light-emitting element in the intermediate wavelength range can be displaced from 555 nm. Furthermore, a relative emission intensity of the light-emitting element in the short wavelength range can be increased, a relative emission intensity of the light-emitting element in the long wavelength range can be increased, a relative emission intensity of the light-emitting element in the intermediate wavelength range can be decreased, or the like. In doing so, in order to vary D without varying the CCT, the emission position of the light-emitting element in the short wavelength range may be moved toward a shorter wavelength side and, at the same time, the emission position of the light-emitting element in the long wavelength range may be moved toward a longer wavelength-side, or the like. Moreover, operations opposite to those described above may be performed to vary $D_{uv}$ toward a positive side.

In addition, when a light-emitting device respectively having two light-emitting elements in each of the three wavelength ranges is assumed, $D_{uv}$ can be lowered by, for example, increasing a relative intensity of a light-emitting element on a relatively shorter wavelength side among the two light-emitting elements in the short wavelength range, increasing a relative intensity of a light-emitting element on a relatively longer wavelength-side among the two light-emitting elements in the long wavelength range, or the like. In doing so, in order to vary $D_{uv}$ without varying the CCT, the relative intensity of the light-emitting element on a relatively shorter wavelength side among the two light-emitting elements in the short wavelength range is increased and, at the same time, the relative intensity of the light-emitting element on a relatively longer wavelength-side among the two light-emitting elements in the long wavelength range is increased. Moreover, operations opposite to those described above may be performed to vary D toward a positive side.

Meanwhile, as means for varying $|\Delta h_n|$, $SAT_{ave}$, $\Delta C_n$, and $|\Delta C_{max} - \Delta C_{min}|$ which are related to a difference between color appearances of the 15 color samples when illumination by the light-emitting device is assumed and color appearances when illumination by calculational reference light is assumed and, in particular, as means for increasing $\Delta C_n$, operations such as described below can be performed after adjusting an entire spectral power distribution so that $D_{uv}$ assumes a desired value. Operations which may be performed include replacing each light-emitting element with a material having a narrow full-width at half-maximum, forming a spectrum shape in which light-emitting elements are appropriately separated from each other, installing a filter that absorbs a desired wavelength in an illumination light source, a lighting fixture, or the like in order to form a concave and/or a convex shape in a spectrum of each light-emitting element, and additionally mounting a light-emitting element which performs emission at a narrower band in a light-emitting element.

In the first aspect of the third invention of the present invention, the control element is a passive element that itself has no amplifying function, and is not especially limited if the intensity modulation for each wavelength can be performed in an appropriate range on light that is emitted from a light-emitting element or a light-emitting device having relatively low level processing, in the main radiant direction, and can constitute a light-emitting device having high level processing. In the first aspect of the third invention of the present invention, this function may be expressed as an action of the control element on a light-emitting element. Examples of the control element according to the first aspect of the third invention of the present invention are passive devices, such as a reflection mirror, an optical filter and various types of optical lenses. The control element according to the first aspect of the third invention of the present invention may be an absorption material that is dispersed in the sealing material of the packaged LED, so as to perform intensity modulation for each wavelength in an appropriate range. However, a light-emitting element and a reflection mirror, an optical filter, an absorption material or the like that can perform intensity modulation, of which wavelength dependency is low, on the light emitted from a light-emitting device having relatively low level processing, are not included in the control element.

In the first aspect of the third invention of the present invention, the control element is for converting the spectral power distribution of the light emitted from the light-emitting element in the main radiation direction into a spectral power distribution of the light that satisfies all of Conditions 1 to 4 described above. Therefore the characteristics of the control element according to the first aspect of the third invention of the present invention depend on the spectral power distribution of the light emitted from the light-emitting element in the main radiant direction.

However, in some cases, certain characteristics of the light-emitting element are preferable to make a good appearance of colors of the light emitted from the light-emitting device to an even better appearance of colors.

In the first aspect of the third invention of the present invention, it is preferable that when $D_{uv}(\Phi_{elm3}(\lambda))$ denotes $D_{uv}$ derived from the spectral power distribution of the light emitted from the light-emitting element in the main radiant direction, and $D_{uv}(\varphi_{SSL3}(\lambda))$ denotes $D_{uv}$ derived from the spectral power distribution of the light emitted from the light-emitting device in the main radiant direction, the control element satisfies $D_{uv}(\varphi_{SSL3}(\lambda)) < D_{uv}(\Phi_{elm3}(\lambda))$.

The above mentioned Condition 2 specifies that $-0.0220$ $D_{uv}(\varphi_{SSL3}(\lambda)) \leq -0.0070$ is satisfied. $D_{uv}$ in this range is a very small value compared with a common LED illumination which is already on the market. Therefore it is preferable that the control element according to the first aspect of the third invention of the present invention has a characteristic to decrease $D_{uv}$ of the spectral power distribution. However even if the control element according to the first aspect of the third invention of the present invention increase $D_{uv}$, this is acceptable for certain if the light-emitting device satisfies Condition 2. For example, in the case of a light-emitting element with which appearance of colors becomes too strong (glaring), a good appearance of colors may be implemented by disposing a control element that increases $D_{uv}$.

There are various means of decreasing $D_{uv}$, from zero to an appropriate negative value as described above, but these means can also be used to select a suitable control element according to the third invention of the present invention. For example, a control element, that increases the relative emission intensity of the light-emitting element in a short wavelength region, increases the relative emission intensity of the light-emitting element in a long wavelength region, and decreases the relative emission intensity of the light-emitting element in an intermediate wavelength range, more specifically, a control element of which light transmittance is high in the short wavelength region and the long wavelength region, and of which light transmittance is low in the intermediate wavelength range can be selected. A control element that adds convex/concave portions to the spectral power distribution of the light emitted from the light-emitting element in the main direction, can also be selected. To change D in a positive side, an operation the opposite of the above mentioned operation can be performed.

In the third invention of the present invention, it is preferable that when $A_{cg}(\Phi_{elm3}(\lambda))$ denotes $A_{cg}$ derived from the spectral power distribution of the light emitted from the light-emitting element in the main radiant direction, and $A_{cg}(\varphi_{SSL3}(\lambda))$ denotes $A_{cg}$ derived from the spectral power distribution of the light emitted from the light-emitting device in the main radiant direction, the control element satisfies $A_{cg}(\varphi_{SSL3}(\lambda)) < A_{cg}(\Phi_{elm3}(\lambda))$.

The above Condition 1 specifies that $-10.0 < A_{cg} \leq 120.0$ is satisfied. $A_{cg}$ in this range is a very small value compared with a common LED illumination which is already on the market. Therefore it is preferable that the control element according to the third invention of the present invention has a characteristic to decrease $A_{cg}$. However even if the control element according to the third invention of the present invention increases $A_{cg}$, it is acceptable for certain if the light-emitting device satisfies Condition 2. For example, in the case of a light-emitting element with which appearance of colors becomes too strong (glaring), a good appearance of colors may be implemented by disposing a control element that increases $A_{cg}$.

In the first aspect of the third invention of the present invention, it is preferable that when $SAT_{ave}(\Phi_{elm3}(\lambda))$ denotes an average saturation difference derived from the spectral power distribution of the light emitted from the light-emitting element in the main radiant direction, and $SAT_{ave}(\varphi_{SSL3}(\lambda))$ denotes an average saturation difference derived from the spectral power distribution of the light emitted from the light-emitting device in the main radiation direction, the control element satisfies $SAT_{ave}(\Phi_{elm3}(\lambda)) < SAT_{ave}(\varphi_{SSL3}(\lambda))$.

If the average saturation difference $SAT_{ave}$ increases within an appropriate range, appearance of colors becomes better, hence it is preferable that the control element according to the first aspect of the third invention of the present invention has a characteristic to increase $SAT_{ave}$ when the illumination by the spectral power distribution is mathematically assumed. However even if the control element according to the first aspect of the third invention of the present invention decreases $SAT_{ave}$, a good appearance of colors may be implemented by disposing a control element that decreases $SAT_{ave}$ in the case of a light-emitting element with which appearance of colors becomes too strong (glaring).

In the first aspect of the third invention of the present invention, it is preferable that the control element absorbs or reflects light in the range of 380 nm$\leq \lambda$ (nm)$\leq$780 nm.

In the first aspect of the third invention of the present invention, it is preferable that the control element includes a collection and/or diffusion function of light emitted from the light-emitting element, such as the function(s) of a concave lens, a convex lens and a Fresnel lens.

In the first aspect of the third invention of the present invention, it is preferable that the control element, which is often disposed close to the light-emitting element, is heat resistant. A control element that is heat resistant is, for example, a control element made of a heat resistant material, such as glass. In the control element according to the first aspect of the third invention of the present invention, a desired element may be doped and colored to implement desired reflection characteristics and transmission characteristics.

For the above mentioned control element according to the first aspect of the third invention of the present invention, an appropriate filter on the market that satisfies the requirements of the first aspect of the third invention of the present invention may be selected. A filter may be designed and fabricated such that the light emitted from the light-emitting device has a desired spectral power distribution.

For example, to fabricate a filter having a plurality of absorption peaks, a plurality of types of films having a characteristic to absorb a light in a certain wavelength region and films having a characteristic to absorb a light in other wavelength regions may be prepared, and a multilayer filter may be created by layering these films. Dielectric films may be stacked to create a multilayer film, so as to implement desired characteristics.

As described above, the first aspect of the third invention of the present invention discloses a method of implementing a light-emitting device with controlling secondary influence by light irradiation, even for illumination objects for which this secondary influence is of concern, while implementing a natural, vivid, highly visible and comfortable appearance of objects as if the objects are seen, in a high luminance environment exceeding 10000 lx, as outdoors, for various illumination objects having various hues, within a 5 lx to about 10000 lx luminous range. In particular, the first aspect of the third invention of the present invention provides respective hues with natural vividness and, at the same time, enables white objects to be perceived more whiter as compared to experimental reference light.

Especially the first aspect of the third invention of the present invention is an extremely practical technique to provide an illumination device that implements a good appearance of colors by a very simple method of disposing such a control element as a filter and reflection mirror, in an illumination device which is already on the market, and cannot implement a good appearance of colors.

In addition, the light-emitting device according to the first aspect of the third invention of the present invention is a light-emitting device in which means for producing a color appearance which is as natural, vivid, highly visible, and comfortable as perceived in a high-illuminance environment involve setting the index $A_{cg}$, $D_{uv}$, $\varphi_{BG-min}/\varphi_{BM-max}$, and $\lambda_{RM-max}$ as obtained from a spectral power distribution of light emitted in a main radiant direction to within an appropriate range.

In other words, according to the first aspect of the third invention of the present invention, intensity modulation is performed on an appropriate wavelength in the light emitted from the light-emitting element using a control element, and the light emitted from the light-emitting device satisfies all of Conditions 1 to 4, and as long as this requirement is satisfied, the light-emitting device may have any configuration. For example, the device may be any of an individual illumination light source, an illuminating module in which at least one or more of the light sources is mounted on a heatsink or the like, and a lighting fixture in which a lens, a light-reflecting mechanism, a driving electric circuit, and the like are added to the light source or the module. Furthermore, the device may be a lighting system which is a collection of individual light sources, individual modules, individual fixtures, and the like and which at least has a mechanism for supporting such components.

Means according to the illumination method of the fourth aspect of the third invention of the present invention for producing a color appearance which is as natural, vivid, highly visible, and comfortable as perceived in a high-illuminance environment involve providing a light-emitting device setting $D_{uv}$ of light at a position of an illuminated object to within an appropriate range and, at the same time, setting indices related to a difference between color appearances of the 15 color samples when illumination by the light is assumed and color appearances when illumination by calculational reference light is assumed such as $|\Delta h_n|$, $SAT_{ave}$, $\Delta C_n$, and $|\Delta C_{max} - \Delta C_{min}|$ to within appropriate ranges.

In other words, the illumination method according to the fourth aspect of the third invention of the present invention is an illumination method in which light emitted from a semiconductor light-emitting element is included in the spectral power distribution as a constituent element and, at the same time, the illumination method according to the fourth aspect of the third invention of the present invention is an illumination method of illuminating light in which $|\Delta h_n|$, $SAT_{ave}$, $\Delta C_n$, $|\Delta C_{max} - \Delta C_{min}|$, $D_{uv}$, and the like are within appropriate ranges to an illuminated object, and a light-emitting device used in the illumination method according to the fourth aspect of the third invention of the present invention can be configured in any way as long as the device is capable of providing such illumination. For example, the device may be any of an individual illumination light source, an illuminating module in which at least one or more of the light sources is mounted on a heatsink or the like, and a lighting fixture in which a lens, a light-reflecting mechanism, a driving electric circuit, and the like are added to the light source or the module. Furthermore, the device may be a lighting system which is a collection of individual light sources, individual modules, individual fixtures, and the like and which at least has a mechanism for supporting such components.

In the third invention of the present invention, the meteorological, photometric and colormetric characteristics of the light-emitting devices of the examples are shown in Table 3-16, Table 3-17 and Table 3-18, where appearance of colors of the illumination objects was generally very good.

The light-emitting device according to the first aspect of the third invention of the present invention is an illumination device that can implement a good appearance of colors for an illumination device that cannot implement a good appearance of colors, by using a very simple method of disposing such a control element as a filter and a reflection mirror in this illumination device, and also an illumination device that can implement a good appearance of colors suitable to the taste of the user, for an illumination device which is already capable of implementing a good appearance of colors, by using a very simple method of disposing such a control element as a filter and a reflection mirror in this illumination device.

The fifth aspect of the third invention of the present invention is a method for manufacturing a light-emitting device and the second aspect of the third invention of the present invention is a method for designing a light-emitting device. With a method for manufacturing and a method for designing according to these aspects of the third invention, a method for manufacturing and design guidelines for "a light-emitting device capable of realizing a natural, vivid, highly visible and comfortable appearance of colors or an appearance of objects" can be provided. In addition, the fourth aspect of the third invention of the present invention is an illumination method. With an illumination method according to the fourth aspect of the third invention of the present invention, "a natural, vivid, highly visible and comfortable appearance of colors or an appearance of objects" can be realized. All of the descriptions on the first aspect of the third invention of the present invention may be applied to the second, fourth, and fifth aspects of the third invention of the present invention.

INDUSTRIAL APPLICABILITY

<1. First Invention of Present Invention>

The light-emitting device according to the first invention of the present invention has an extremely wide field of application and may be used without being limited to particular uses. However, in consideration of the features of the light-emitting device according to the first invention of the present invention is favorably applied to the following fields.

For example, when illuminated by a light-emitting device according to the first invention of the present invention, white appears whiter, more natural, and more comfortable as compared to conventionally known light-emitting devices even with substantially similar CCT and substantially similar luminance. In addition, differences in lightness among achromatic colors such as white, gray, and black become more visible.

As a result, for example, black letters or the like on an ordinary sheet of white paper become more legible. To utilize such features, favorable applications include a reading light, lighting for a writing desk, and work lighting such as office lighting. In addition, work may conceivably involve performing a visual external examination of fine parts, distinguishing between near colors of cloth or the like, checking color in order to verify freshness of meat, performing a product inspection by comparing with a criteria sample, and the like at a factory or the like. In addition, illumination by the light-emitting device according to the first invention of the present invention makes color identification among close hues easier and realizes a work environment that is as comfortable as though in a high-illuminance environment. Even from such a perspective, applications to work lighting are favorable.

Furthermore, compared to the light-emitting devices disclosed in Japanese Patent No. 5252107 and Japanese Patent No. 5257538, illumination provided by a light-emitting device according to the first invention of the present invention results in high light source efficiency of the light-emitting device and emission of a larger luminous flux even when similar power is supplied. Therefore, the light-emitting device can be favorably used as a light-emitting device that illuminates an illuminated object from a higher ceiling surface than normal and an applicable range of the light-emitting device can be further expanded.

Furthermore, since color discrimination ability increases, for example, applications to medical lighting such as a light source for surgical operations and a light source used in a gastroscope or the like are also favorable. While arterial blood is vivid red due to its high oxygen content, venous blood is dark red due to its high carbon dioxide content. Although arterial blood and venous blood are both red, chromas of the colors differ from each other. Therefore, with the light-emitting device according to the first invention of the present invention which achieves favorable color appearance (chroma), it is expected that arterial blood and venous blood can be readily distinguished from each other. In addition, since it is obvious that favorable color representation in color image information such as an endoscope has a significant effect on diagnosis, it is expected that a normal location and a lesion location can be readily distinguished from each other. Due to similar reasons, the illumination method can be favorably applied to an illumination method used in industrial equipments such as a product image judgment device.

When illuminated by the light-emitting device according to the first invention of the present invention, a truly natural color appearance as though viewed under several tens of thousands of lx such as outdoor illuminance on a sunny day is achieved for a majority of, and in some cases, all colors such as purple, bluish purple, blue, greenish blue, green, yellowish green, yellow, reddish yellow, red, and reddish purple even when illuminance only ranges from around several thousand lx to several hundred lx. In addition, the skin color of the subjects (Japanese), various foods, clothing, wood colors, and the like which have intermediate chroma also acquire natural color appearances which many of the subjects feel more favorable.

Therefore, by applying the light-emitting device according to the first invention of the present invention to ordinary lighting for homes and the like, it is conceivable that food may appear fresher and more appetizing, newspapers, magazines, and the like may become more legible, and visibility of differences in level in the house may increase, thereby contributing to improving home safety. Accordingly, the light-emitting device according to the first invention of the present invention is favorably applied to residential uses' illumination. In addition, the present invention is also favorable as exhibit lighting for clothing, food, vehicles, suitcases, shoes, ornaments, furniture, and the like, and enables lighting which makes such items stand out from their surroundings. As described above, in particular, compared to the light-emitting devices disclosed in Japanese Patent No. 5252107 and Japanese Patent No. 5257538, illumination provided by a light-emitting device according to the first invention of the present invention results in higher light source efficiency of the light-emitting device and emission of a larger luminous flux even when similar power is supplied. Therefore, the light-emitting device can be favorably used as a light-emitting device that illuminates an illuminated object from a higher ceiling surface than normal. Due to such characteristics, a light-emitting device according to the first invention of the present invention is particularly preferably applied to illumination for exhibition.

Furthermore, the present invention is also favorable as lighting for goods such as cosmetics in which slight differences in color are the decisive factor when purchasing the goods. When used as exhibit lighting for white dresses and the like, since subtle differences in color become more visible such as a difference between bluish white and creamy white among similar whites, a person can select a color that is exactly according to his or her desire. Furthermore, the present invention is also favorable as presentation lighting at a wedding center, a theater, and the like, and enables a pure white dress or the like to be perceived as being pure white and kimonos, makeup, in kabuki or the like to appear vividly. The present invention also favorably highlights skin tones. In order to realize such illumination, since a light-emitting device according to the first invention of the present invention which has high light source efficiency is capable of providing illumination over a distance, a light-emitting device according to the first invention of the present invention is particularly preferably applied to illumination for presentation. In addition, by using the present invention as lighting in a hair salon, colors that are no different than those perceived outdoors can be obtained during hair coloring and excessive dyeing or insufficient dyeing can be prevented.

Furthermore, since white appears more white, achromatic colors can be readily distinguished, and chromatic colors attain their natural vividness, the first invention of the present invention are also favorable as a light source in a location where a wide variety of activities are conducted in a given limited space. For example, passengers in an airplane read, work, and eat at their seats. Similar situations take place on a train, a long-distance bus, and the like. The first invention of the present invention is favorably applicable as lighting for interior of transportation.

In addition, since white appears more white, achromatic colors can be readily distinguished, and chromatic colors attain their natural vividness, the first invention of the present invention enables paintings and the like in an art museum or the like to be illuminated in a natural tone as though viewed outdoors and is therefore also favorable as lighting for works of art.

On the other hand, the first invention of the present invention is also favorably applicable as lighting for aged persons. In other words, even in case where small characters are hard to read and difference in steps or the like are hard to see under normal illuminance, by applying the light-emitting device according to the first invention of the present invention, such problems can be solved since achromatic colors and chromatic colors can be readily distinguished from one another. Therefore, the first invention of the present invention is also favorably applicable to lighting in public facilities or the like which are used by the general public such as a waiting room in a retirement house or a hospital, a book store, and a library. While luminance itself must be increased in an appropriate range in order to realize such illumination, a light-emitting device according to the first invention of the present invention which has high light source efficiency is capable of increasing luminance of an illuminated surface even when supplied power is similar. Therefore, a light-emitting device according to the first invention of the present invention is particularly preferably applied to illumination for the aged persons.

Furthermore, the light-emitting device according to the first invention of the present invention can be favorably used in applications for securing visibility by adapting to an illumination environment in which illuminance is often at a relatively low level due to various circumstances.

For example, the light-emitting device according to the first invention of the present invention is favorably applied to street lamps, head lights of vehicles, and foot lamps to increase visibility as compared to using conventional light sources.

<2. Second Invention of Present Invention>

The description on the industrial applicability of the first invention of the present invention will also apply to the industrial applicability of the second invention of the present invention.

<3. Third Invention of Present Invention>

The light-emitting device such as an illumination light source, a lighting fixture, a lighting system, and the like, and the illumination method according to the third invention of the present invention has an extremely wide field of application and may be used without being limited to particular uses. However, in consideration of the features of the illumination method or the light-emitting device according to the third invention of the present invention, the illumination method or the light-emitting device according to the third invention of the present invention is favorably applied to the following fields.

For example, when illuminated by the light-emitting device or the illumination method according to the third invention of the present invention, white may be perceived as being whiter, more natural, and more comfortable as compared to a conventional a conventional light-emitting device or illumination method even at a similar CCT and a similar illuminance. Furthermore, differences in lightness among achromatic colors such as white, gray, and black become more visible.

As a result, for example, black letters or the like on an ordinary sheet of white paper become more legible. To utilize such features, favorable applications include a reading light, lighting for a writing desk, and work lighting such as office lighting. In addition, while work may conceivably involve performing a visual external examination of fine parts, distinguishing between near colors of cloth or the like, checking color in order to verify freshness of meat, performing a product inspection by comparing with a criteria sample, and the like at a factory or the like, illumination by the illumination method according to the third invention of the present invention makes color identification among close hues easier and realizes a work environment that is as comfortable as though in a high-illuminance environment. Even from such a perspective, applications to work lighting are favorable.

Furthermore, since color discrimination ability increases, for example, applications to medical lighting such as a light source for surgical operations and a light source used in a gastroscope or the like are also favorable. While arterial blood is vivid red due to its high oxygen content, venous blood is dark red due to its high carbon dioxide content. Although arterial blood and venous blood are both red, chromas of the colors differ from each other. Therefore, with the device or the illumination method according to the third invention of the present invention which achieves favorable color appearance (chroma), it is expected that arterial blood and venous blood can be readily distinguished from each other. In addition, since it is obvious that favorable color representation in color image information such as an endoscope has a significant effect on diagnosis, it is expected that a normal location and a lesion location can be readily distinguished from each other. Due to similar reasons, the illumination method can be favorably applied to an illumination method used in industrial equipments such as a product image judgment device.

When illuminated by the light-emitting device or the illumination method according to the third invention of the present invention, a truly natural color appearance as though viewed under several tens of thousands of lx such as outdoor illuminance on a sunny day is achieved for a majority of, and in some cases, all colors such as purple, bluish purple, blue, greenish blue, green, yellowish green, yellow, reddish yellow, red, and reddish purple even when illuminance only ranges from around several thousand lx to several hundred lx. In addition, the skin color of the subjects (Japanese), various foods, clothing, wood colors, and the like which have intermediate chroma also acquire natural color appearances which many of the subjects feel more favorable.

Therefore, by applying the light-emitting device or the illumination method according to the third invention of the present invention to ordinary lighting for homes and the like, it is conceivable that food may appear fresher and more appetizing, newspapers, magazines, and the like may become more legible, and visibility of differences in level in the house may increase, thereby contributing to improving home safety. Accordingly, the third invention of the present invention is favorably applied to residential uses' illumination. In addition, the present invention is also favorable as exhibit lighting for clothing, food, vehicles, suitcases, shoes, ornaments, furniture, and the like, and enables lighting which makes such items stand out from their surroundings.

The present invention is also favorable as lighting for goods such as cosmetics in which slight differences in color are the decisive factor when purchasing the goods. When used as exhibit lighting for white dresses and the like, since subtle differences in color become more visible such as a difference between bluish white and creamy white among similar whites, a person can select a color that is exactly according to his or her desire. Furthermore, the present invention is also favorable as presentation lighting at a wedding center, a theater, and the like, and enables a pure white dress or the like to be perceived as being pure white and kimonos, makeup, in kabuki or the like to appear vividly. The present invention also favorably highlights skin tones. In addition, by using the present invention as lighting in a hair salon, colors that are no different than those perceived outdoors can be obtained during hair coloring and excessive dyeing or insufficient dyeing can be prevented.

Furthermore, while a control element according to the third invention of the present invention has a function of improving color appearance and a function of adjusting color appearance in accordance with preferences of a user, the control element may additionally have a function of reducing relative spectral intensity of light with relatively high energy which may be irradiated from a light-emitting element such as a part of ultraviolet light, near-ultraviolet light, violet light, blue-violet light, and blue light. In such a case, for example, color degradation, alteration, corrosion, deterioration, and the like of illuminated objects such as clothing and food can be reduced. In addition, since a control element according to the third invention of the present invention is also capable of reducing relative spectral intensity of light from a light-emitting element with a wavelength that may potentially cause thermal radiation such as near infrared light, middle infrared light, and far infrared light, alteration, corrosion, deterioration, and the like of illuminated objects such as food can be reduced. Therefore, an effect of reducing alteration, corrosion, deterioration, and the like of illuminated objects such as food can also be provided.

Furthermore, since white appears more white, achromatic colors can be readily distinguished, and chromatic colors attain their natural vividness, the third invention of the present invention is also favorable as a light source in a location where a wide variety of activities are conducted in a given limited space. For example, passengers in an airplane read, work, and eat at their seats. Similar situations take place on a train, a long-distance bus, and the like. The third invention of the present invention is favorably applicable as lighting for interior of transportation.

In addition, since white appears more white, achromatic colors can be readily distinguished, and chromatic colors attain their natural vividness, the third invention of the present invention enables paintings and the like in an art museum or the like to be illuminated in a natural tone as though viewed outdoors and is therefore also favorable as lighting for works of art.

On the other hand, the third invention of the present invention is also favorably applicable as lighting for aged persons. In other words, even in case where small characters are hard to read and difference in steps or the like are hard to see under normal illuminance, by applying the illumination method or the light-emitting device according to the third invention of the present invention, such problems can be solved since achromatic colors and chromatic colors can be readily distinguished from one another. Therefore, the present invention is also favorably applicable to lighting in public facilities or the like which are used by the general public such as a waiting room in a retirement house or a hospital, a book store, and a library.

Furthermore, the light-emitting device or the illumination method according to the third invention of the present invention can be favorably used in applications for securing visibility by adapting to an illumination environment in which illuminance is often at a relatively low level due to various circumstances.

For example, the illumination method or the light-emitting device according to the third invention of the present invention is favorably applied to street lamps, head lights of vehicles, and foot lamps to increase visibility as compared to using conventional light sources.

While the invention has been described in detail and with reference to specific embodiments thereof, it will be apparent to one skilled in the art that various changes and modifications can be made therein without departing from the spirit and scope thereof.

EXPLANATION OF REFERENCE NUMERALS 200 light-emitting device
201, 211, 221, 231, 241, 251 light-emitting area 1
202, 212, 222, 232, 242, 252 light-emitting area 2
203, 223 light-emitting area 3
204 light-emitting area 4
205 light-emitting area 5
206 packaged LED
243, 253 virtual outer periphery
244, 254 two points on virtual outer periphery
245, 255 distance between two points on virtual outer periphery
210 packaged LED
220 packaged LED
230 illumination system
240 pair of packaged LEDs
301 housing
302 bule LED chip
302$d$ thermal radiation filament
303 package
341 green phosphor
342 red phosphor
305 cut-off filter (control element)
306 encapsulant
310 packaged LED (light-emitting device having low level processing)
311 incandescent bulb (light-emitting device having mid-level processing)
320 LED light bulb with filter (light-emitting device having high level processing)
330 lighting system (light-emitting device having further high level processing)

The invention claimed is:

1. An illumination method comprising: preparing illuminated objects; and an illuminating the objects by light emitted from light-emitting devices, wherein
the light-emitting devices, comprising, as a light-emitting element:
a blue semiconductor light-emitting element,
a green phosphor, and
a red phosphor; and
in the illuminating, when light emitted from the light-emitting devices illuminates the objects, the objects are illuminated so that the light measured at a position of the objects satisfies all of <1> to <4> below:
<1>: if an a* value and a b* value in CIE 1976 L*a*b* color space of 15 Munsell renotation color samples from #01 to #15 listed below when mathematically assuming illumination by the light measured at the position of the objects are respectively denoted by $a^*_{nSSL1}$ and $b^*_{nSSL1}$ (where n is a natural number from 1 to 15), and
if an a* value and a b* value in CIE 1976 L*a*b* color space of the 15 Munsell renotation color samples when mathematically assuming illumination by a reference light that is selected according to a correlated color temperature $T_{SSL1}$ of the light measured at the position of the objects are respectively denoted by $a^*_{nref1}$ and $b^*_{nref1}$ (where n is a natural number from 1 to 15), then each saturation difference $\Delta C_{nSSL1}$ satisfies $-4.00 \leq \Delta C_{nSSL1} \leq 8.00$ (where $n$ is a natural number from 1 to 15), <2>: an average saturation difference represented by formula (1-3) below $$\frac{\sum_{n=1}^{15} \Delta C_{nSSL1}}{15} \quad (1\text{-}3)$$

satisfies $$0.50 \leq \frac{\sum_{n=1}^{15} \Delta C_{nSSL1}}{15} \leq 4.00,$$

<3>: if a maximum saturation difference value is denoted by $\Delta C_{SSL-max1}$ and a minimum saturation difference value is denoted by $\Delta C_{SSL-min1}$, then a difference $\Delta C_{SSL-max1} - \Delta_{SSL-min1}$ between the maximum saturation difference value and the minimum saturation difference value satisfies $$2.00 \leq \Delta C_{SSL-max1} - \Delta C_{SSL-min1} \leq 10.00,$$

where $\Delta C_{nSSL1} = \sqrt{\{(a^*_{nSSL1} + (b^*_{nSSL1})^2\}} - \sqrt{\{(a^*_{nrefl})^2 + (b^*_{nrefl})^2\}}$ with the 15 Munsell renotation color samples being:

| #01 | 7.5P   | 4/10  |
|-----|--------|-------|
| #02 | 10PB   | 4/10  |
| #03 | 5PB    | 4/12  |
| #04 | 7.5B   | 5/10  |
| #05 | 10BG   | 6/8   |
| #06 | 2.5BG  | 6/10  |
| #07 | 2.5G   | 6/12  |
| #08 | 7.5GY  | 7/10  |
| #09 | 2.5GY  | 8/10  |
| #10 | 5Y     | 8.5/12|
| #11 | 10YR   | 7/12  |
| #12 | 5YR    | 7/12  |
| #13 | 10R    | 6/12  |
| #14 | 5R     | 4/14  |
| #15 | 7.5RP  | 4/12; |

<4>: if hue angles in CIE 1976 L*a*b* color space of the 15 Munsell renotation color samples when mathematically assuming illumination by the light measured at the position of the objects are denoted by $\theta_{nSSL1}$ (degrees) (where n is a natural number from 1 to 15), and if hue angles in CIE 1976 L*a*b* color space of the 15 Munsell renotation color samples when mathematically assuming illumination by a reference light that is selected according to the correlated color temperature $T_{SSL1}$ of the light measured at the position of the objects are denoted by $\theta_{nrefl}$ (degrees) (where n is a natural number from 1 to 15), then an absolute value of each difference in hue angles $|\Delta h_{nSSL1}|$ satisfies $$0.00 \leq |\Delta h_{nSSL}| \leq 12.50 \text{ (degrees) (where } n \text{ is } a \text{ natural number from 1 to 15)},$$

where $\Delta h_{nSSL1} = \theta_{nSSL1} - \theta_{nrefl}$.

2. The illumination method according to claim 1, wherein Condition 1 below is satisfied
   Condition 1:
      wherein X denotes wavelength,
      $\varphi_{SSL1}(\lambda)$ denotes a spectral power distribution of light emitted from the light-emitting device in the main radiant direction,
      $\varphi_{refl}(\lambda)$ denotes a spectral power distribution of reference light which is selected in accordance with a correlated color temperature $T_{SSL1}$ of the light emitted from the light-emitting device in the main radiant direction,
      $(X_{SSL1}, Y_{SSL1}, Z_{SSL1})$ denote tristimulus values of the light emitted from the light-emitting device in the main radiant direction, and
      $(X_{refl}, Y_{refl}, Z_{refl})$ denote tristimulus values of the reference light which is selected in accordance with $T_{SSL1}$ of the light emitted from the light-emitting device in the main radiant direction, and
      a normalized spectral power distribution $S_{SSL1}(\lambda)$ of the light emitted from the light-emitting device in the main radiant direction, a normalized spectral power distribution $S_{refl}(\lambda)$ of the reference light which is selected in accordance with $T_{SSL1}$ of the light emitted from the light-emitting device in the main radiant direction, and a difference $\Delta S_{SSL1}(\lambda)$ of between normalized spectral power distributions are respectively defined as $$S_{SSL1}(\lambda) = \varphi_{SSL1}(\lambda)/Y_{SSL1}$$

$$S_{refl}(\lambda) = \varphi_{refl}(\lambda)/Y_{refl}$$

$$\Delta S_{SSL1}(\lambda) = S_{refl}(\lambda) - S_{SSL1}(\lambda), \text{ and}$$

where $\lambda_{SSL1-RL-max}$ (nm) represents a wavelength that provides a longest wavelength local maximum value of $S_{SSL1}(\lambda)$ in a wavelength range of 380 nm or more and 780 nm or less, and a wavelength Λ4 that provides $S_{SSL1}(\lambda_{SSL1-RL-max})/2$ exists on a longer wavelength-side of $\lambda_{SSL1-RL-max}$, an index $A_{cg}(\varphi_{SSL1}(\lambda))$ represented by the following formula (1-1) satisfies $$-10.0 < A_{cg}(\varphi_{SSL1}(\lambda)) \leq 120.0,$$

where $\lambda_{SSL1-RL-max}$ (nm) represents a wavelength that provides the longest wavelength local maximum value of $S_{SSL1}(\lambda)$ in a wavelength range of 380 nm or more and 780 nm or less, and the wavelength Λ4 that provides $S_{SSL1}(\lambda_{SSL1-RL-max})/2$ does not exist on the longer wavelength-side of $\lambda_{SSL1-RL-max}$, an index $A_{cg}(\varphi_{SSL1}(\lambda))$ represented by the following formula (1-2) satisfies $$-10.0 < A_{cg}(\varphi_{SSL1}(\lambda)) \leq 120.0;$$

$$A_{cg}(\varphi_{SSL1}(\lambda)) = \int_{380}^{405} \Delta S_{SSL1}(\lambda)d\lambda + \int_{495}^{590}(-\Delta S_{SSL1}(\lambda))d\lambda + \int_{590}^{\Lambda 4} \Delta S_{SSL1}(\lambda)d\lambda \qquad (1\text{-}1)$$

$$A_{cg}(\varphi_{SSL1}(\lambda)) = \int_{380}^{405} \Delta S_{SSL1}(\lambda)d\lambda + \int_{495}^{590}(-\Delta S_{SSL1}(\lambda))d\lambda + \int_{590}^{780} \Delta S_{SSL1}(\lambda)d\lambda \qquad (1\text{-}2)$$

3. The illumination method according to claim 1, wherein Condition 2 below is satisfied
   Condition 2:
      a distance $D_{uv}(\varphi_{SSL1}(\lambda))$ of the spectral power distribution $\varphi_{SSL1}(\lambda)$ of light from a black-body radiation locus defined by ANSI C78.377 satisfies $$-0.0220 \leq D_{uv}(\varphi_{SSL1}(\lambda)) < 0.$$

4. The illumination method according to claim 1, wherein Condition 3 below is satisfied
   Condition 3:
      where a maximum value of spectral intensity in a range of 430 nm or more and 495 nm or less is defined as $\varphi_{SSL1-BM-max}$ and a minimum value of spectral intensity in a range of 465 nm or more and 525 nm or less is defined as $\varphi_{SSL1-BG-min}$, the spectral power distribution $\varphi_{SSL1}(\lambda)$ of light satisfies $$0.2250 \leq \varphi_{SSL1-BG-min}/\varphi_{SSL1-BM-min} \leq 0.7000.$$

5. The illumination method according to claim 1, wherein Condition 4 below is satisfied
   Condition 4:
      in the spectral power distribution $\varphi_{SSL1}(\lambda)$ of light, where a maximum value of spectral intensity in a range of 590 nm or more and 780 nm or less is defined as $\varphi_{SSL1\text{-}RM\text{-}max}$, a wavelength $\lambda_{SSL1\text{-}RM\text{-}max}$ that provides $\varphi_{SSL1\text{-}RM\text{-}max}$ satisfies $$605 \text{ (nm)} \leq \lambda_{SSL1\text{-}RM\text{-}max} \leq 653 \text{ (nm)}.$$

6. The method according to claim 3, wherein in Condition 2, $$-0.0184 \leq D_{uv}(\varphi_{SSL1}(\lambda)) \leq -0.0084 \text{ is satisfied.}$$

7. The method according to claim 5, wherein in Condition 4, $$625 \text{ (nm)} \leq \lambda_{SSL1\text{-}RM\text{-}max} \leq 647 \text{ (nm) is satisfied.}$$

8. The method according to claim 1, wherein Condition 5 below is satisfied
Condition 5:
in the spectral power distribution $\varphi_{SSL1}(\lambda)$ of light, a wavelength $\lambda_{SSL1\text{-}BM\text{-}max}$ that provides $\varphi_{SSL1\text{-}BM\text{-}max}$ satisfies $$430 \text{ (nm)} \leq \lambda_{SSL1\text{-}BM\text{-}max} \leq 480 \text{ (nm)}.$$

9. The method according to claim 1, wherein Condition 6 below is satisfied
Condition 6:

$$0.1800 \leq \varphi_{SSL1\text{-}BG\text{-}min}/\varphi S_{SSL1\text{-}RM\text{-}max} \leq 0.8500.$$

10. The method according to claim 9, wherein in Condition 6, $$0.1917 \leq \varphi_{SSL\text{-}BG\text{-}min}/\varphi_{SSL1\text{-}RM\text{-}max} \leq 0.7300 \text{ is satisfied.}$$

\* \* \* \* \*